United States Patent [19]
Takasugi et al.

[11] Patent Number: 5,978,303
[45] Date of Patent: Nov. 2, 1999

[54] MEMORY DEVICE PROVIDING BURST READ ACCESS AND WRITE ACCESS FROM A SINGLE ADDRESS INPUT

[75] Inventors: Atsushi Takasugi; Takeshi Gotoh, both of Tokyo, Japan

[73] Assignee: Oki Electric Industry Co., Ltd., Tokyo, Japan

[21] Appl. No.: 09/096,585

[22] Filed: Jun. 12, 1998

[30] Foreign Application Priority Data

Jul. 10, 1997 [JP] Japan .................................... 9-185532
Jul. 22, 1997 [JP] Japan .................................... 9-212474
May 19, 1998 [JP] Japan .................................... 10-137171

[51] Int. Cl.$^6$ .................................................. G11C 8/00
[52] U.S. Cl. ................................. 365/230.03; 365/230.06
[58] Field of Search ......................... 365/230.03, 230.06, 365/233, 236

[56] References Cited

U.S. PATENT DOCUMENTS 5,604,697  2/1997  Takahashi et al. ...................... 365/230
5,848,021  12/1998 Sugibayashi ........................ 365/230.06

OTHER PUBLICATIONS

MSM54V24632A 131,072 Word×32–Bit×2–Bank Synchronous Dynamic RAM, Oki Semiconductor, Aug. 1, 1997, pp. 1–29.

Primary Examiner—Trong Phan
Attorney, Agent, or Firm—Jones Volentine, LLP

[57] ABSTRACT

According to a first aspect of the invention, a memory device has a main memory array and a sub memory array. In a single burst, data are read from a series of columns in the main memory array, transferred from one column in the main memory array to one column in the sub memory array, read from a series of columns in the sub memory array, and written into the above-mentioned one column in the main memory array. According to a second aspect of the invention, a memory device has a memory array and separate external data input terminals and output terminals. In a single burst, data are read from a series of columns in the memory array, and written to one of the columns, preferably the last column in the series. Input of the written data is preferably simultaneous with the output of the data read from the column to which the input data are written.

82 Claims, 90 Drawing Sheets

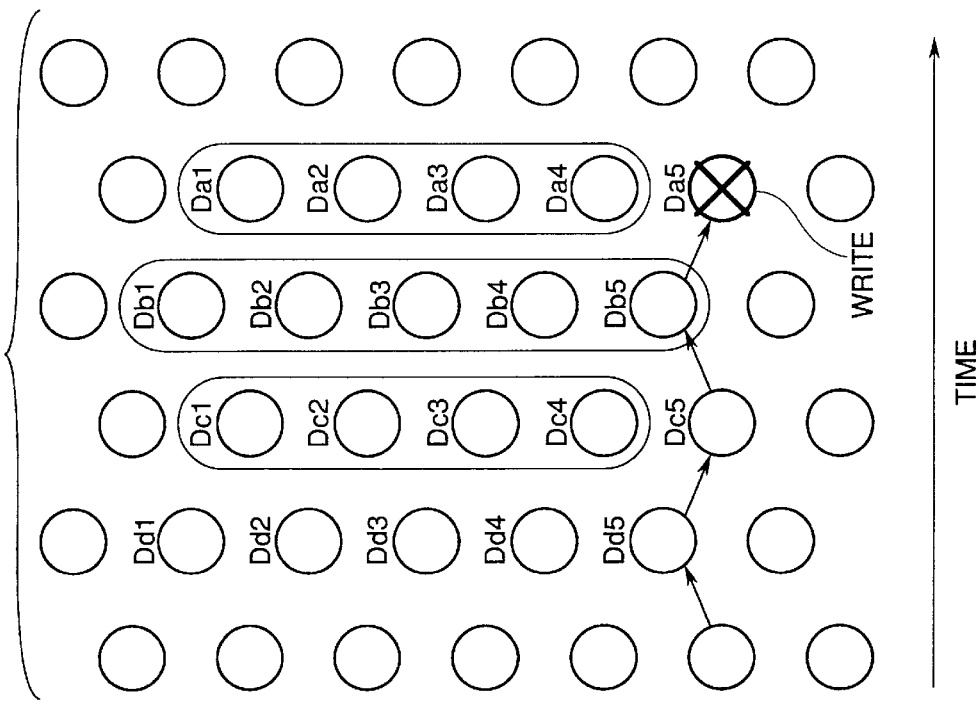
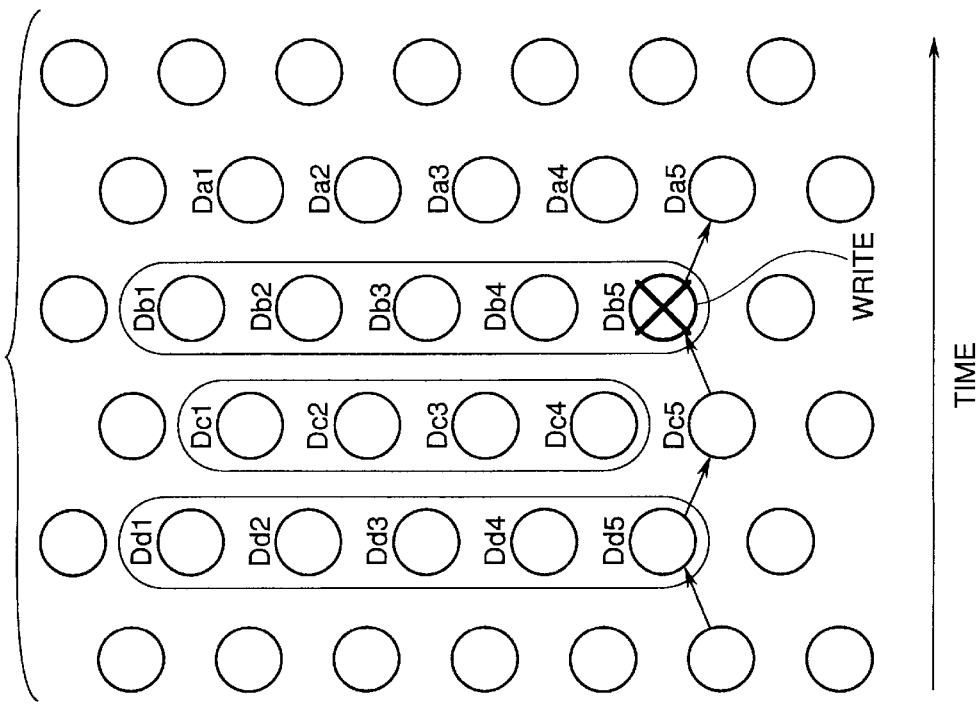

MEMORY DEVICE PROVIDING BURST READ ACCESS AND WRITE ACCESS FROM A SINGLE ADDRESS INPUT

BACKGROUND OF THE INVENTION

The present invention relates to a memory device with features useful in, for example, the digital processing of moving pictures.

This type of processing is becoming increasingly necessary: television sets are making use of digital image-processing techniques; personal computers and workstations are being used to display video images; and moving pictures are being transferred between these different media, with attendant conversion between different formats.

Much digital image processing is performed on rectangular blocks of picture elements or pixels. Spatial and temporal filtering for noise rejection, effect processing, and format conversion are typical examples. Motion estimation for image compression is another example. When moving pictures are processed in real time, there is accordingly a need for very fast retrieval of blocks of pixels. For example, as each new pixel in a moving picture is received and stored, it may be necessary to read a block of pixels in which the new pixel occurs, and corresponding blocks of pixels from several preceding image frames or fields, all in the space of time before the next pixel is received.

Conventional dynamic random access memory (DRAM) is far too slow for this task, because every read or write access must be preceded by the time-consuming input of a new address.

Conventional dual-ported dynamic random-access memory, also known as video random-access memory (VRAM), can provide high-speed serial read access to an entire row of pixels, e.g. to all of the pixels in a horizontal scanning line on a screen, but this feature is not useful for access to rectangular blocks of pixels.

Synchronous dynamic random-access memory (SDRAM) and synchronous graphics random-access memory (SGRAM) permit burst access to smaller groups of pixels, but require separate address input for read access and write access, which is inconvenient when the arrival of each new pixel requires both types of access. SDRAM and SGRAM also fail to support some of the burst lengths most often required in digital filtering.

Moreover, none of these memories can be easily cascaded to provide access to pixel blocks in several frames or fields.

The inadequacies of existing types of random-access memory have often forced system designers to use first-in-first-out (FIFO) memory for storing fields and frames, and provide an application-specific integrated circuit (ASIC) with line memories for use in accessing rectangular blocks of pixels. An ASIC with twenty-one line memories, each a static random-access memory (SRAM) storing one thousand twenty-four eight-bit words, has been used in digital television receivers, for example. SRAM memory cells are large, however, so the line memories take up much space in the ASIC, limiting the amount of actual image-processing circuitry that can be accommodated. The SRAM line memories also consume much current, because they are operated as shift registers, and their presence increases the cost of the ASIC.

Further details will be given below.

SUMMARY OF THE INVENTION

It is accordingly an object of the present invention to provide a memory device combining the functions of a field or frame memory and a group of line memories.

Another object of the invention is to provide a memory device in which input of a single row-column address can produce burst read access combined with single write access.

Another object is to provide a memory device in which input of a single row address can produce burst read access combined with single write access, using a column address input previously.

Still another object is to provide a memory device suitable for cascading.

Yet another object is to provide a memory device that can store pixel data for multiple fields or frames of a moving picture, and output multiple pixel data from each of the fields or frames in a single combined burst.

According to a first aspect of the invention, a memory device has a main memory array and a sub memory array, both arrays sharing the same word lines, row decoder, and internal data bus. The sub memory array has fewer columns than the main memory array. The data bus is coupled to a data input unit and a data output unit, which have external data input and output terminals.

A column address generator generates a series of column addresses from a single starting column address, designated by an external column address signal. A main column decoder decodes the column addresses to select a series of columns in the main memory array. A sub column decoder decodes low-order bits of the column addresses to select a series of columns in the sub memory array.

A control signal generator generates internal control signals that cause data stored in the main memory array to be output through the internal data bus, cause data stored in the main memory array to be transferred through the internal data bus to the sub memory array, cause data stored in the sub memory array to be output through the internal data bus, and cause input data to be transferred to the main memory array through the internal data bus. Preferably these operations are performed in a single burst, in which data are output from multiple columns in the main memory array and multiple columns in the sub memory array, are transferred from one column in the main memory array to one column in the sub memory array, and are input to the same one column in the main memory.

The data input terminals and data output terminals may be separate, permitting the data input unit to receive input data during the output of data from the data output unit. The input data and the data that are output simultaneously with the input data preferably have the same column address in the main memory array, to facilitate cascading of memory devices.

To facilitate the transfer of data from the main memory array to the sub memory array, the internal data bus may be divided into a main part coupled to the main memory array, and a sub part coupled to the sub memory array. The two parts may be interconnected by a data bus switch, or by the data output unit. When a data bus switch is used, a write amplifier is preferably provided to amplify data being written from the sub part of the internal data bus into the sub memory array.

The column address signal lines linking the column address generator to the main column decoder and sub column decoder may be similarly divided by an address bus switch, or separate signal lines may be provided.

The memory device preferably has an address register in which the starting address can be stored, so that the column address generator can produce the same series of column addresses repeatedly without requiring repeated external input of the same starting address.

The memory device preferably has at least two banks, each with its own main memory array and sub memory array. A single burst can then comprise the output of data read from the main memory array in a first bank, from the main memory array in a second bank, and from the sub memory array in the first bank, and the input of data to the main memory array in the first bank. The writing of input data in the main memory array in the first bank, and the transfer of data from the main memory array to the sub memory array in the first bank, preferably take place during read access to the second bank. A transfer register is preferably provided, so that data read from the main memory array in the first bank can be temporarily stored in the transfer register, then transferred to the sub memory array in the first bank while the second bank is being accessed. An input data register may also be provided to hold the input data, pending writing to the main memory array in the first bank.

According to a second aspect of the invention, a memory device has a memory array, a row decoder, a column decoder, a column address generator, an internal data bus, a data input unit, and a data output unit. The data input terminals of the data input unit are separate from the data output terminals of the data output unit. The data output unit is coupled to the internal data bus by a data bus switch.

The memory device also has a control signal generator that generates internal control signals causing the column address generator to generate a series of column addresses from a starting address designated by an external column address signal. A burst of data is read from the corresponding columns in the memory array. At the end of the burst, input data are received by the data input unit and transferred to one column in the memory array.

This one column is preferably the last column from which data were read. A buffer circuit is preferably coupled between the data bus switch and data output unit, permitting the input data to be received by the data input unit and transferred to the memory array while the data read from the last column are being output by the data output unit, to facilitate cascading of memory devices.

A data bus initialization unit is preferably provided to initialize the internal data bus after the data read from the last column have been transferred to the buffer circuit, in preparation for the transfer of data from the data input unit to the memory array.

An address register is preferably provided as in the first aspect of the invention.

The memory array may be divided into multiple blocks, each storing data for one field or frame of a moving picture. In this case, a block selection unit is preferably provided to modify at least one of the column address bits midway through the burst, causing the burst to jump from one block to another, thus reading data for multiple pixels in different fields or frames.

The memory array may also be divided into multiple banks.

BRIEF DESCRIPTION OF THE DRAWINGS

In the attached drawings:

FIGS. 62, 63, and 64 illustrate pixel data accessed in a filtering operation performed on consecutive fields, using different numbers of pixels from even and odd fields;

DETAILED DESCRIPTION OF THE INVENTION

Embodiments of the invention will be described with reference to the attached illustrative drawings, following some further general information about moving picture processing.

Figure 1:
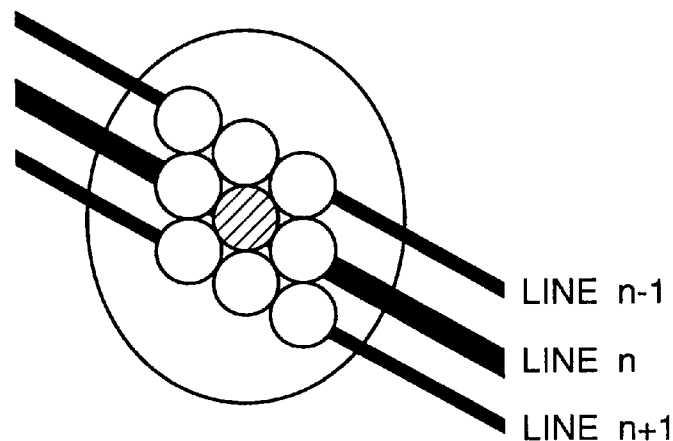
FIG. 1 illustrates a group of pixels.

One common type of digital image processing is a filtering process that modifies a pixel value according to the values of the surrounding pixels. Referring to FIG. 1, such a filtering process might modify the value of the pixel indicated by a hatched circle, in the n-th scanning line, according to the adjacent pixels indicated by non-hatched circles in scanning lines n−1, n, and n+1.

Figure 2:
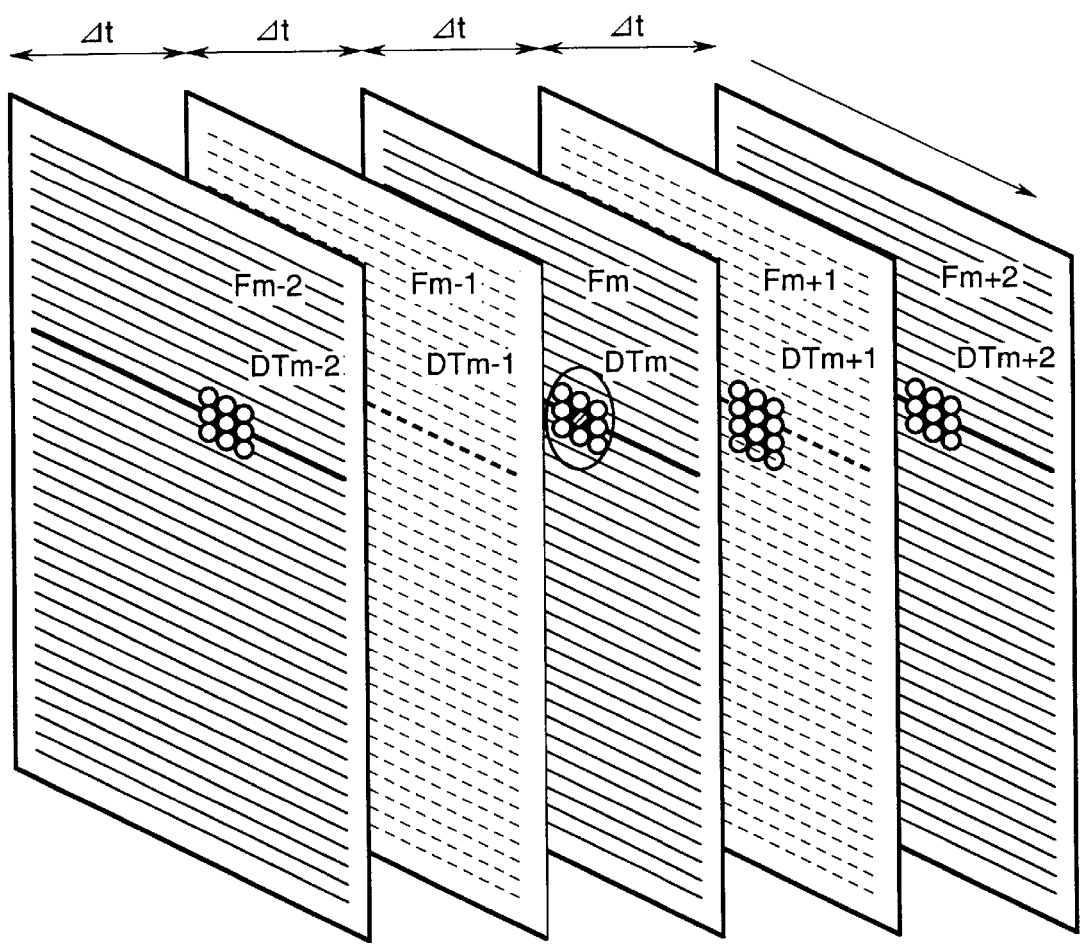
FIG. 2 illustrates groups of pixels in several consecutive fields in a moving picture.

Such filtering can extend in the temporal dimension. FIG. 2 illustrates five consecutive fields of a moving picture, comprising odd fields Fm−2, Fm, and Fm+2 interlaced with even fields Fm−1 and Fm+1. The symbol Δt represents the field interval, e.g. one-sixtieth or one-fiftieth of a second. A spatial and temporal filtering process might generate a filtered pixel value at the position marked by hatching in field Fm according to the values of all pixels in the five groups from DTm−2 to DTm+2.

Figure 3:
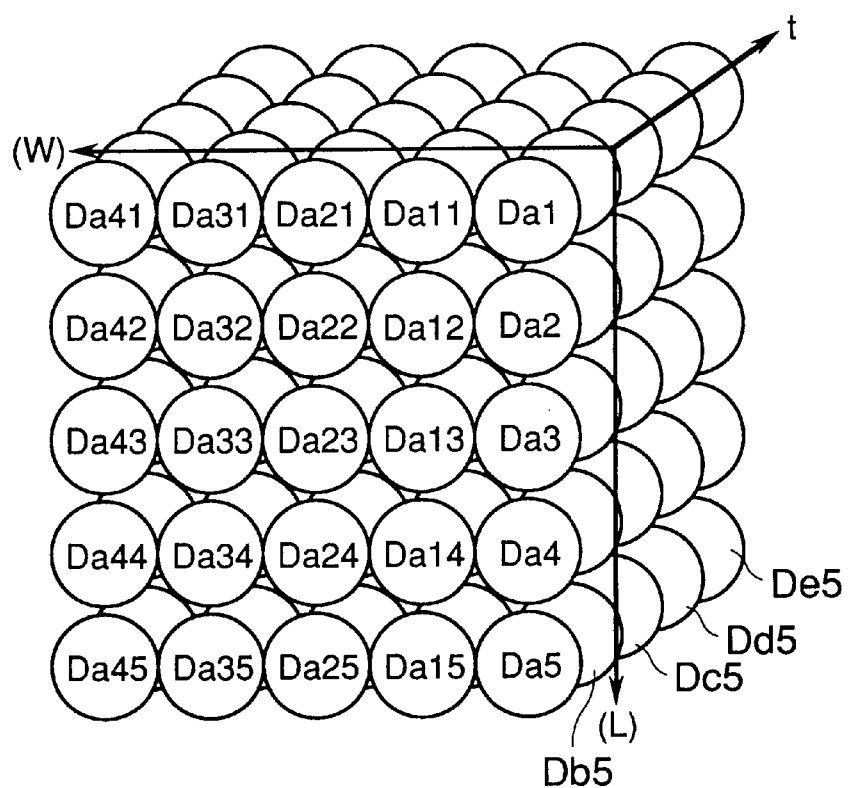
FIG. 3 illustrates larger groups of pixels in consecutive fields in a moving picture.

FIG. 3 generalizes this process to access to five-by-five pixel blocks in five consecutive fields, and shows that spatial and temporal filtering requires rapid access to pixels separated by three types of delay: a bit delay (W) corresponding to the interval between consecutive pixels in the same line; a line delay (L) corresponding to the interval between consecutive lines; and a field delay (t) corresponding to the interval between fields.

The term 'bit delay' is used, incidentally, because all data bits of the same pixel are usually accessed simultaneously, in parallel. This term does not imply that a pixel is represented by a single bit. A pixel typically comprises eight bits in a monochrome image, and more bits in a color image.

Figure 4:
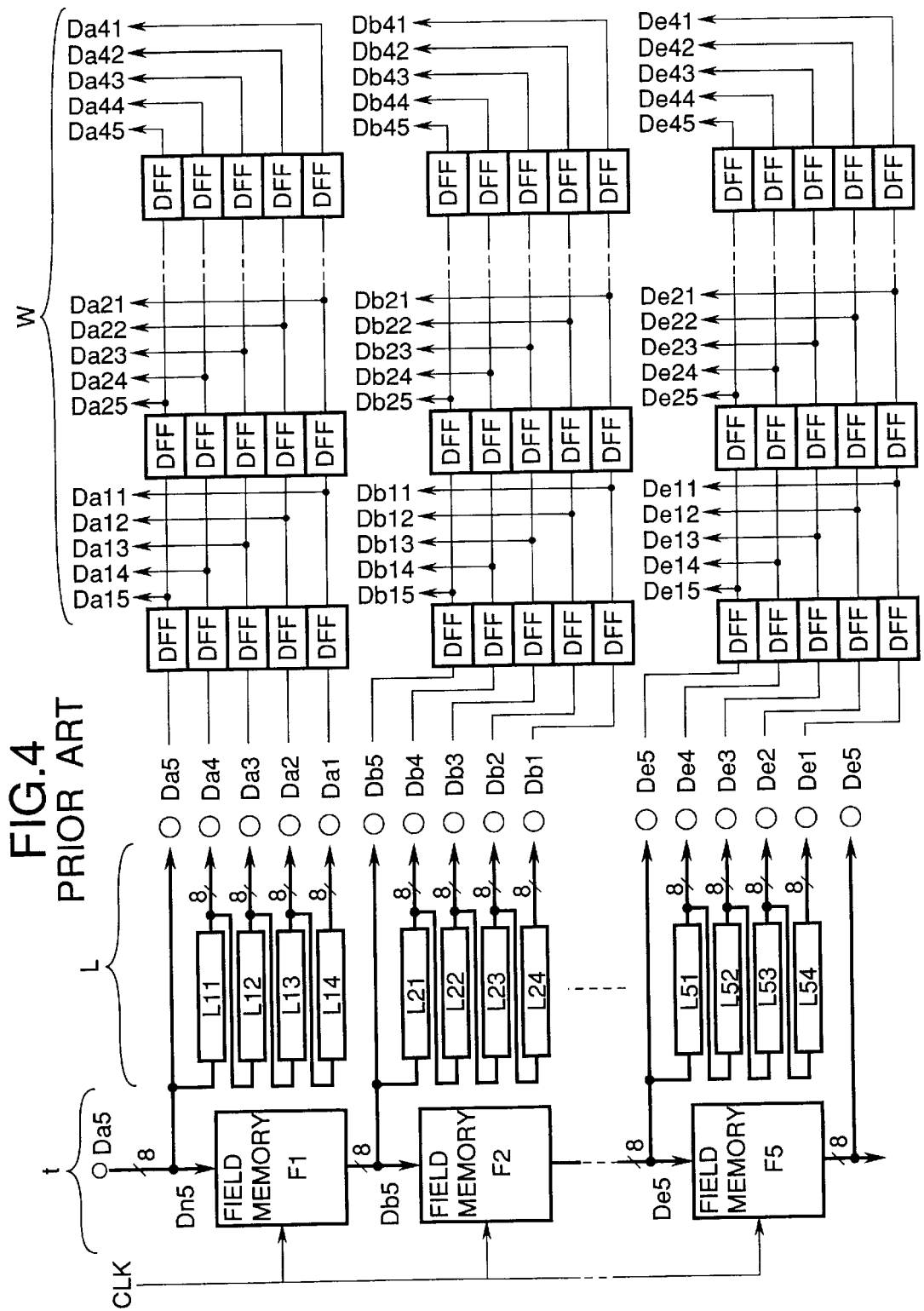
FIG. 4 illustrates a conventional system providing read access to the pixels in FIG. 3.

FIG. 4 shows a conventional system providing access to the pixel values shown in FIG. 3, assuming eight bits per pixel. At the left are five cascaded FIFO field memories F1, F2, . . . , F5, each storing an amount of pixel data equivalent to one field. These field memories are dual-port devices, the output port of one memory being coupled to the input port of the next memory. Each pixel resides in each field memory for one field interval Δ t. Input and output take place simultaneously, synchronized with the same clock signal (CLK). The first field memory F1, for example, simultaneously receives a new pixel Da5 and passes the pixel Db5 at the same position in the preceding field to the second field memory F2. The field memories thus provide the field delay (t) indicated in FIG. 3.

The line delay (L) is provided by a plurality of line memories L11, . . . , L54. Each pixel supplied to the first field memory F1 is also supplied to the first line memory L11, which is cascaded with line memories L12, L13, and L14. The pixel is shifted through this cascade as through a shift register, spending a time equivalent to one horizontal scanning interval in each line memory, thus being output from line memory L11 with a one-line delay, from line memory L12 with a two-line delay, and so on. The other line memories provide similar delays for the inputs to field memories F2 to F5.

The bit delay (W) is provided by an array of D-type flip-flops, marked DFF in the drawing. Each pixel input to one of the field memories, or output from one of the line memories, is also fed to a cascade of four D-type flip-flops. The outputs of these flip-flops, together with the inputs and outputs of the field memories and line memories, provide simultaneous read access to all of the pixels shown in FIG. 3, comprising a five-by-five block in each of five consecutive fields.

The line memories and D-type flip-flops in FIG. 4 are conventionally provided in an ASIC device, but the line memories employ SRAM circuits that are expensive in terms of space, current consumption, and device cost, as noted above.

Figure 5:
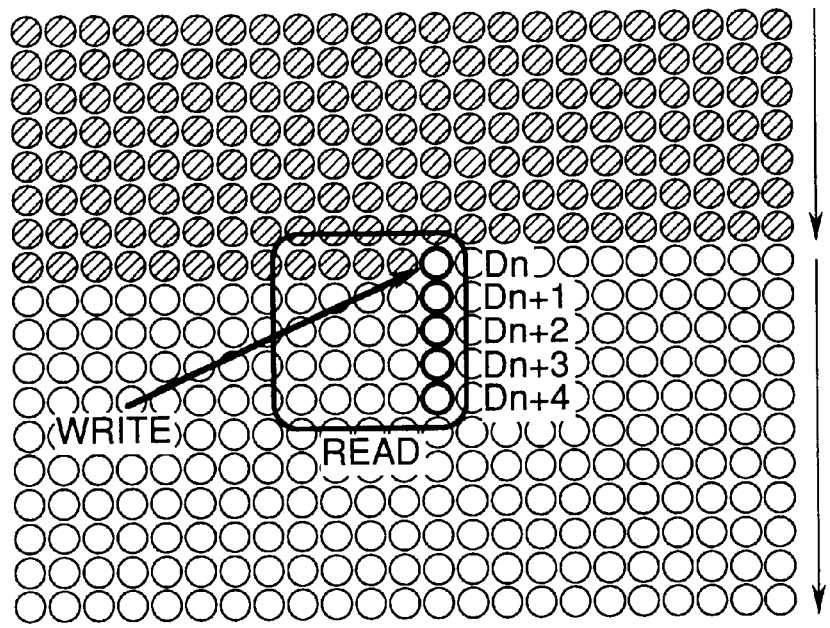
FIG. 5 illustrates a case of read and write access.
Figure 6:
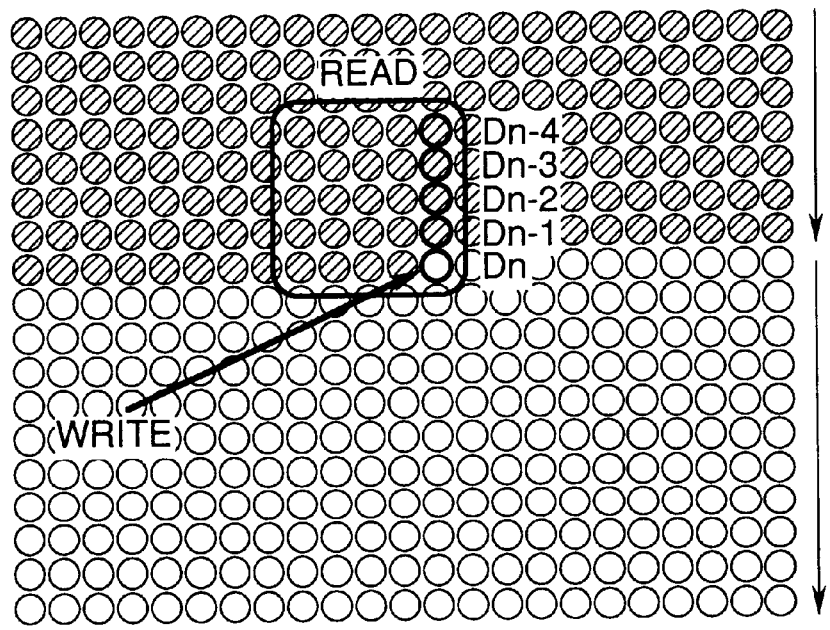
FIG. 6 illustrates another case of read and write access.

FIGS. 5 and 6 illustrate two ways in which block access can be synchronized with pixel input. Both drawings indicate pixels stored in one field memory. Hatched circles indicate new pixels, belonging to the field currently being received, while non-hatched circles indicating pixels belonging to the previous field. The lines marked 'read' indicate the locations of five-by-five blocks of pixels being used in filtering. The arrows marked 'write' indicate the location (Dn) of a pixel currently being received.

In FIG. 5, while a new pixel is being written at location Dn in the field memory, a five-by-five block of pixels in the previous field is being processed. The horizontal scanning line containing Dn is the oldest scanning line in this block. The pixel data are passed through cascaded D-type flip-flops as shown in FIG. 4, so it suffices to load the data from the five locations indicated by dark circles Dn to Dn+4 into the D-type flip-flops before writing the new pixel at location Dn. These data are all still held in the field memory.

FIG. 6 is similar, except that now the horizontal scanning line containing Dn is the newest scanning line in the block. Pixels Dn−1 to Dn−4 have already been overwritten, and Dn is about to be overwritten. Additional means must be provided for storing the overwritten pixels. If the filtering operation involves both the current field and the preceding field, pixel values must be output from locations Dn to Dn−4 in both fields.

Figure 7:
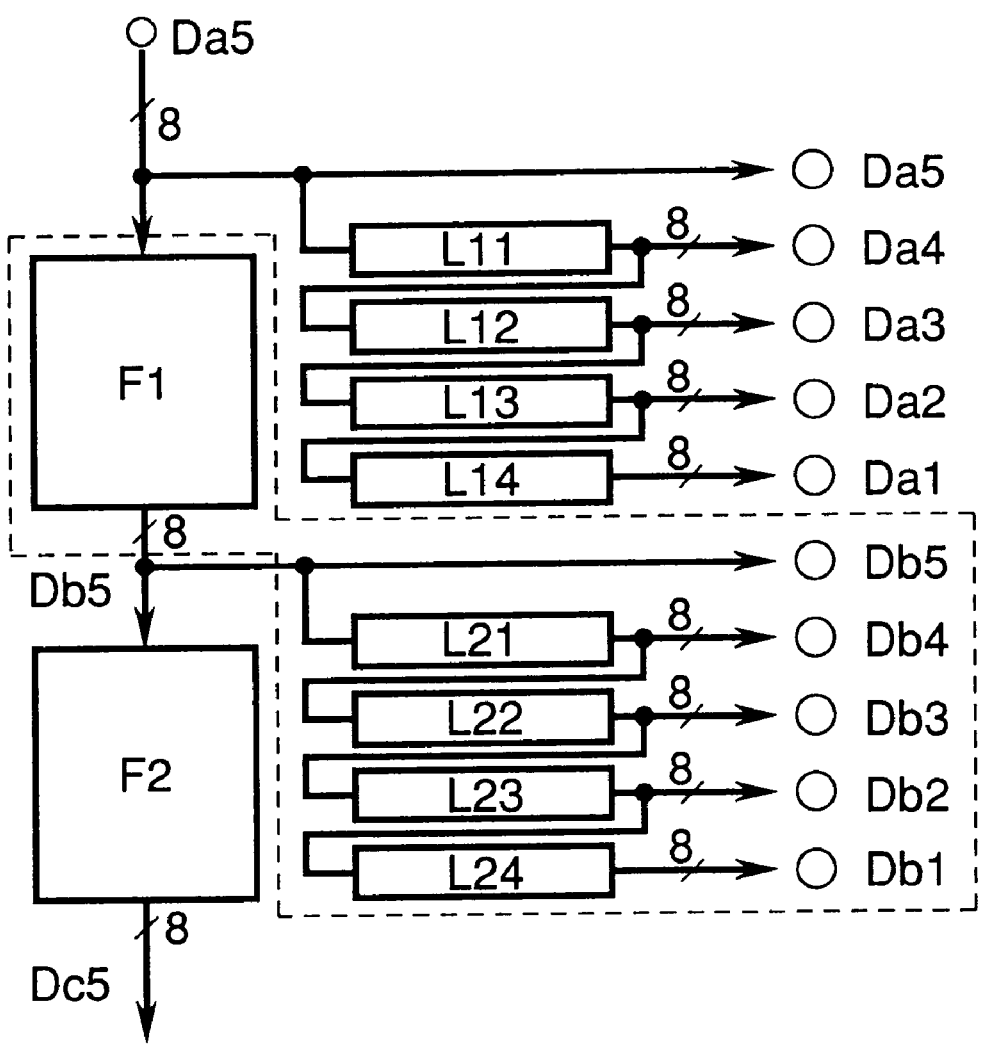
FIG. 7 indicates the part of FIG. 4 corresponding to the access operation in FIG. 5.
Figure 8:
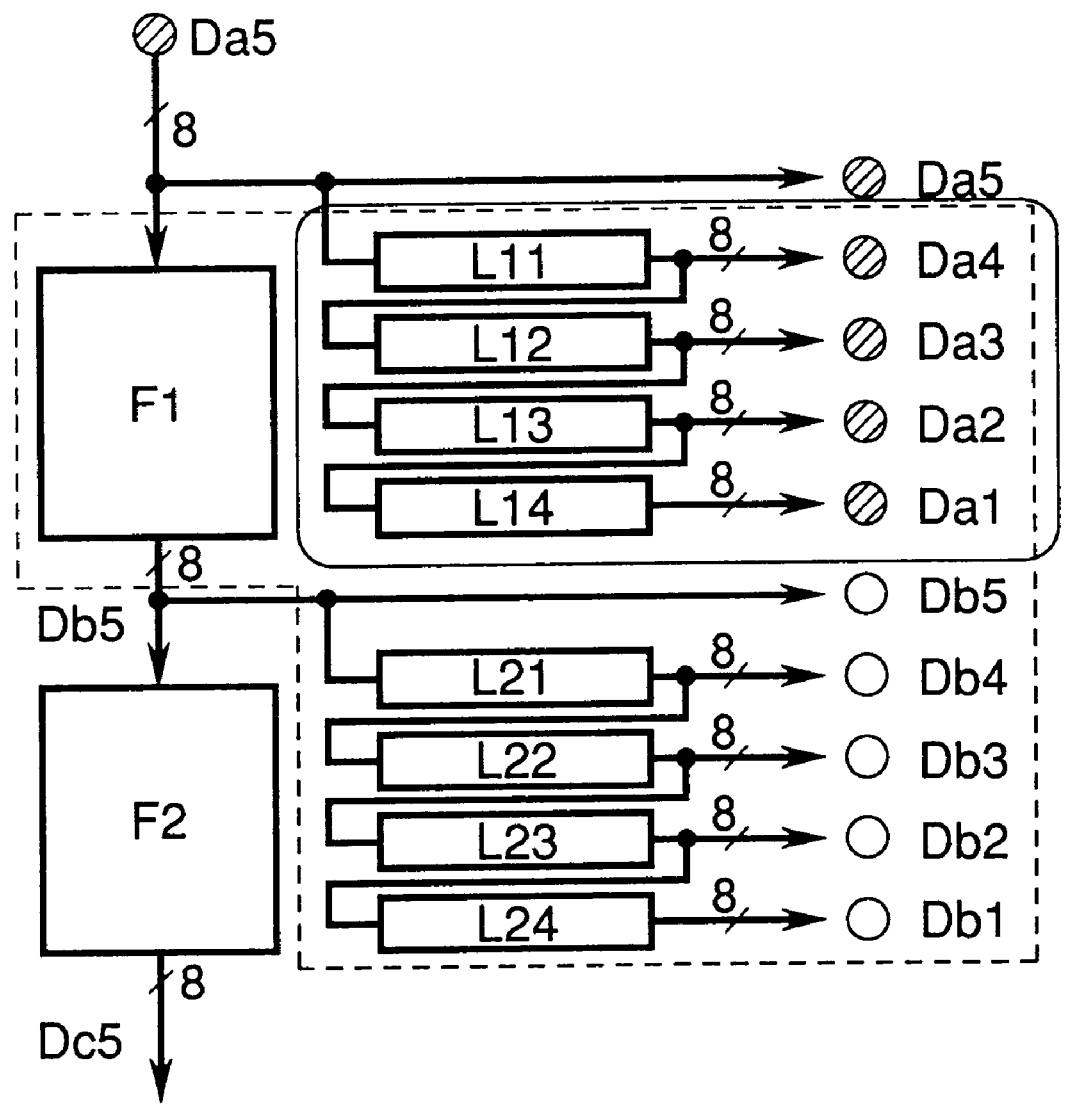
FIG. 8 indicates the part of FIG. 4 corresponding to the access operation in FIG. 6.

FIGS. 7 and 8 show enlarged views of part of FIG. 4. The dotted line in FIG. 7 indicates the field memory F1 and line memories L21 to L24 that provide read access to pixels Dn to Dn+4 in FIG. 5. The dotted line in FIG. 8 indicates the field memory F1 and line memories L11 to L24 that provide read access to pixels Dn to Dn−4 in FIG. 6, in both the current field and the preceding field, excepting pixel Da5.

The present invention provides a single memory device that can provide the functions of all of the parts enclosed in the dotted line in FIG. 7, or all of the parts enclosed in the dotted line in FIG. 8. The memory device is moreover well adapted for the type of field-memory cascading shown in FIGS. 4, 7, and 8.

First embodiment

Figure 9:
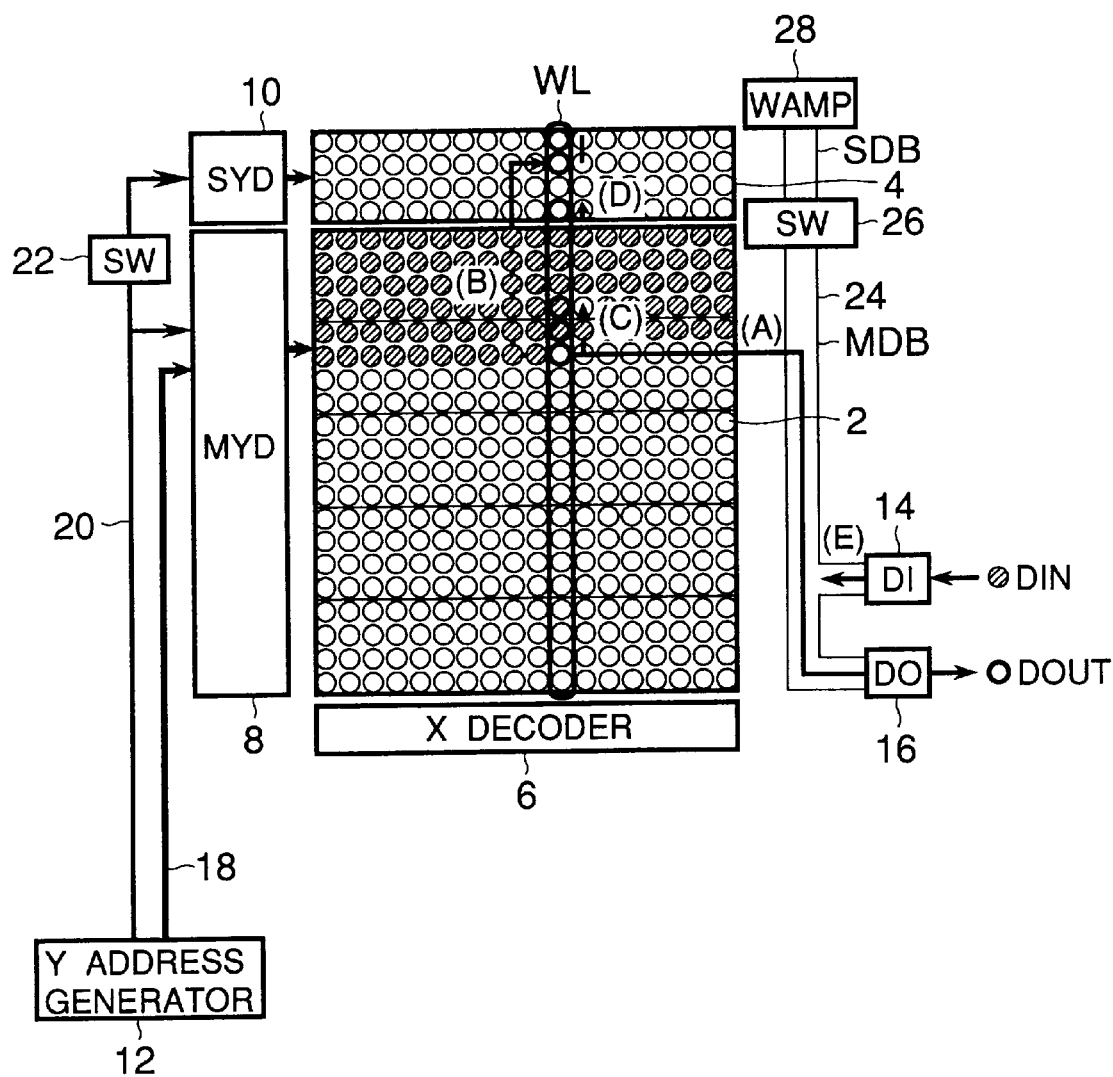
FIG. 9 is a block diagram illustrating a first embodiment of the invention.

The first embodiment is a memory device, shown in the block diagram in FIG. 9, that provides the functions of the part enclosed in the dotted line in FIG. 8. Exemplifying the first aspect of the invention, the memory device comprises a main memory array 2, a sub memory array 4, a row (X) decoder 6, a main column decoder (MYD) 8, a sub column decoder (SYD) 10, a column (Y) address generator 12, a data input unit (DI) 14, and a data output unit (DO) 16. The data input unit 14 has at least one data input terminal, denoted DIN. The data output unit 16 has at least one data output terminal, denoted DOUT.

The letters X and Y will be used to mean row and column, respectively, below.

The Y address generator 12 is coupled to the main Y decoder 8 by a high-order address bus 18, and to the main Y decoder 8 and sub Y decoder 10 by a low-order address bus 20, which is divided into two parts by an address bus switch 22. The first part of the low-order address bus 20 is coupled to the main Y decoder 8. The second part of the low-order address bus 20 is coupled to the sub Y decoder 10, and can be disconnected from the Y address generator 12 by the address bus switch 22.

The data input unit 14 and data output unit 16 are coupled to the main memory array 2 and sub memory array 4 by an internal data bus 24, which is similarly divided into two parts by a data bus switch 26 and terminates at a write amplifier (WAMP) 28. The two parts of the internal data bus 24 will be referred to as the main data bus (MDB) and sub data bus (SDB).

Each circle in the main memory array 2 and sub memory array 4 represents a group of memory cells having a common X-Y (row-column) address. In image-processing applications, each group of memory cells stores data for one pixel. In a moving picture scanned in successive horizontal scanning lines, pixels having the same column address (Y address) are disposed in the same scanning line. Columns accordingly run horizontally in the drawings, while rows run vertically. The memory cells in each row are coupled to a word line (WL), which is shared by both the main memory array 2 and the sub memory array 4.

Figure 10:
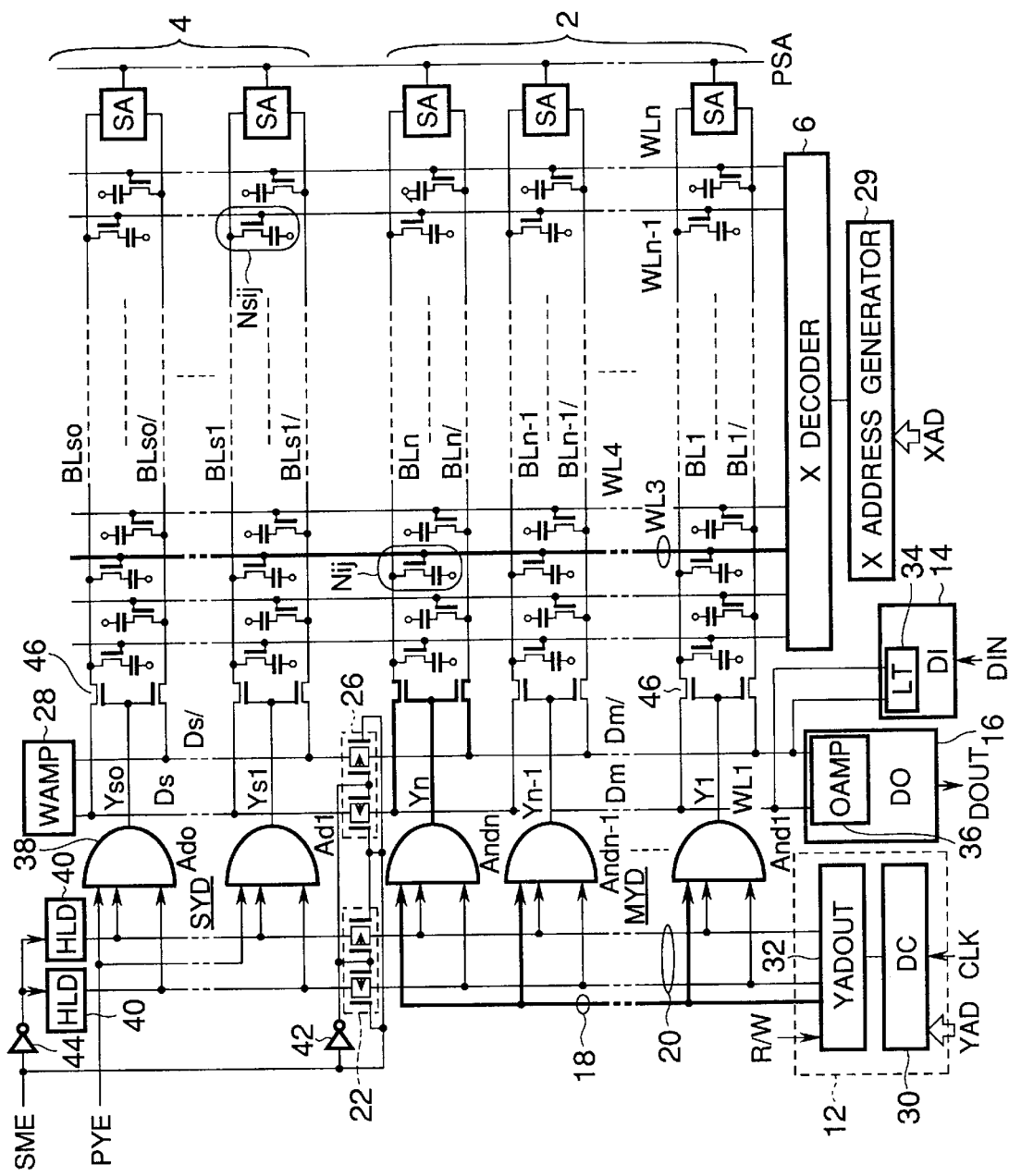
FIG. 10 is a circuit diagram illustrating the first embodiment in greater detail.

FIG. 10 shows the structure of the first embodiment in more detail. The X decoder 6 is coupled to an X address generator 29 which receives an externally input row address XAD. The Y address generator 12, which receives an externally input column address YAD, comprises a down-counter (DC) 30 and a Y-address output circuit (YADOUT) 32. The down-counter 30 operates as a column address counter, generating a decremental series of column addresses (Y addresses). The data input unit 14 has an internal latch (LT) 34 for holding input data. The data output unit 16 has an output amplifier (OAMP) 36 for amplifying output data. The main and sub Y decoders MYD and SYD comprise a plurality of AND gates 38 that are coupled to the high-order address bus 18 and low-order address bus 20. Address-holding latches (HLD) 40 are provided for each of the address signal lines in the low-order address bus 20.

The AND gates 38 in the main Y decoder are denoted And1 to Andn; the AND gates 38 in the sub Y decoder are denoted Ad1 to Ado. The letters 'n' and 'o' denote the numbers of columns in the main memory array 2 and sub memory array 4, respectively. The sub memory array 4 has fewer columns than the main memory array 2 (o<n). The AND gates 38 output column select signals that are denoted Y1 to Yn in the main Y decoder, and Ys1 to Yso in the sub Y decoder.

Each part of the data bus comprises a pair of complementary bus lines, denoted Dm and Dm/ in the main data bus and Ds and Ds/ in the sub data bus. Bus lines Dm and Ds are mutually coupled through a transmission gate, comprising a pair of transistors of opposite channel types, in the data bus switch 26. Bus lines Dm/ and Ds/ are similarly coupled through a transmission gate in the data bus switch 26, and the low-order address signal lines are switched by similar transmission gates in the address bus switch 22. These transmission gates are controlled by a sub memory enable (SME) signal, which is supplied directly to the negative-channel transistors in each transmission gate, and is inverted by an inverter 42 for supply to the positive-channel transistors in the transmission gates. The SME signal is also supplied through an inverter 44 to control the address-holding latches 40.

The main memory array 2 has pairs of complementary bit lines BL1 and BL1/ to BLn and BLn/ running in the column direction, at right angles to the word lines WL1, . . . , WLn. Dynamic memory cells Nij, each comprising a transistor and a capacitor, are coupled as shown to the word lines and bit lines. Sense amplifiers (SA) are coupled to each pair of complementary bit lines. Each pair of complementary bit lines in the main memory array 2 is coupled to the complementary data bus lines Dm and Dm/ by a pair of transfer transistors 46, which are driven by a column select signal from one of the AND gates 38 in the main Y decoder.

The sub memory array 4 has similar pairs of complementary bit lines BLs1 and BLs1/ to BLso and BLso/, memory cells Nsij, sense amplifiers SA, and transfer transistors 46. The sense amplifiers in both the main memory array 2 and sub memory array 4 are activated by a single sense amplifier control signal PSA.

For simplicity, FIG. 10 shows a single memory cell located at each X-Y address. In general, a group of memory cells is located at each X-Y address, as noted above. The data bus then has a plurality of complementary pairs of bus lines. In each column there are a like plurality of complementary pairs of bit lines and a like plurality of sense amplifiers, and the data input unit 14 and data output unit 16 have a like plurality of input and output terminals, respectively.

An element of the first embodiment that is omitted from FIGS. 9 and 10 is a memory control signal generator that generates the control signals shown in FIG. 10. In addition to the SME and PSA control signals already mentioned above, these control signals include a control signal PYE that is supplied to the AND gates Ad1 to Ado in the sub Y decoder, and a control signal R/W that is supplied to the Y address output circuit 32. The memory control signal generator will be shown in the drawings of later embodiments.

Next, the operation of the first embodiment will be described.

The memory control signal generator can be programmed for various modes of operation. The first mode described below is useful for providing access to pixel data in the manner of FIG. 6.

This mode will be described first with reference to FIG. 9. Following the convention of FIG. 6, the hatched circles in FIG. 9 represent groups of memory cells storing pixel data for the current field, while the non-hatched circles represent groups of memory cells storing data for the preceding field.

In this mode an X address is received and is decoded by the X decoder 6, which activates a corresponding word line WL. All memory cells coupled to this word line, in both the main memory array 2 and the sub memory array 4, are thereby coupled to their respective bit lines, and the data stored in these memory cells are amplified by the sense amplifiers.

Next a starting Y address is generated by the Y address generator 12 and decoded by the main Y decoder 8, which selects a corresponding column in the main memory array 2. The memory cells located at the intersection of this column with the row of word line WL are coupled to the data bus 24, and their data are transferred to the data output unit 16, as indicated by the dark line (A).

At the same time, these data are transferred from the main memory array 2 to the sub memory array 4, as indicated by the arrow (B). This transfer takes place over the internal data bus 24, the main data bus and sub data bus being coupled through the data bus switch 26. The data are amplified by the write amplifier 28. As soon as the write amplifier 28 has acquired the data, the data bus switch 26 is opened, disconnecting the main data bus from the sub data bus. At approximately the same time, the sub Y decoder 10 decodes the low-order address bits of the Y address and selects a corresponding column in the sub memory array 4. The data amplified by the write amplifier 28 are written into the memory cells located at the intersection of this column in the sub memory array 4 with word line WL.

Next, the down-counter 30 in the Y address generator 12 generates successively decreasing Y addresses, causing the main Y decoder 8 to select successive columns in the main memory array 2, as indicated by the arrow (C). The data in the memory cells on word line WL in these columns are successively transferred to the data output unit 16. The data output unit 16 outputs the transferred data from its data output terminals (DOUT) with a certain latency.

During the transfer of these data (C), the data bus switch 26 remains open, so the transfers do not affect the sub memory array 4. The address bus switch 22 is also opened, so that the sub Y decoder 10 does not receive the successive Y addresses, but continues to receive the first Y address from the address-holding latches 40. The operation of writing data (B) into the selected memory cells in the sub memory array 4 can thus continue during the transfer of successive data (C) from the main memory array 2 to the data output unit 16.

In the operation illustrated in FIG. 9, the transfer of data from the main memory array 2 to the data output unit 16 ends when three columns have been accessed. By this time, the operation of writing the first data transferred into the sub memory array 4 has also been completed.

Next, the address bus switch 22 and data bus switch 26 are closed, and the Y address generator 12 generates the same series of three Y addresses again. The data stored in the corresponding memory cells (D) on word line WL in the sub memory array 4 are transferred over the data bus 24 to the data output unit 16 and output with the above-mentioned latency. Data from the main memory array 2 and sub memory array 4 are thus output in a single continuous serial burst.

In the meantime, new input data have been received at the data input terminals (DIN) and are held in the latch 34 in the data input unit 14. After the transfer of data (D) from the sub memory array 4 to the data output unit 16 has been completed, the Y address generator 12 generates the starting Y address once again, and the new input data are transferred (E) from the data input unit 14 to the main memory array 2 and written into the same memory cells that were read at the beginning of the burst.

One reason for writing the new data at the end of the burst is that this enables read access to continue without interruption. If the new data were to be written at an intermediate point in the burst, extra control would be needed to carry out a read-write-read switchover; faster operation is possible if only a single read-write switchover has to be made.

Another reason for writing the new data at the end of the burst is the latency of the data output unit 16, which enables the new data to be transferred over the data bus 24 in the background while the data output unit 16 is still outputting data read from the sub memory array 4.

The operation described above will now be interpreted with reference to FIG. 8. Operation (A) in FIG. 9 corresponds to the output of Db5 from field memory F1 to field memory F2 in FIG. 8. Operation (C) in FIG. 9 corresponds to the output of data Da4 to Da1 from line memories L11 to L14 in FIG. 8. Operation (D) in FIG. 9 corresponds to the output of data Db5 to Db1 from field memory F1 and line memories L21 to L24 in FIG. 8. Operation (E) in FIG. 9 corresponds to the input of new data Da5 to field memory F1. The first embodiment thus provides the functions of field memory F1 and line memories L11 to L24 in FIG. 8.

When the memory device of the first embodiment is employed for digital processing of moving pictures, in the ASIC that controls the memory device, the eight line memories L11 to L24, which required thousands of SRAM memory cells, can be replaced by a short (e.g. nine-stage) shift register for storing the burst of data read from the memory device. An example of this type of shift register will be shown later, in FIG. 75. The size, cost, and current consumption of the ASIC can be significantly reduced in this way.

Incidentally, output of data Db5 occurs twice in the above operation, once from the main memory array 2 at the beginning of the burst, and once again from the sub memory array 4 in the middle of the burst. This double output can be used to advantage when memory devices are cascaded, as described later.

Certain aspects of the above mode of operation of the first embodiment will now be described in more detail.

The operation of the first embodiment is synchronized with the clock signal (CLK) indicated in FIG. 10. In addition, the first embodiment receives the following external control signals: chip select (CS/), row address strobe (RAS/), column address strobe (CAS/), and write enable (WE/). The slash in the signal names indicates that the signals are active low. The first embodiment also has an external address bus (ADD). The address inputs and all other input and output signals are synchronized with the rising edge of the clock signal (CLK).

Figure 11:
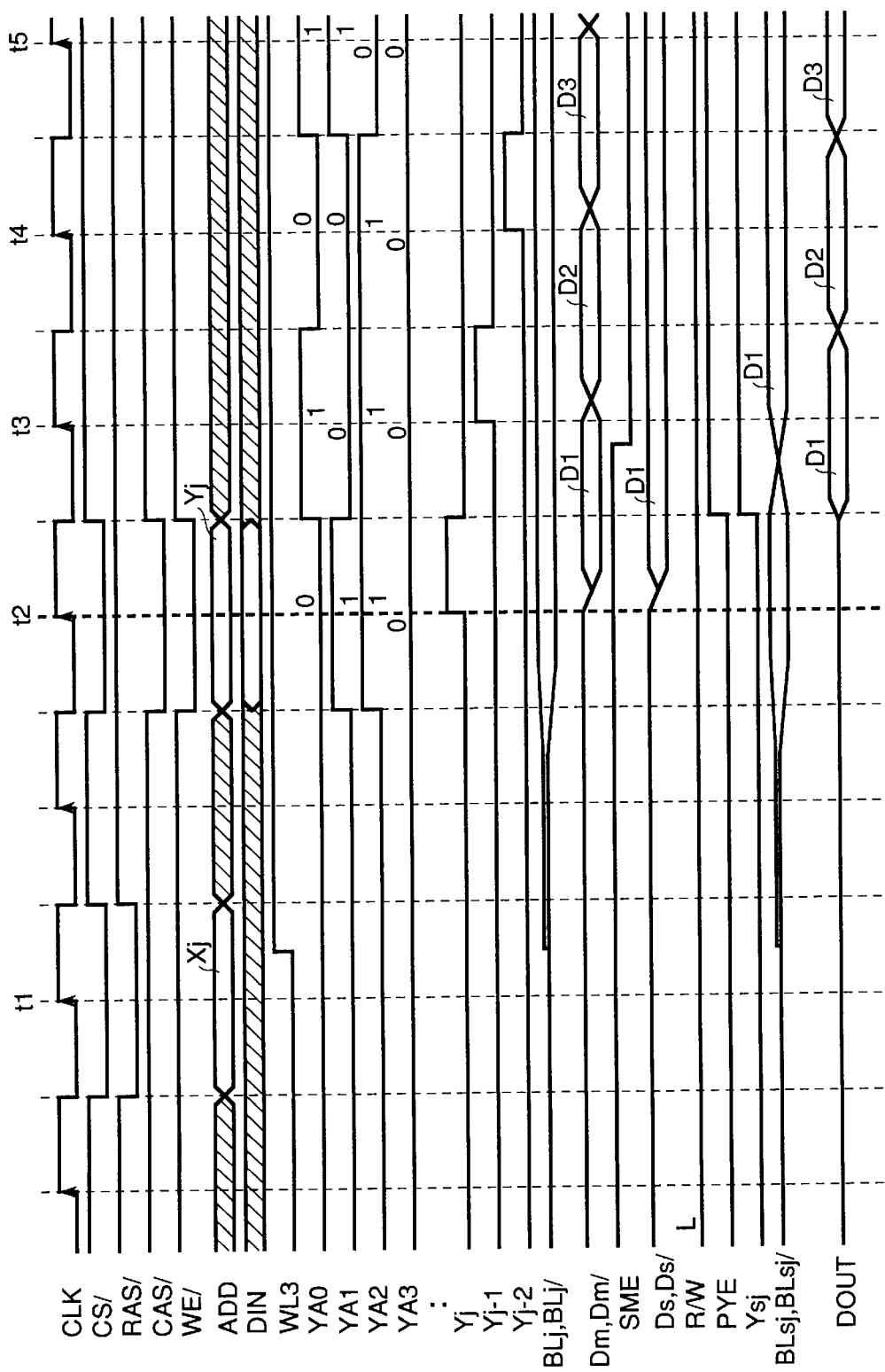
FIG. 11 is a timing diagram illustrating read access to the main memory array in the first embodiment.

FIG. 11 illustrates waveforms of the external control signals and various internal control signals during the operations of reading data from the main memory array 2 and transferring data from the main memory array 2 to the sub memory array 4 (operations A, B, and C in FIG. 9). The internal control signals are generated from the external control signals by the control signal generator mentioned earlier, according to operating mode information programmed into the control signal generator.

At time t1, CS/ and RAS/ are low, while CAS/ and WE/ are high. This combination of control signals indicates that the address on the address bus (ADD) is a row address (Xi), which the X address generator 29 feeds to the X decoder 6. The X decoder 6 activates the corresponding word line WLi (WL3 in FIG. 11), connecting the capacitors in the memory cells on this word line to the bit lines BLj and BLj/ in the main memory array 2 (j=1 to n) and bit lines BLsj and BLsj/ in the sub memory array 4 (j=1 to o). The data stored in these capacitors appear as small potential differences between the bit lines in each complementary pair. Next, the sense amplifier control signal PSA (not visible) activates the sense amplifiers, which amplify the potential differences on the bit lines in both memory arrays to the full supply voltage swing, as shown.

At time t2, CS/, CAS/, and WE/ are low, while RAS/ is high. This combination of control signals indicates that the address on the address bus (ADD) is a column address (Yj), which is loaded into the down-counter 30 in the Y address generator 12. This combination of signals also indicates the presence of input data at the input data terminals (DIN). The input data are latched in the latch 34 in the data input unit 14, but are not written immediately in the main memory array 2.

It will be assumed that the four low-order bits of the Y address Yj, and hence the four low-order bits YA3, YA2, YA1, and YA0 of the starting address output by the down-counter 30, have the value '0110' as shown. The AND gates 38 in the main Y decoder 8 decode the starting address. The column select signal (also denoted Yj) output by just one of these AND gates 38 goes high for one-half clock cycle starting at time t2, connecting bit lines BLj and BLj/ to the main data bus lines Dm and Dm/ for that half clock cycle. The potentials on bit lines BLj and BLj/ are thereby transferred as data D1 through the transfer transistors 46 to the data bus lines Dm and Dm/, as indicated.

Enable signal SME is high at this time, so the main data bus lines Dm and Dm/ are coupled through the data bus switch 26 to the sub data bus lines Ds and Ds/. Data D1 are accordingly also transferred to the sub data bus lines Ds and Ds/.

The R/W control signal is low during read operations, as indicated by the letter L.

The PYE enable signal is low during the half clock cycle starting at time t2, disabling the sub Y decoder 10 during this interval. The column select signals output by all AND gates 38 in the sub Y decoder 10 remain low during this interval. This gives the write amplifier 28 time to latch and internally amplify the potentials (D1) on the sub data bus lines Ds and Ds/.

The write amplifier 28 has an enable signal, which has been omitted from the drawings for the sake of simplicity. Also omitted is a main Y decoder enable signal, which in the operations shown in FIG. 11 is high, enabling the main Y decoder 8. This main Y decoder enable signal can be supplied to the AND gates 38 in the main Y decoder 8 in the same way that PYE is supplied to the AND gates 38 in the sub Y decoder 10; alternatively, the main Y decoder enable signal can be supplied to the Y address output circuit 32, then supplied by the Y address output circuit 32 to the AND gates 38 as an extra address bit.

One half clock cycle after time t2, PYE goes high. The sub Y decoder 10 now decodes the low-order address bits, and the column select signal Ysj output by the corresponding AND gate 38 in the sub Y decoder 10 goes high, as indicated, connecting a complementary pair of bit lines BLsj and BLsj/ to the sub data bus lines Ds and Ds/, which are held at the potentials of data D1 by the write amplifier 28. Regardless of the previous potentials of bit lines BLsj and BLsj/, the write amplifier 28 drives these bit lines to the potentials of data D1.

One-half clock cycle after time t2, the down-counter 30 decrements and the low-order address bits change from '0110' to '0101' (as read in order from YA3 to YA0), but the output of the Y address output circuit 32 remains '0110' until just before time t3. The output amplifier 36 in the data output unit 16 also begins output of data D1 from the output terminals (DOUT) at this time.

Shortly before time t3, enable signal SME goes low, disconnecting the sub data bus lines Ds and Ds/ from the main data bus lines Dm and Dm/, and blocking further input of low-order address bits to the sub Y decoder 10. The address-holding latches 40 continue to hold the low-order bit values of the starting address ('0110'), signal Ysj remains high, and the data D1 on complementary bit lines BLsj and BLsj/ are written into the corresponding memory cells in the sub memory array 4. The writing of data D1 can continue for an arbitrary period while other data are being read from the main memory array 2, giving the write amplifier 28 ample time to charge or discharge the capacitors in the memory cells being written to.

At time t3, the Y address output circuit 32 outputs a decremented Y address (ending in '0101'), which the main Y decoder 8 decodes, and the column select signal Yj−1 output by the AND gate 38 in the preceding column goes high. Data D2 are read from the bit lines in this column onto the main data bus lines Dm and Dm/. The data D1 read earlier are available at the output terminals DOUT to be read by an external device at time t3. The read latency, from input of the column address signal to output of the first data in the burst, is one clock cycle.

The burst operation continues in this way. At time t4, the Y address output circuit 32 outputs another decremented Y address (ending in '0100'), and transfer of data D3 from the main memory array 2 to the main data bus lines Dm and Dm/ begins, while data D2 are available at the output terminals DOUT. Further description of this part of the burst will be omitted.

When the reading of data from the main memory array 2 is completed, data are read from the sub memory array 4 in substantially the same way, with enable signals SME and PYE both in the high state and the main Y decoder enable signal (not shown) in the low state. The down-counter 30 starts over from Y address Yj (ending in '0110').

The read latency of these operations is not limited to one clock cycle. The memory device may have a longer read latency, or the read latency may be programmable.

A detailed description of the writing of new data into the main memory array 2 will be omitted here. Descriptions will be given in later embodiments.

Next, a second mode of operation of the first embodiment will be described. In this mode, the reading of data from the main memory array 2 is not automatically followed by the reading of data from the sub memory array 4. Instead, the reading of data from the sub memory array 4 is initiated by an external command. This mode is useful when an external device needs to obtain data from the main memory array 2 and sub memory array 4 at different times, or needs to obtain data from one row in the main memory array 2 and from another row in the sub memory array 4.

The operations of reading data from the main memory array 2 and transferring data from the main memory array 2 to the sub memory array 4 are carried out as shown in FIG. 11 and described above.

Figure 12:
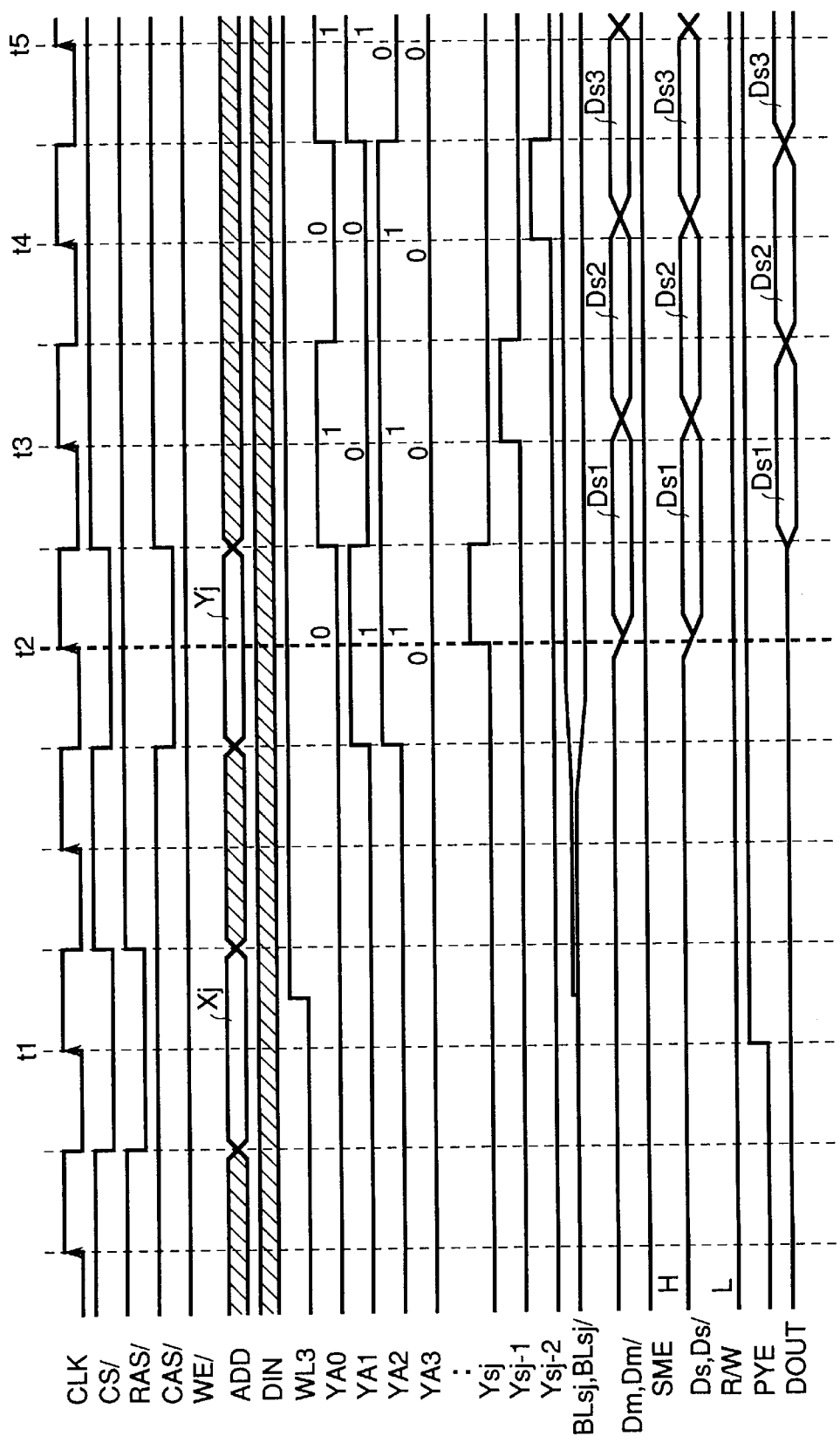
FIG. 12 is a timing diagram illustrating read access to the sub memory array in the first embodiment.

FIG. 12 illustrates the reading of data from the sub memory array 4. Throughout this operation the SME signal remains high and the R/W signal remains low, as indicated by the letters H and L.

Before this operation, the control signal generator is programmed by an external command (not shown) that designates access to the sub memory array 4. Accordingly, when the X address (Xi) is input at time tl, enable signal PYE goes high.

At time t2, CS/ and CAS/ are low, while RAS/ and WE/ are high. Accordingly, a Y address (Yj) is received, but no new input data are latched. This Y address (ending in '0110') is immediately output by the down-counter 30 and Y address output circuit 32. Since SME is high, the low-order bits of the Y address are passed through the address bus switch 22 to the sub Y decoder 10. Since PYE is high, the sub Y decoder 10 is enabled and decodes these low-order bits. The column select signal Ysj output by the corresponding AND gate 38 in the sub Y decoder 10 goes high (for one-half clock cycle), and the data Ds1 stored in the memory cells on word line WLi (WL3) in the corresponding column of the sub memory array 4 are transferred to the sub data bus lines Ds and Ds/. Since SME is high, these data Ds1 are transferred through the data bus switch 26 to the main data bus lines Dm and Dm/, as shown, and thus to the data output unit 16.

At time t3, data Ds1, amplified by the output amplifier 36, are output from the output data terminals DOUT. In the meantime, the down-counter 30 has decremented to the next lower address (ending in '0101'), so the sub Y decoder 10 activates column select signal Ysj−1, and data Ds2 are transferred from the memory cells selected by this signal Ysj−1 to the data bus lines.

The read operation continues in this way at times t4 and t5. Further description will be omitted.

As a variation, the first embodiment can be designed always to operate in the second mode, requiring separate address input for every burst access to the sub memory array 4. Separate address input can also be used for write access to the main memory array 2. Various other modes of operation are possible. The essential feature of the first embodiment is the existence of a sub memory array 4 that shares the same word lines and low-order Y address bits with the main memory array 2, and to which data are automatically transferred from the main memory array 2 when the main memory array 2 is accessed.

As another variation, the input of the new data Da5 can be timed to coincide with the first output of the old data Db5. Referring again to FIG. 11, in this case CS/ and CAS/ should be low at time t2, and CS/ and WE/ should be low at time t3, with the new data being sent to the input terminals DIN at time t3 instead of time t2. Alternatively, the memory device can be programmed to operate in a mode in which the data input unit 14 latches the new data automatically at the time of output of the first data in each burst, without requiring separate input of the WE/ signal. This variation is convenient when the first embodiment (F1) is cascaded with another memory device (F2), as shown in FIG. 8, as both memory devices F1 and F2 can receive input data simultaneously.

Second Embodiment

Figure 13:
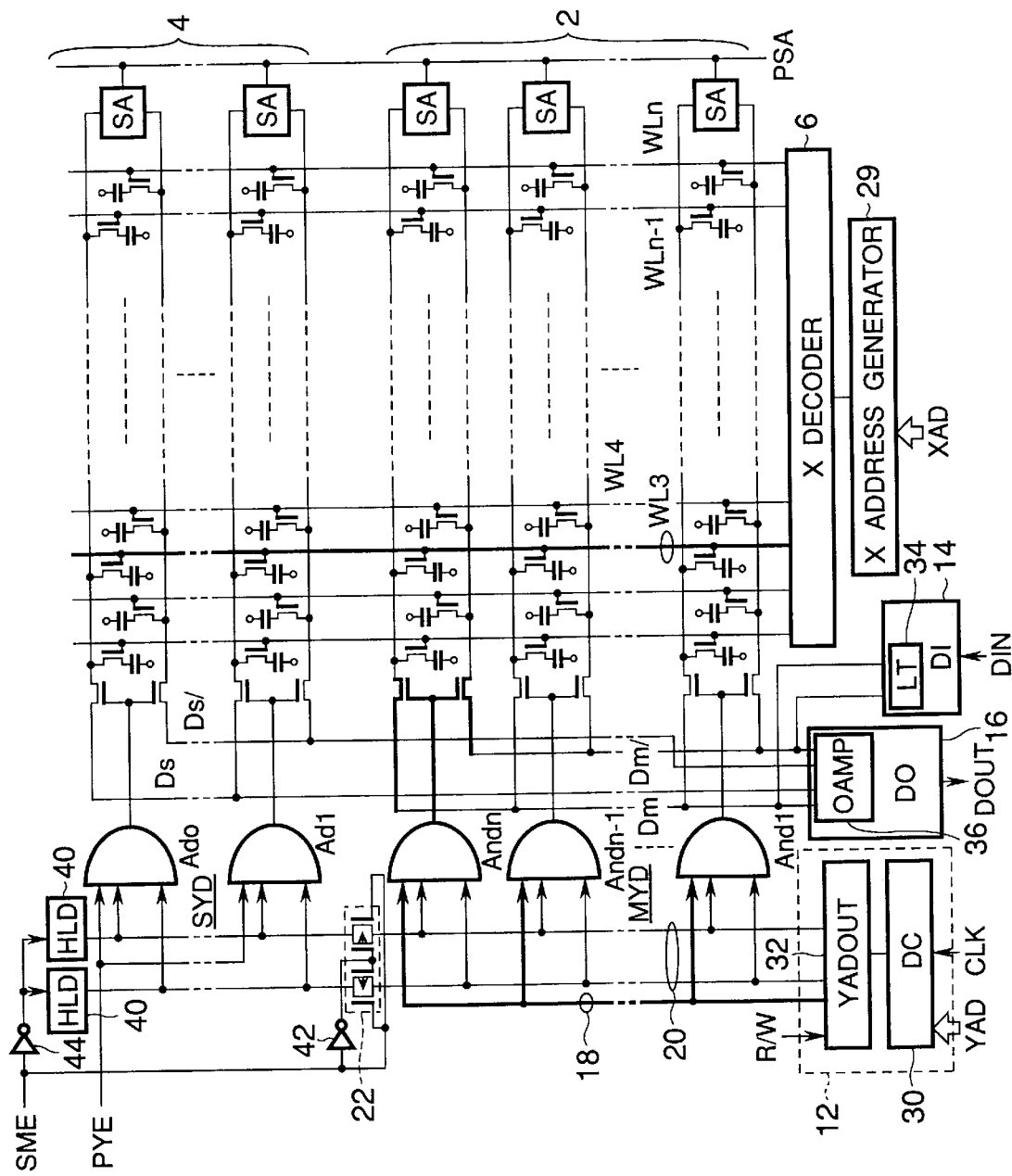
FIG. 13 is a circuit diagram illustrating a second embodiment of the invention.

Referring to FIG. 13, the second embodiment is similar to the first embodiment, except for the data bus configuration. All elements of the second embodiment also appeared in the first embodiment, and are shown with the same reference numerals. The following description will be confined to the differences from the first embodiment.

In the first embodiment, the main and sub data buses were interconnected by a data bus switch 26, but in the second embodiment they are not interconnected. Instead, both the main data bus lines Dm and Dm/ and sub data bus lines Ds and Ds/ are connected independently to the output amplifier 36 in the data output unit 16. The output amplifier 36 assumes the function of the data bus switch 26 by transferring data from the main data bus to the sub data bus. The output amplifier 36 also assumes the function of the write amplifier 28 in the first embodiment, by amplifying the data written into the sub memory array 4. This enables both the data bus switch 26 and write amplifier 28 to be omitted from the second embodiment.

The main data bus lines Dm and Dm/ are connected to the latch 34 in the data input unit 14. The sub data bus lines Ds and Ds/ are not connected to the data input unit 14.

The second embodiment operates in the same way as the first embodiment, but elimination of the data bus switch 26 also eliminates the electrical resistance of the transistors in the data bus switch 26, permitting higher-speed access to the sub memory array 4. In addition, the electrical capacitance of each complementary pair of data bus lines can be reduced, also permitting higher-speed access. The second embodiment can thus operate at a higher clock rate than the first embodiment.

Elimination of the data bus switch 26 and write amplifier 28 also simplifies the circuit configuration of the second embodiment, which is a further advantage.

Third embodiment

Figure 14:
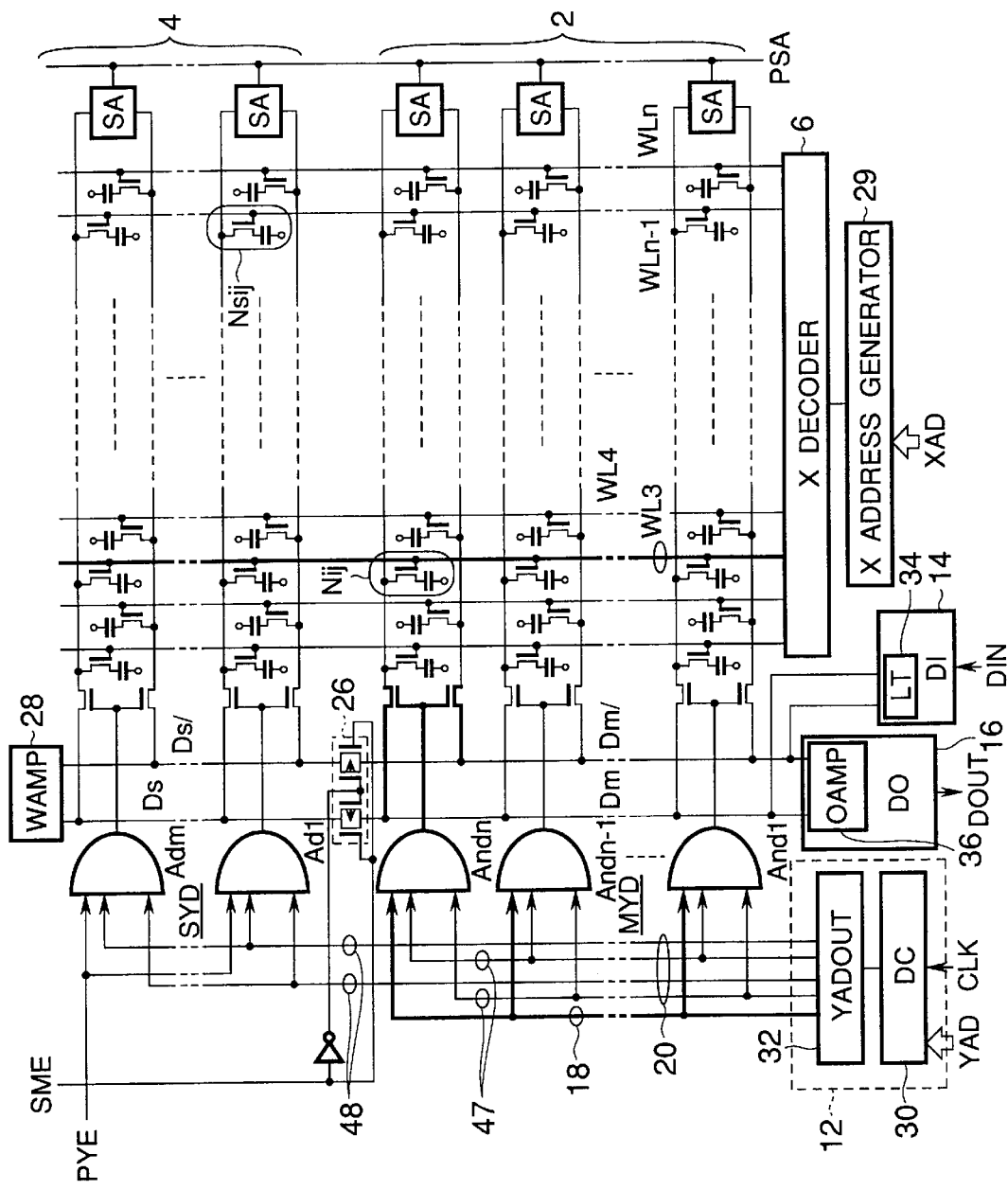
FIG. 14 is a circuit diagram illustrating a third embodiment of the invention.

Referring to FIG. 14, the third embodiment is similar to the first embodiment, except for the column (Y) address bus configuration. Elements of the third embodiment that appeared in the first embodiment are shown with the same reference numerals. The following description will be confined to the differences from the first embodiment.

In the first embodiment, the low-order address bus 20 was coupled directly to the main Y decoder 8, and was coupled through an address bus switch 22 to the sub Y decoder 10. In the third embodiment, the low-order address bus 20 is duplicated, with one set of low-order address lines 47 coupled to the main Y decoder 8, and a duplicate set of low order address lines 48 coupled to the sub Y decoder 10. The address bus switch 22 and the address holding latches 40 of the first embodiment are eliminated.

The high-order address bus 18 and low-order address lines 47 combine to form a main address bus, carrying both the high-order and low-order parts of the Y address from the Y address generator 12 to the main Y decoder 8. Low-order address lines 48 form a sub address bus, carrying the low-order part of the Y address from the Y address generator 12 to the sub Y decoder 10.

The third embodiment operates in the same way as the first embodiment, but elimination of the address bus switch 22 also eliminates the electrical resistance of the transistors in the address bus switch 22, permitting higher-speed access to the sub memory array 4. In addition, the electrical capacitance of the low-order address bus lines can be reduced, also permitting higher-speed access. The third embodiment can thus operate at a higher clock rate than the first embodiment.

Elimination of the address bus switch 22 and address-holding latches 40 also simplifies the circuit configuration of the third embodiment, which is a further advantage.

Fourth embodiment

Figure 15:
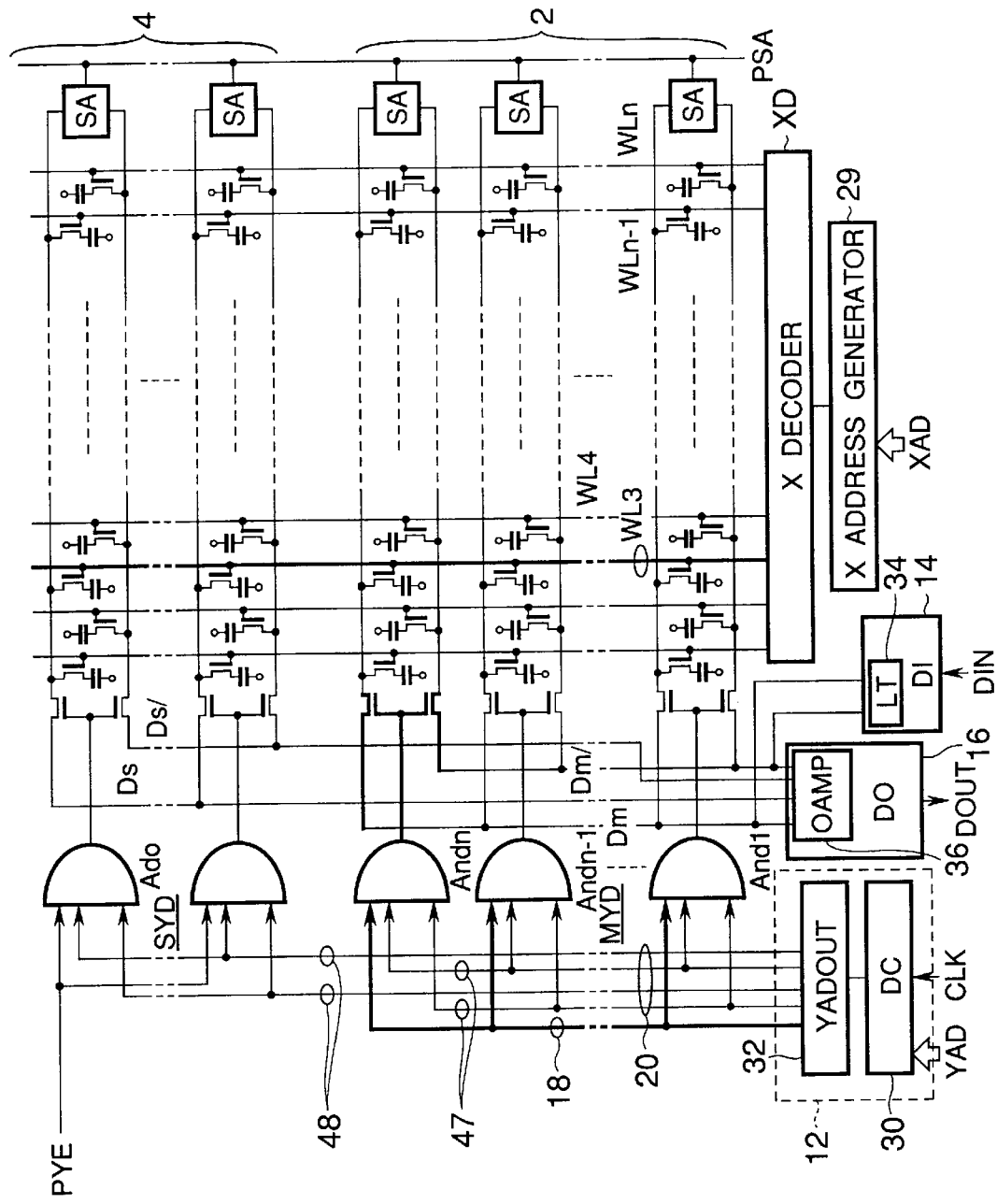
FIG. 15 is a circuit diagram illustrating a fourth embodiment of the invention.

Referring to FIG. 15, the fourth embodiment combines the features of the second and third embodiments. The main data bus lines Dm and Dm/ and sub data bus lines Ds and Ds/ are connected separately to the output amplifier 36 in the data output unit 16, and separate low-order address bus lines 47 and 48 are provided for the main Y decoder 8 and sub Y decoder 10. The address bus switch 22, data bus switch 26, write amplifier 28, and address-holding latches 40 of the first embodiment are all eliminated.

The fourth embodiment provides the combined benefits of the second and third embodiments in terms of simplified circuit configuration and higher-speed operation.

The operation of the first four embodiments is summarized in FIG. 16, again using Da1 to Da5 to represent pixel data in the current field and Db1 to Db5 to represent pixel data in the preceding field. When data Da5 for a new pixel are received, the data Db5 for the same pixel in the preceding field are transferred from the main memory array 2 to the sub memory array 4, the data Db5, Da4 to Da1, and Db5 to Db1 are output in burst fashion from the main memory array 2 and sub memory array 4, and the new data Da5 are written into the main memory array 2. All of these data have the same row address (X address) in the memory device.

Figure 16:
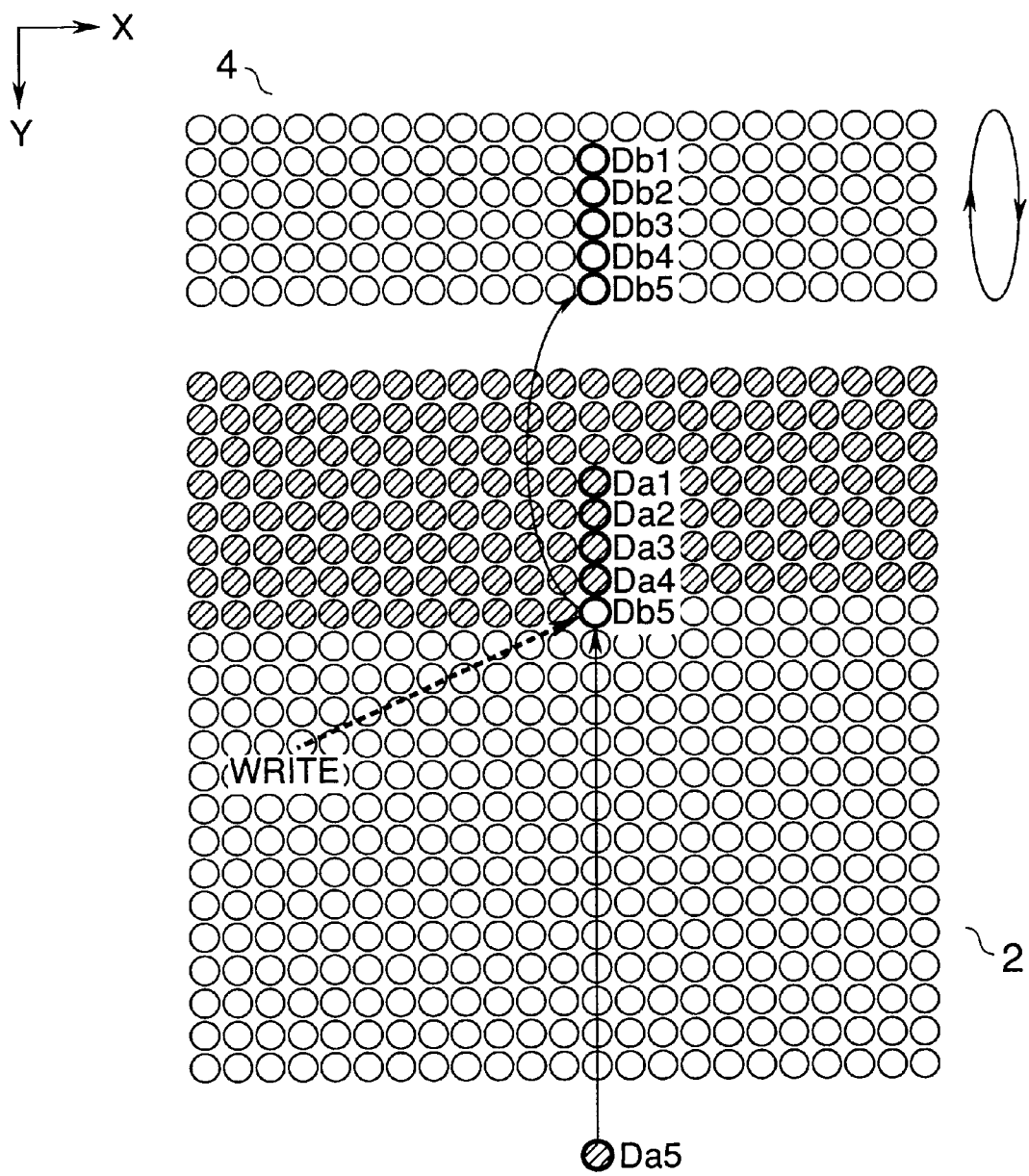
FIG. 16 illustrates the usage of the main and sub memory arrays in the first four embodiments.

As indicated by the elliptical arrows, the sub memory array 4 is used cyclically. In the third and fourth embodiments, in which the main Y decoder 8 and sub Y decoder 10 have separate address bus lines, it is not strictly necessary for the address supplied to the sub Y decoder 10 to be identical to the low-order bits of the address supplied to the main Y decoder 8, as long as the cyclical usage of the sub memory array 4 is adhered to. The number of columns in the sub memory array 4 can then be a number which is not a power of two, such as the number six, as illustrated in FIG. 16.

In the descriptions so far, the data Db5 have been output twice in the same burst, but this not always necessary. The memory device can be configured, for example, to transfer the new data Da5 from the data input unit 14 to the data output unit 16 and have Da5 output instead of Db5 at the beginning of the burst. The old data Db5 are still transferred from the main memory array 2 to the sub memory array 4. Examples will be shown in the following embodiments.

Omitted from the descriptions so far has been an account of the means by which the burst length is controlled, and the means by which the same Y address is loaded repeatedly into the down-counter 30. Examples of these means will be shown in the following embodiments, but the first four embodiments are not limited to the means shown in the succeeding embodiments. The first four embodiments can be designed to operate by repeated external input of the same address, for example, as pointed out earlier. Burst length can also be under external control.

Fifth embodiment

Figure 17:
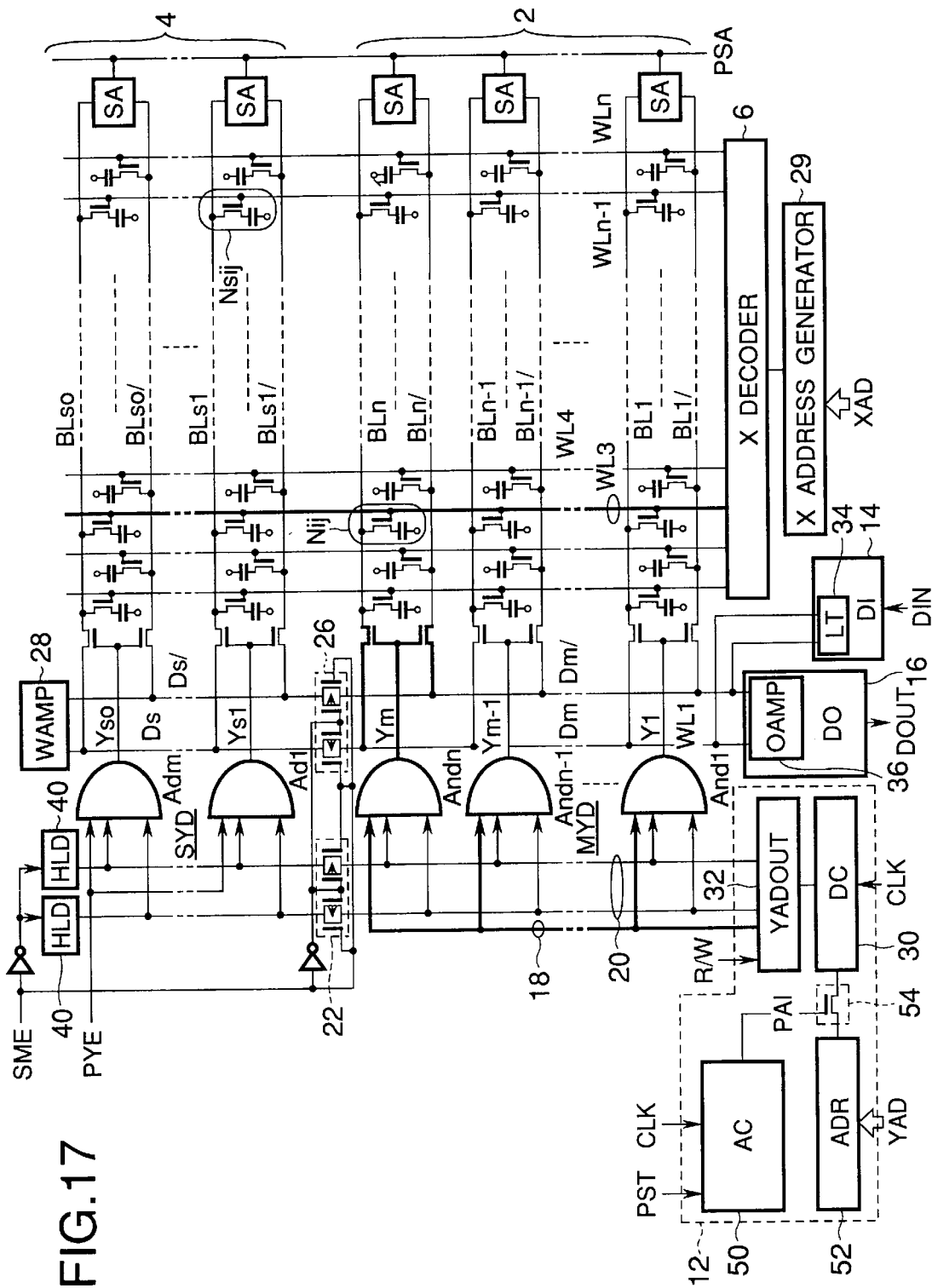
FIG. 17 is a circuit diagram illustrating a fifth embodiment of the invention.

Referring to FIG. 17, the fifth embodiment has the same elements as the first embodiment, indicated with the same reference numerals, and three additional elements disposed in the Y address generator 12. The three additional elements are an access counter (AC) 50, an address register (ADR) 52, and an address register output switch 54. The access counter 50 receives the clock signal CLK and a stopping control signal PST, and outputs an address input control signal PAI to the address register output switch 54. The address register 52 receives and stores the externally input Y address YAD. The address register output switch 54 couples the address register 52 to the down-counter 30.

Control signal PST initializes the access counter 50 to a value that controls the burst length. This value may be a constant value preset in the access counter 50, or a programmable value stored in the memory control signal generator (not visible) and conveyed to the access counter 50 by control signal PST itself. The access counter 50 only needs to output control signal PAI, so the access counter 50 can be configured as a ring counter or shift register.

Although not explicitly indicated in the drawing, the fifth embodiment also has control signals that transfer the input data held in the latch 34 in the data input unit 14 to the output amplifier 36 in the data output unit 16, via the main data bus lines Dm and Dm/, for example, or by a direct interconnection bypassing the data bus lines. This transfer enables the input data to be output from the data output unit 16 without first being stored in the main memory array 2.

Figure 18:
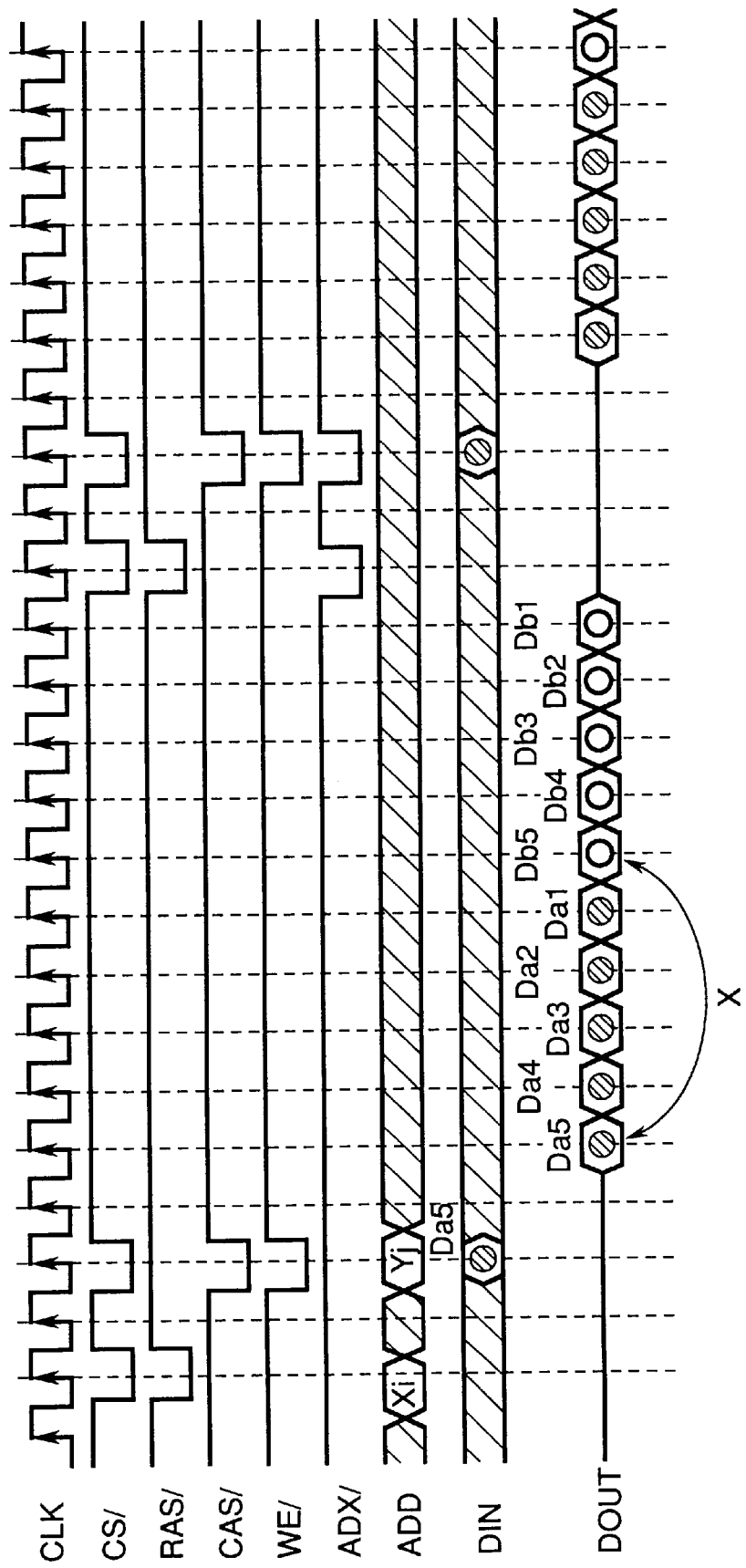
FIG. 18 is a timing diagram illustrating a burst access operation performed in the fifth embodiment.

Referring to FIG. 18, the fifth embodiment receives the same CS/, RAS/, CAS/, and WE/ control signals as the preceding embodiments, and an additional address transfer control signal ADX/. The memory device uses this control signal ADX/ to generate an X or Y address signal internally, without input on the address bus ADD. When RAS/ and ADX/ are both low, the X address generator 29 generates a new X address by incrementing the previous X address. When CAS/ and ADX/ are both low, the Y address held in the address register 52 is transferred through the address register output switch 54 into the down-counter 30.

In the operation illustrated in FIG. 18, the read latency is two clock cycles, instead of the one clock cycle illustrated earlier. Following input of a new X address Xi and Y address Yj, together with new data Da5, the input data Da5 are transferred from the data input unit 14 to the data output unit 16 as described above. The input data Da5 are also retained in the data input unit 14. The old data Db5, which reside in the memory cells to which the new data Da5 will be written later, are transferred from the main memory array 2 to the sub memory array 4, without being latched in the data output unit 16 at this time. Then data Da4 to Da1 are read from the main memory array 2, and data Db5 to Db1 are read from the sub memory array 4, as in the preceding embodiments.

The sequence of data output from the data output terminals (DOUT) is accordingly first Da5, then Da4 to Da1, then Db5 to Db1. The fifth embodiment thus provides data for five pixels from the current field and the corresponding five pixels from the preceding field.

The arrow marked X in FIG. 18 indicates the reloading of address Yj from the address register 52 to the down-counter 30. This operation is controlled by the access counter 50 as follows. In the clock cycle in which the column address strobe signal CAS/ goes low, the internal control signal PST initializes the access counter 50 to, for example, the value five. While the down-counter 30 is counting off five consecutive Y addresses (Yj to Yj−4), the access counter 50 counts down from five to zero. When the count in the access counter 50 reaches zero, the access counter 50 activates the PAI control signal, and the address Yj held in the address register 52 is loaded once more into the down-counter 30. On the next clock cycle, accordingly, the address register 52 starts counting down from Yj again.

In this way, the down-counter 30 can easily generate Y addresses for reading data from both the main memory array 2 and the sub memory array 4, without requiring a second address input. The access counter 50 also counts down from five to zero during the reading of data from the sub memory array 4. Following the reading of data from the sub memory array 4, the access counter 50 again activates control signal PAI, loading the starting address (Yj) into the down-counter 30 once more. The new input data Da5 held in the latch 34 in the data input unit 14 are now transferred to the main memory array 2 and written into the memory cells formerly occupied by data Db5.

After this burst access, external control signal ADX/ is driven low twice, together first with CS/ and RAS/, then with CS/, CAS/, and WE/. These commands cause the X address generator 29 to generate the next X address (Xi+1), and the access counter 50 to reload the same Y address (Yj) into the down-counter 30. The next burst thus outputs the data for the five pixels one position to the right of Da5 to Da1 and Db5 to Db1 in the current field and previous field.

Further bursts can be output in the same way, using control signal ADX/ to generate new addresses. Pixel data for an entire horizontal scanning line can thus be received and stored in the memory device, accompanied by burst output of data required for filtering, with the provision of only one X address and one Y address at the beginning of the scanning line.

FIG. 18 also illustrates one of the advantages of the fifth embodiment over conventional synchronous dynamic random-access memory. The burst length in the fifth embodiment is limited (indirectly) only by the size of the sub memory array 4, while the burst length in conventional synchronous dynamic random-access memory is limited to the specific values one, two, four, and eight. Unlimited bursts may also be possible, but then external control is required to stop the burst. With conventional synchronous dynamic random-access memory, it would be difficult to obtain a continuous burst of ten data, read from five consecutive addresses in each of two fields.

Figure 19:
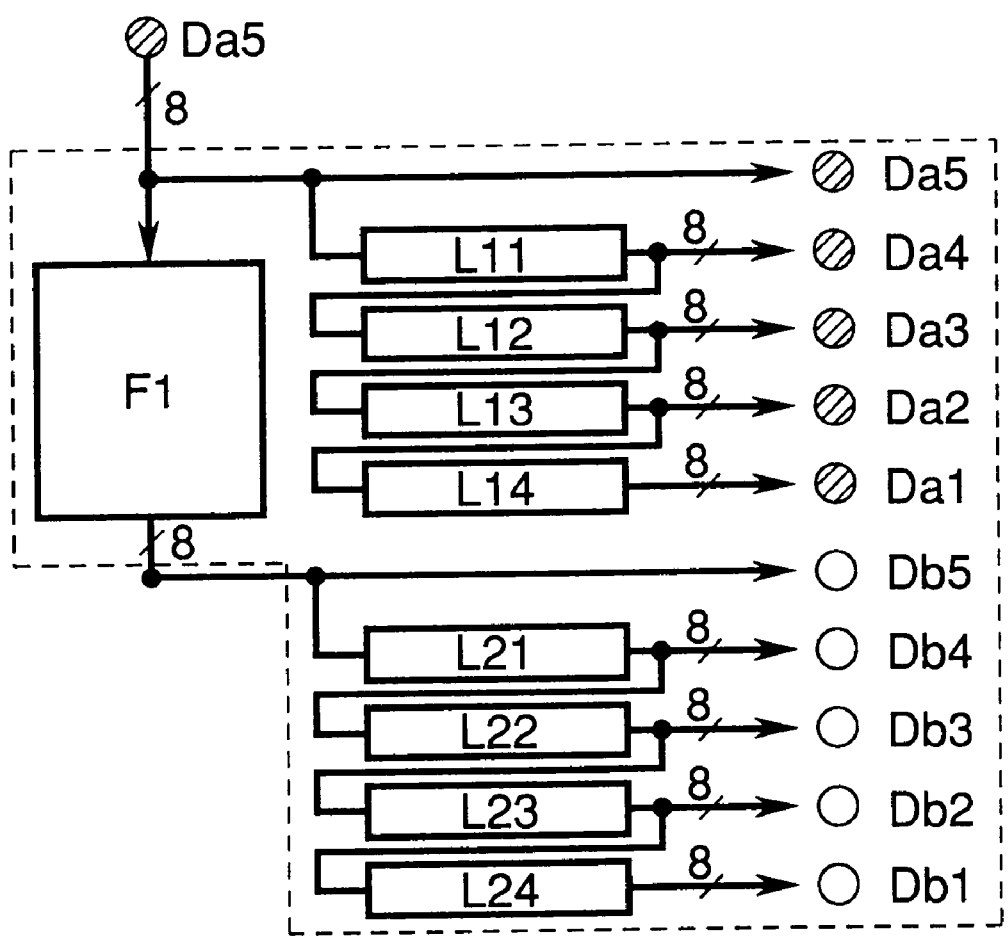
FIG. 19 indicates the part of FIG. 4 corresponding to the access operation in FIG. 18.

The fifth embodiment provides the functions of the field memory F1 and line memories L11 to L24 enclosed in the dotted line in FIG. 19. The functional scope is slightly larger than the scope provided by the first four embodiments, in that output of the new data Da5 is also included, but this arrangement is less suitable for cascading of memory devices. FIG. 19, in which memory device F1 is used alone, should be compared with FIG. 8, in which memory device F1 is cascaded with memory device F2.

Figure 20:
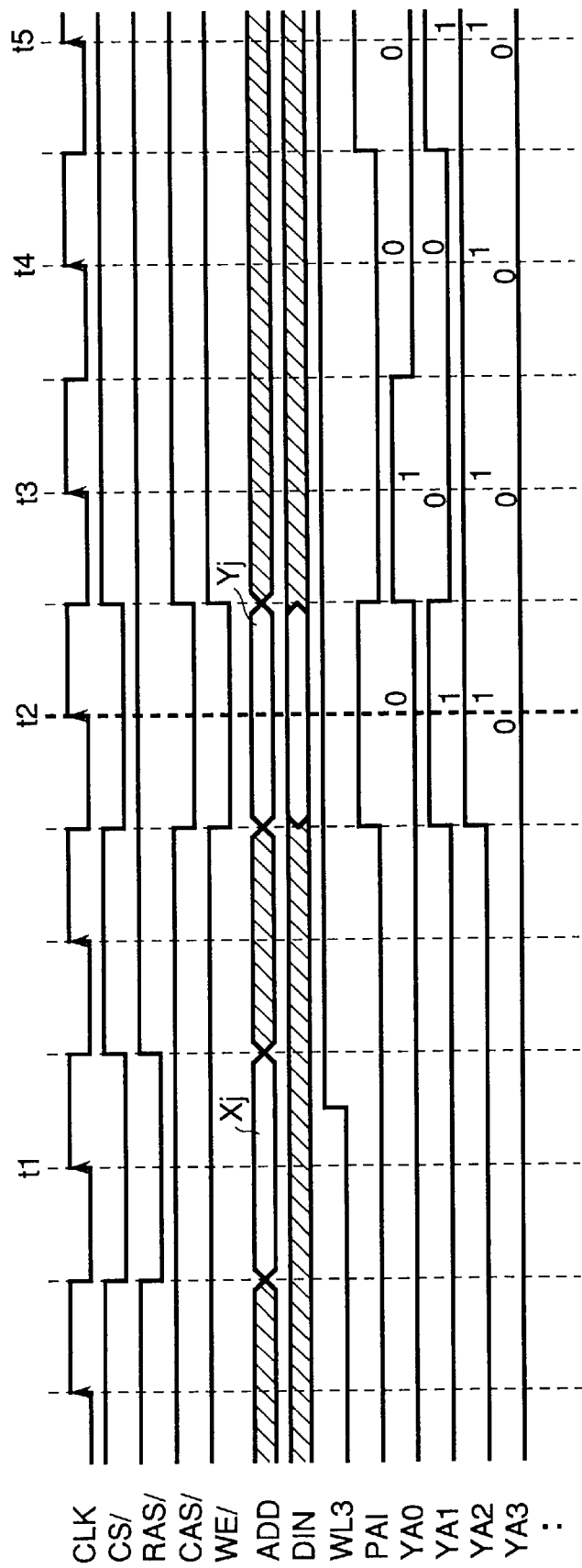
FIG. 20 is a timing diagram illustrating the reloading of the down-counter in the fifth embodiment.

FIG. 20 illustrates the timing of control signal PAI in the fifth embodiment, given that the starting Y address (Yj) ends in '0110'. The number of columns accessed in the main memory array 2 is now shown as three instead of five. PAI is driven high in the clock cycle centered at time t2 to load the starting address Yj into the down-counter 30, causing '0110' to appear on address signal lines YA3, YA2, YA1, and YA0. As the down-counter 30 decrements, the address output value changes to addresses ending in '0101' at time t3 and '0100' at time t4. In the clock cycle centered at time t5, the access counter 50 drives PAI high again, reloading the same address (Yj) from the address register 52 into the down-counter 30, and the value '0110' again appears on address signal lines YA3, YA2, YA1, and YA0.

The fifth embodiment is not restricted to the mode of operation shown in FIG. 18; the burst can begin with output of the old data Db5 instead of the new data Da5, to permit cascading of memory devices. In this case, input of the new data Da5 is preferably timed to coincide with the first output of the old data Db5, as explained in the first embodiment.

Regardless of whether the burst begins with output of the new data Da5 or old data Db5, the reloading of the Y address from the address register 52 into the down-counter 30 in response to the ADX/ control signal enables the fifth embodiment to receive and store an entire horizontal scanning line of pixels, and provide bursts of output data required for filtering, with input of only one column address. This is an advantage for the device that controls the fifth embodiment, since the controlling device does not have to supply the same column address repeatedly.

Sixth Embodiment

Figure 21:
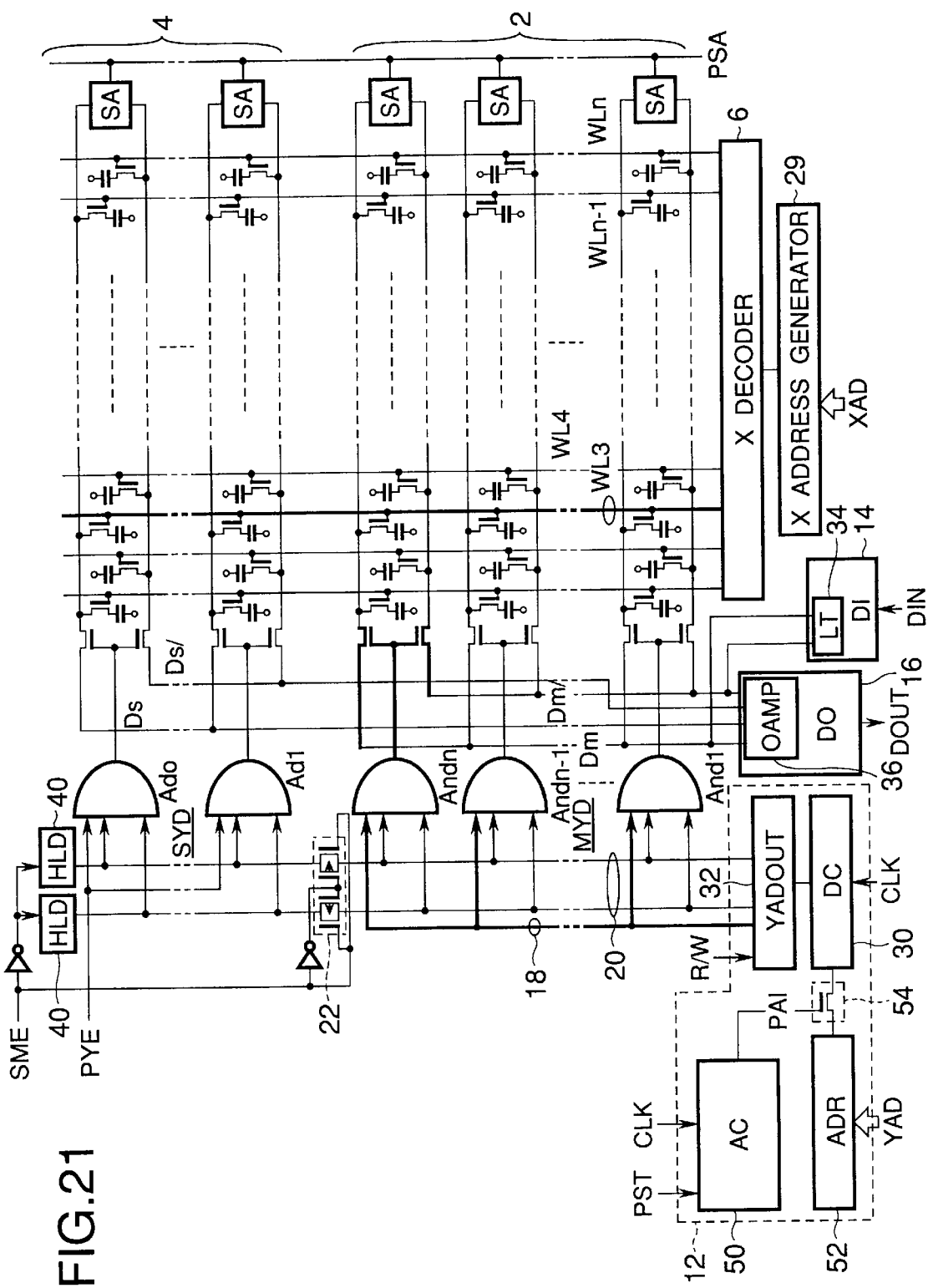
FIG. 21 is a circuit diagram illustrating a sixth embodiment of the invention.

Referring to FIG. 21, the sixth embodiment is similar to the fifth embodiment, except for the data bus configuration. The component elements of the sixth embodiment are shown with the same reference numerals as in the fifth embodiment. The following description will be confined to the differences from the fifth embodiment.

In the fifth embodiment, the main and sub data buses were interconnected by a data bus switch 26, but in the sixth embodiment, the main and sub data buses are not interconnected. As in the second embodiment, both the main data bus lines Dm and Dm/ and sub data bus lines Ds and Ds/ are connected independently to the output amplifier 36 in the data output unit 16. The output amplifier 36 thus assumes the function of the data bus switch 26 by transferring data from the main data bus to the sub data bus, and assumes the function of the write amplifier 28 by amplifying the data written into the sub memory array 4, as in the second embodiment, enabling both the data bus switch 26 and write amplifier 28 to be omitted.

As in the second embodiment, the main data bus lines Dm and Dm/ are connected to the latch 34 in the data input unit 14. The sub data bus lines Ds and Ds/ are not connected to the data input unit 14.

The sixth embodiment operates in the same way as the fifth embodiment, absence of the data bus switch 26 eliminating the electrical resistance of the transistors in the data bus switch 26 and permitting higher-speed access to the sub memory array 4. The electrical capacitance of each complementary pair of data bus lines can be reduced, as in the second embodiment. The sixth embodiment can thus operate at a higher clock rate than the fifth embodiment, and elimination of the data bus switch 26 and write amplifier 28 simplifies the circuit configuration.

Seventh embodiment

Figure 22:
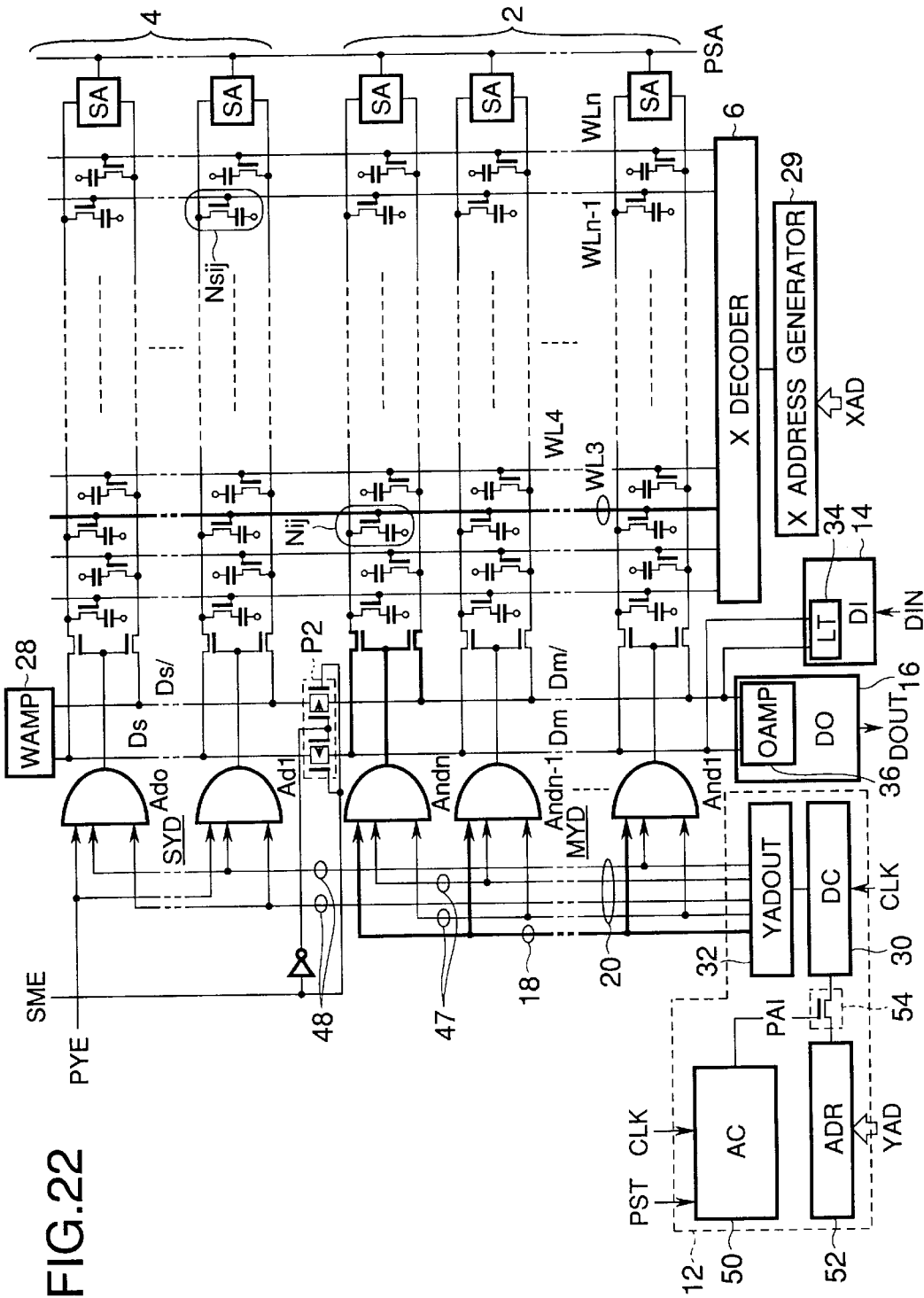
FIG. 22 is a circuit diagram illustrating a seventh embodiment of the invention.

Referring to FIG. 22, the seventh embodiment is similar to the fifth embodiment, except for the column address bus configuration. Elements of the seventh embodiment that appeared in the fifth embodiment are shown with the same reference numerals. The following description will be confined to the differences from the fifth embodiment.

In the fifth embodiment, the low-order address bus 20 was coupled directly to the main Y decoder 8, and was coupled through an address bus switch 22 to the sub Y decoder 10. In the seventh embodiment, the low-order address bus 20 is duplicated, with one set of low-order address lines 47 coupled to the main Y decoder 8, and a duplicate set of low order address lines 48 coupled to the sub Y decoder 10. The address bus switch 22 and the address holding latches 40 of the fifth embodiment are eliminated.

The seventh embodiment operates in the same way as the fifth embodiment, but the absence of the address bus switch 22 eliminates the electrical resistance of the transistors in the address bus switch 22, permitting higher-speed access to the sub memory array 4. In addition, the electrical capacitance of the low-order address bus lines can be reduced, also permitting higher-speed access. The seventh embodiment can thus operate at a higher clock rate than the fifth embodiment, and elimination of the address bus switch 22 and address-holding latches 40 also simplifies the circuit configuration.

Eighth embodiment

Figure 23:
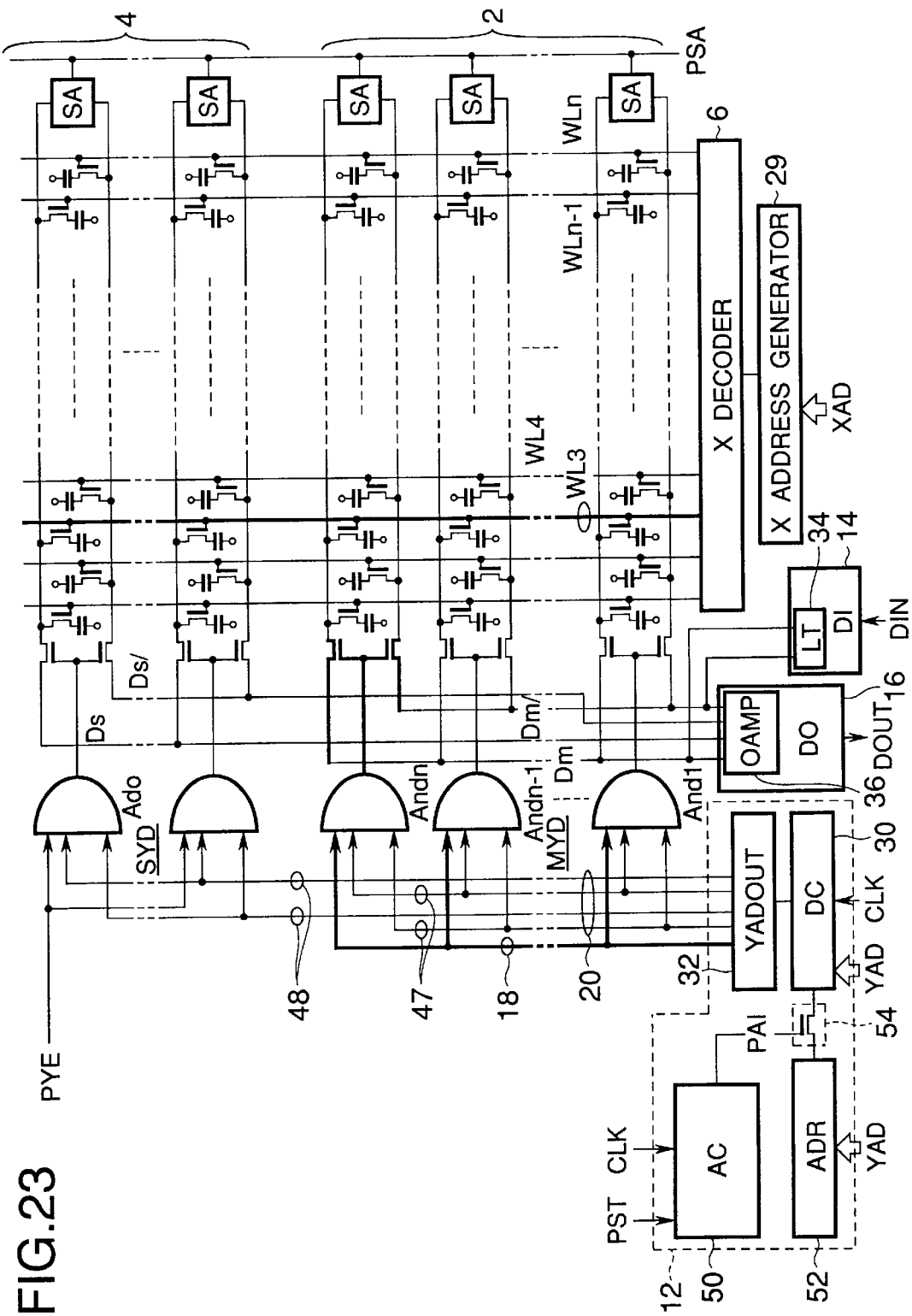
FIG. 23 is a circuit diagram illustrating an eighth embodiment of the invention.

Referring to FIG. 23, the eighth embodiment combines the features of the sixth and seventh embodiments. The main data bus lines Dm and Dm/ and sub data bus lines Ds and Ds/ are connected separately to the output amplifier 36 in the data output unit 16, and separate low-order address bus lines 47 and 48 are provided for the main Y decoder 8 and sub Y decoder 10. The address bus switch 22, data bus switch 26, write amplifier 28, and address-holding latches 40 of the fifth embodiment are all eliminated.

The eighth embodiment provides the combined benefits of the sixth and seventh embodiments in terms of simplified circuit configuration and higher-speed operation.

Ninth embodiment

Figure 24:
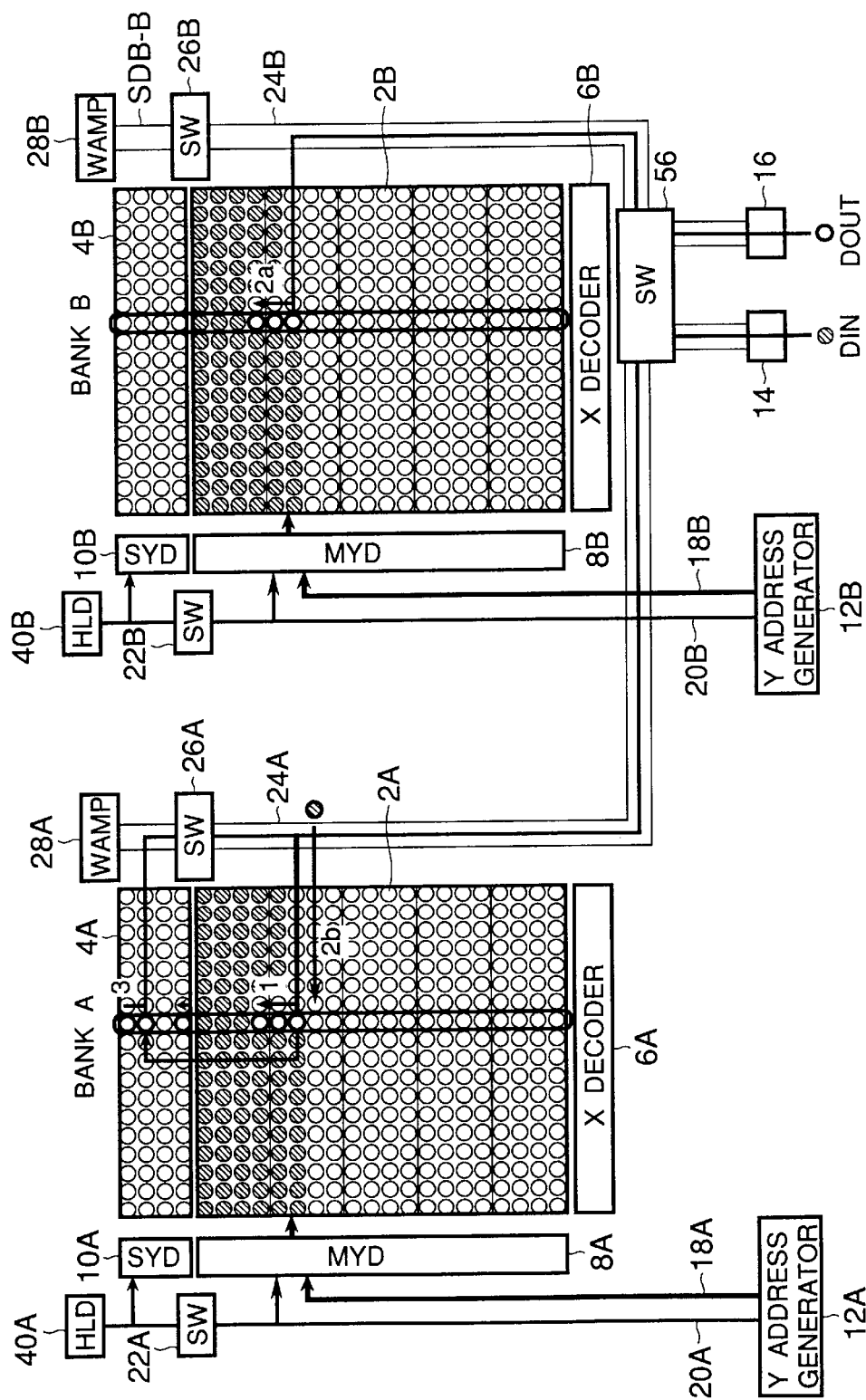
FIG. 24 is a block diagram illustrating a ninth embodiment of the invention.

Referring to FIG. 24, the ninth embodiment is a memory device with two banks, referred to as bank A and bank B. Each of the two banks A and B is similar in configuration to the fifth embodiment. The same reference numerals are used as in the fifth embodiment, with suffixes A and B to distinguish the two banks. Thus bank A comprises a main memory array 2A, a sub memory array 4A, an X decoder 6A, a main Y decoder 8A, a sub Y decoder 10A, a Y address generator 12A, a high-order address bus 18A, a low-order address bus 20A, an address bus switch 22A, an internal data bus 24A, a data bus switch 26A, a write amplifier 28A, and an address-holding latch 40A, while bank B comprises a main memory array 2B, a sub memory array 4B, an X decoder 6B, a main Y decoder 8B, a sub Y decoder 10B, a Y address generator 12B, a high-order address bus 18B, a low-order address bus 20B, an address bus switch 22B, an internal data bus 24B, a data bus switch 26B, a write amplifier 28B, and an address-holding latch 40B. The two data buses 24A and 24B are both coupled through a bank switch 56 to the data input unit 14 and data output unit 16, which are shared by both banks A and B.

The detailed circuit configuration of each bank is as illustrated in FIG. 17.

FIG. 24 also illustrates one mode of operation of the ninth embodiment. The main memory arrays of banks A and B together hold an amount of pixel data equivalent to one frame, comprising two consecutive fields, of a moving picture. The field data are divided between the two banks on an even-odd basis that will be described later. The two sub memory arrays hold data that are delayed by one frame (two fields) with respect to the data in the main memory array in the same bank.

In this mode of operation, an output burst is divided into three parts.

First, data are read from the main memory array 2A in, for example, bank A (operation 1), while data for one pixel are transferred to the sub memory array 4A in bank A. The data transferred to the sub memory array 4A are two fields old; the other data read from the main memory array 2A belong to the current field.

Next, pixel data one field old are read from the main memory array 2B in bank B (operation 2a). At the same time, data for one new pixel in the current field are written in the main memory array 2A in bank A (operation 2b), at the location from which data were transferred to the sub memory array 4A in operation 1.

Finally, pixel data are read from the sub memory array 4A in bank A (operation 3). These data are two fields old.

The first pixel output in the burst may be either the old pixel transferred to the sub memory array 4A, or the new pixel written into the main memory array 2A, depending on whether the memory device is being used in a cascaded configuration or not.

Figure 25:
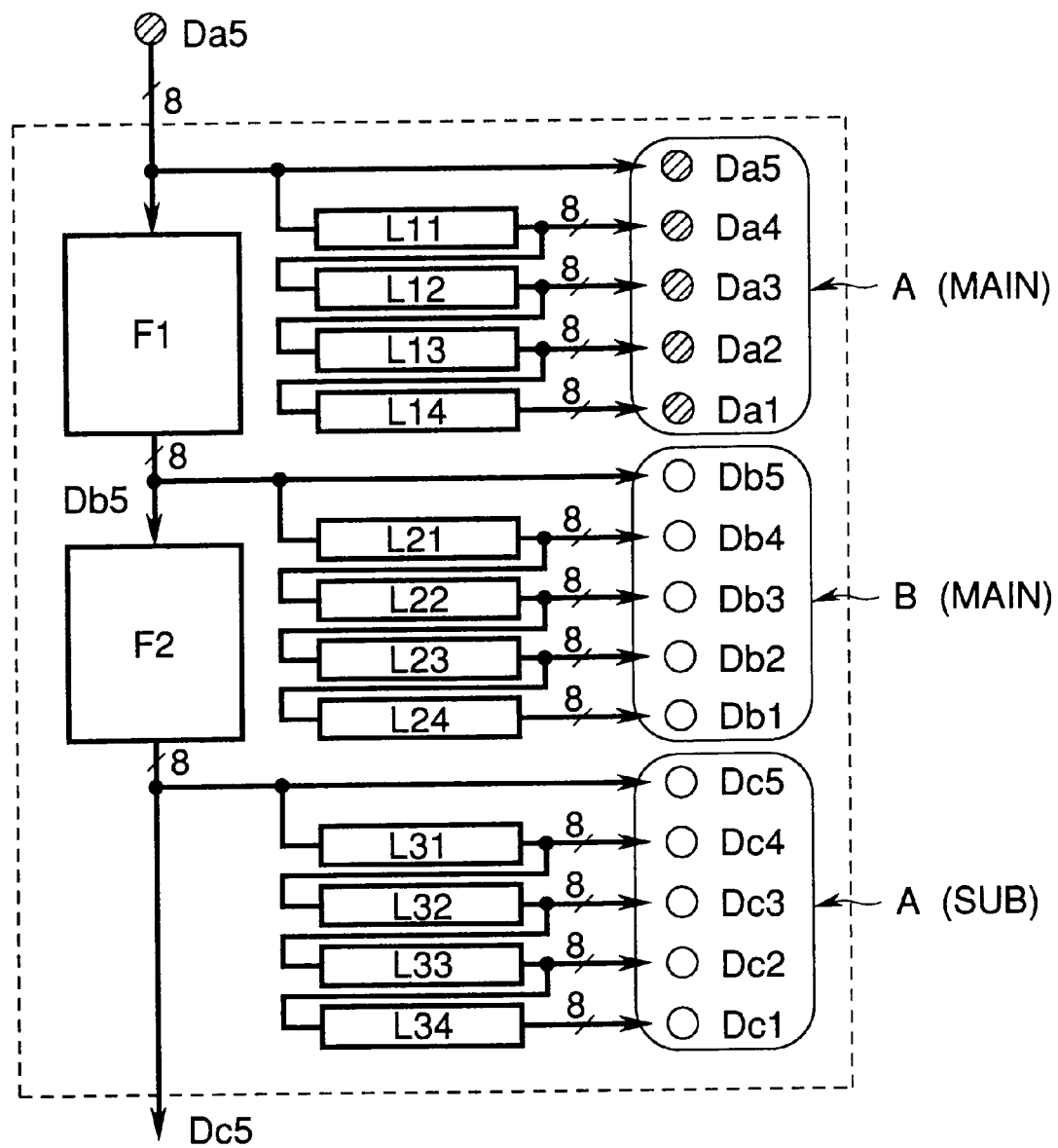
FIG. 25 indicates the part of the system in FIG. 4 that can be replaced by the ninth embodiment.

FIG. 25 illustrates a case in which data for five pixels are output in each part of the burst. First, data Da5 to Da1, pertaining to the newest field, are output from the main memory array 2A in bank A. (Data Da5 are actually output by direct transfer from the data input unit 14 to the data output unit 16.) Next, data Db5 to Db1, pertaining to the most recent preceding field, are output from the main memory array 2B in bank B. Finally, data Dc5 to Dc1, pertaining to the second most recent preceding field, are output from the sub memory array 4A in bank A. As FIG. 25 shows, the ninth embodiment enables a single memory device to carry out the functions of two field memories (F1 and F2) and three sets of line memories (L11 to L34), providing data from three consecutive fields (fields a, b, and c).

Referring once more to FIG. 2, digital filtering usually operates on pixels in an odd number of fields, including the field in which a filtered pixel value is being generated, and equal numbers of preceding and following fields. The ninth embodiment enables a filtering operation that generates a filtered pixel in field Fm by operations on data in the three fields Fm, Fm−1, and Fm+1, for example, to be implemented with a single memory device, fields Fm+1, Fm, and Fm−1 corresponding to fields a, b, and c, respectively, in FIG. 25.

In a cascaded configuration, the ninth embodiment also enables a filtering operation that generates a filtered pixel in field Fm by operations on data in the five fields Fm, Fm−1, Fm−2, Fm+1, and Fm+2 to be implemented with just two memory devices. A first memory device receives new pixel data Da5 in FIG. 25 and simultaneously outputs old pixel data Dc5, accompanied by a burst of other pixel data from fields a, b, and c (pixel data Dc5 may be output twice). A second memory device receives the data for pixel Dc5 from the first memory device and outputs a burst of pixel data from fields c, d, and e. Fields a, b, c, d, and e correspond to fields Fm+2, Fm+1, Fm, Fm−1, and Fm−2, respectively. In this case, two memory devices of the invented type can replace four conventional field memories and five conventional sets of line memories.

FIGS. 26 to 29 illustrate a preferred scheme for storing field data in the ninth embodiment.

Figure 26:
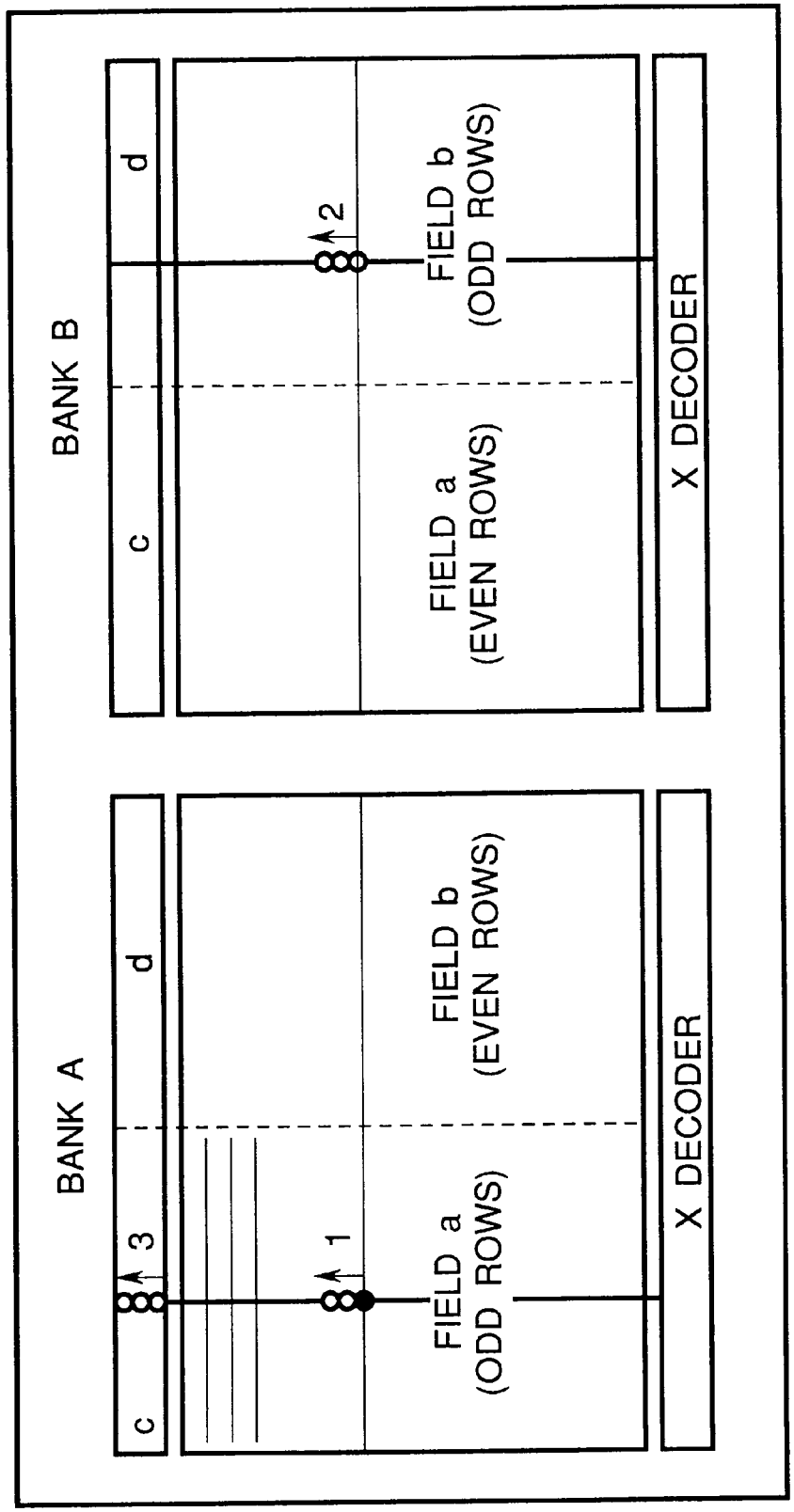
FIGS. 26, 27, 28, and 29 illustrate a scheme for storing and accessing pixel data in the ninth embodiment.
Figure 27:
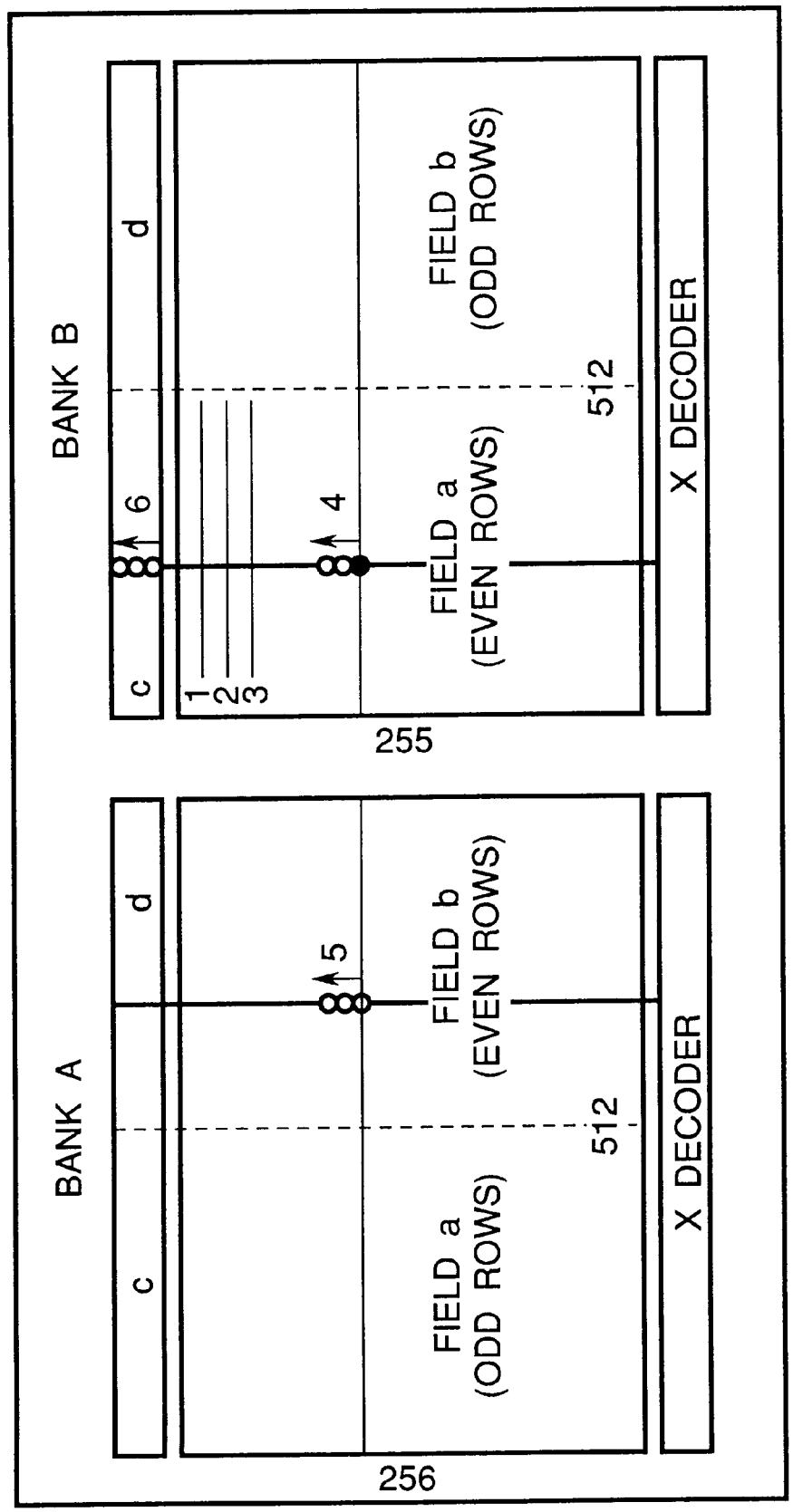

In FIG. 26, bank A stores data for pixels with odd X addresses (row addresses) in field a (the newest field), and data for pixels with even X addresses in field b (the preceding field). Bank B stores data for pixels with even X addresses in field a, and odd X addresses in field b. The sub memory arrays hold corresponding data for fields c and d. The numbers one, two, and three indicate the operations of reading data for three pixels in a row with an odd X address in field a (1), reading data for three corresponding pixels in the same row in field b (2), and reading data for three corresponding pixels in the same row in field c (3). These operations are performed when a new pixel with an odd X address is received and stored in bank A, at the location indicated by the dark dot.

The next new pixel to be received has an even row (X) address. This pixel is stored at the location indicated by the dark dot in FIG. 27, while data for three pixels with this even X address are read from field a (4), then from field b (5), then from field c (6).

These operations continue, new pixels being stored alternately in bank A and bank B, until all pixels in field a have been received.

Figure 28:
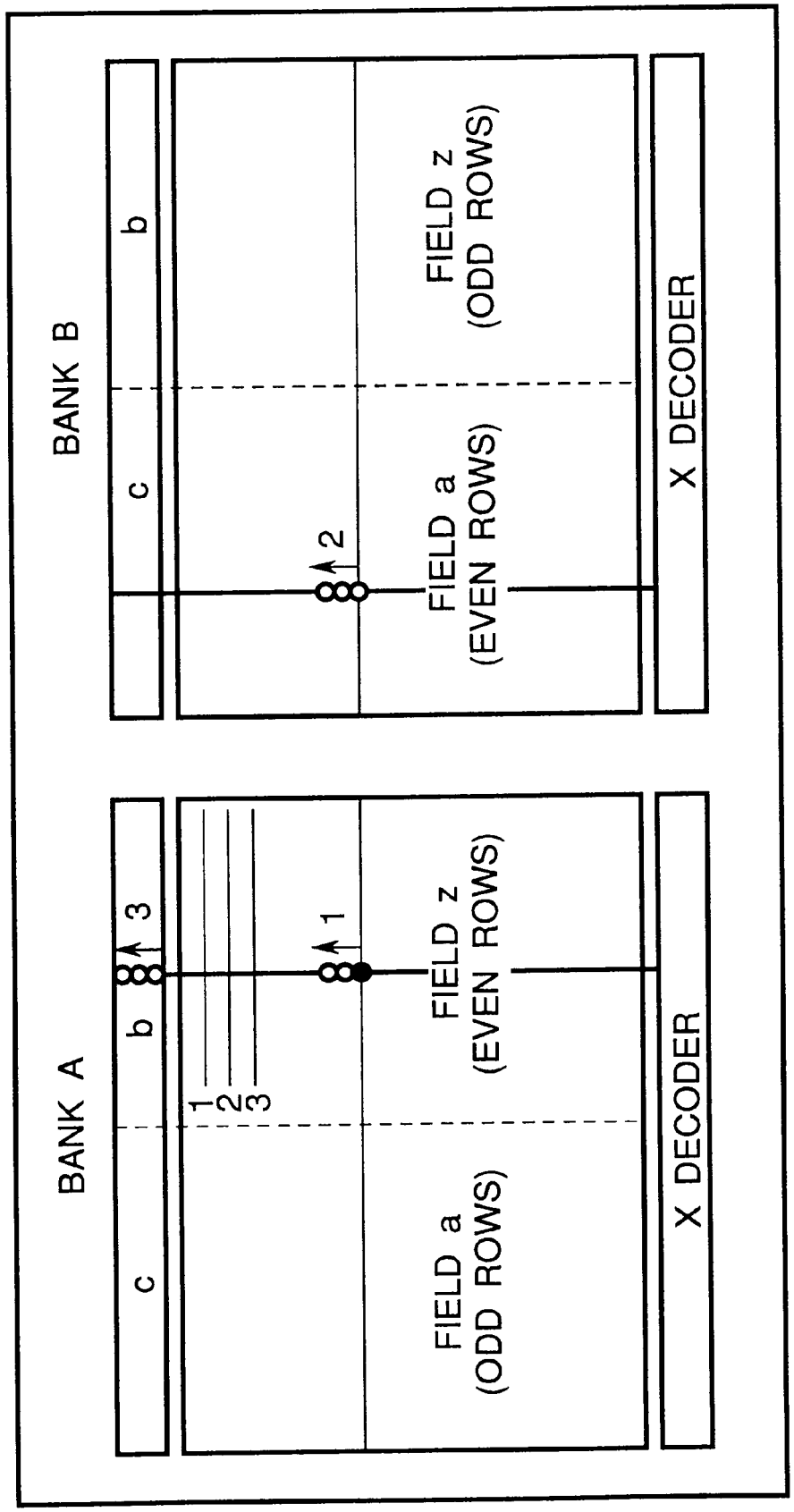

Referring to FIG. 28, in the next field (field z), data for pixels with even X addresses are stored in bank A, and data for pixels with odd X addresses are stored in bank B, in both cases overwriting the data of field b, while leaving the data of field a intact. The dark dot indicates the location at which data for a new pixel with an even X address are stored in bank A. The numbers one, two, and three indicate the operations of reading data for three pixels with this even X address in field z (1), reading data for three corresponding pixels in the same row in field a (2), and reading data for three corresponding pixels in the same row in field b (3).

Figure 29:
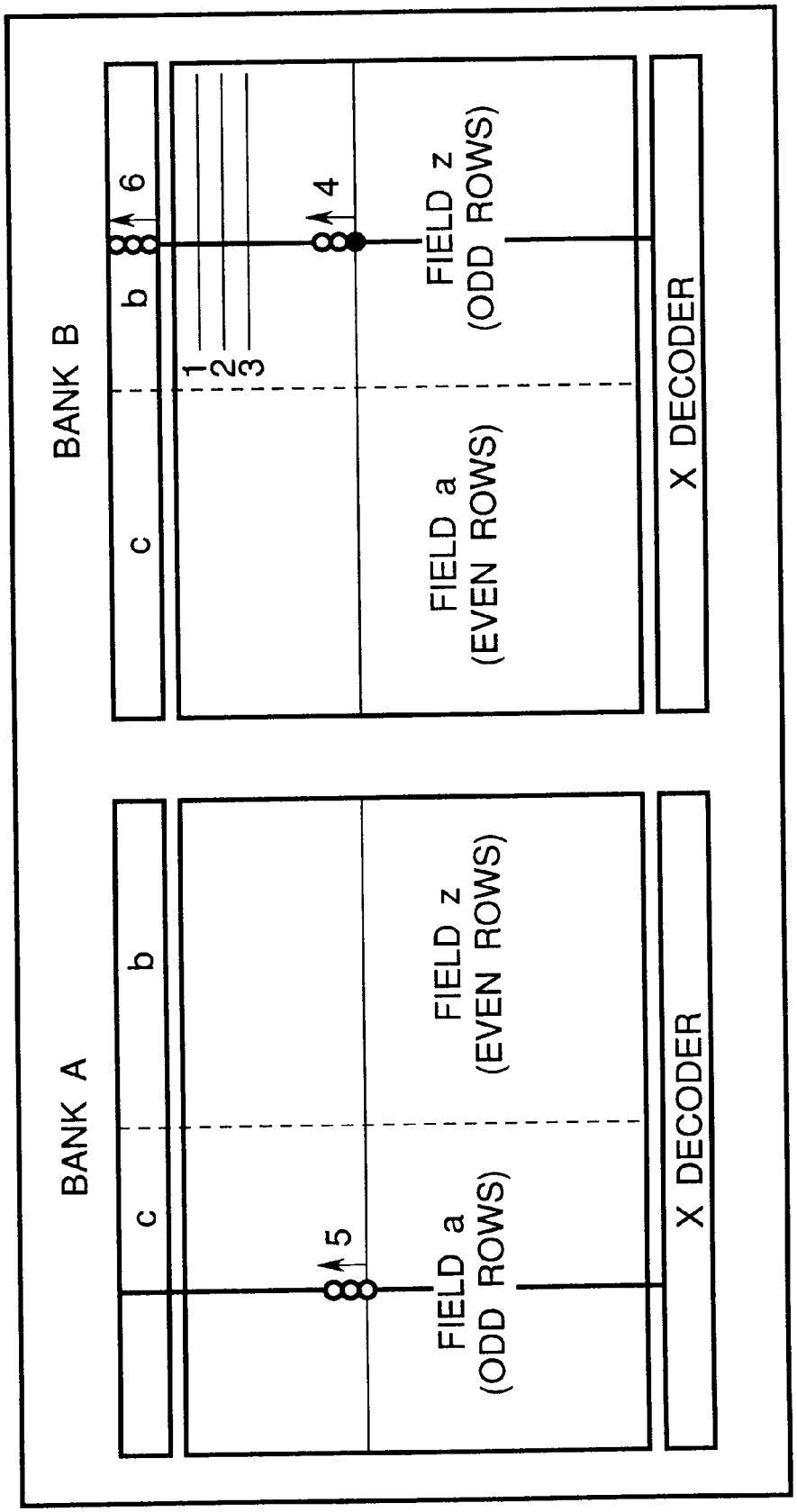

In FIG. 29, the dark dot indicates the location at which data for the next new pixel, which has an odd X address, are stored in bank B. The numbers four, five, and six indicate the operations of reading data for three pixels with this odd X address in field z (4), reading data for three corresponding pixels in the same row in field a (5), and reading data for three corresponding pixels in the same row in field b (6).

In FIGS. 26 to 29, even and odd rows have been segregated for the sake of visibility, but of course these rows may be interleaved.

Figure 30:
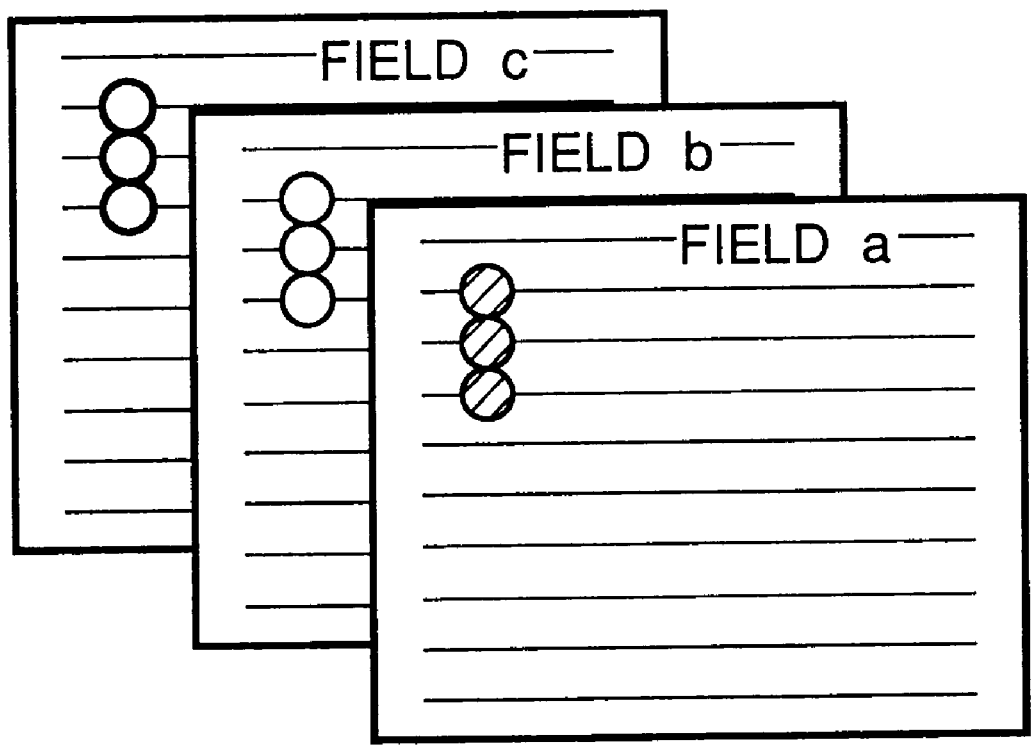
FIG. 30 illustrates pixel data that can be accessed in single burst in the ninth embodiment.

Several modes of operation of the ninth embodiment will be described next. In the first two modes to be described, the scheme outlined in FIGS. 26 to 29 will be employed to output pixel data from three consecutive fields, as illustrated in FIG. 30, in a single burst.

Figure 31:
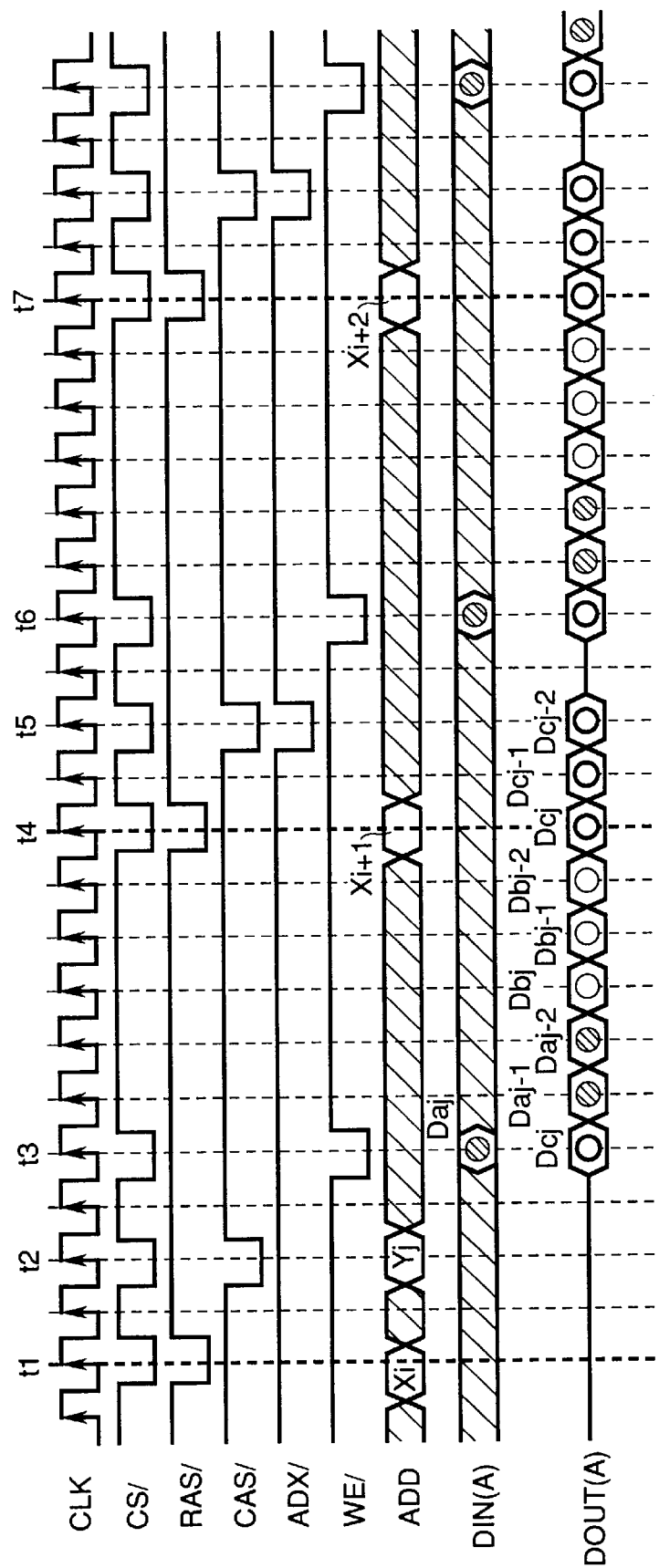
FIG. 31 is a timing diagram illustrating a burst that accesses the pixel data shown in FIG. 30 in a manner suitable for cascading.

FIG. 31 illustrates a mode of operation suitable for a cascaded memory configuration.

At time ti, with CS/ and RAS/ low, an odd X address (Xi) is latched and decoded, and the corresponding word line (WLi) in bank A is driven by X decoder 6A. The bank bus switch 56 is set to connect bank A to the output unit 16.

At time t2, with CS/ and CAS/ low, a Y address (Yj) is received and stored in the address registers 52 in the Y address generators 12A and 12B in both banks A and B. In bank A, address Yj is loaded into the down-counter 30, the main and sub Y decoders 8A and 10A are enabled in turn, and the address bus switch 22A is controlled as described in the first embodiment to transfer old data Dcj from the main memory array 2A to the sub memory array 4A, and to the data output unit 16. In bank B, precharging of the word lines and initialization (precharging and equalization) of the bit lines and data bus lines begins at this point.

At time t3, with CS/ and WE/ low, new data Daj for the pixel with row address Xi and column address Yj are received and latched in the data input unit 14. At the same time, the data output unit 16 outputs the old data Dcj with the same row-column address. In the meantime, the down-counter 30 in Y address generator 12A is decrementing, data Daj−1 and data Daj−2 are being transferred from the main memory array 2A in bank A to the data output unit 16, and word line WLi has been activated in bank B.

When the transfer of data Daj−2 from main memory array 2A to the data output unit 16 is completed, the bank bus switch 56 is switched over to couple bank B to the output unit 16, and bank A to the input unit 14. Transfer of data Dbj, Dbj−1, and Dbj−2 from the main memory array 2B in bank B to the data output unit 16 now begins, the down-counter 30 in Y address generator 12B generating the necessary column addresses.

Burst output of data continues as shown from time t3 to time t4, the output data coming first from bank A (field a), then bank B (field b). While data are being read from the main memory array 2B in bank B, address Yj is reloaded into the down-counter 30 in Y address generator 12A, and the new data Daj are written into the main memory array 2A in bank A. As soon as the transfer of data from bank B to the data output unit 16 is completed, bank B is precharged and initialized again. Transfer of data from the sub memory array 4A in bank A to the data output unit 16 also begins during this interval, the bank bus switch 56 now coupling bank A to the output unit 16 again, and the down-counter 30 in Y address generator 12A again counting down from Yj to Yj−2.

At time t4, the next X address (Xi+1) is input. This is an even row address, so the corresponding word line (WLi+1) is activated in bank B. At the same time, the data output unit 16 is outputting data Dcj, while data Dcj−2 are being transferred from the sub memory array 4A in bank A to the data output unit 16.

At time t5 the first burst ends with the output of data Dcj−2 from the data output unit 16. At the same time, CS/, CAS/ and ADX/ are driven low, causing the column address Yj to be reloaded from the address registers 52 to the down-counters 30 in the Y address generators 12A and 12B in both banks. Initialization (precharging and equalization) of the word lines, bit lines, and data bus lines in bank A begins at this time.

At time t6, the second burst begins with output of data read from the main memory array 2B in bank B, and input of new data that will be written in the main memory array 2B in bank B. The second burst is carried out in the same way as the first burst, with the roles of banks A and B interchanged.

At time t7 another new X address (Xi+2) is received, and the second burst is followed by a third burst, which is carried out in the same way as the first burst, using the ADX/ signal to reload the same column address.

As FIG. 31 shows, interleaving of access between banks A and B allows one burst to follow another with little delay, the precharging of one bank being hidden behind the reading of data from the other bank. The writing of new input data to each bank is also hidden behind the reading of data from the other bank, permitting highly efficient operation.

Simultaneous input and output of data having the same X and Y addresses implies that when two memory devices are cascaded, both can receive the same address signals and control signals (CS/ RAS/, CAS/, WE/, and ADX/), and both can provide output data with the same timing. This greatly simplifies the design of a cascaded memory system.

The X addresses in FIG. 31 were all generated externally, but the ninth embodiment can also operate in the mode described in the fifth embodiment, in which new X addresses are generated automatically in response to CS/, RAS/, and ADX/.

Figure 32:
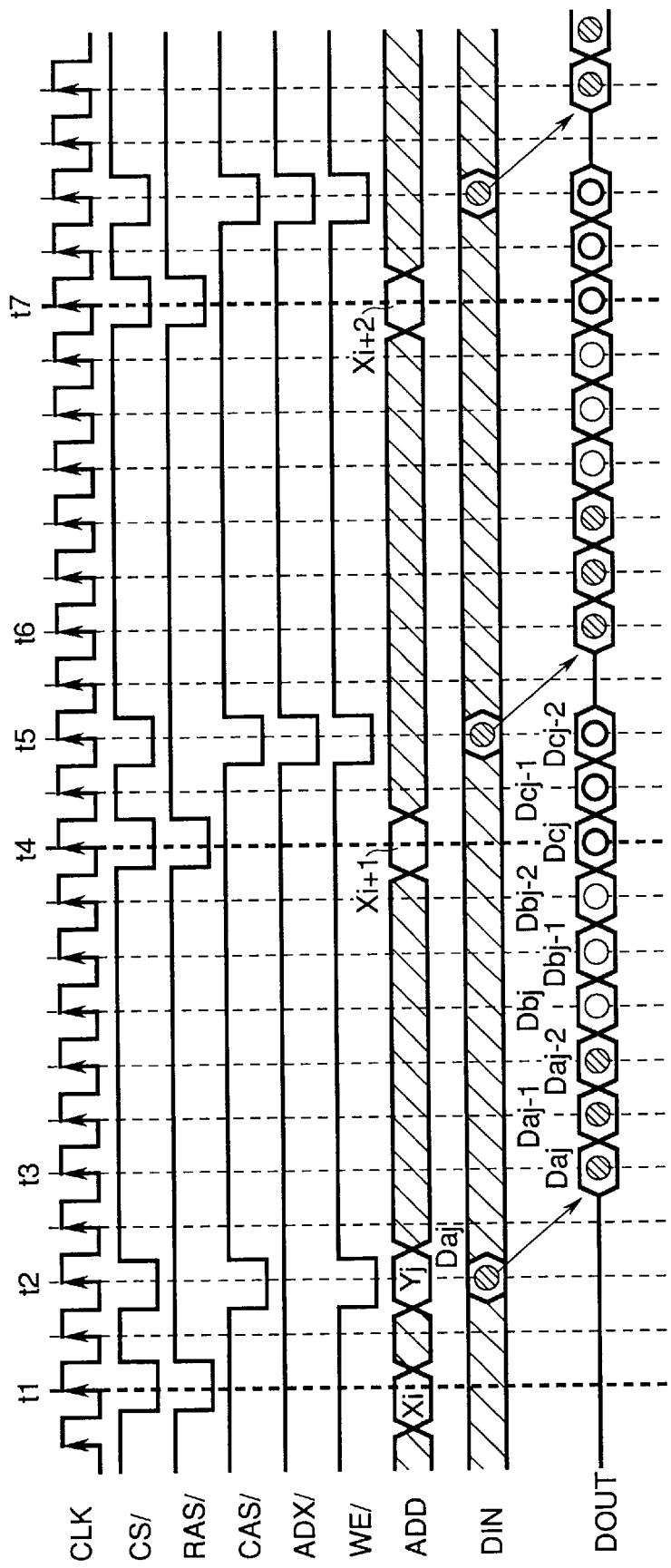
FIG. 32 is a timing diagram illustrating another burst that accesses the pixel data shown in FIG. 30.

FIG. 32 illustrates a similar series of bursts suitable for use in a non-cascaded memory configuration. The operation in this mode is nearly the same as in FIG. 31, except that input of the new data (Daj) occurs two clock cycles earlier, enabling the new data to be transferred from the data input unit 14 to the data output unit 16 and output as the first data of the burst. In this mode the ninth embodiment provides data for three pixels from each of three fields, with no duplicated output. A detailed description will be omitted.

Figure 33:
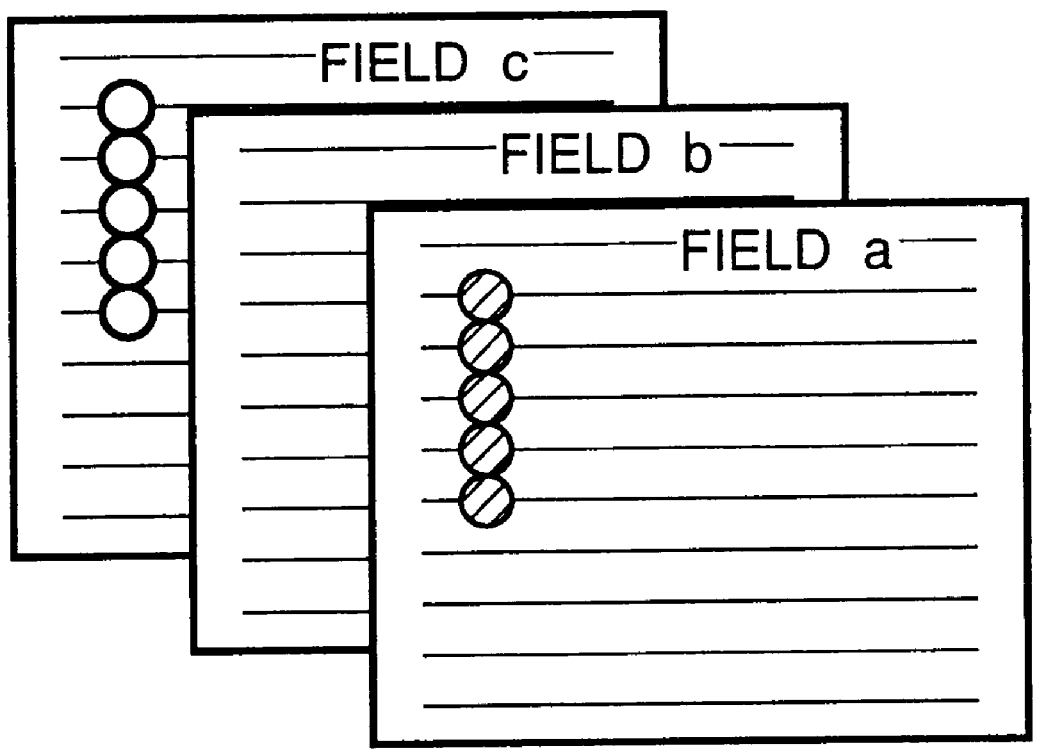
FIG. 33 illustrates more pixel data that can be accessed in single burst in the ninth embodiment.

The preceding modes of operation of the ninth embodiment are useful in digital filtering operations in which a field delay is required, but the ninth embodiment can also be used to advantage in operations, such as motion estimation, in which a frame delay is necessary. Referring to FIG. 33, such operations require a burst of data from fields a and c, without requiring data from the intervening field b.

Figure 34:
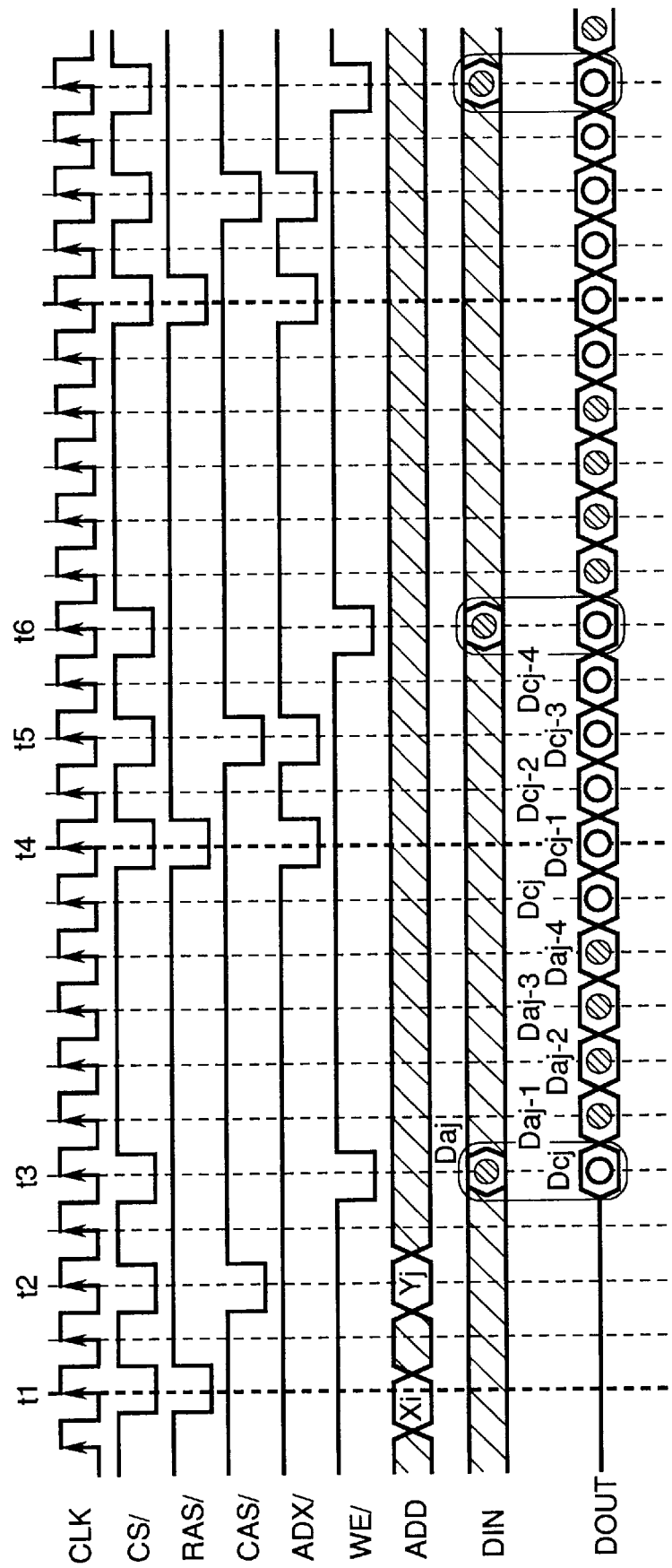
FIG. 34 is a timing diagram illustrating a burst that accesses the pixel data shown in FIG. 33 in a manner suitable for cascading.

FIG. 34 illustrates the output of this type of burst in a cascaded mode. In the first burst, initiated by X address input at time t1, data from fields a and c are output, data Dcj being output twice, the first time in synchronization with the input of new data Daj. Only one bank, e.g. bank A, is used for this burst. The other bank (bank B) is precharged during the first burst, during the interval between times t3 and t4. Input of commands and data for the second burst, which uses bank B, occurs at times t4, t5, and t6, enabling the second burst to follow the first burst with no interruption whatsoever. The addresses for the second burst are generated by the ADX/ signal as explained in the fifth embodiment. During the second burst, the new data Daj are written in the main memory array 2A in bank A as a background operation, then bank A is precharged.

Figure 35:
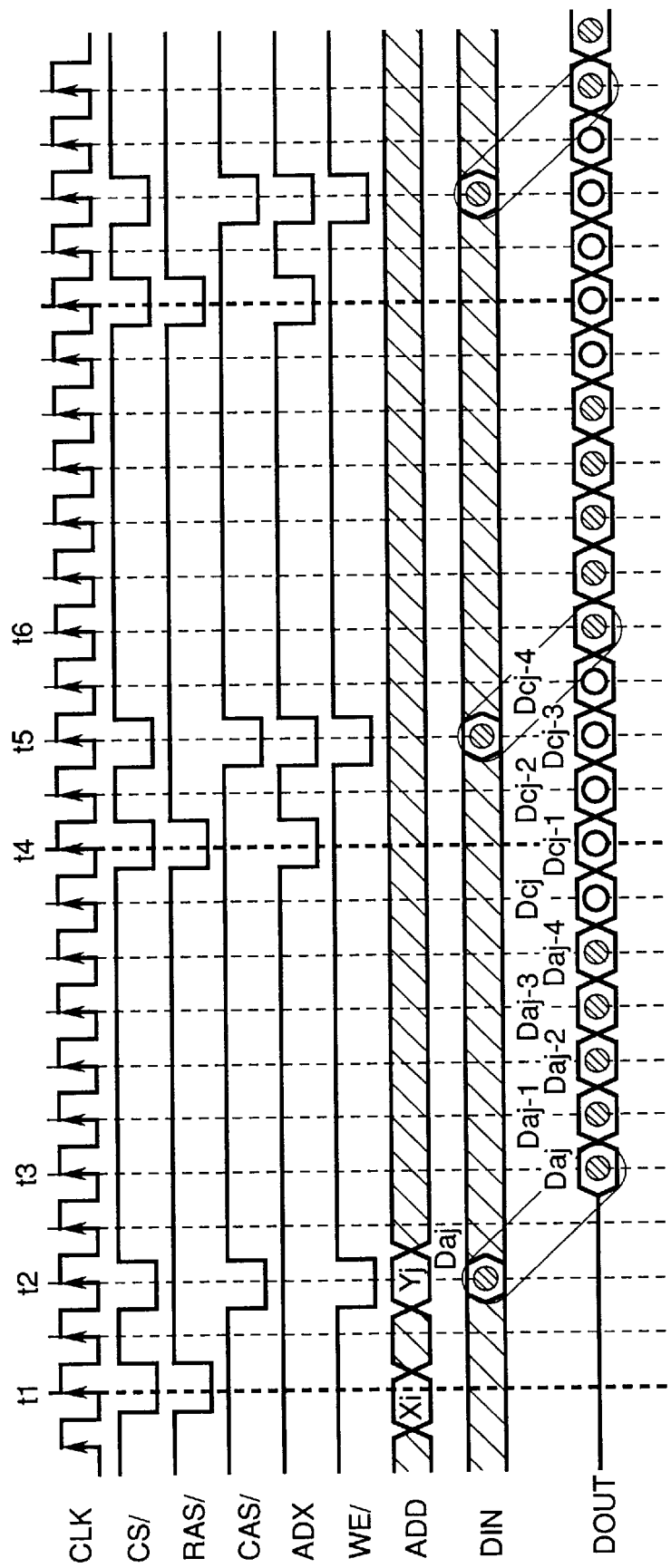
FIG. 35 is a timing diagram illustrating another burst that accesses the pixel data shown in FIG. 33.

FIG. 35 illustrates a similar non-cascaded mode of operation of the ninth embodiment. The timing is the same as in FIG. 34, except that input of the new data (Daj) occurs two clock cycles earlier, enabling the new input data to be transferred from the data input unit 14 to the data output unit 16 and output as the first data of the burst. Each burst comprises five pixels from each of two fields, with a one-frame delay between the two fields.

Figure 36:
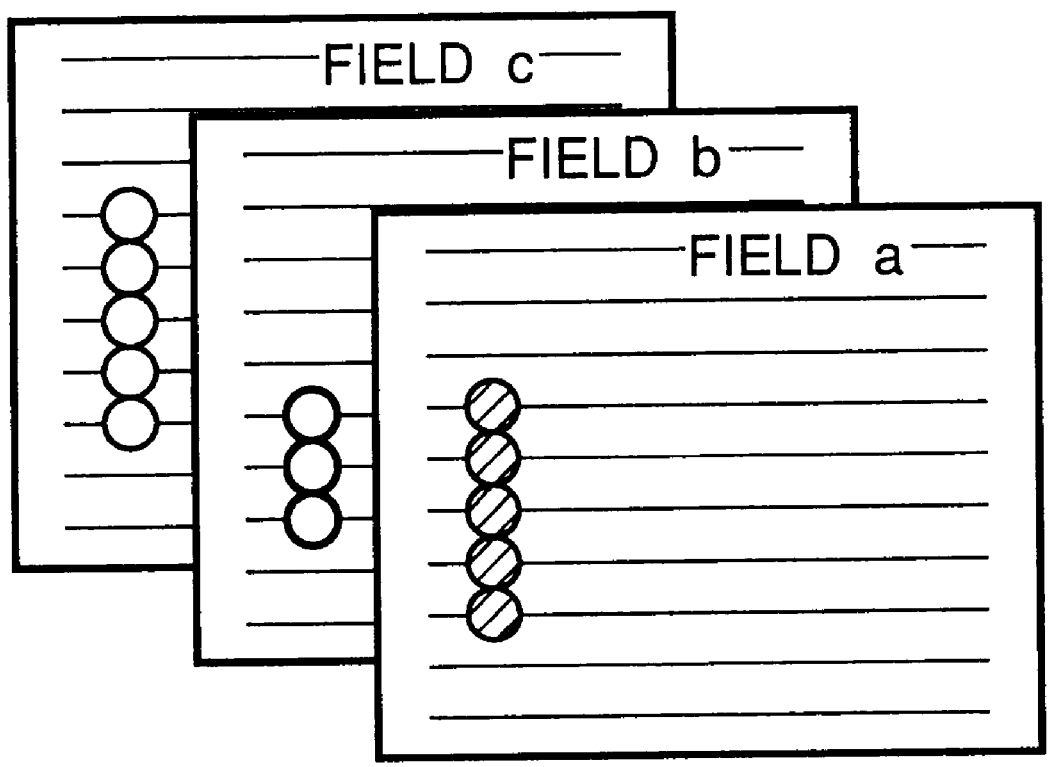
FIG. 36 illustrates still more pixel data that can be accessed in single burst in the ninth embodiment.

In some image-processing operations, different amounts of data are required from different fields. FIG. 36 shows a case in which five pixels are required from field a, three from field b, and five from field c. Since the ninth embodiment has separate Y address generators 12A and 12B for banks A and B, this requirement can easily be met, by controlling the down-counters and Y address decoders in banks A and B in different ways.

Figure 37:
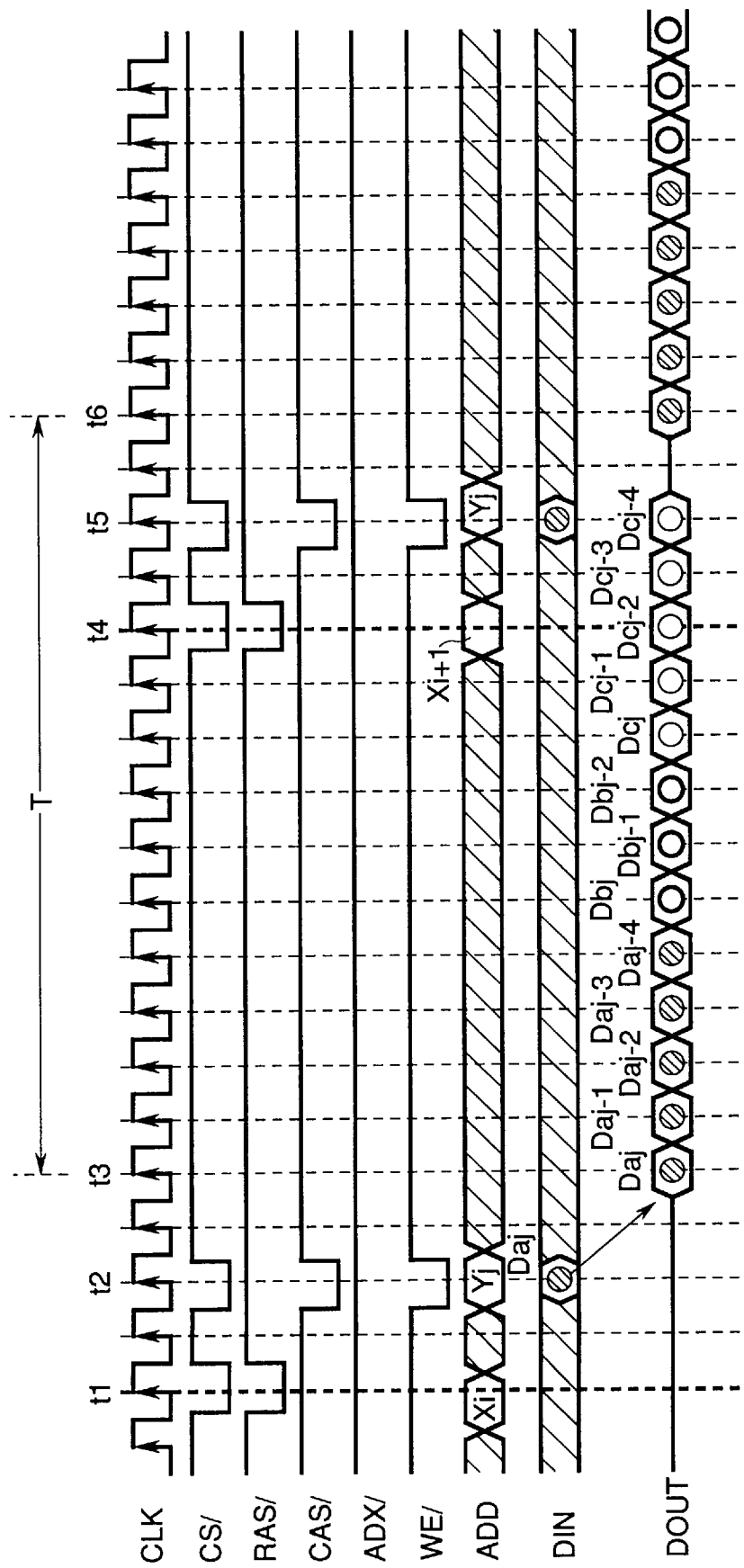
FIG. 37 is a timing diagram illustrating a burst that accesses the pixel data shown in FIG. 36.

FIG. 37 illustrates the output of this type of burst in a non-cascaded mode. The burst comprises data for five pixels (Daj to Daj−4) from field a, three pixels (Dbj to Dbj−2) from field b, and five pixels (Dcj to Dcj−4) from field c. Bursts of this type are repeated at intervals of fourteen clock cycles, this being equivalent to the interval between the arrival of new pixels, indicated by the letter T.

Further details of this type of operation will appear in later embodiments.

Tenth embodiment

Figure 38:
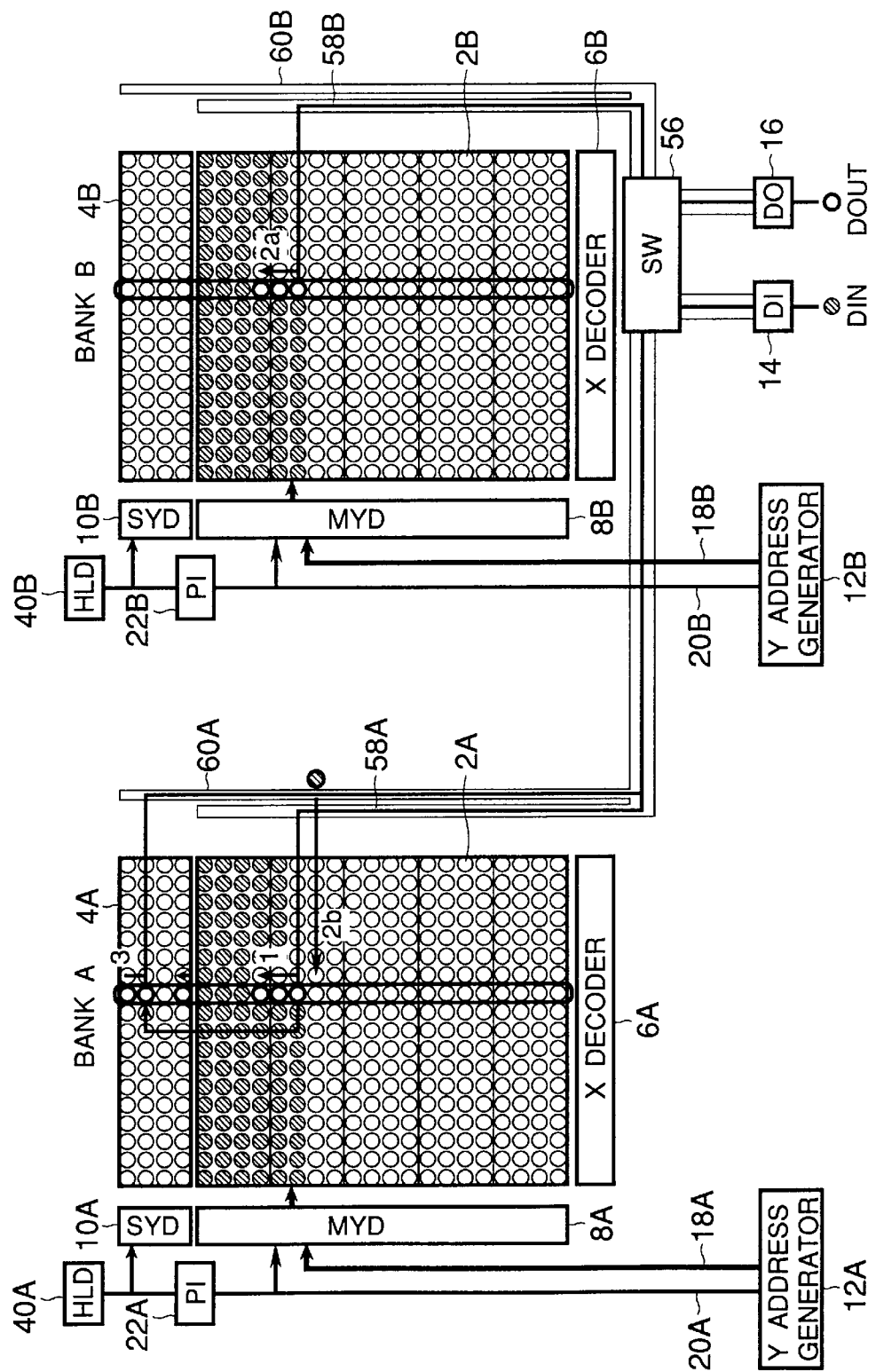
FIG. 38 is a block diagram illustrating a tenth embodiment of the invention.

Referring to FIG. 38, the tenth embodiment is similar to the ninth embodiment, except that each bank has separate data bus lines for the main and sub memory arrays, as in the sixth embodiment. Bank A has a main data bus 58A and a sub data bus 60A. Bank B has a main data bus 58B and a sub data bus 60B. The main data buses 58A and 58B are coupled through the bank bus switch 56 to the data input unit 14 and data output unit 16. The sub data buses 60A and 60B are coupled through the bank bus switch 56 to the data output unit 16.

Other elements in FIG. 38 are the same as in FIG. 24, and are shown with the same reference numerals.

Having separate main and sub data buses enables the data bus switches 26A and 26B and write amplifiers 28A and 28B of the ninth embodiment to be eliminated, simplifying the circuit configuration. In addition, the electrical resistance and capacitance of the data bus lines can be reduced, as described in the sixth embodiment, resulting in higher-speed operation.

Eleventh embodiment

Figure 39:
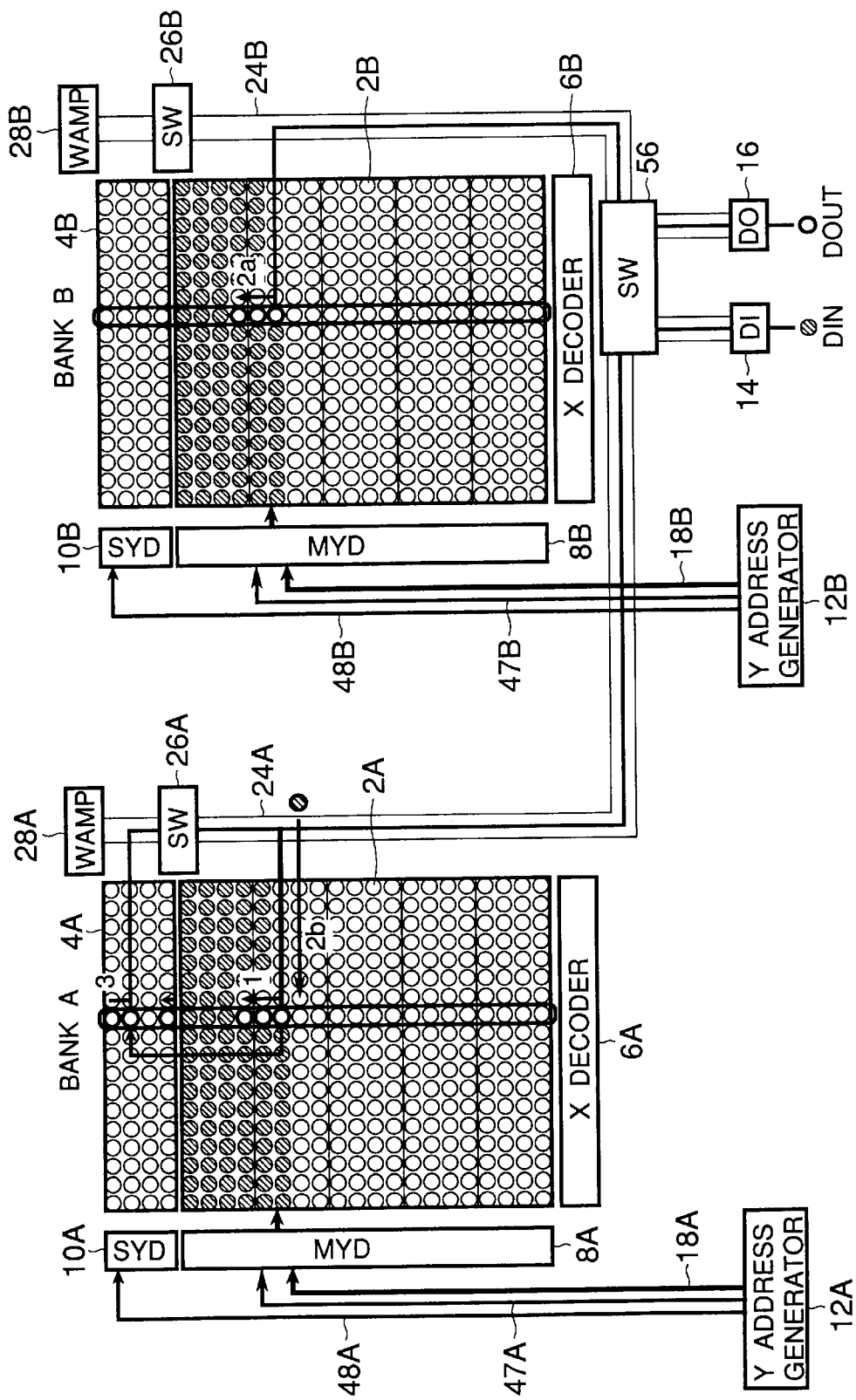
FIG. 39 is a block diagram illustrating an eleventh embodiment of the invention.

Referring to FIG. 39, the eleventh embodiment is similar to the ninth embodiment, except that each bank has separate address bus lines for the main and sub memory arrays, as in the seventh embodiment. Bank A has main low-order address lines 47A and sub low-order address lines 48A. Bank B has main low-order address lines 47B and sub low-order address lines 48B. Other elements in FIG. 39 are the same as in FIG. 24, and are shown with the same reference numerals.

Having separate main and sub address buses enables the address bus switches and address-holding latches of the ninth embodiment to be eliminated, simplifying the circuit configuration. In addition, the electrical resistance and capacitance of the address bus lines can be reduced as described in the seventh embodiment, resulting in higher-speed operation.

Twelfth embodiment

Figure 40:
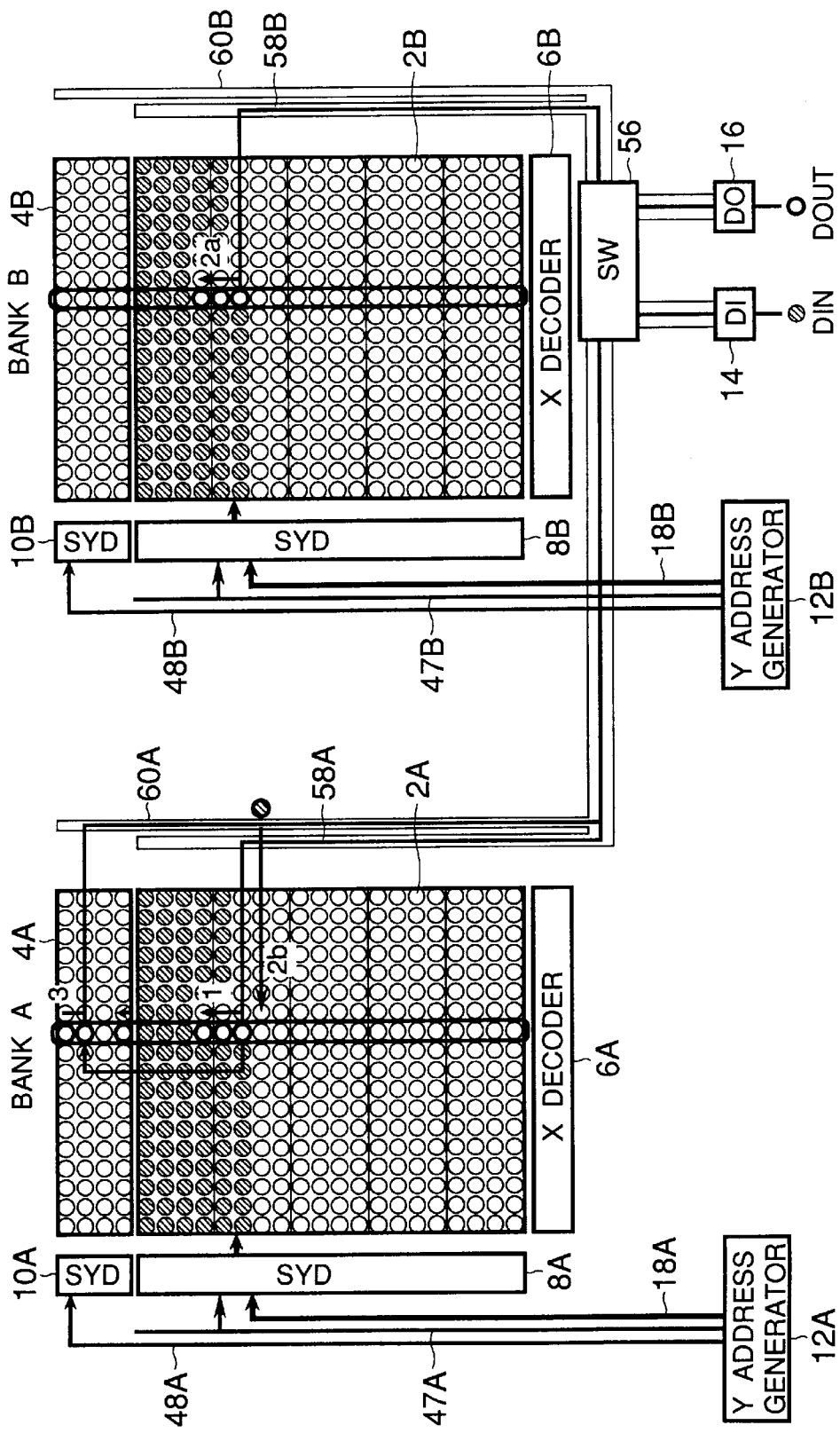
FIG. 40 is a block diagram illustrating a twelfth embodiment of the invention.

Referring to FIG. 40, the twelfth embodiment combines the features of the tenth and eleventh embodiments. Separate main data buses 58A and 58B and sub data buses 60A and 60B are provided, and separate main low-order address lines 47A and 47B and sub low-order address lines 48A and 48B are provided. The bus switches 22A, 22B, 26A, and 26B, write amplifiers 28A and 28B, and address-holding latches 40A and 40B of the ninth embodiment are all eliminated.

The twelfth embodiment provides the combined benefits of the tenth and eleventh embodiments in terms of simplified circuit configuration and higher-speed operation.

Thirteenth embodiment

Figure 41:
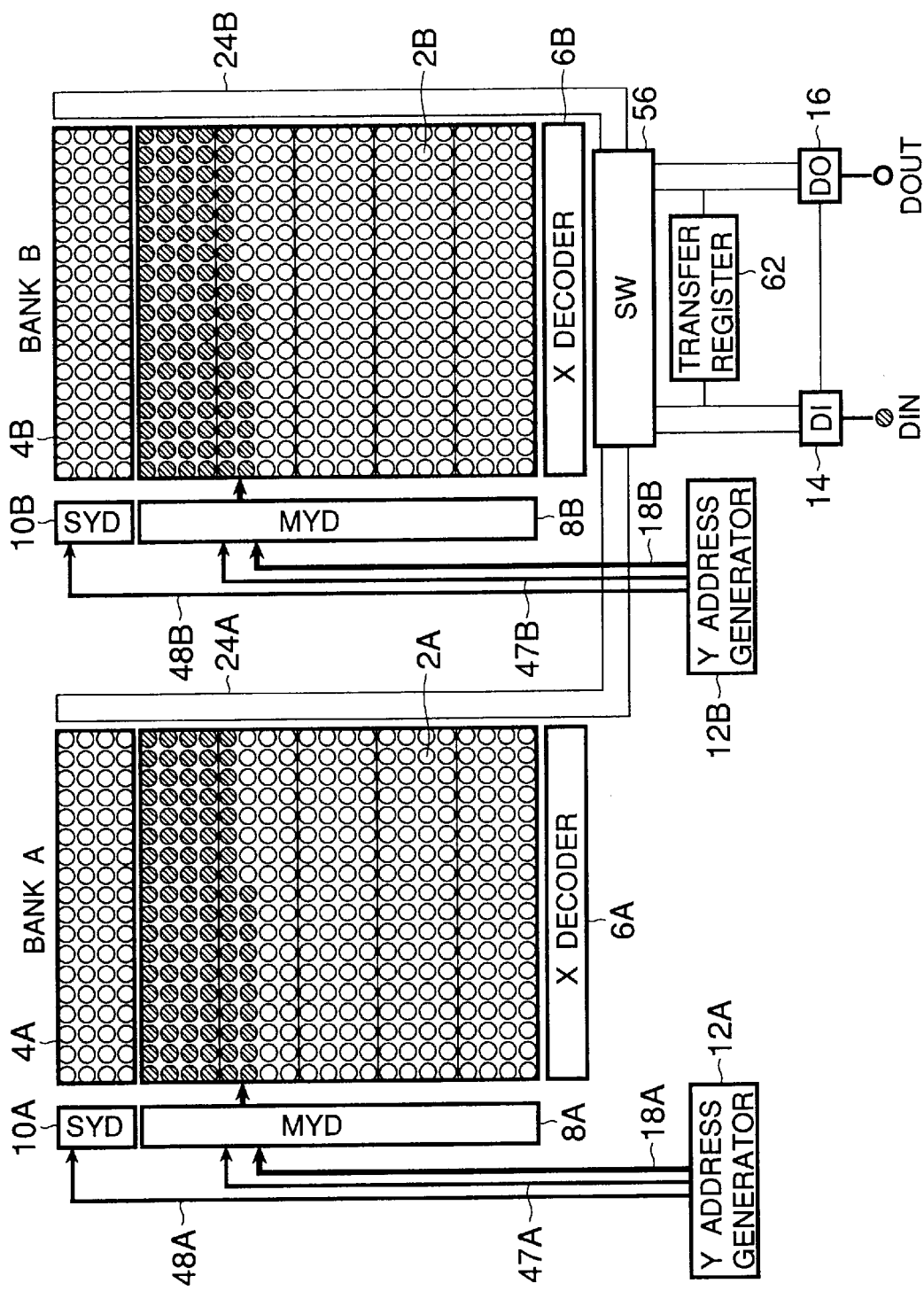
FIG. 41 is a block diagram illustrating a thirteenth embodiment of the invention.

Referring to FIG. 41, the thirteenth embodiment is similar to the eleventh embodiment, but the data buses 24A and 24B are not divided into main and sub parts and do not have write amplifiers. Bus switches 26A and 26B and write amplifiers 28A and 28B in the eleventh embodiment are thus eliminated.

As a new element, the thirteenth embodiment has a transfer register 62 coupled to the bank bus switch 56. The transfer register 62 temporarily stores the data being transferred from the main memory array to the sub memory array in one bank, so that the data can be written into the sub memory array as a background operation while the other bank is being accessed.

Other elements are as shown in FIG. 39, with the same reference numerals. The interconnection between the data input unit 14 and data output unit 16 is shown explicitly in FIG. 41.

Next the operation of the thirteenth embodiment in the non-cascaded field-delay mode will be described, with reference to FIGS. 42 to 47. The timing relationships of the input and output data and control signals are the same as in the corresponding mode in the ninth embodiment, so reference will also be made in the description to timings and data values shown in FIG. 32.

Figure 42:
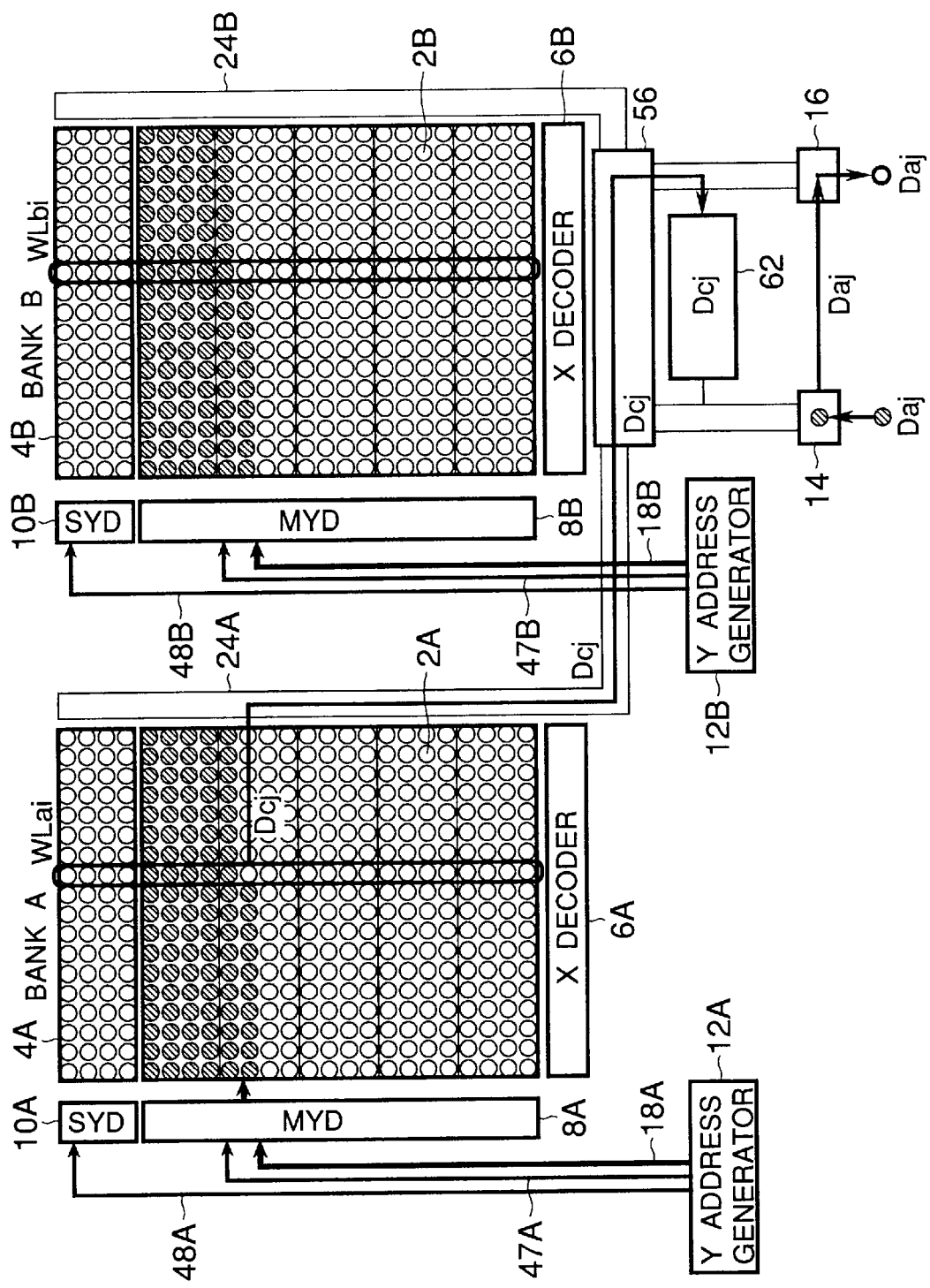
FIGS. 42 to 47 illustrate the operation of the thirteenth embodiment in a non-cascaded mode.

Following input of X and Y addresses Xi and Yj as shown in FIG. 32 (times t1 and t2), word lines WLai and WLbi in FIG. 42 are activated in banks A and B, at the timings described in the ninth embodiment, and the bank bus switch 56 is set so that the data output unit 16 and transfer register 62 are both connected to the data bus 24A of bank A. The old data Dcj stored at this X-Y address (Xi-Yj) In the main memory array 2A of bank A are transferred through the data bus 24A and bank bus switch 56 into the transfer register 62, as indicated by arrows in FIG. 42, and the new input data Daj are transferred from the data input unit 14 to the data output unit 16. Data Daj are output from the data output unit 16 with a read latency of two clock cycles, at time t3 in FIG. 32.

Figure 43:
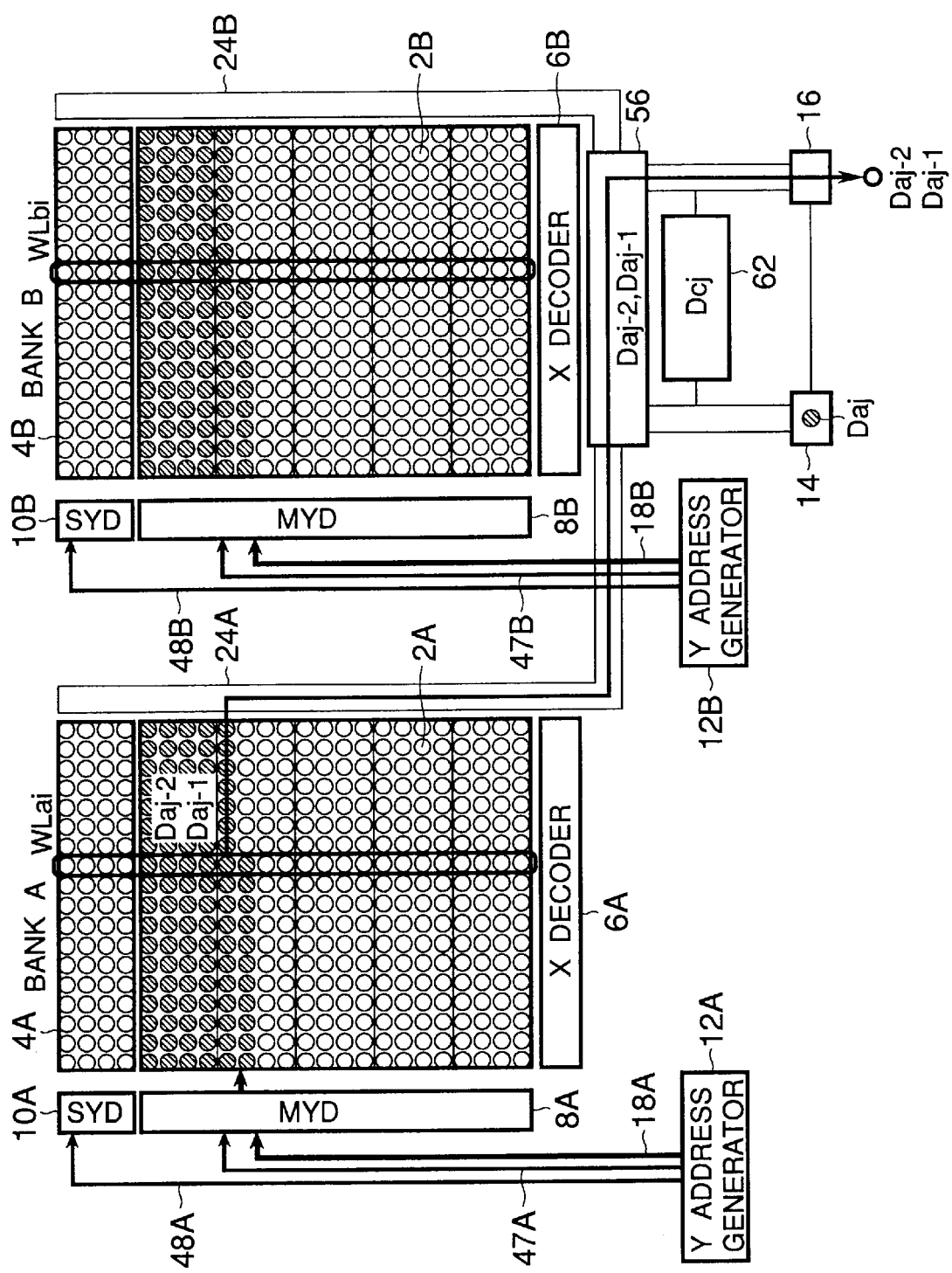

Referring to FIG. 43, following data Dcj, data Daj-1 and Daj-2 are transferred from the main memory array 2A through the data bus 24A and bank bus switch 56 to the data output unit 16, and output from the data output unit 16 in the next two clock cycles after time t3. Data Daj and Dcj remain held in the data input unit 14 and transfer register 62, respectively.

Figure 44:
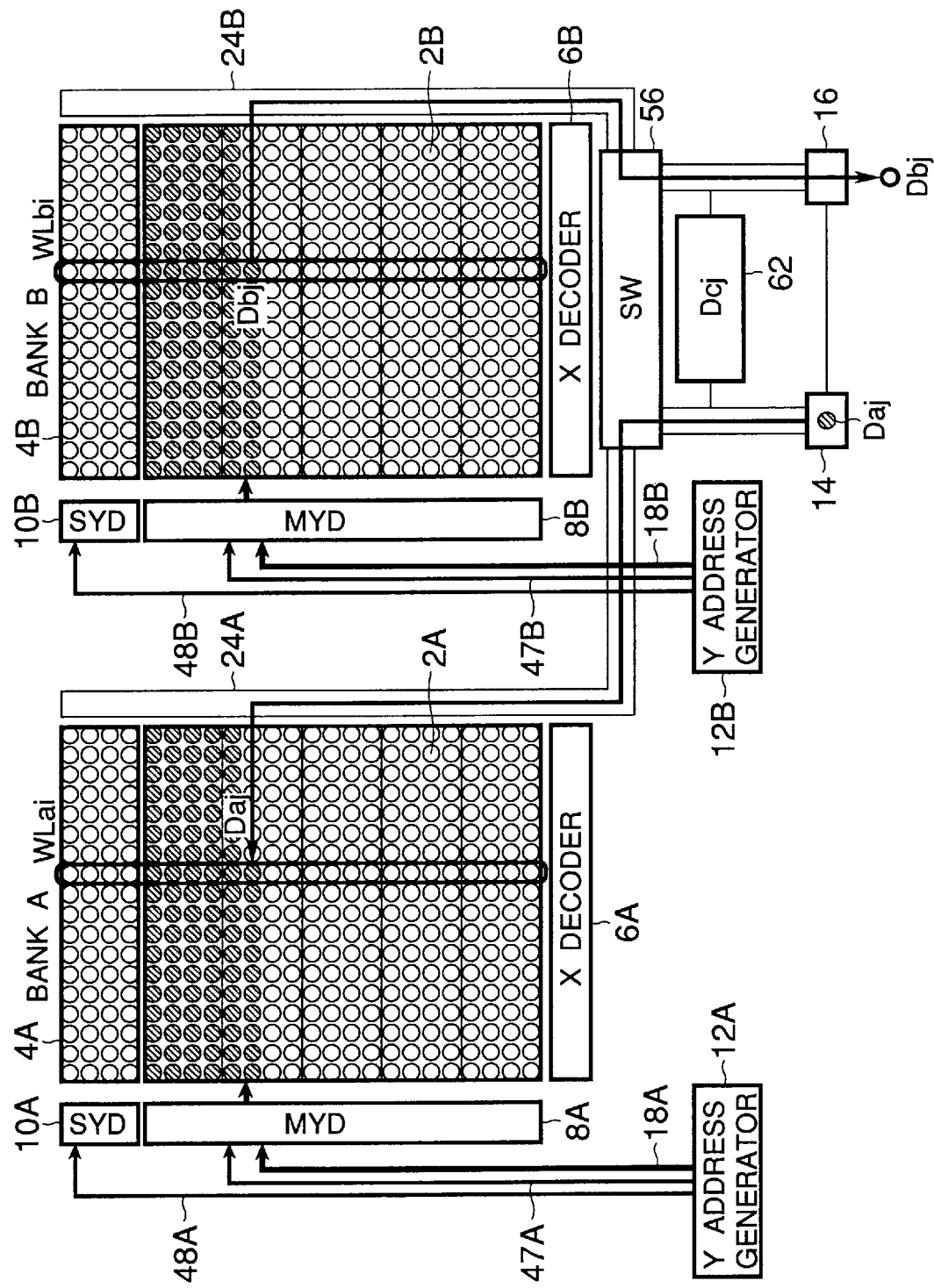

Referring to FIG. 44, following the transfer of data Daj-2 from the main memory array 2A in bank A to the data output unit 16, the setting of the bank bus switch 56 is changed so that the data input unit 14 is connected to the data bus 24A of bank A, while the data output unit 16 is connected to the data bus 24B of bank B. Both Y address generators 12A and 12B now generate column address Yj. The new input data Daj are transferred from the data input unit 14 through the bank bus switch 56 and data bus 24A to the main memory array 2A in bank A, and written into the memory cells formerly occupied by data Dcj. At substantially the same time, data Dbj are transferred from the main memory array 2B in bank B through the data bus 24B and bank bus switch 56 to the data output unit 16, and output following data Daj-2.

Figure 45:
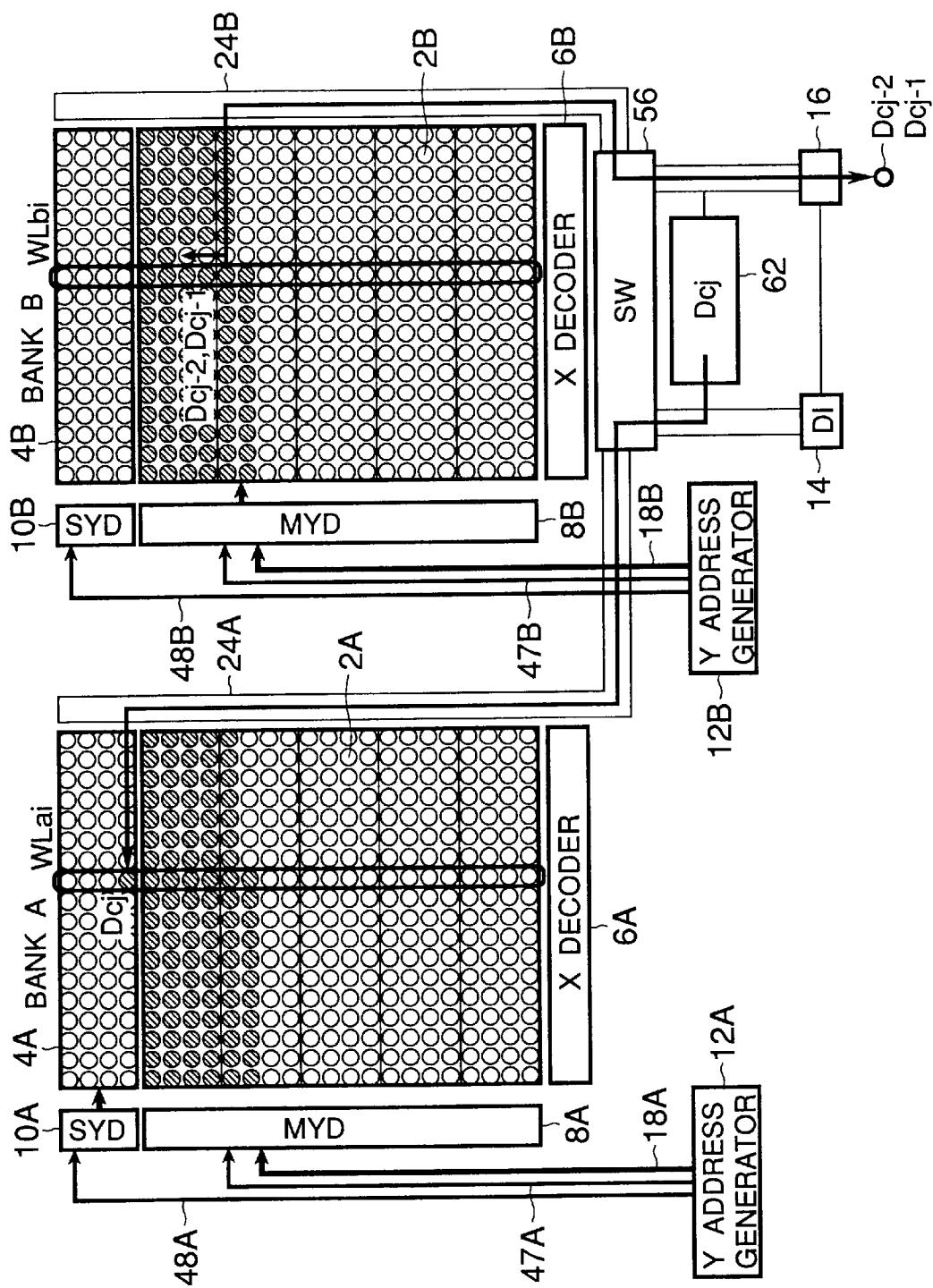

Next, referring to FIG. 45, the Y address generator 12A in bank A can generate any convenient column address, while the Y address generator 12B in bank B counts down to addresses Yj-1 and Yj-2. In these clock cycles, the data Dcj held in the transfer register 62 are transferred through the bank bus switch 56 and data bus 24A to the sub memory array 4A in bank A and written in the memory cells in the column designated by Y address generator 12A, while data Dbj-1 and Dbj-2 are transferred from the main memory array 2B in bank B through data bus 24B and the bank bus switch 56 to the data output unit 16. These data are output from the data output unit 16 following data Dbj.

Figure 46:
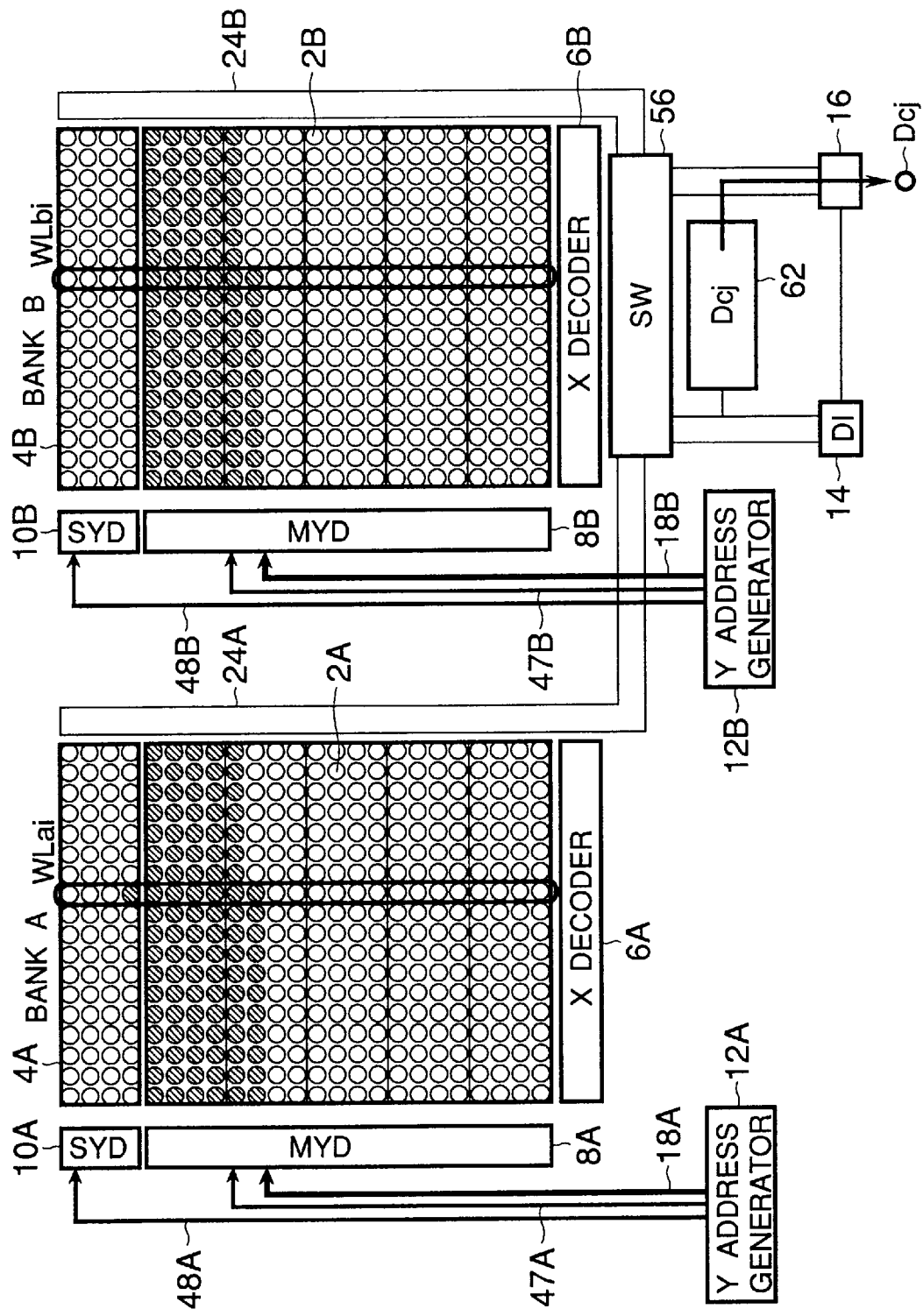

Referring to FIG. 46, the next data to be transferred to and output from the data output unit 16 are the data Dcj held in the transfer register 62. Data Dcj are output from the data output unit 16 at time t4 in FIG. 32.

Figure 47:
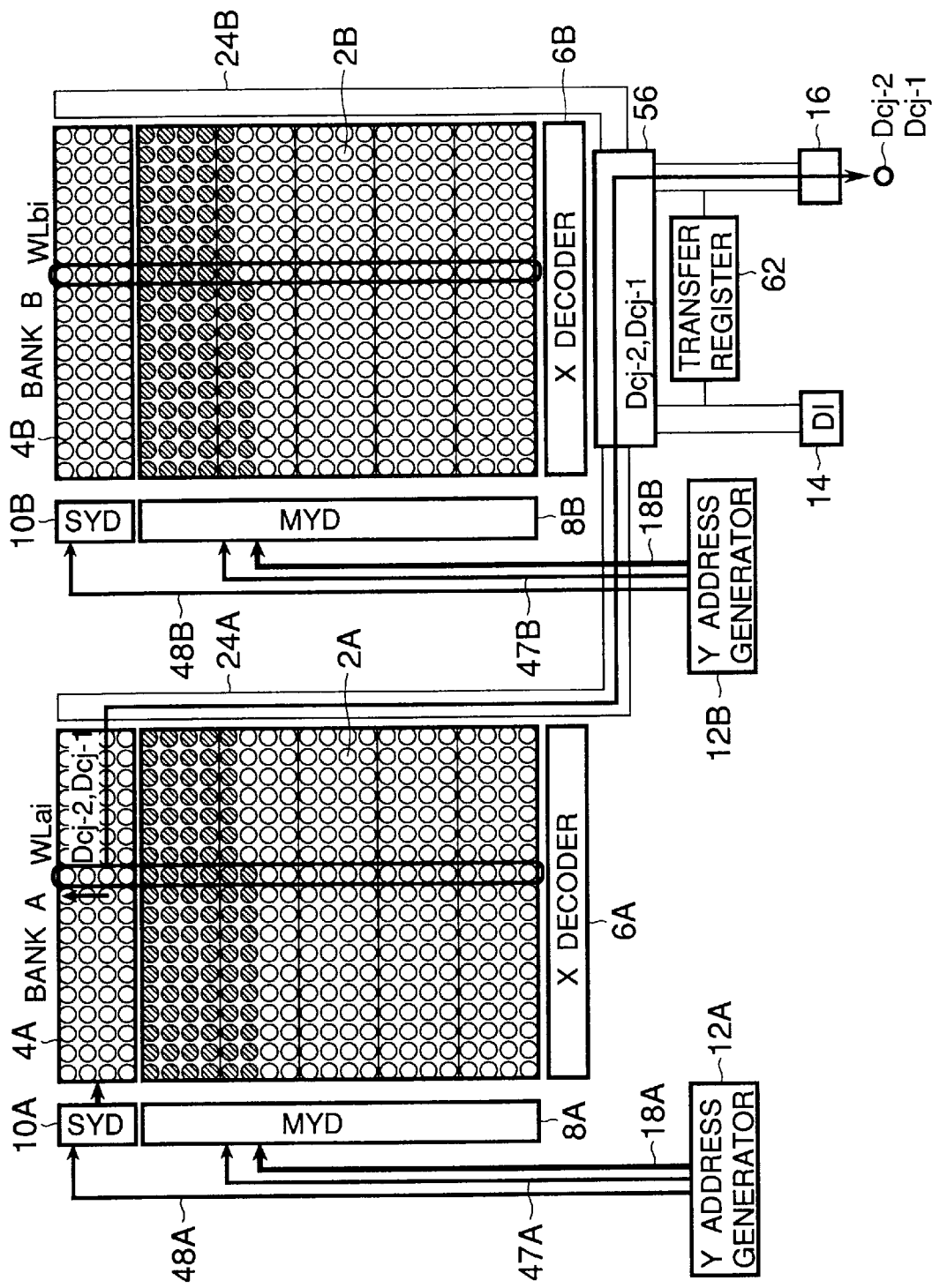

Referring to FIG. 47, the bank bus switch 56 is now switched again, to connect the data output unit 16 to the data bus 24A in bank A, and the Y address generator 12A generates two more column addresses. Data Dcj-1 and Dcj-2 are transferred from the sub memory array 4A in bank A through the data bus 24A and bank bus switch 56 to the data output unit 16, and output following data Dcj, completing the first burst in FIG. 32.

The next burst is performed in the same way, with the roles of banks A and B interchanged.

Figure 48:
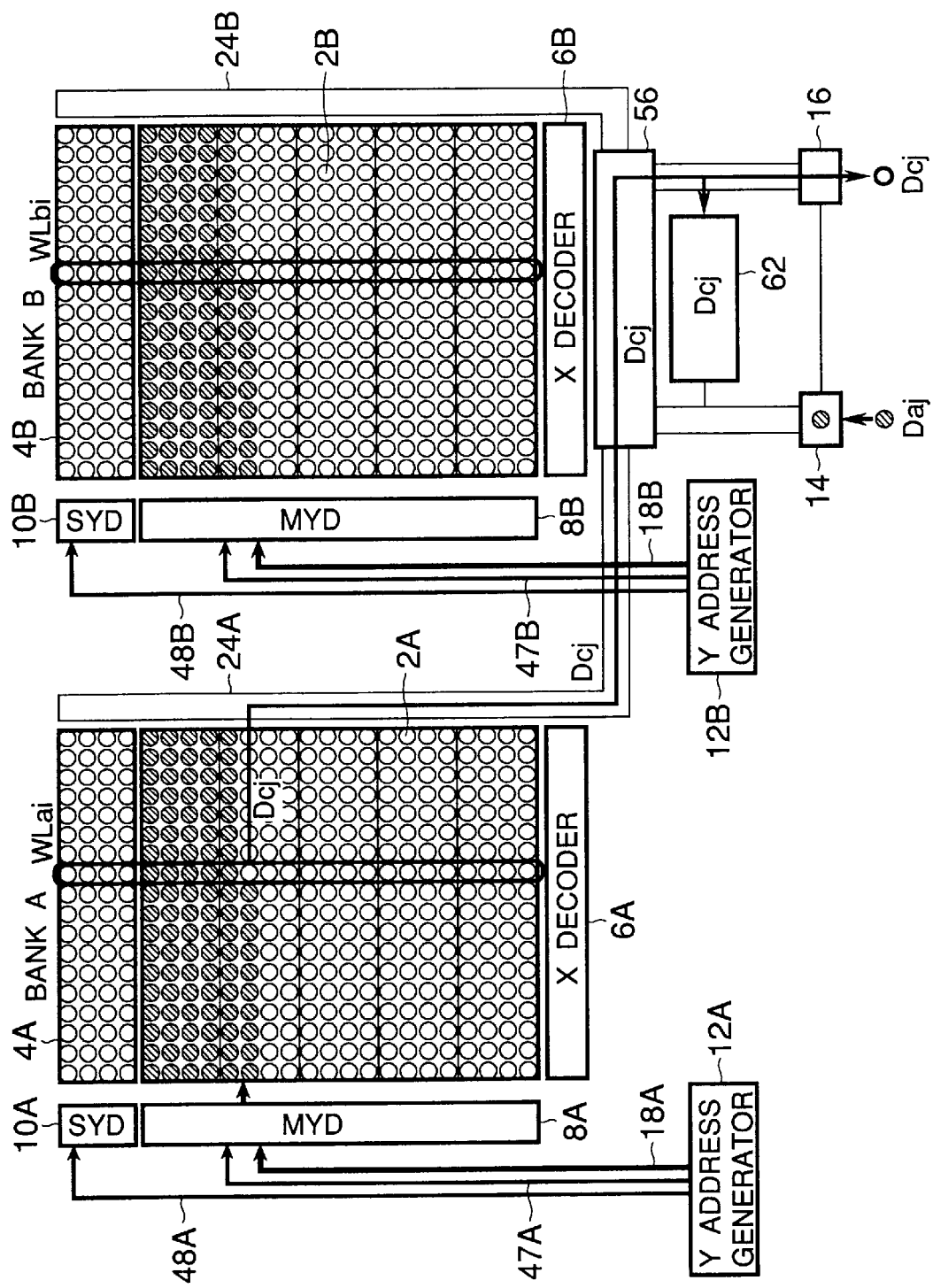
FIG. 48 illustrates the operation of the thirteenth embodiment in a cascaded mode, at the beginning of a burst.

The thirteenth embodiment can also operate in a cascaded mode, as shown in FIG. 31. Internal operations are as described in FIGS. 42 to 47, except that the new data Daj are not transferred from the data input unit 14 to the data output unit 16. Instead, the old data Dcj are transferred to the data output unit 16 and output at the beginning of the burst, input of the new data Daj being timed to coincide with output of the old data Dcj, as illustrated in FIG. 48.

Although the external data input and output sequences and timings are the same in the thirteenth embodiment as in the ninth embodiment, the transfer register 62 relaxes the requirements on internal operations in several ways. As shown in FIG. 45, the writing of data Dcj from the transfer register 62 into the sub memory array 4A is performed in the background during the transfer of data Dbj-1 and Dbj-2 from the main memory array 2B to the data output unit 16, providing an extra timing margin for the amplification of data Dcj on the bit lines in the sub memory array 4A. Furthermore, since data Dcj are transferred out of the main memory array 2A and into the sub memory array 4A in separate operations, the down-counter 30 in Y address generator 12A does not have to be reloaded when access to the sub memory array 4A begins, but can simply keep counting down from its current address. During the entire burst, the down-counter 30 in the Y address generator 12A has to be reloaded only once, before the writing of data Daj into the main memory array 2A, instead of twice as in the ninth embodiment.

In the description above, the writing of data Daj into the main memory array 2A preceded the writing of data Dcj into the sub memory array 4A, but the order of these two operations can be interchanged.

As a variation of the thirteenth embodiment, since data can be stored at arbitrary addresses in the sub memory arrays 4A and 4B, and since the data buses 24A and 24B are not divided into main and sub parts, the invention can be practiced with a single memory array, a single Y decoder, and a single Y address bus in each bank, part of the single memory array in each bank being reserved for use as a sub part, to which data that are about to be overwritten are transferred from the other (main) part of the same array.

Next, five more embodiments related to the thirteenth embodiment will be described, using the same reference numerals as in FIG. 41 for equivalent elements.

Fourteenth embodiment

Figure 49:
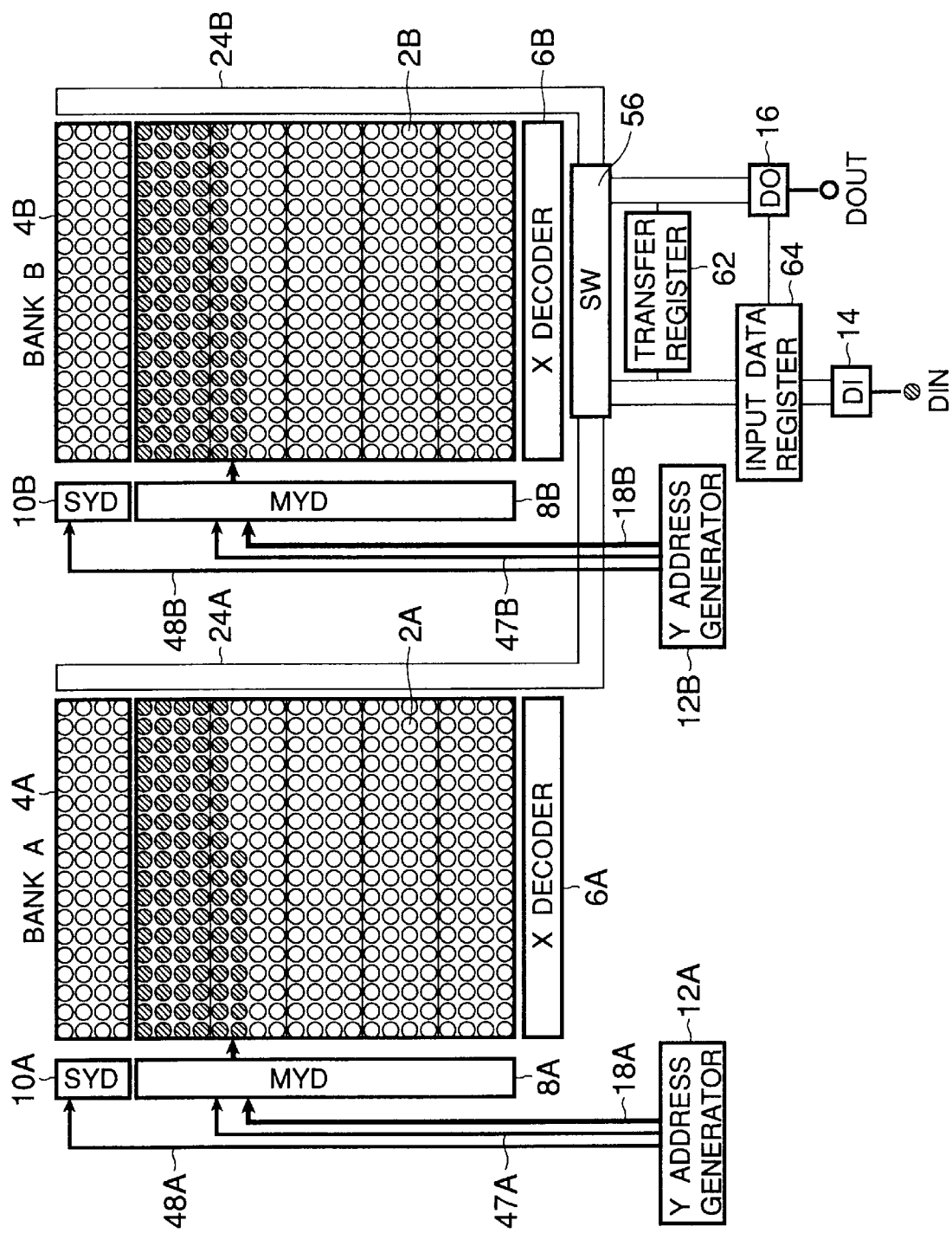
FIG. 49 is a block diagram illustrating a fourteenth embodiment of the invention.

Referring to FIG. 49, the fourteenth embodiment has an input data register 64 coupled between the data input unit 14 and bank bus switch 56. Input data are transferred from the data input unit 14 to the input data register 64, then held in the input data register 64 while waiting to be written into one of the main memory arrays.

Aside from this difference, the fourteenth embodiment operates in the same way as the thirteenth embodiment, so a detailed description will be omitted.

The input data register 64 allows an extra degree of freedom in the timing of internal operations of the memory device. Another advantage is that the input data can be stored closer to the memory arrays, as there may be considerable distance, in terms of signal line length and signal propagation time, between the data input unit 14 and bank bus switch 56.

Fifteenth embodiment

Figure 50:
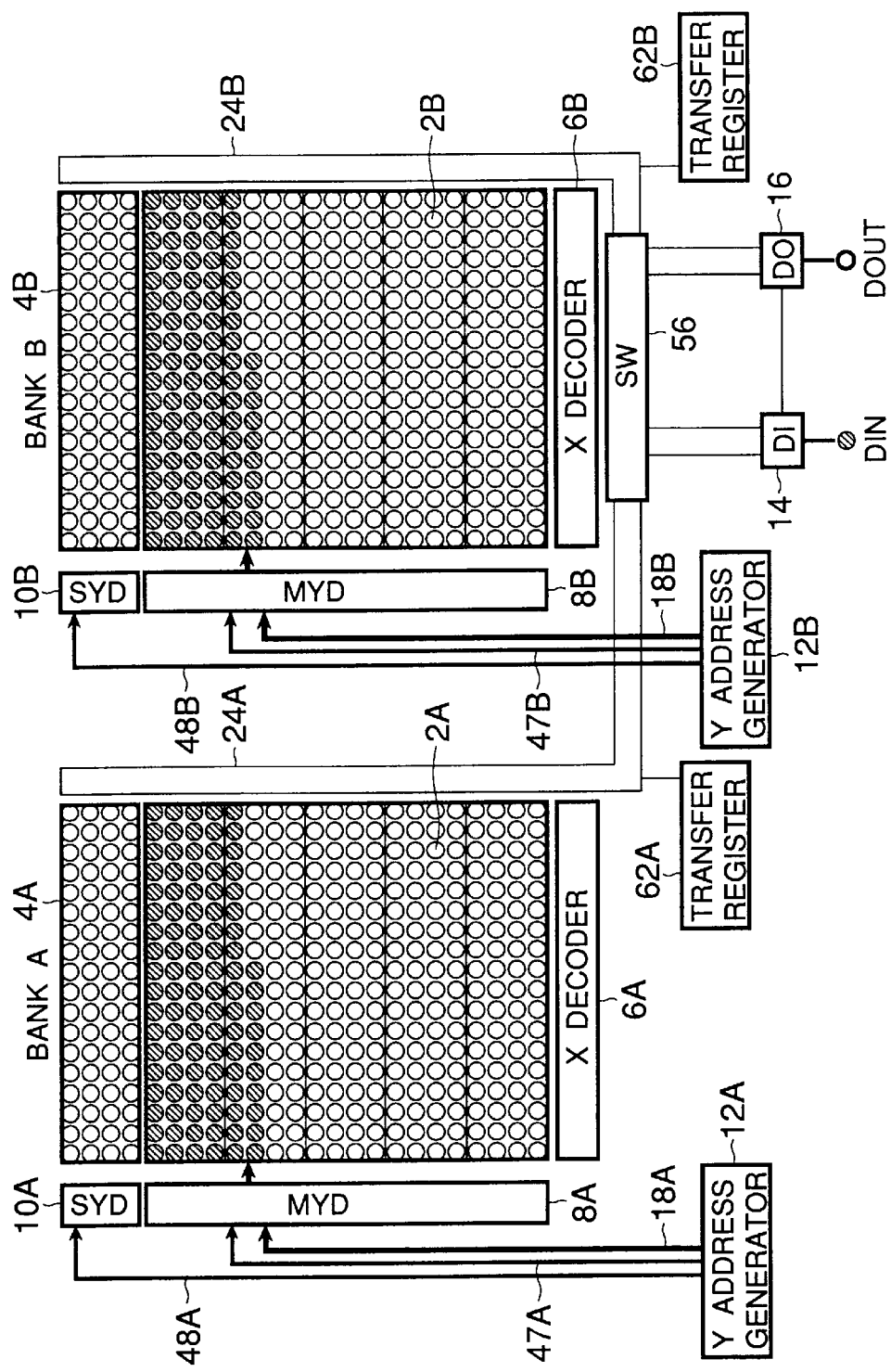
FIG. 50 is a block diagram illustrating a fifteenth embodiment of the invention.

Referring to FIG. 50, the fifteenth embodiment is identical to the thirteenth embodiment, except that in place of a single transfer register 62, separate transfer registers 62A and 62B are coupled to the data buses 24A and 24B in banks A and B. This arrangement enables data to be transferred from the main memory array to the transfer register in each bank, and from the transfer register to the sub memory in each bank, without passing through the bank bus switch 56, so the transfer does not have to overcome the electrical resistance of the bank bus switch 56.

Sixteenth embodiment

Figure 51:
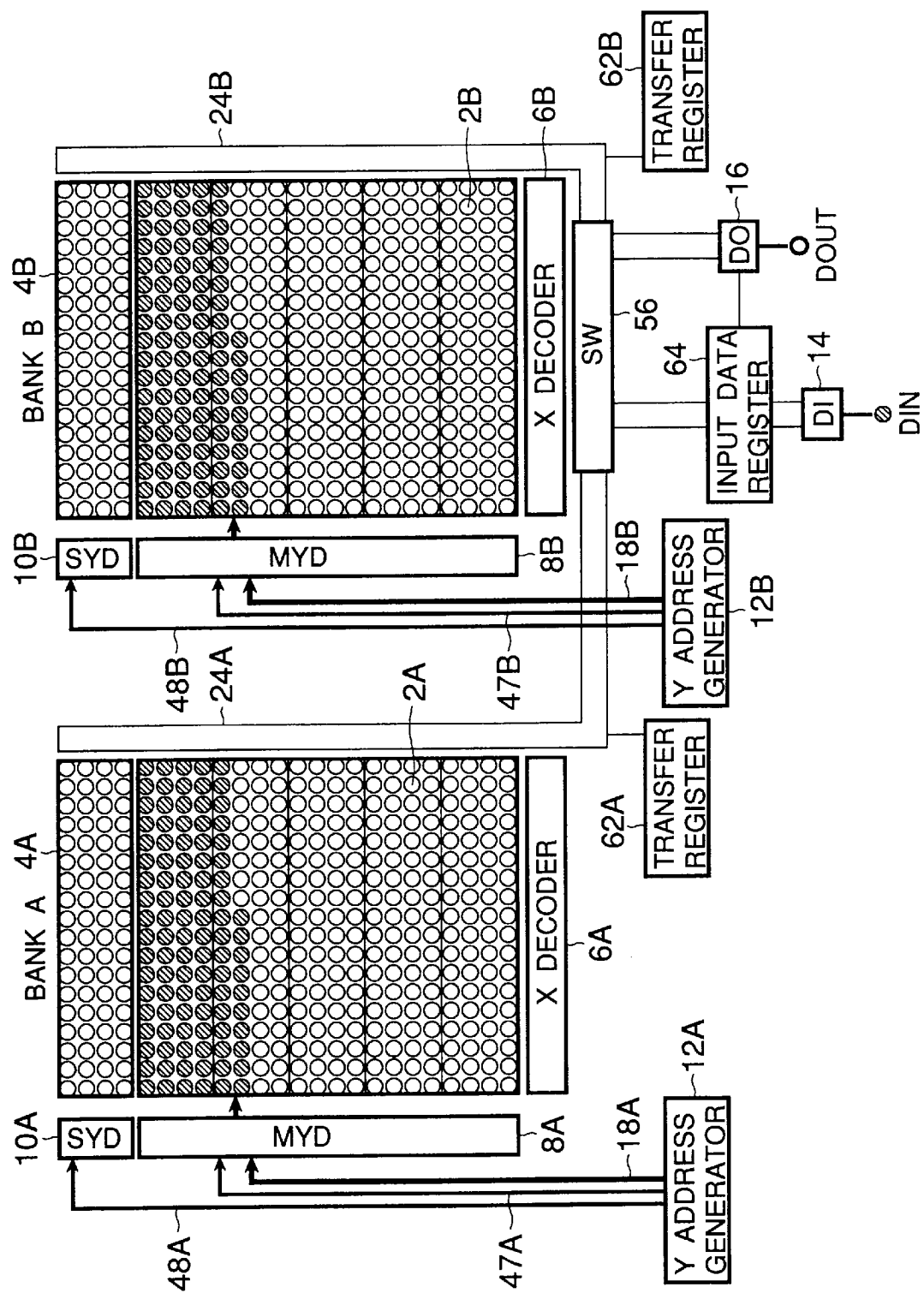
FIG. 51 is a block diagram illustrating a sixteenth embodiment of the invention.

Referring to FIG. 51, the sixteenth embodiment combines the features of the fourteenth and fifteenth embodiments, having an input data register 64 as in the fourteenth embodiment, and separate transfer registers 62A and 62B as in the fifteenth embodiment. The advantages of this arrangement are as described above.

Seventeenth embodiment

Figure 52:
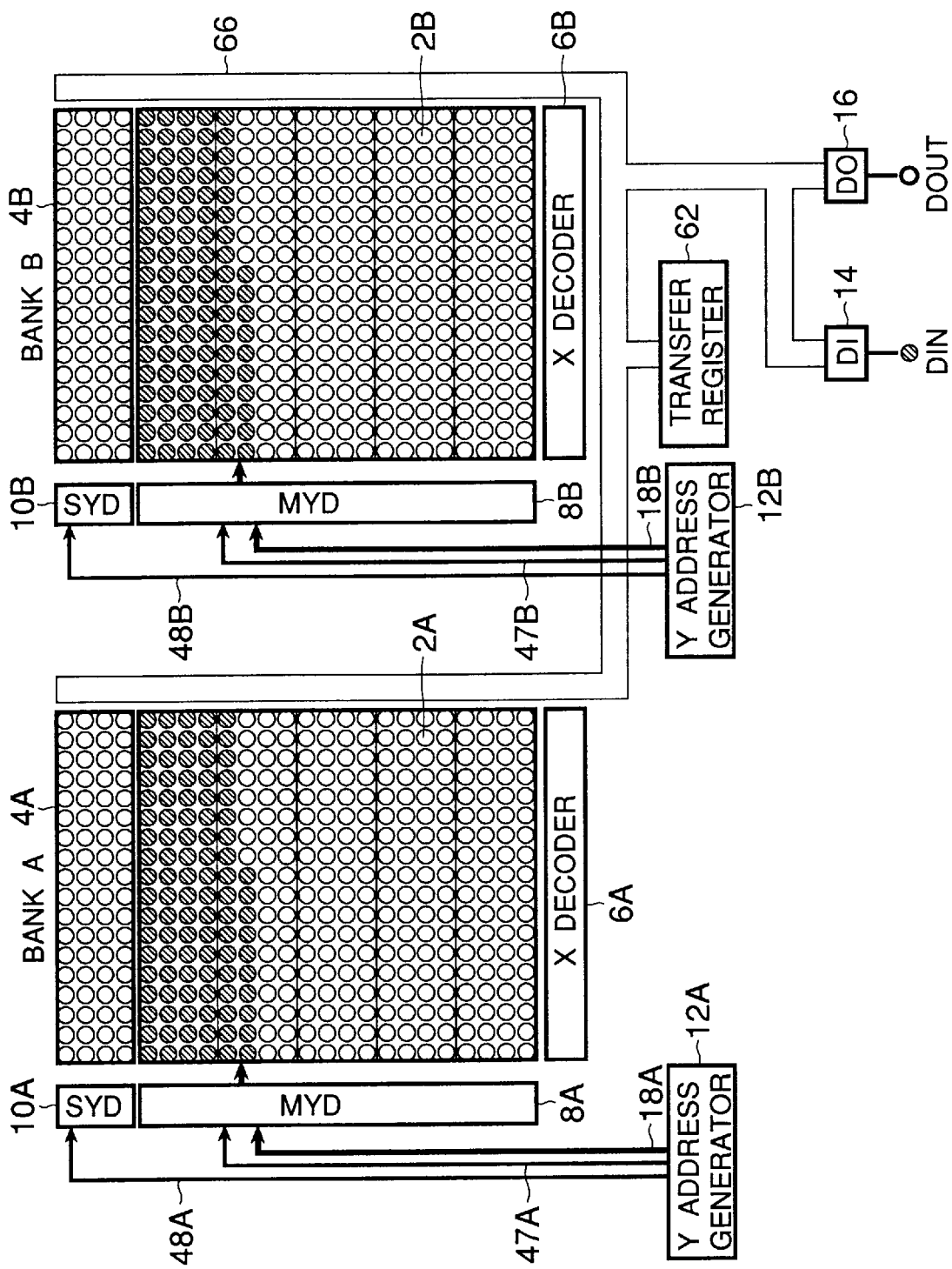
FIG. 52 is a block diagram illustrating a seventeenth embodiment of the invention.

Referring to FIG. 52, the seventeenth embodiment employs a single full-duplex data bus 66 for both banks A and B, eliminating the bank bus switch 56 of the thirteenth embodiment. A full-duplex data bus is a data bus that can carry data in the read and write directions simultaneously without collision. The data bus 66 is coupled directly to the data input unit 14, data output unit 16, and transfer register 62.

Other elements are as described in the thirteenth embodiment, and have the same reference numerals.

The seventeenth embodiment operates in substantially the same way as the thirteenth embodiment, without the need for data bus switching, and without the electrical resistance of the bank bus switch.

Eighteenth embodiment

Figure 53:
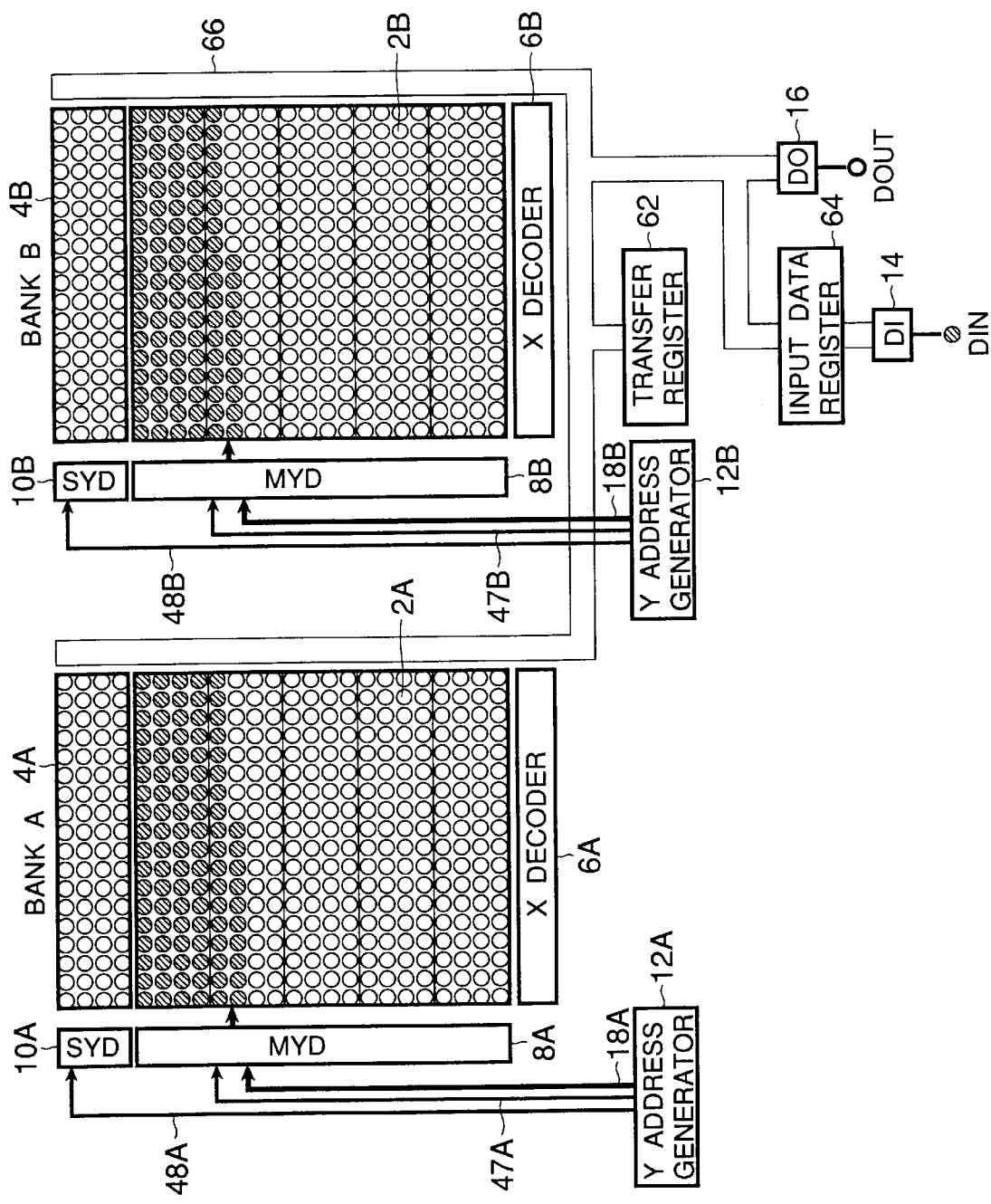
FIG. 53 is a block diagram illustrating an eighteenth embodiment of the invention.

Referring to FIG. 53, the eighteenth embodiment combines the features of the fourteenth and seventeenth embodiments, employing a full-duplex data bus 66 which is coupled to the data output unit 16, transfer register 62, and input data register 64, the input data register 64 being coupled to the data input unit 14. The advantages of this arrangement are as described above.

Nineteenth embodiment

Figure 54:
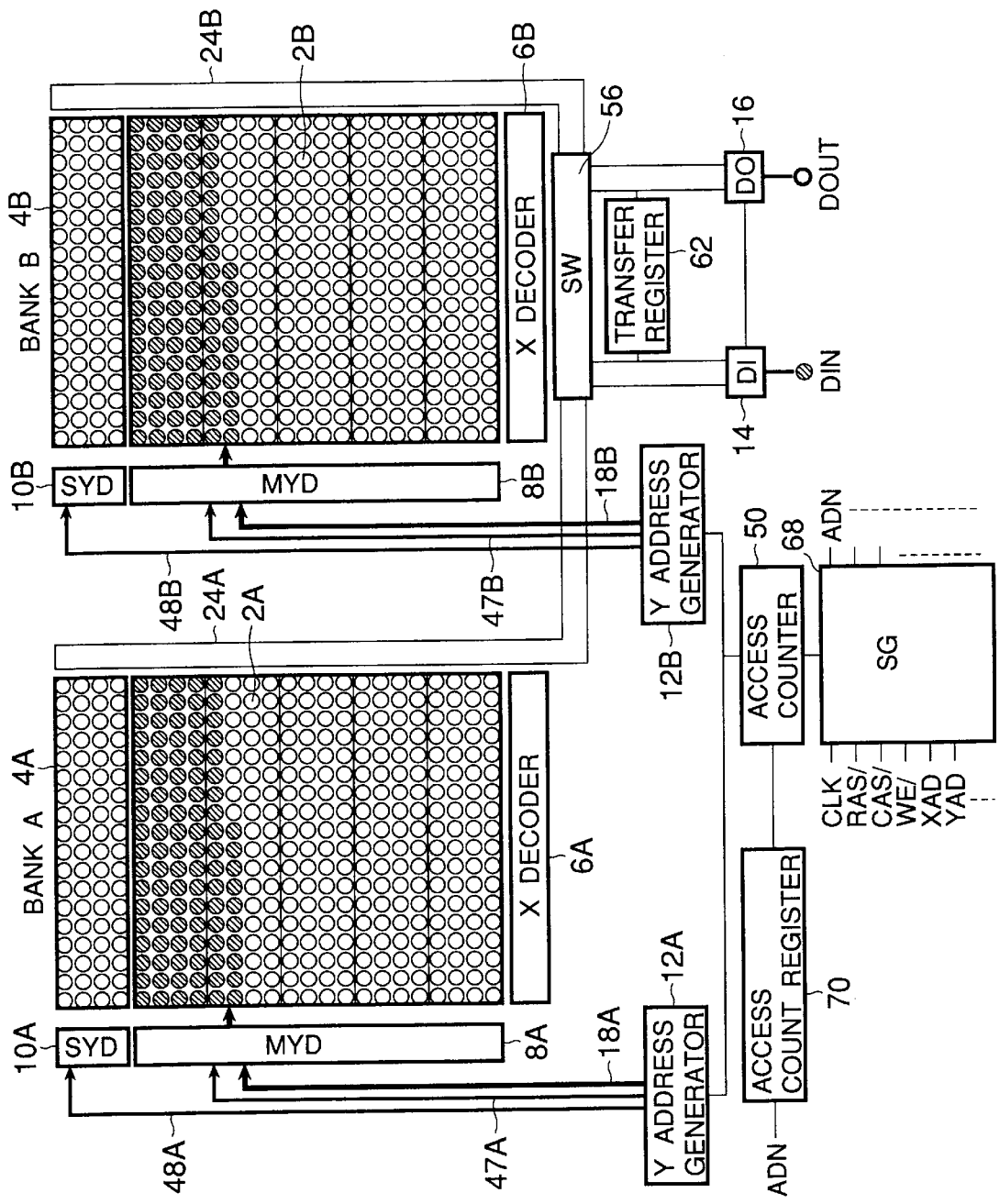
FIG. 54 is a block diagram illustrating a nineteenth embodiment of the invention.

Referring to FIG. 54, the nineteenth embodiment differs from the thirteenth embodiment in regard to the configuration of the Y address generators 12A and 12B. In the thirteenth embodiment, each Y address generator separately included an access counter 50 for controlling the number of addresses generated by the down-counter 30. In the nineteenth embodiment, both Y address generators 12A and 12B share the same access counter 50. The shared access counter 50 is controlled by the memory control signal generator (SG) 68 which was omitted from earlier drawings for simplicity. Also provided in the nineteenth embodiment is an access count register 70 that stores an initial value ADN for the access counter 50, this value being supplied from the memory control signal generator 68.

The other elements of the nineteenth embodiment, including the transfer register 62, are the same as in the thirteenth embodiment, and have the same reference numerals.

The nineteenth embodiment provides an efficient way to control the Y address generators 12A and 12B so that each Y address generator always generates a fixed number of consecutive addresses. The memory control signal generator 68 can simply place the appropriate fixed number ADN in the access count register 70, then command the access counter 50 to reload this fixed number ADN at appropriate times, and let the access counter 50 control both Y address generators 12A and 12B.

This mode of control is useful in filtering operations that require the same number of pixels from each of three fields, as illustrated in FIGS. 31 and 32, for example.

Twentieth embodiment

Figure 55:
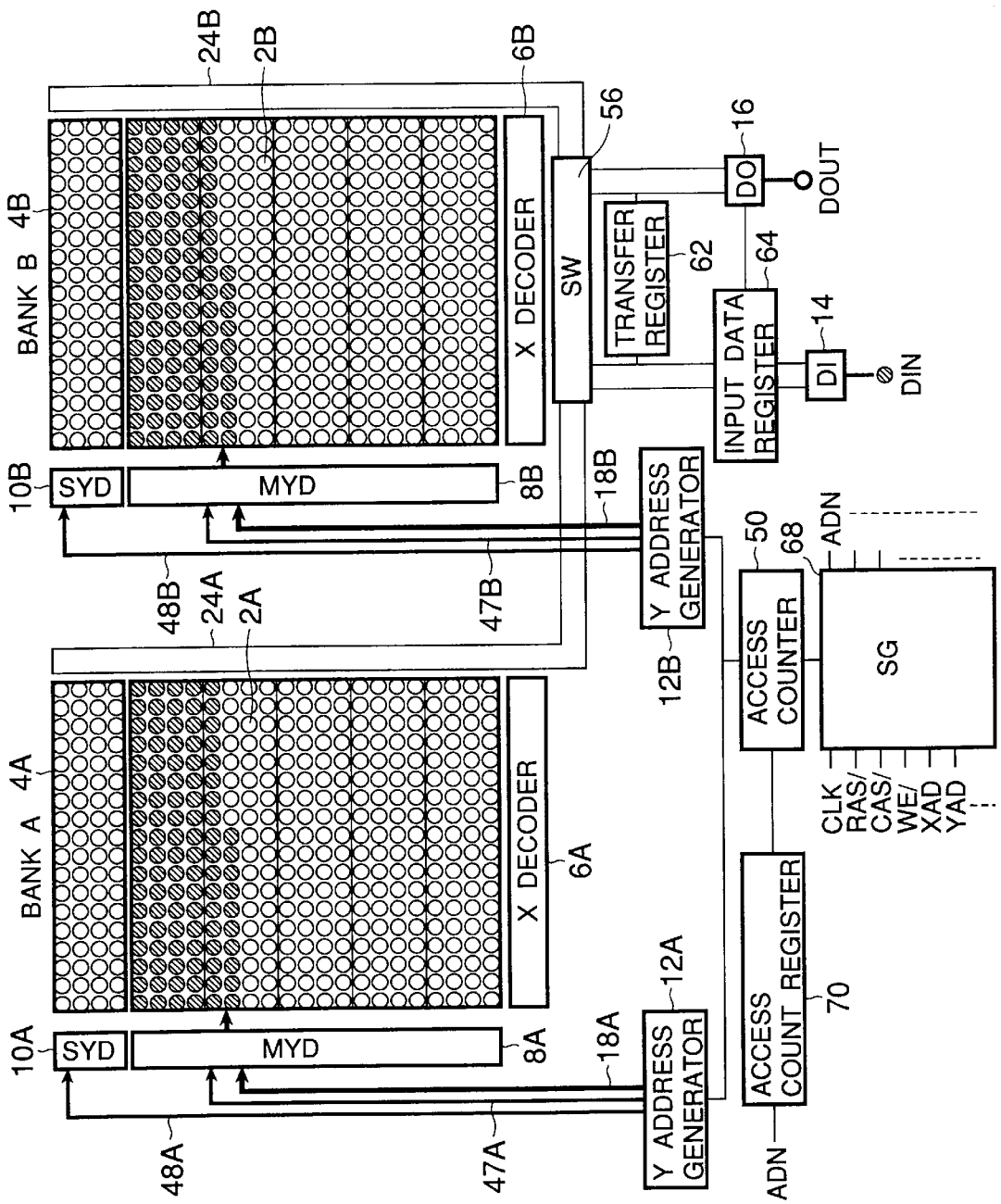
FIG. 55 is a block diagram illustrating a twentieth embodiment of the invention.

Referring to FIG. 55, the twentieth embodiment combines the features of the fourteenth and nineteenth embodiments, having a transfer register 62, an input data register 64, a shared access counter 50 controlled by the memory control signal generator 68, and an access count register 70 for storing a fixed value ADN, which the access counter 50 uses to control the number of consecutive addresses generated by the Y address generators 12A and 12B. The advantages of the twentieth embodiment are as described above.

Twenty-first embodiment

Figure 56:
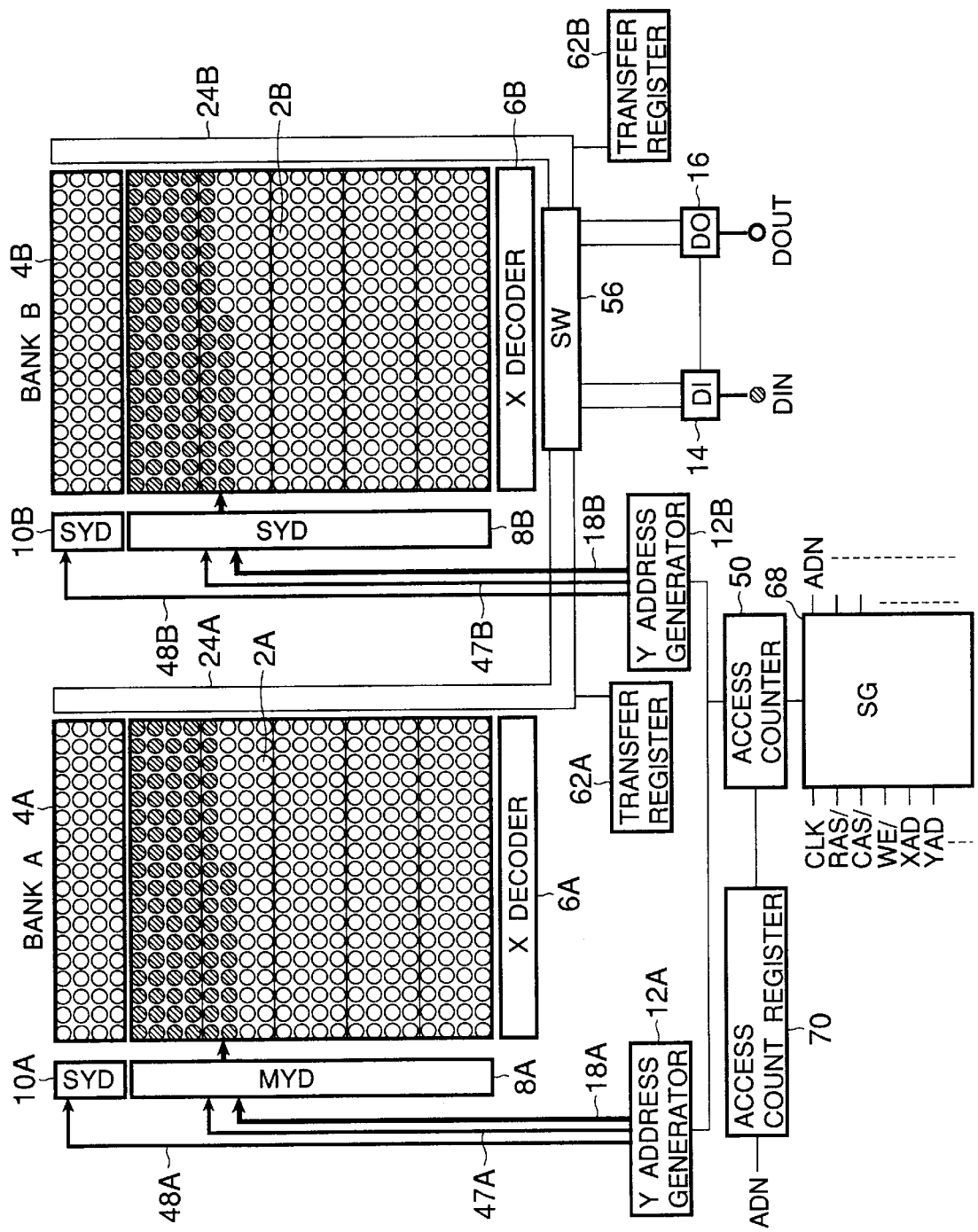
FIG. 56 is a block diagram illustrating a twenty-first embodiment of the invention.

Referring to FIG. 56, the twenty-first embodiment combines the features of the fifteenth and nineteenth embodiments, having separate transfer registers 62A and 62B coupled to the data buses 24A and 24B in banks A and B, in place of the single transfer register 62 of the nineteenth embodiment. The advantages of the twenty-first embodiment are as described above.

Twenty-second embodiment

Figure 57:
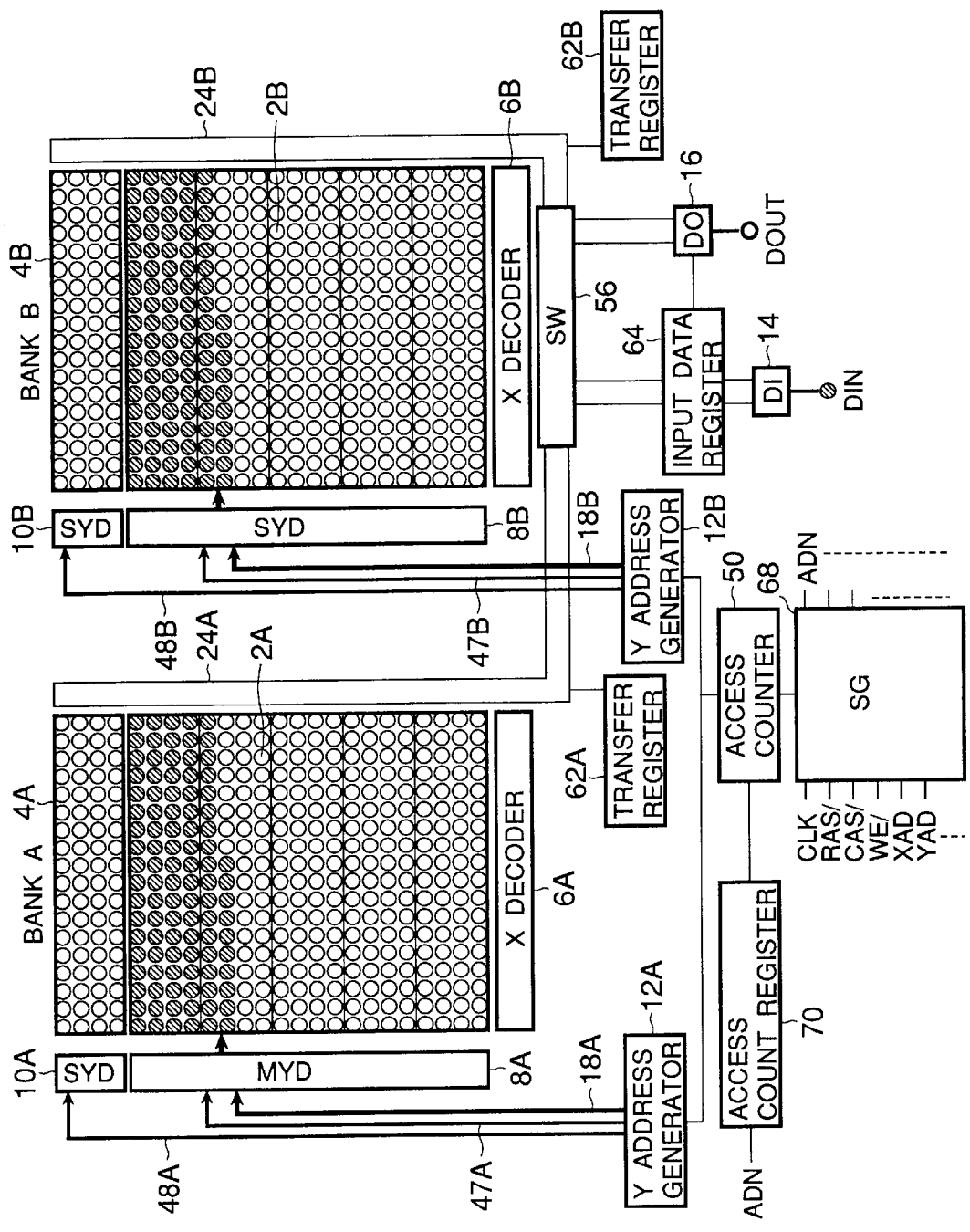
FIG. 57 is a block diagram illustrating a twenty-second embodiment of the invention.

Referring to FIG. 57, the twenty-second embodiment combines the features of the sixteenth and nineteenth embodiments, having an input data register 64, separate transfer registers 62A and 62B coupled to the data buses 24A and 24B in banks A and B, and other elements as shown in the nineteenth embodiment. The advantages of the twenty-second embodiment are as described above.

Twenty-third embodiment

Figure 58:
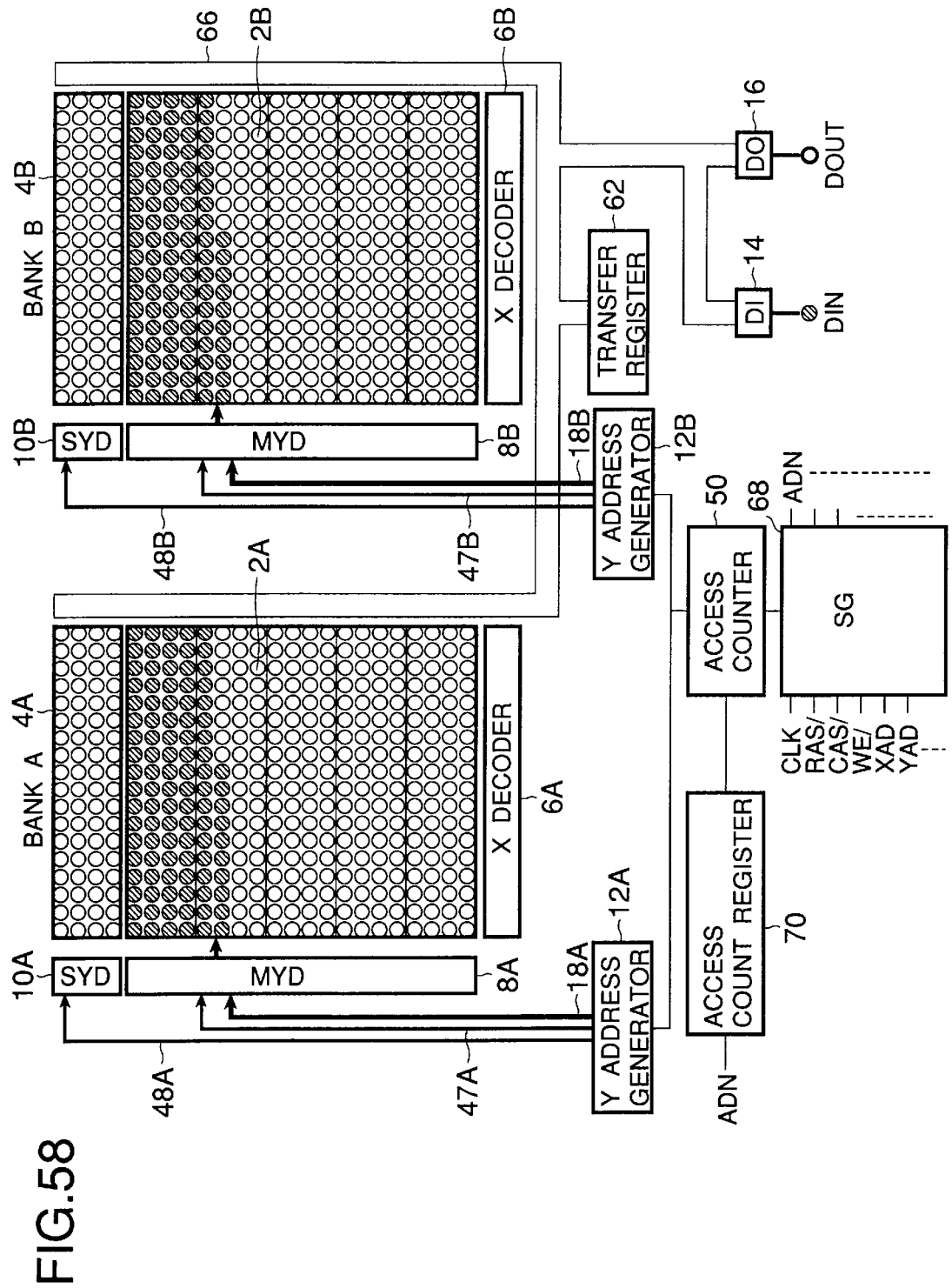
FIG. 58 is a block diagram illustrating a twenty-third embodiment of the invention.

Referring to FIG. 58, the twenty-third embodiment combines the features of the seventeenth and nineteenth embodiments, having a full-duplex data bus 66 coupled to the data input unit 14, data output unit 16, and transfer register 62, and other elements as shown in the nineteenth embodiment. The advantages of the twenty-third embodiment are as described above.

Twenty-fourth embodiment

Figure 59:
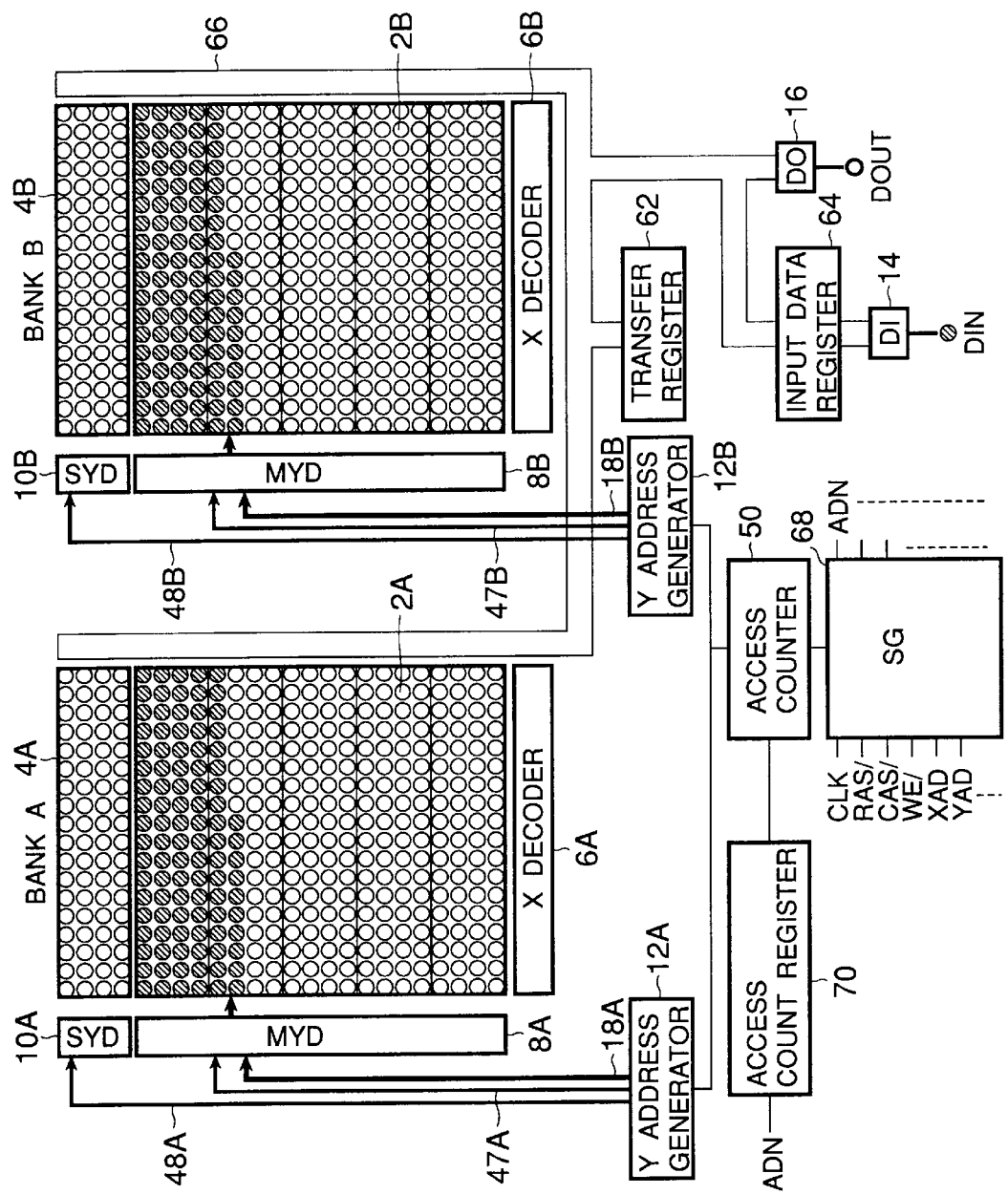
FIG. 59 is a block diagram illustrating a twenty-fourth embodiment of the invention.

Referring to FIG. 59, the twenty-fourth embodiment combines the features of the eighteenth and nineteenth embodiments, having a full-duplex data bus 66 coupled to the data output unit 16, transfer register 62, and input data register 64, and other elements as shown in the nineteenth embodiment. The advantages of the twenty-fourth embodiment are as described above.

Twenty-fifth embodiment

Figure 60:
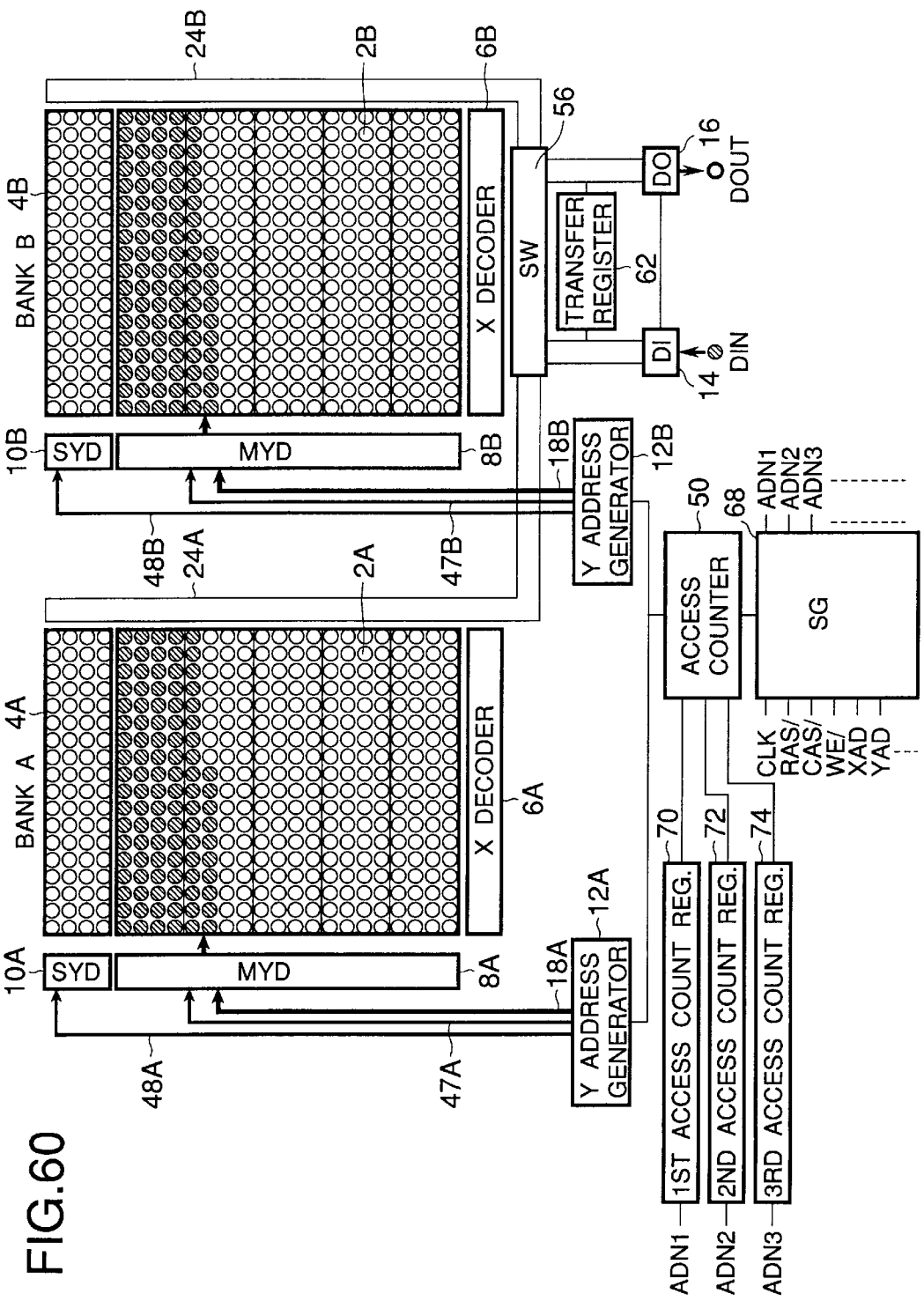
FIG. 60 is a block diagram illustrating a twenty-fifth embodiment of the invention.

Referring to FIG. 60, the twenty-fifth embodiment adds two more access count registers 72 and 74 to the configuration of the nineteenth embodiment. The first access count register 70 holds a value ADN1 corresponding to the number of pixels required from the first field accessed in a burst. The second and third access count registers 72 and 74 hold values ADN2 and ADN3 corresponding to the number of pixels required from the second and third fields. All three values ADN1, ADN2, and ADN3 are supplied by the memory control signal generator 68.

The twenty-fifth embodiment is useful in filtering operations that require data for different numbers of pixels in different fields, as illustrated in FIGS. 36 and 37, for example. For the operation illustrated in FIGS. 36 and 37, ADN1, ADN2, and ADN3 can be set to five, three, and five, respectively. ADN1 is used to control the first part of a burst, in which data are read from, for example, the main memory array 2A in bank A. ADN2 is used to control the second part of the burst, in which data are read from, for example, the main memory array 2B in bank B. ADN3 is used to control the third part of the burst, in which data are read from, for example, the sub memory array 4A in bank A.

Twenty-sixth embodiment

Figure 61:
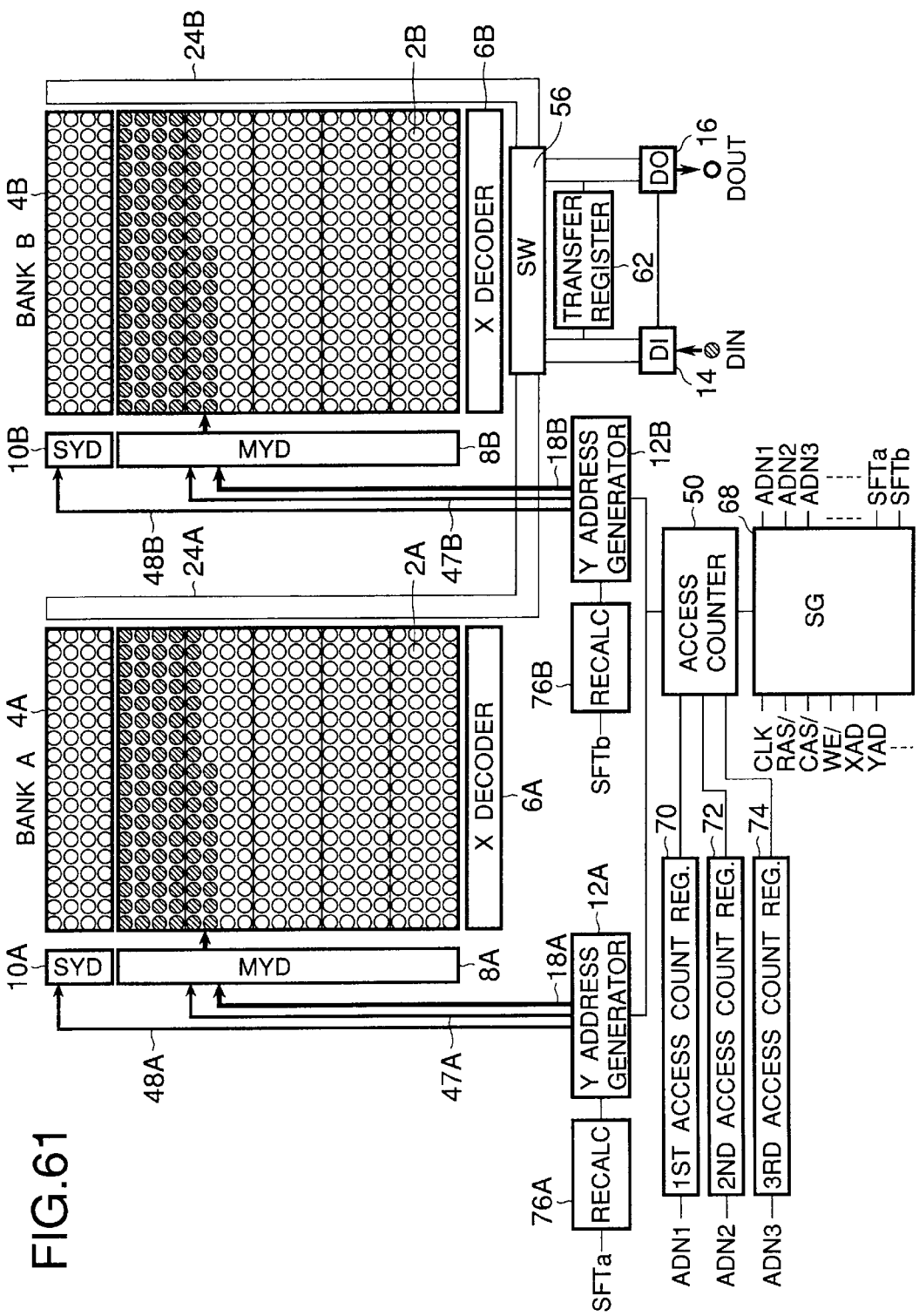
FIG. 61 is a block diagram illustrating a twenty-sixth embodiment of the invention.

Referring to FIG. 61, the twenty-sixth embodiment adds a pair of address recalculators (RECALC) 76A and 76B to the configuration of the twenty-fifth embodiment. Address recalculator 76A, which is coupled to the Y address generator 12A in bank A, recalculates the starting Y address value used by the Y address generator 12A, in response to a shift control signal SFTa output by the memory control signal generator 68. Address recalculator 76B, coupled to the Y address generator 12B in bank B, does likewise for the starting Y address value used by Y address generator 12B, in response to a shift control signal SFTb output by the memory control signal generator 68.

The twenty-sixth embodiment is particularly useful in a type of filtering employed in conversion from interlaced to progressive scanning. This will be illustrated in FIGS. 62 to 64, which show vertical cross-sections through several consecutive fields distributed along the time axis.

Figure 62:
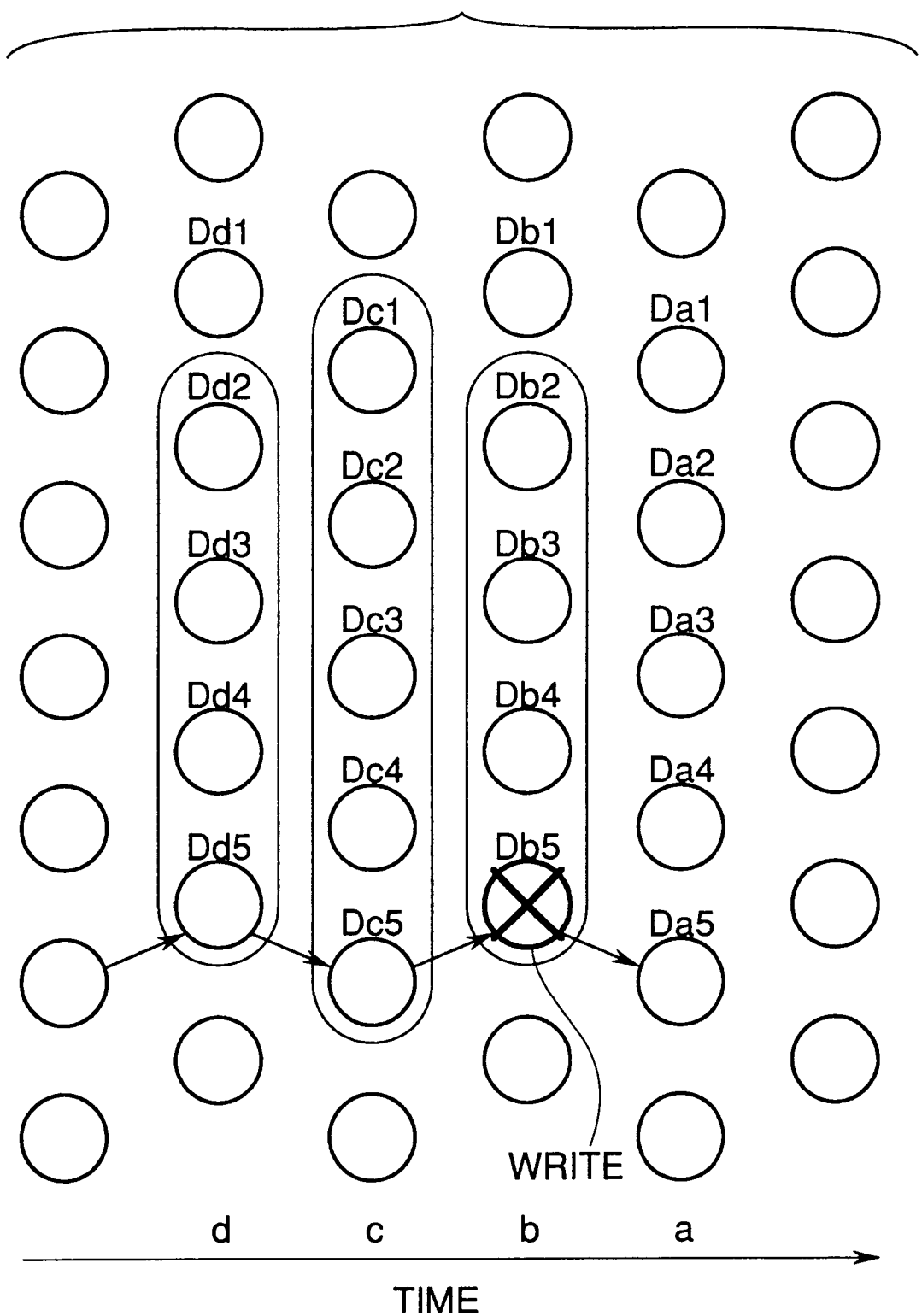

Referring to FIG. 62, in interlaced scanning, pixels in the even fields (fields a and c) are disposed in the spaces between pixels in the odd fields (fields b and d). To produce a filtered pixel value at the position of pixel Dc3, a typical filtering process requires the values of five pixels from even field c (Dc1 to Dc5), four pixels from the preceding odd field d (Dd2 to Dd5), and four pixels from the following odd field b (Db2 to Db5).

These data could be produced in a single burst by the twenty-fifth embodiment, because pixels Dd5, Dc5, and Db5 all have the same column address when stored in the memory device, as indicated by the arrows. That is, the starting column address is the same in all three fields b, c, and d. It would only be necessary to assign values of four to ADN1 and ADN3 and a value of five to ADN2. The X mark on pixel Db5 indicates that this is where the new pixel data will be written over old pixel data during the burst.

Conversion to progressive scanning also calls for the production of a new pixel disposed midway between pixels Dc2 and Dc3 in field c, however, requiring the data indicated in FIG. 63: pixels Dd1 to Dd5 in field d, pixels Dc1 to Dc4 in field c, and pixels Db1 to Db5 in field b. These data could not be produced as conveniently by the twenty-fifth embodiment, since the starting address in field c (the column address of Dc4) differs from the starting addresses in fields b and d (the column addresses of Dd5 and Db5).

FIG. 64 indicates the pixel data required for conversion of the pixel value Db3 in odd field b, these data being Dc1 to Dc4 from field c, Db1 to Db5 from field b, and Da1 to Da4 from field a. In this case, not only does the starting column address in field b differ from the starting column address in fields a and c, but the new input pixel data Da5 are not part of the output burst.

The twenty-sixth embodiment can deal with all of these cases. A detailed description of the operations for FIGS. 62 and 64 will be given next.

Figure 65:
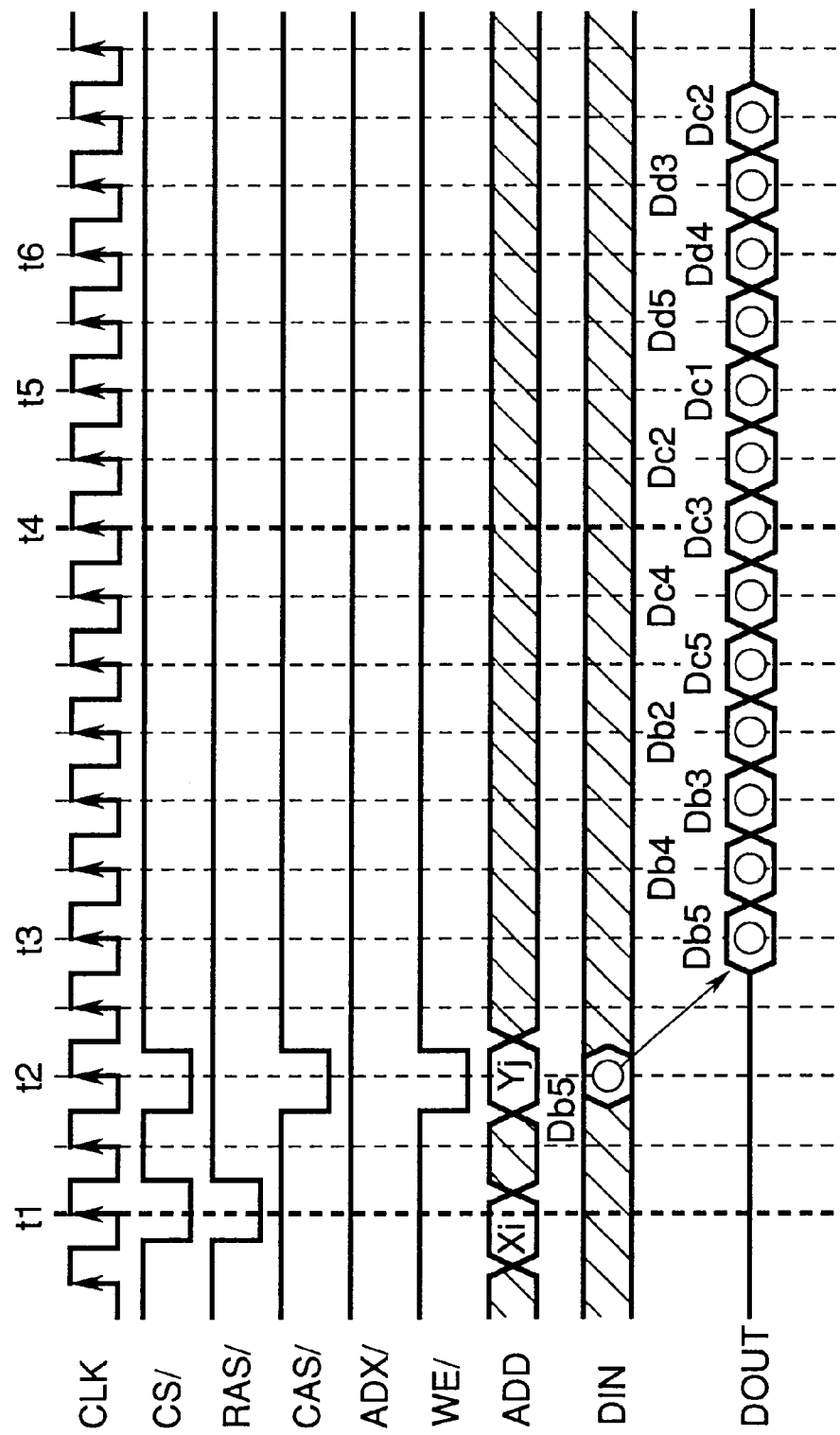
FIG. 65 is a timing diagram illustrating burst access to the pixel data in FIG. 62 in the twenty-sixth embodiment.

For the burst in FIG. 62, the memory control signal generator 68 sets ADN1 to four, ADN2 to five, ADN3 to four, and SFTa and SFTb both to zero. FIG. 65 illustrates the resulting output sequence.

Assuming that output starts from bank B, first the value ADN1 (four) is read from the access count register 70 into the access counter 50, which accordingly allows the Y address generator 12B in bank B to generate four Y addresses (Yj to Yj−3). Data Dd5 are transferred from the main memory array 2B in bank B to the transfer register 62, new input data Db5 are transferred from the data input unit 14 to the data output unit 16, and data Db4 to Db2 are read from the main memory array 2B in bank B and output by the data output unit 16 following data Db5.

Next, the value ADN2 (five) is read from the second access count register 72 into the access counter 50, which allows Y address generator 12A to generate five Y addresses (Yj to Yj−4), and Dc5 to Dc1 are output in succession from the main memory array 2A in bank A. During this time, in the background, data Dd5 are written from the transfer register 62 into the sub memory array 4B in bank B, and the new input data Db5 held in the data input unit 14 are written into the main memory array 2B.

Finally, the value ADN3 (four) is read from the third access count register 74 into the access counter 50, the Y address generator 12B generates four more Y addresses, and data Dd5 to Dd2 are output from the sub memory array 4B in bank B.

Figure 66:
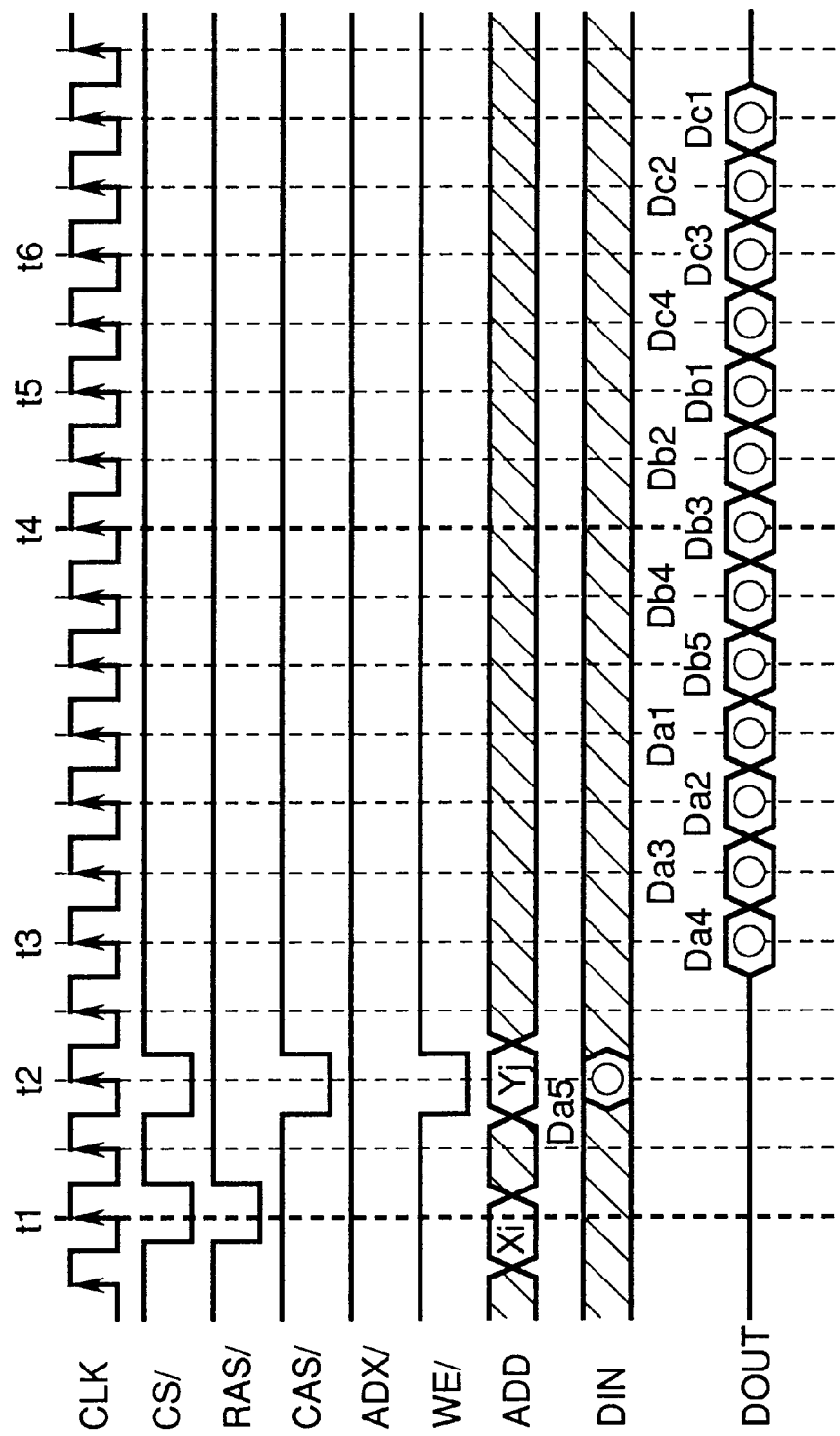
FIG. 66 is a timing diagram illustrating burst access to the pixel data in FIG. 64 in the twenty-sixth embodiment.

For the burst in FIG. 64, assuming that output now starts from bank A, the memory control signal generator 68 sets ADN1 to four, ADN2 to five, ADN3 to four, SFTa to one, and SFTb to zero. FIG. 66 illustrates the resulting output sequence.

First, the value ADN1 (four) is read from the access count register 70 into the access counter 50, and the Y address generator 12A generates four Y addresses. Since SFTa is one, the address recalculator 76A recalculates the starting address as Yj−1 instead of Yj. The Y address generator 12A skips address Yj and starts Y address output from Yj−1. Data Da4 to Da1 are transferred from the main memory array 2A in bank A to the data output unit 16, and output by the data output unit 16 in the first part of the burst.

Next, the value ADN2 (five) is read from the second access count register 72 into the access counter 50, which allows Y address generator 12B to generate five Y addresses. Since SFTb is zero, the address recalculator 76B does not change the starting address, which remains Yj. Data Db5 to Db1 are read in succession from the main memory array 2B in bank B and output by the data output unit 16. During this time, in bank A, in the background, the Y address generator 12A generates the address Yj that was skipped earlier. Data Dc5 are transferred from the main memory array 2A to the transfer register 62, then the new input data Da5 are written into the main memory array 2A, at the same address. Following this write operation, the Y address generator 12A generates the appropriate address, and the data Dc5 held in the transfer register 62 are written into the sub memory array 4A in bank A.

Finally, the value ADN3 (four) is set in the access counter 50, the starting address in the Y address generator 12A is recalculated by the address recalculator 76A, the Y address generator 12A generates four more Y addresses, beginning from the recalculated starting address, and data Dc4 to Dc1 are output from the sub memory array 4A in bank A.

For the burst in FIG. 63, if the burst starts from bank B, the memory control signal generator 68 sets ADN1 to five, ADN2 to four, ADN3 to five, SFTa to one, and SFTb to zero. A detailed description will be omitted.

Operations as described above, taking different numbers of pixels from different fields, are useful not only in conversion from interlaced to progressive scanning, but also in picture-in-picture processing, format conversion, noise rejection, and various other operations.

Next, a variation that applies to all of the preceding embodiments will be described.

Figure 67:
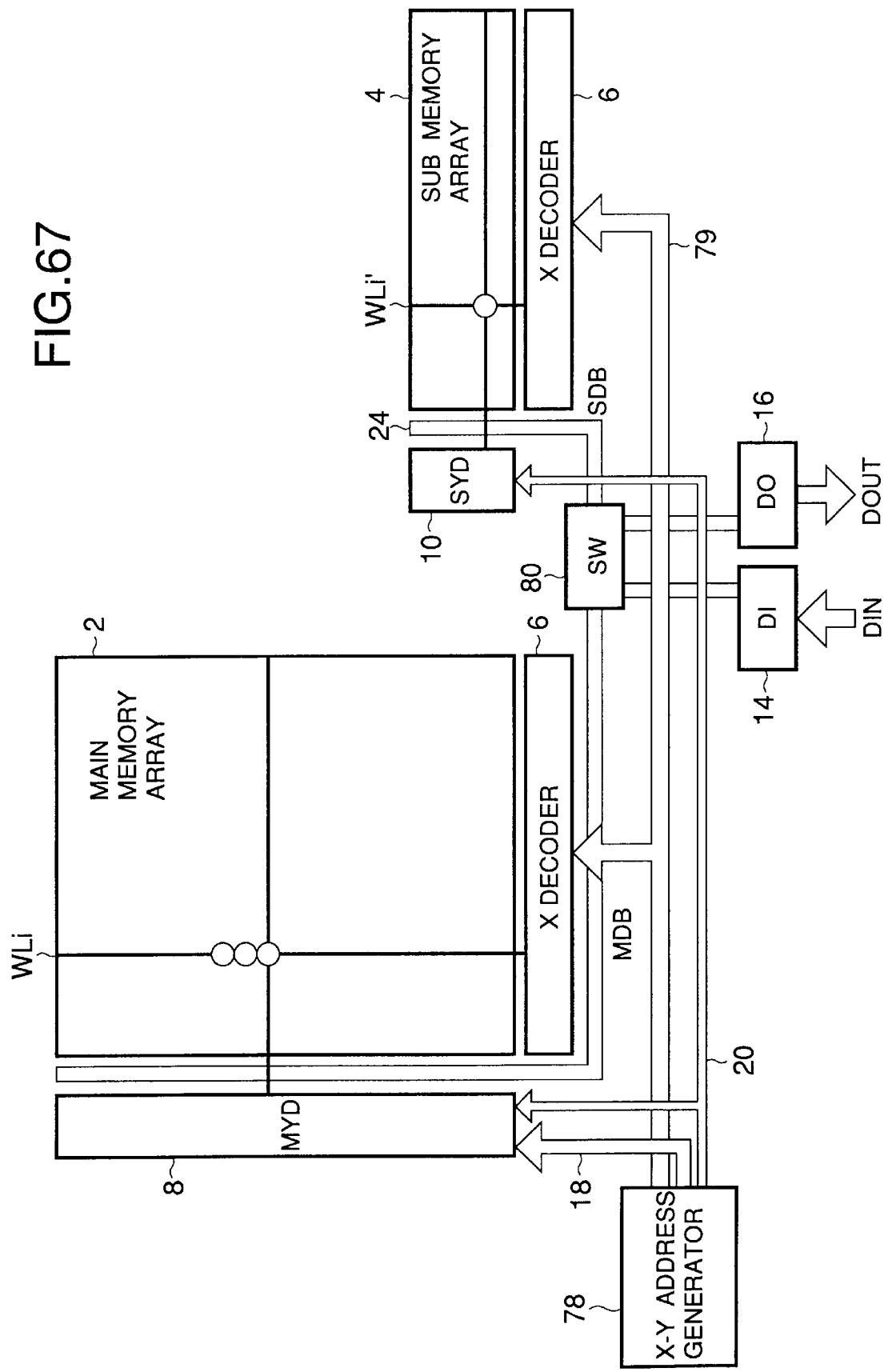
FIG. 67 illustrates a variation of the preceding embodiments.

Referring to FIG. 67, in this variation, the main memory array 2 and sub memory array 4 have separate X decoders and word lines. The sub memory array 4 has its own X decoder 77. If there are two banks, the sub memory array in each bank has a separate X decoder.

X and Y addresses are generated by an X-Y address generator 78, which supplies X addresses to the X decoders 6 and 77 via an X address bus 79, and supplies Y addresses to the high-order Y address bus 18 and low-order Y address bus 20.

The internal data bus 24 is divided into two parts by a data bus switch 80. The data bus switch 80 can selectively couple the main data bus (MDB) to the data input unit 14 and data output unit 16, and can selectively couple the sub data bus (SDB) to the data output unit 16, as well as selectively coupling the main data bus and sub data bus to each other.

When an X address (Xi) is received, both X decoders 6 and 77 simultaneously activate the corresponding word lines WLi and WLi' in the main and sub memory arrays. Since the two word lines WLi and WLi' are activated simultaneously, they can be considered to be different sections of the same word line. Similarly, X decoders 6 and 77 operate as if they were a single X decoder producing dual decoded outputs.

Since both X decoders 6 and 77 receive the same X address, this variation operates in substantially the same way as the first embodiment, and can be modified to duplicate the operation of any of the other preceding embodiments.

The preceding embodiments provided ways to obtain blocks of data of the type shown in FIG. 6, comprising data from the current column and the immediately preceding columns. The following embodiments will show similar ways to obtain blocks of data of the type shown in FIG. 5, comprising data from the current column and the immediately following columns.

In this situation, there is nothing to be gained by transferring the overwritten pixel data into a sub memory array, because an interval of nearly one field will elapse before the overwritten data will be needed again, and during this interval, the data would disappear from the sub memory array. Rather, the overwritten data must be transferred to another field memory, which is to say that field memories must be cascaded as shown in FIG. 4.

The following embodiments, exemplifying the second aspect of the invention, will accordingly not have the sub memory arrays of the preceding embodiments, but will have the features used for cascading in the preceding embodiments, including separate data input and data output terminals. These embodiments will provide the functions of at least the field memory F1 and line memories L21 to L24 enclosed in the dotted line in FIG. 7.

The same reference numerals will be used as in the preceding embodiments for identical or equivalent parts.

Twenty-seventh embodiment

Figure 68:
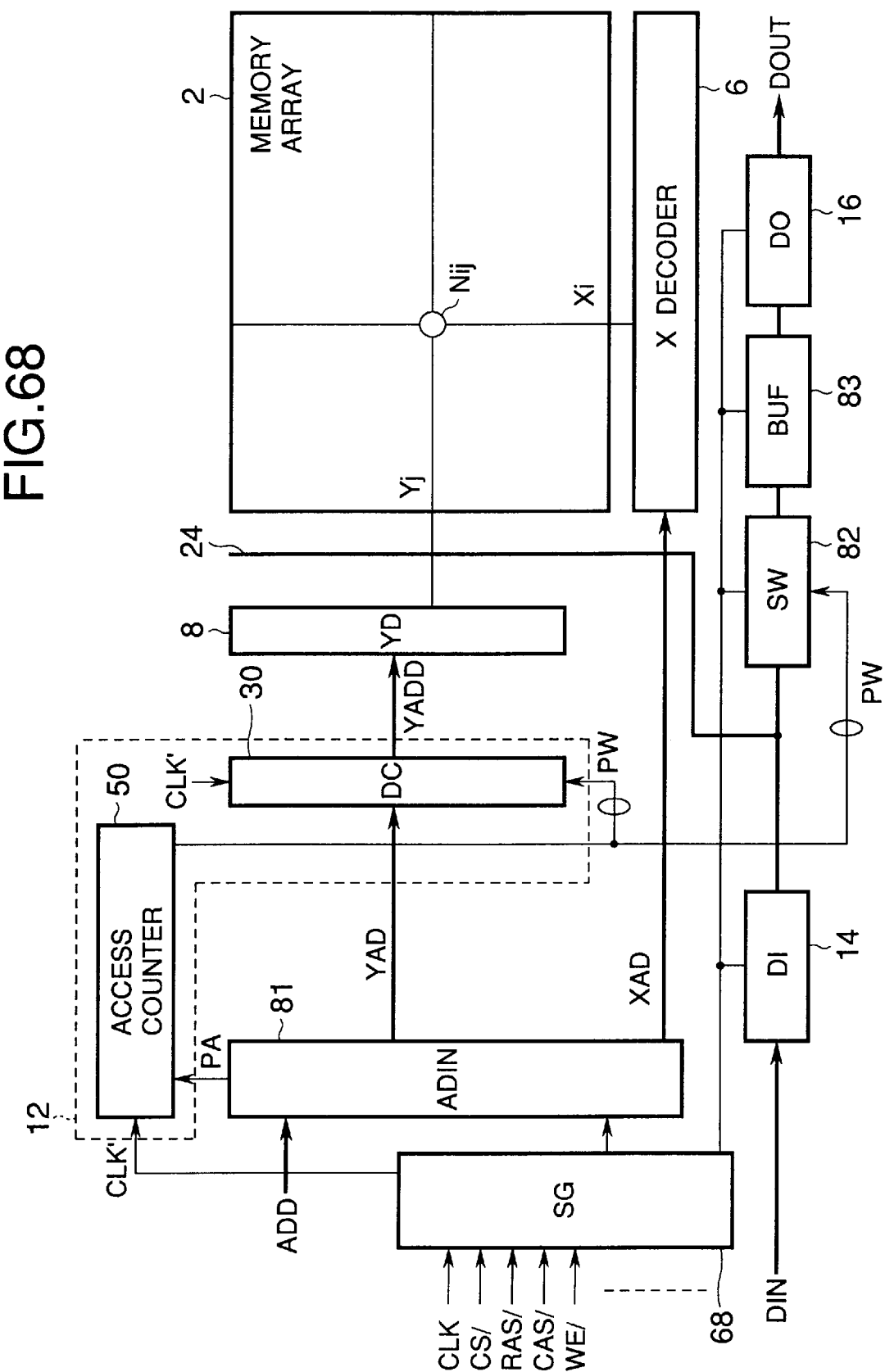
FIG. 68 is a block diagram of a twenty-seventh embodiment of the invention.

Referring to FIG. 68, the twenty-seventh embodiment comprises a memory array 2, an X decoder 6, a Y decoder (YD) 8, a Y address generator 12, a data input unit 14, a data output unit 16, an internal data bus 24, a memory control signal generator 68, an address input unit (ADIN) 81, a data bus switch (SW) 82, and a buffer circuit (BUF) 83. The Y address generator 12 comprises a down-counter 30 and an access counter 50.

As in the preceding embodiments, the circle Nij in the memory array 2 denotes a group of memory cells sharing a common X address (Xi) and Y address (Yj).

The address input unit 81, which was omitted from the drawings in the preceding embodiments for simplicity, receives an X address and Y address separately from the external address input terminals (ADD), and generates internal address signals XAD and YAD. The Y address signal YAD is furnished to the down-counter 30, which counts down from YAD to generate the Y addresses YADD supplied to the Y decoder 8. The down-counter 30 and access counter 50 both operate in synchronization with an internal clock signal (CLK'), which is generated from the external clock signal (CLK), and in the present embodiment has the same frequency as the external clock signal. The access counter 50 receives a burst length control signal PA from the address input unit 81, and generates a control signal PW that controls the down-counter 30 and data bus switch 82.

The data input unit 14, data bus switch 82, buffer circuit 83, and data output unit 16 are controlled by the memory control signal generator 68. The data input unit 14 passes input data from the external data input terminals DIN to the internal data bus 24. The data bus switch 82 passes data from the data bus 24 to the buffer circuit 83, where the data are stored pending output by the data output unit 16 from the external data output terminals DOUT. The buffer circuit 83, which was also omitted from the drawings in the preceding embodiments, is a FIFO buffer with a depth equal, for example, to the maximum read latency of the memory device.

The memory control signal generator 68 has an internal mode register (not visible) that can be programmed to designate the read latency and various access modes. The mode register is programmed by means of commands formed by combinations of the CS/, CAS/, RAS/, and WE/ signals, and values received on the address input lines, in a manner generally similar to the programming of mode registers in existing memory devices, such as the Oki MSM54V24632A.

Figure 69:
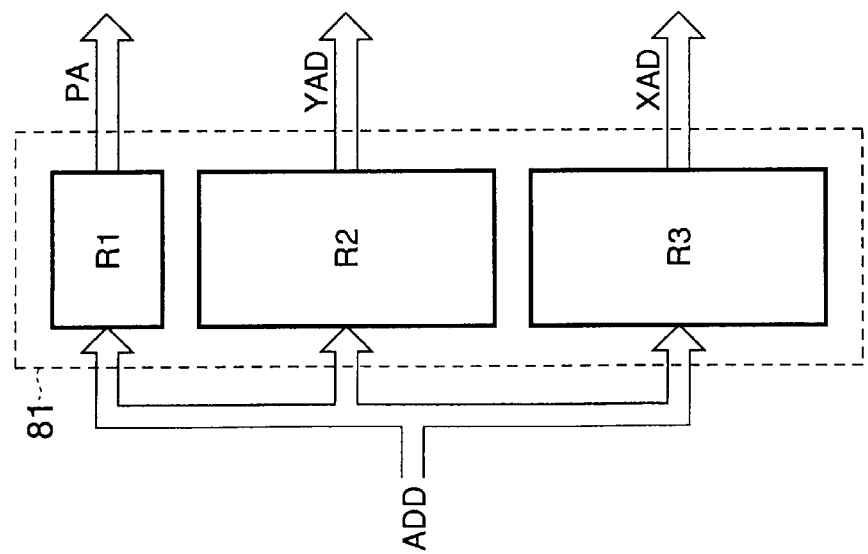
FIG. 69 is a more detailed block diagram of the address input unit in FIG. 68.

Referring to FIG. 69, the address input unit 81 has three internal registers R1, R2, and R3, all of which are coupled to the address input terminals ADD. When the memory control signal generator 68 receives a burst length programming command, the value received at the address input terminals is latched in register R1. At other times, the value received at the address input terminals is latched in register R2 if CS/ and CAS/ are active, and in register R3 if CS/ and RAS/ are active. The X address XAD is output from register R3, the Y address YAD from register R2, and the burst length control signal PA from register R1.

Figure 70:
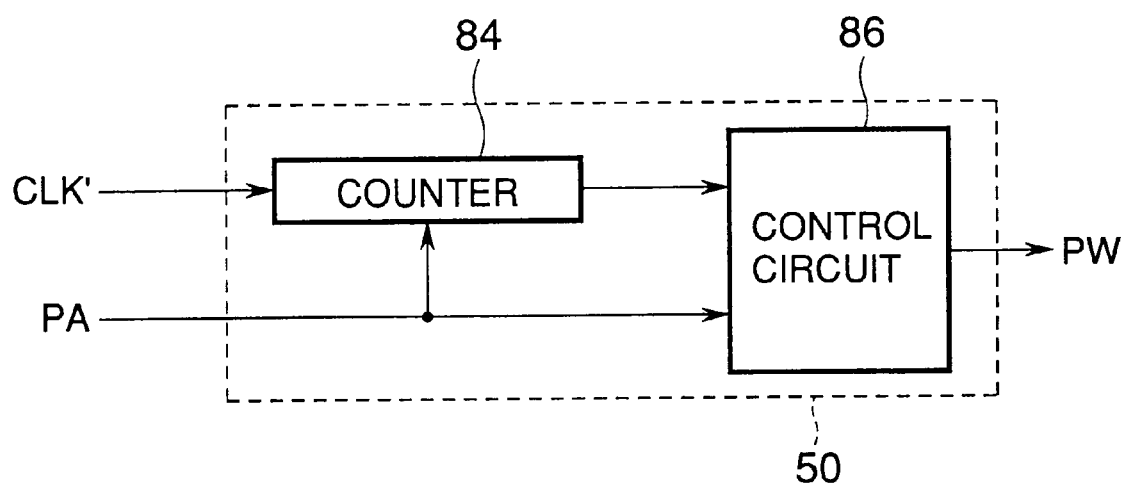
FIG. 70 is a more detailed block diagram of the access counter in FIG. 68.

Referring to FIG. 70, the access counter 50 has a counter 84 and control circuit 86. Counter 84 receives the internal clock signal CLK' and the burst length control signal PA. Control circuit 86 receives control signal PA and the output of counter 84, and generates the PW control signal.

The PA signal is a non-zero signal that causes control circuit 86 to activate the PW control signal, while the value of the PA signal is loaded into counter 84. Counter 84 then counts down from the PA value in synchronization with the CLK' signal. When the output of counter 84 reaches zero, control circuit 86 deactivates the PW control signal.

Next, a preferred mode of operation of the twenty-seventh embodiment will be described.

When the burst length is programmed, the burst length is input from the address input terminals (ADD), and latched in register R1 in the address input unit 81. In a personal computer or workstation, the programming can be done by the basic input-output system (BIOS). In contrast to earlier embodiments, in which the burst length was indirectly limited by the size of the sub memory array, an arbitrary burst length can be designated in the twenty-seventh embodiment. The burst length in the description below will be five.

Figure 71:
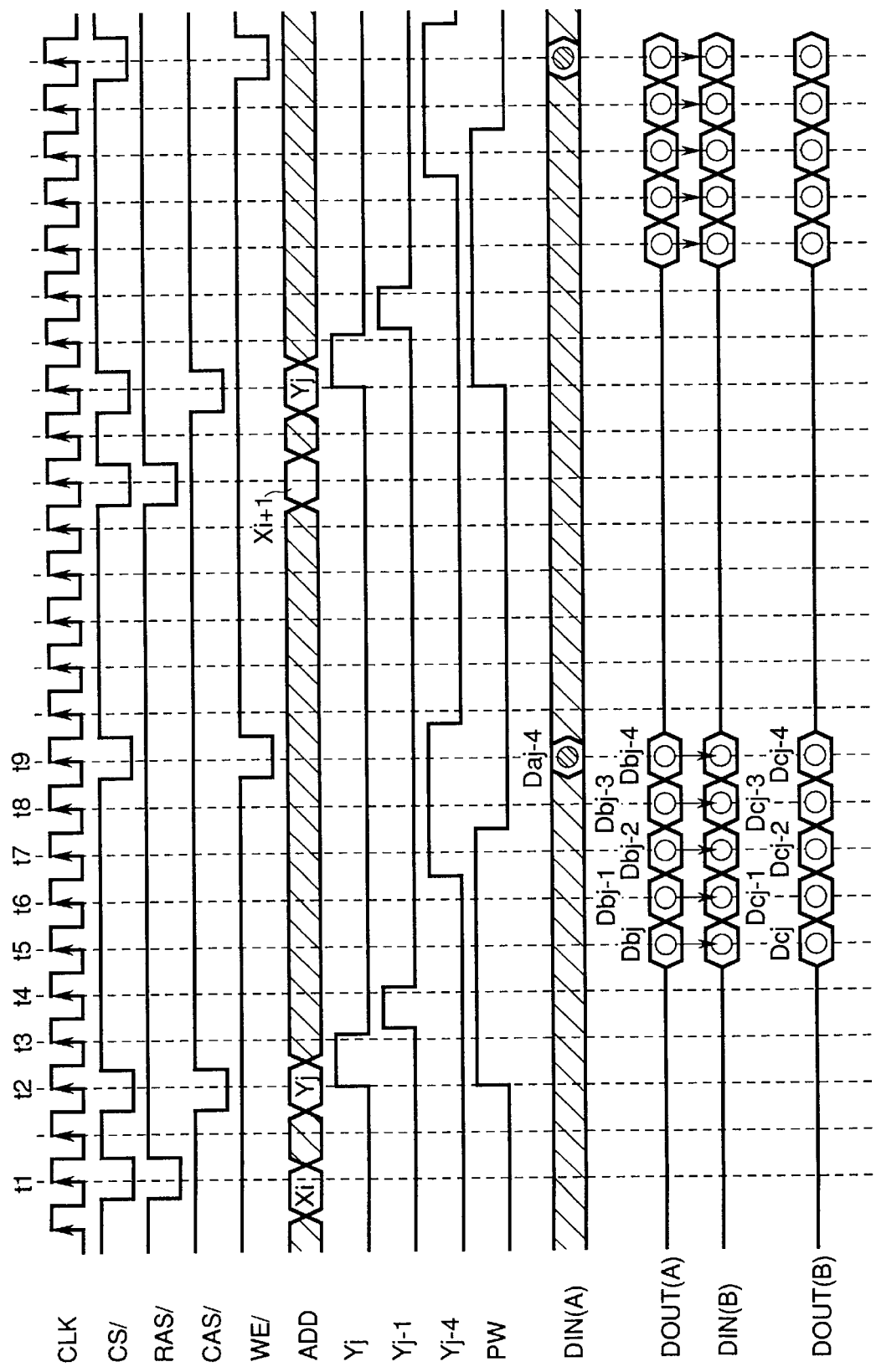
FIG. 71 is a timing diagram illustrating the operation of the twenty-seventh embodiment, showing cascaded input and output.

Following mode programming, access operations can be carried out as illustrated in FIG. 71.

At time t1, a row address (Xi) is received at the address input terminals (ADD), with CS/ and RAS/ low. The row address is latched in register R3 on the rising edge of the internal clock signal CLK', which is substantially simultaneous with the rising edge of the external clock signal CLK. The necessary internal latch signal is generated by the memory control signal generator 68, which also commands the X decoder 6 to decode the X address and activate the corresponding word line in the memory array 2. All memory cells connected to this word line place their data on the corresponding bit lines.

At time t2, with CS/ and CAS/ low, a column address (Yj) is received at the address input terminals and latched in the same way. This column address (Yj) is immediately furnished from the address input unit 81 as column address signal YAD to the down-counter 30, and from the down-counter 30 as column address signal YADD to the Y decoder 8. The Y decoder 8 outputs a decoded signal, indicated by waveform Yj in FIG. 71, that activates the transfer transistors through which the complementary bit lines in column Yj are coupled to the internal data bus 24, as described in the first embodiment. The data Dbj held in memory cells Nij are accordingly placed on the data bus 24.

At time t2, the address input unit 81 generates a PA signal (not shown) that causes the access counter 50 to activate the PW control signal. This signal closes the data bus switch 82, so that data Dbj are passed to the buffer circuit 83. A further control signal from the memory control signal generator 68 (not shown), generated at a time not later than t3, causes the buffer circuit 83 to store data Dbj.

At time t3, the down-counter 30 decrements from Yj to Yj−1, causing the Y decoder 8 to disconnect the complementary bit lines in column Yj from the data bus 24 and connect the complementary bit lines in column line Yj−1 to the data bus 24 instead. This is indicated by the high-to-low transition of waveform Yj and the low-to-high transition of waveform Yj−1 just after time t3 in FIG. 71. Control signal PW remains high, so the data bus switch 82 remains closed and the data Dbj−1 held in memory cells Nij−1 are stored in the buffer circuit 83. Counter 84 in the access counter 50 decrements from five to four.

At time t4, the down-counter 30 decrements from Yj−1 to Yj−2, and the data Dbj−2 held in memory cells Nij−2 are similarly transferred via the data bus 24 and data bus switch 82 to the buffer circuit 83. Counter 84 decrements from four to three.

So far, no data have been output from the memory device; the data output unit 16 has been in the high-impedance state. At the rising edge of the clock signal CLK following time t4, however, the memory control signal generator 68 commands the data output unit 16 to begin output of the data Dbj that were stored in the buffer circuit 83 following time t2. These data Dbj are available at the data output terminals DOUT(A) at the rising edge of the external clock signal CLK at time t5, and can be read at this time by an external device. At time t5, the down-counter 30 decrements from Yj−2 to Yj−3, the data Dbj−3 held in memory cells Nij−3 are transferred to the buffer circuit 83, and counter 84 decrements from three to two.

Similarly, at time t6, the data output unit 16 outputs data Dbj−1 from the buffer circuit 83, the down-counter 30 decrements to Yj−4, data Dbj−4 are transferred from memory cells Nij−4 to the buffer circuit 83, and counter 84 decrements from two to one.

At time t7, the data output unit 16 outputs data Dbj−2. In addition, counter 84 decrements from one to zero, causing the control circuit 86 in the access counter 50 to deactivate the control signal PW. The inactive state of the PW signal halts the down-counter 30 and opens the data bus switch 82, so that no more data are transferred into the buffer circuit 83. The Y address YADD output by the down-counter 30 accordingly stays at Yj−4, and the Y decoder 8 continues to keep the complementary bit lines in column Yj−4 coupled to the data bus 24.

At time t8, the data output unit 16 outputs data Dbj−3. At the falling edge of the external clock signal CLK following time t8, CS/ and WE/ go low, and new input data Daj−4 to be stored in the memory array 2 are received at the data input terminals DIN(A).

At time t9, the data output unit 16 outputs data Dbj−4, and the data input unit 14 sends the new input data Daj−4 via the data bus 24 to the memory array 2. Since the complementary bit lines in column line Yj−4 are still coupled to the data bus 24, data Daj−4 are stored in memory cells Nij−4, replacing the data Dbj−4 that have just been output.

If the output terminals DOUT(A) of the memory device are coupled to the input terminals DIN(B) of another memory device of the same type, and this second memory device receives the same write enable signal WE/, then at time t9, while the first memory device (A) is storing new data Daj−4, the second memory device (B) will receive and store the data Dbj−4 output by the first memory device (A), as indicated at the bottom of FIG. 71.

The second memory device (B) will also receive the data Dbj−1 to Dbj−3 output from the first memory device (A) before time t9, but since WE/ is inactive at these earlier times, the second memory device will ignore data Dbj−1 to Dbj−3.

At an appropriate time after t9, the memory control signal generator 68 commands the Y decoder 8 to disconnect all bit lines from the data bus 24, and commands the X decoder 6 to deactivate all word lines. The Yj−4 signal in FIG. 71 goes low at this time, and the data bus 24 is initialized in preparation for the next access. In FIG. 71, this next access is another similar burst, starting at the same column address (Yj) and the next row address (Xi+1).

Figure 72:
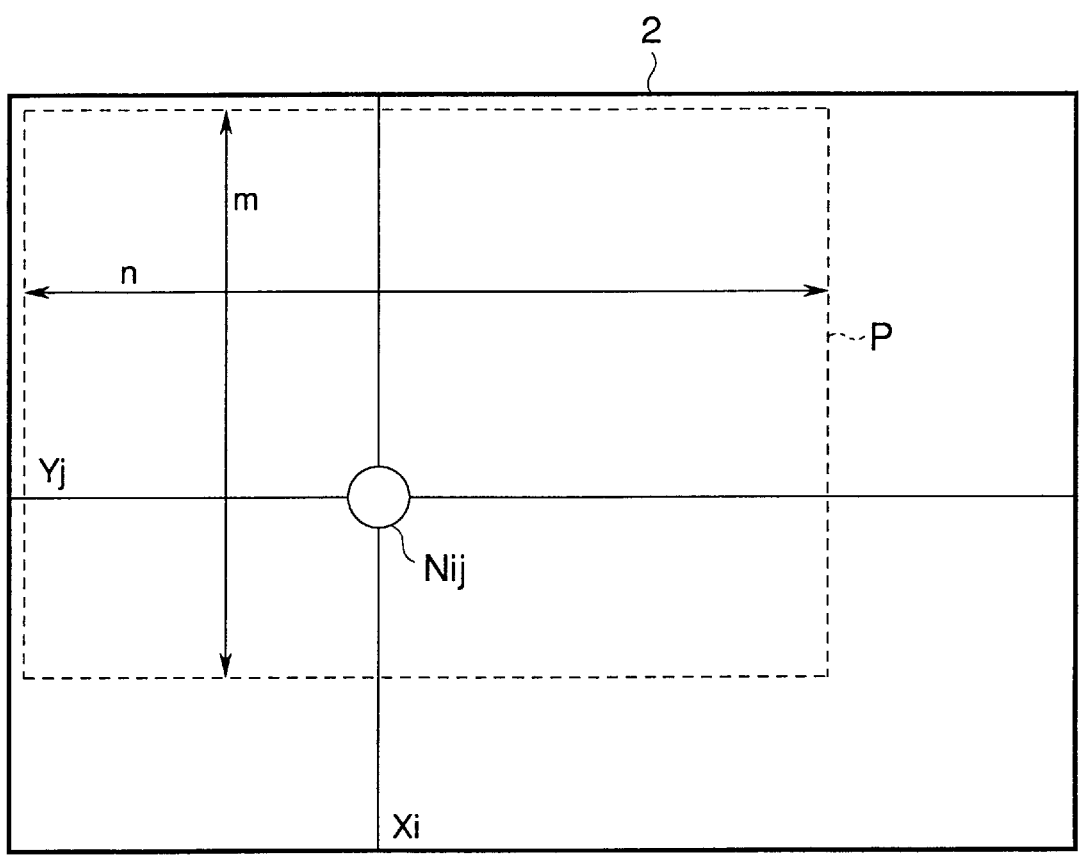
FIG. 72 illustrates the occupation of the memory array in the twenty-seventh embodiment by field data.

Viewing the above operation on a larger scale, FIG. 72 shows the part of the memory array 2 used to store one field or frame of a moving picture P. The pixel data are stored in n rows and m columns, where n is the number of pixels in one horizontal scanning line and m is the number of horizontal scanning lines in one field or frame.

Figure 73:
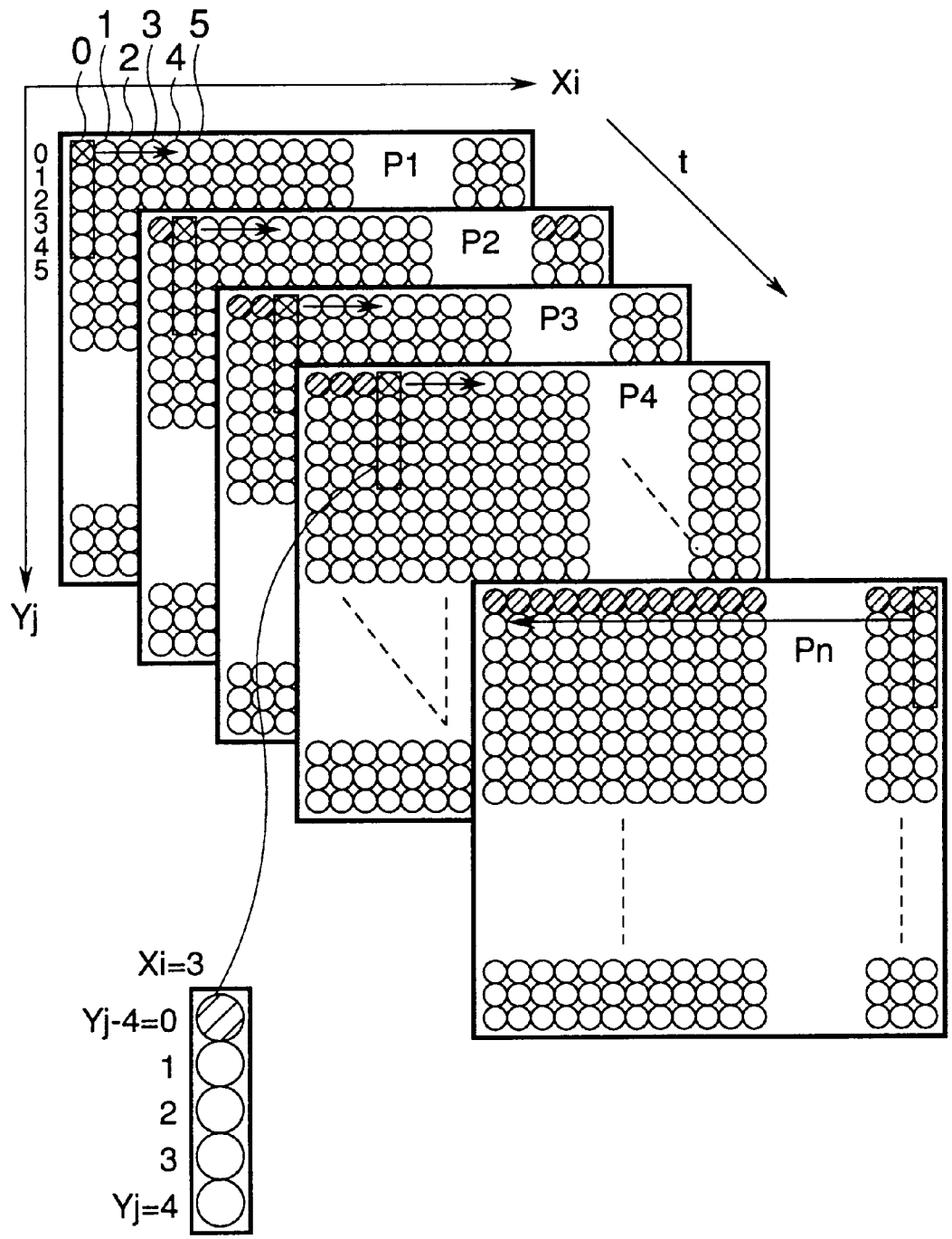
FIGS. 73 and 74 illustrate successive burst accesses performed by the twenty-seventh embodiment.

FIG. 73 illustrates how the memory contents change as the pixel data for the first horizontal scanning line are received, and indicates which pixel data are read. Scanning is from left to right, the row addresses or X addresses starting at zero and increasing by one at a time. Column addresses (Y addresses) also start at zero, as indicated. The letter t represents time, while P1, P2, . . . , Pn represent the changing states of the memory contents. Hatched dots represent pixel data that have already been stored in the memory array 2, white dots represent old pixel data for the previous field, and white dots marked with x's represent old pixel data that are about to be overwritten.

Before being overwritten, the old data marked with x's are read out, together with the old data for four pixels immediately below, as indicated by the rectangular outlines. In state P4, for example, the pixel data with row address three (Xi=3) and column addresses from four to zero (Yj=4, Yj−4=0) are read in a single burst, before new data are written over the old data in column zero.

The column address Yj supplied to the memory device for this operation is four, rather than zero, so the input data are not stored in the column designated by the input column address. This is not a disadvantage, and can even be a convenience in processing video pictures in which the first few scanning lines are located in a vertical blanking interval and have no data to be stored.

Figure 74:
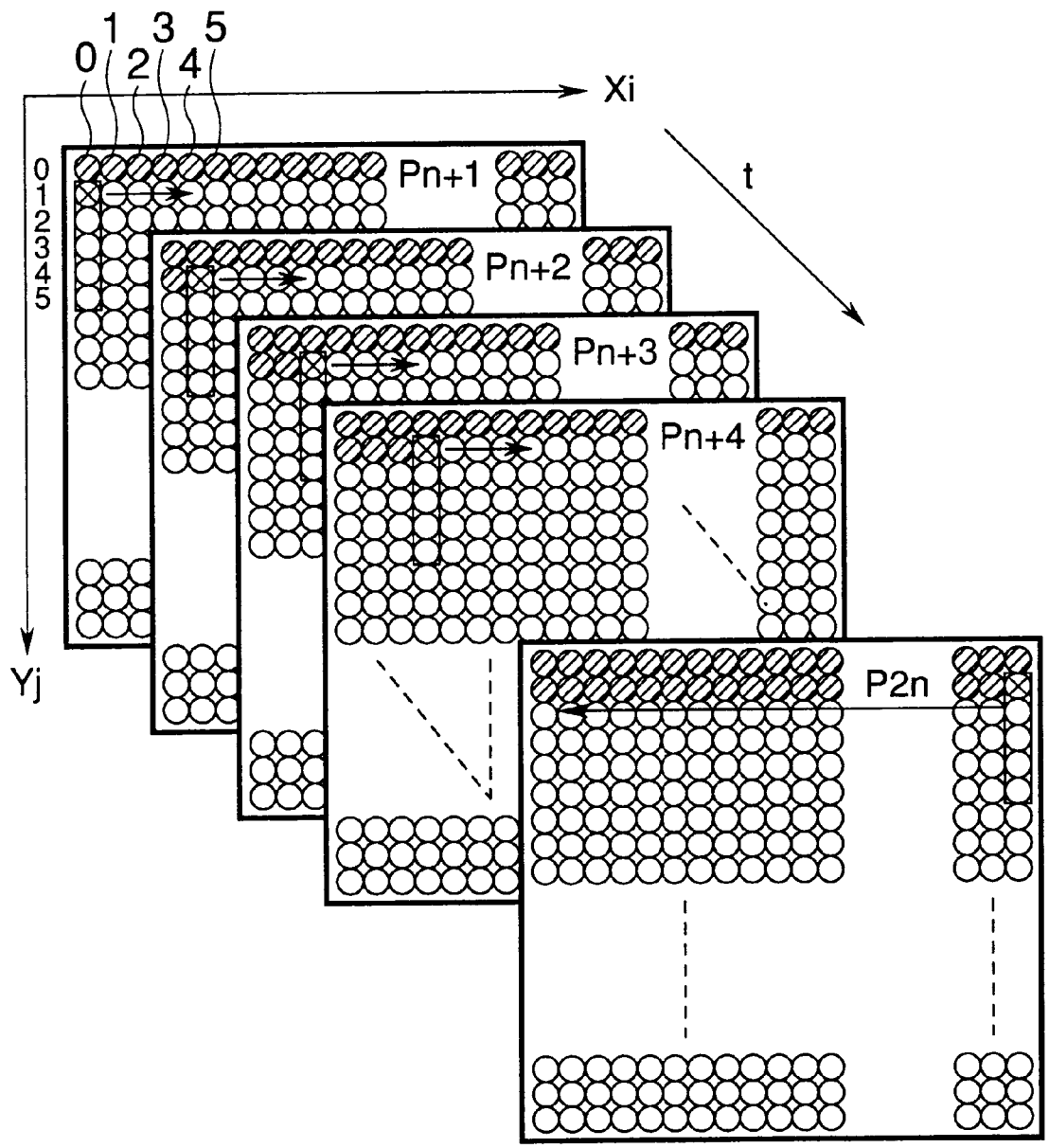

FIG. 74 similarly illustrates the changing states (Pn+1 to P2n) of the memory contents as the pixel data for the second horizontal scanning line are received. In this case the memory device receives column address five (Yj=5), supplies a burst of pixel data from columns five to one, and writes new data in column one. The data in column zero (Yj=0) will not be read again until the beginning of the next field. As pointed out earlier, this is why the data in column zero are not stored in a sub memory array capable of keeping data for only a fraction of one field.

Incidentally, the foregoing description also applies to progressive scanning, with 'field' replaced by 'frame.'

Figure 75:
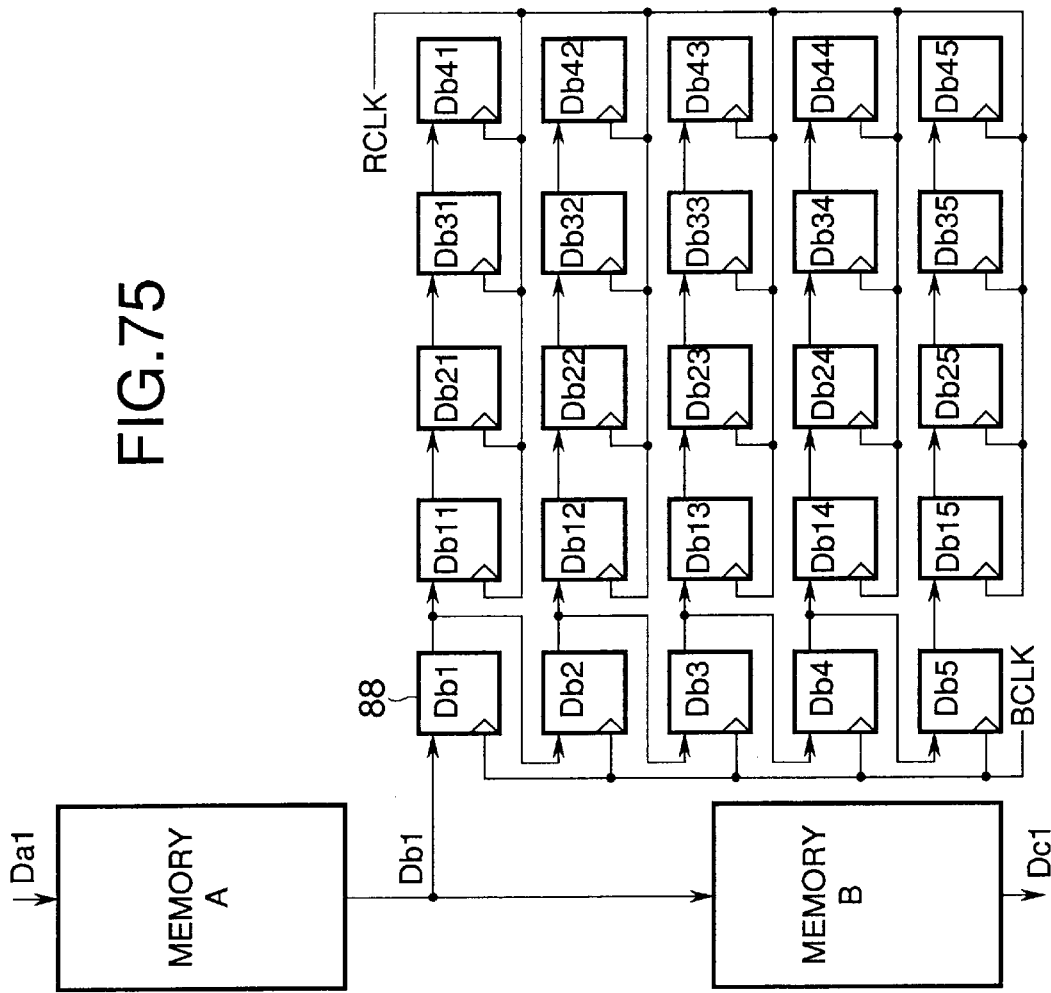
FIG. 75 illustrates a circuit for receiving the data output by the twenty-seventh embodiment.

FIG. 75 illustrates a matrix of D-type flip-flops 88 that can be used to receive the data output by the twenty-seventh embodiment. Memory A receives and outputs data as shown in FIG. 71, the data output from memory A being passed to memory B and the first D-type flip-flop 88. This flip-flop 88 and the four flip-flops directly below it are clocked by a burst clock signal (BCLK) that is synchronized with the output of data from memory A. The burst clock signal BCLK can be generated by gating the clock signal (CLK) shown in FIG. 71, so that in the first burst, for example, BCLK comprises five clock cycles from time t5 to time t9. The five flip-flops clocked by BCLK form a shift register that stores the data Db5 to Db1 output during the burst.

The other flip-flops in FIG. 75 are clocked by a row clock signal (RCLK) that can be generated from the RAS/ or CAS/ control signal. RCLK is pulsed once, before the beginning of each burst. The four flip-flops to the right of the first flip-flop 88 accordingly hold data Db11, Db21, Db31, and Db41 for four pixels to the left of Db1, these data having been output from memory A in four previous bursts.

Figure 76:
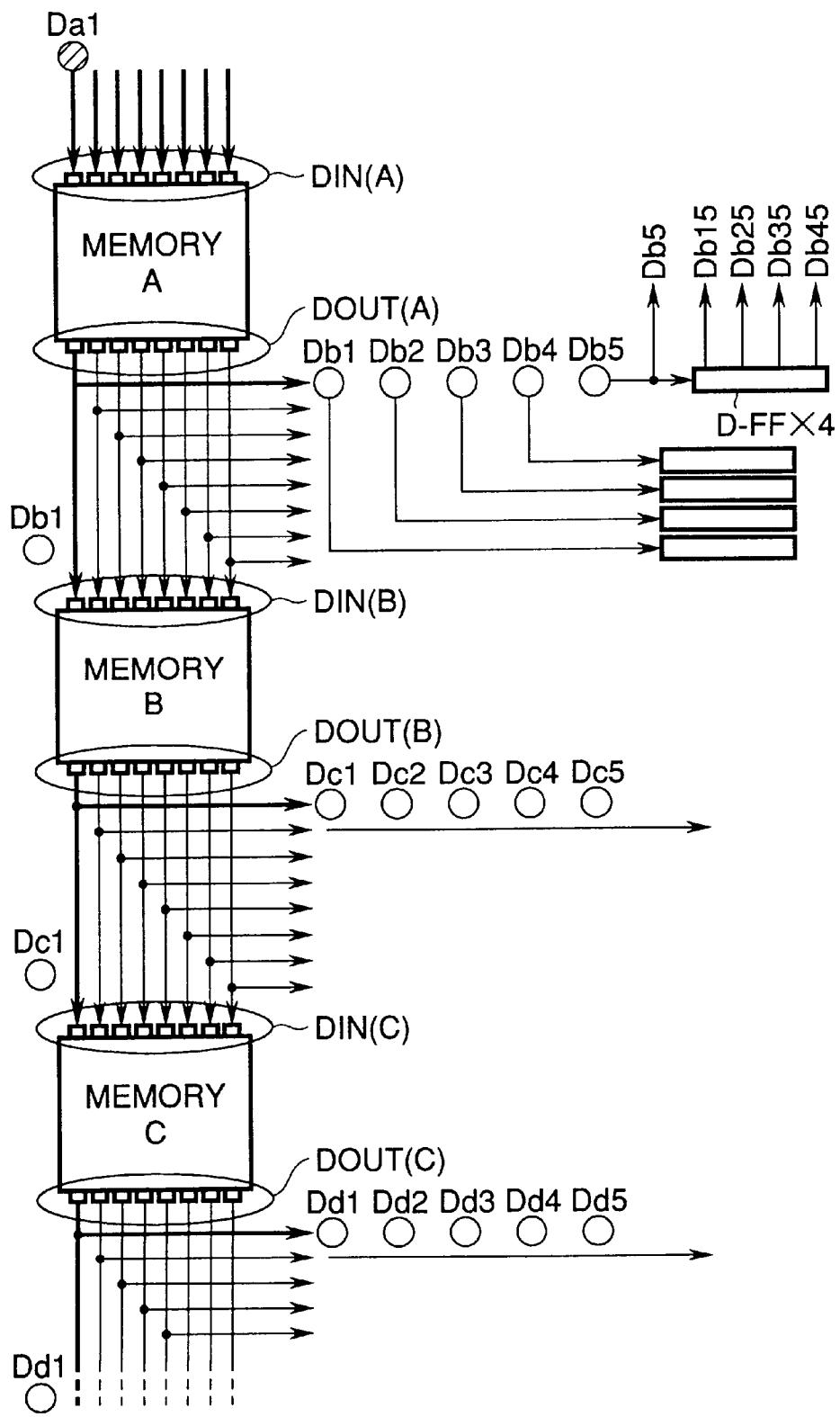
FIG. 76 illustrates the cascading of memory devices in the twenty-seventh embodiment.

FIG. 76 illustrates the cascading of three memory devices A, B, and C according to the twenty-seventh embodiment. Each memory device is shown as having eight data input terminals (DIN) and eight output terminals (DOUT), the input and output data thus comprising eight bits per pixel. The output terminals DOUT(A) of memory A are coupled to the input terminals DIN(B) of memory B, and the output terminals DOUT(B) of memory B are coupled to the input terminals DIN(C) of memory C. An arbitrary number of memory devices can be cascaded in this way.

The output data Db1 to Db5 shown to the right of memory A represent the output of one burst as stored in the D-type flip-flops 88 clocked by the BCLK signal in FIG. 75. The D-type flip-flops clocked by the RCLK signal in FIG. 75 are represented by rectangles labeled D-FF×4 in FIG. 76.

Compared with conventional synchronous dynamic random-access memory, the twenty-seventh embodiment has several advantages in this type of cascaded configuration.

One advantage is that a single X-Y address input suffices for both burst read access and write access.

Another advantage is the simultaneous input and output of data having the same X and Y addresses. Exactly the same address signals, write-enable signals, and other control signals can be supplied to all of the cascaded memory devices, with the same timing. Simultaneous input and output also means that a burst combining read and write access can be completed in a shorter time than would be possible with conventional synchronous dynamic random-access memory.

A third advantage is that the data output terminals of each memory device can be connected directly to the data input terminals of the next memory device in the cascade. Conventional synchronous dynamic random-access memory has only one set of data terminals, which are employed for both input and output. Using conventional synchronous dynamic random-access memory in a cascaded configuration would require intervening switches to keep input data separated from output data, and extra control signals to control the switches.

Due to these advantages, compared with conventional synchronous dynamic random-access memory, in a cascaded configuration, the twenty-seventh embodiment can provide higher-speed operation with less hardware.

Twenty-eighth embodiment

Figure 77:
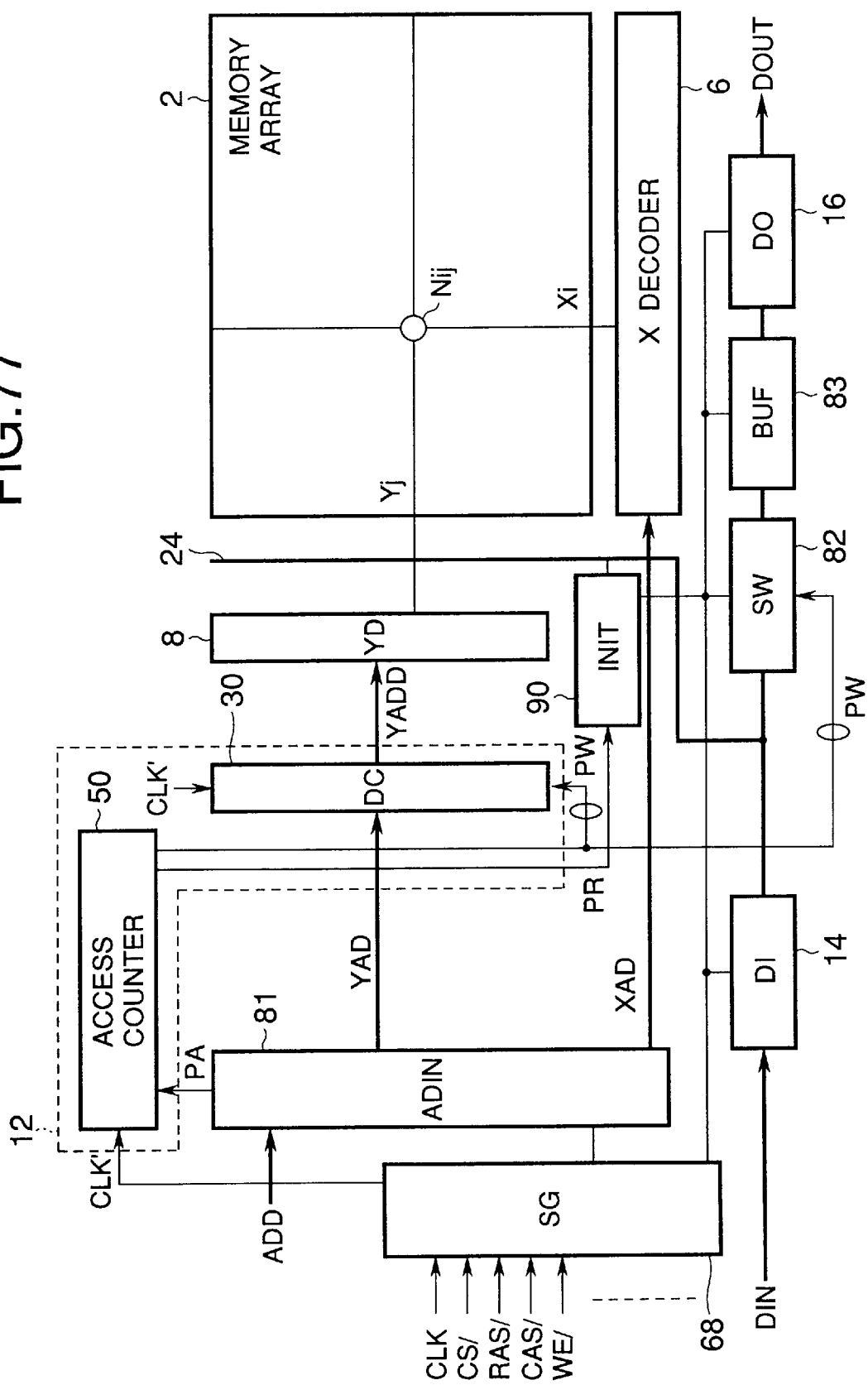
FIG. 77 is a block diagram illustrating a twenty-eighth embodiment of the invention.

Referring to FIG. 77, the twenty-eighth embodiment adds a data bus initialization unit 90 to the configuration of the twenty-seventh embodiment. The data bus initialization unit 90 is controlled by a reset signal PR output from the access counter 50. The function of the data bus initialization unit (INIT) 90 is to initialize the internal data bus 24 by setting the two bus lines in each pair of complementary data bus lines to equal potentials intermediate between the power-supply and ground potentials. This can be done by temporarily interconnecting the two bus lines so that their potentials are equalized, or by precharging the bus lines to the desired intermediate potential, or by both equalization and precharging. The result is that each pair of complementary data bus lines is placed at a level intermediate between the binary one level and the binary zero level.

Figure 78:
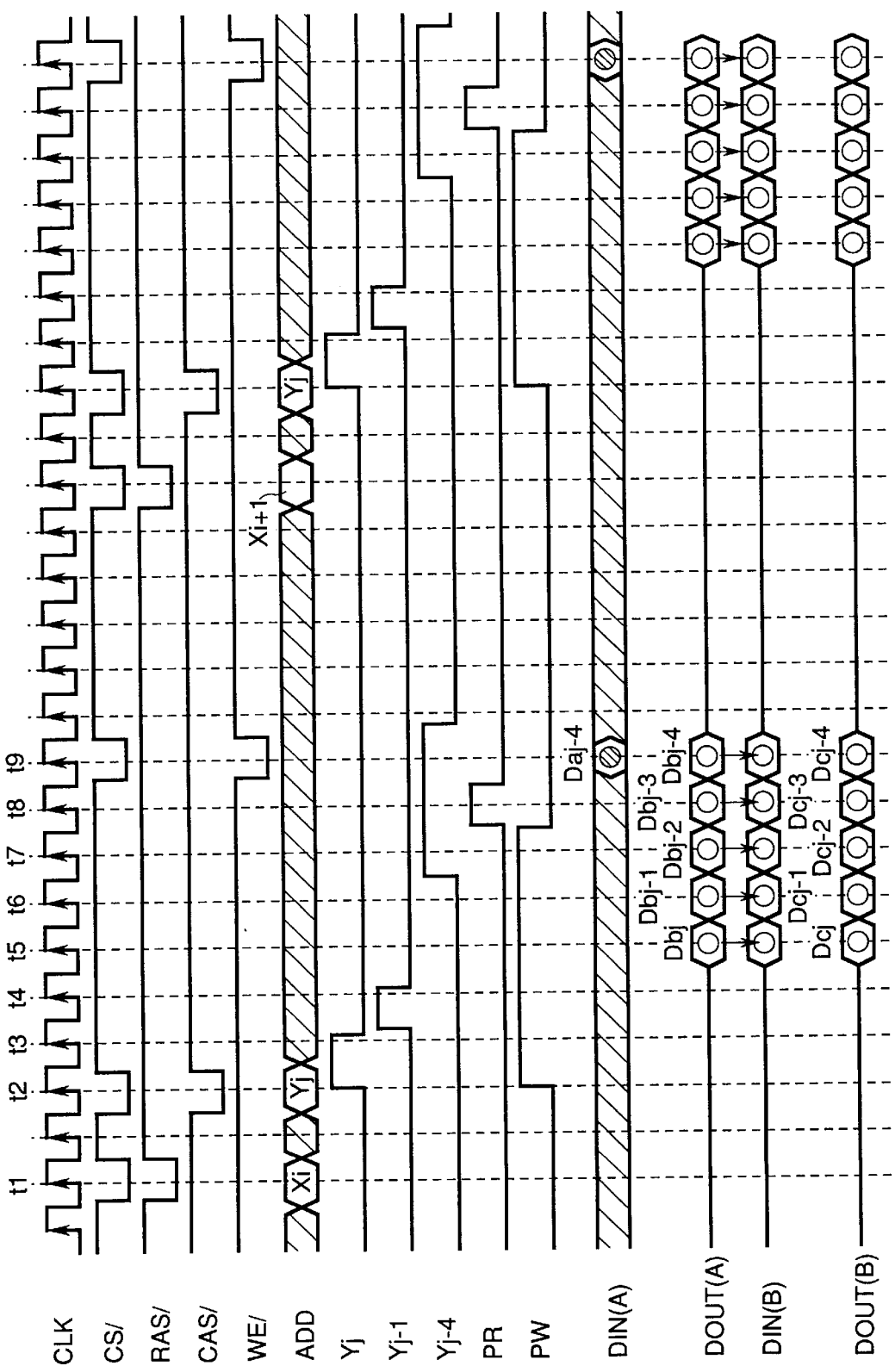
FIG. 78 is a timing diagram illustrating the operation of the twenty-eighth embodiment.

The operation of the twenty-eighth embodiment is illustrated in FIG. 78. The waveforms shown are the same as the waveforms in FIG. 71, with the addition of the PR waveform. The following description will be confined to the data bus initialization operation, other operations being the same as in the twenty-seventh embodiment.

During the transfer of data from the memory array 2 to the buffer circuit 83 over the data bus 24 from time t2 to time t7, while the PW control signal is high, the PR control signal remains low, keeping the data bus initialization unit 90 inactivated.

After time t7, when the access counter 50 sets the PW signal to the low state, the access counter 50 simultaneously drives the PR signal high for one clock cycle, centered around time t8. During this clock cycle, the data bus 24 is initialized by the data bus initialization unit 90. The bit lines in column Yj–4, which are still connected to the data bus 24, and the memory cells Nij–4 in the same column, are also initialized. The data bus initialization unit 90 is deactivated at a timing between times t8 and t9, leaving the data bus 24 and these bit lines and memory cells in the initialized state.

At time t9, the new input data Daj–4 are received and transferred from the data input unit 14 to the data bus 24. From their intermediate potential, the data bus lines and bit lines can quickly swing to the levels representing either binary one or binary zero, and the capacitors in memory cells Nij–4 can quickly be charged or discharged to store the data. The writing of data can thus be completed in a short time, allowing the next burst to begin quickly.

If the data bus 24 is not initialized, and if the new input data Daj–4 differ from the old data Dbj–4, the data bus lines and bit lines will have to make a full swing between the power-supply and ground potentials, and the capacitors in the memory cells will have to be fully charged or discharged, so the write operation will take longer, and more time will have to be allowed between bursts.

By shortening the time between bursts, the twenty-eighth embodiment enables the memory device to output longer bursts.

Twenty-ninth embodiment

Figure 79:
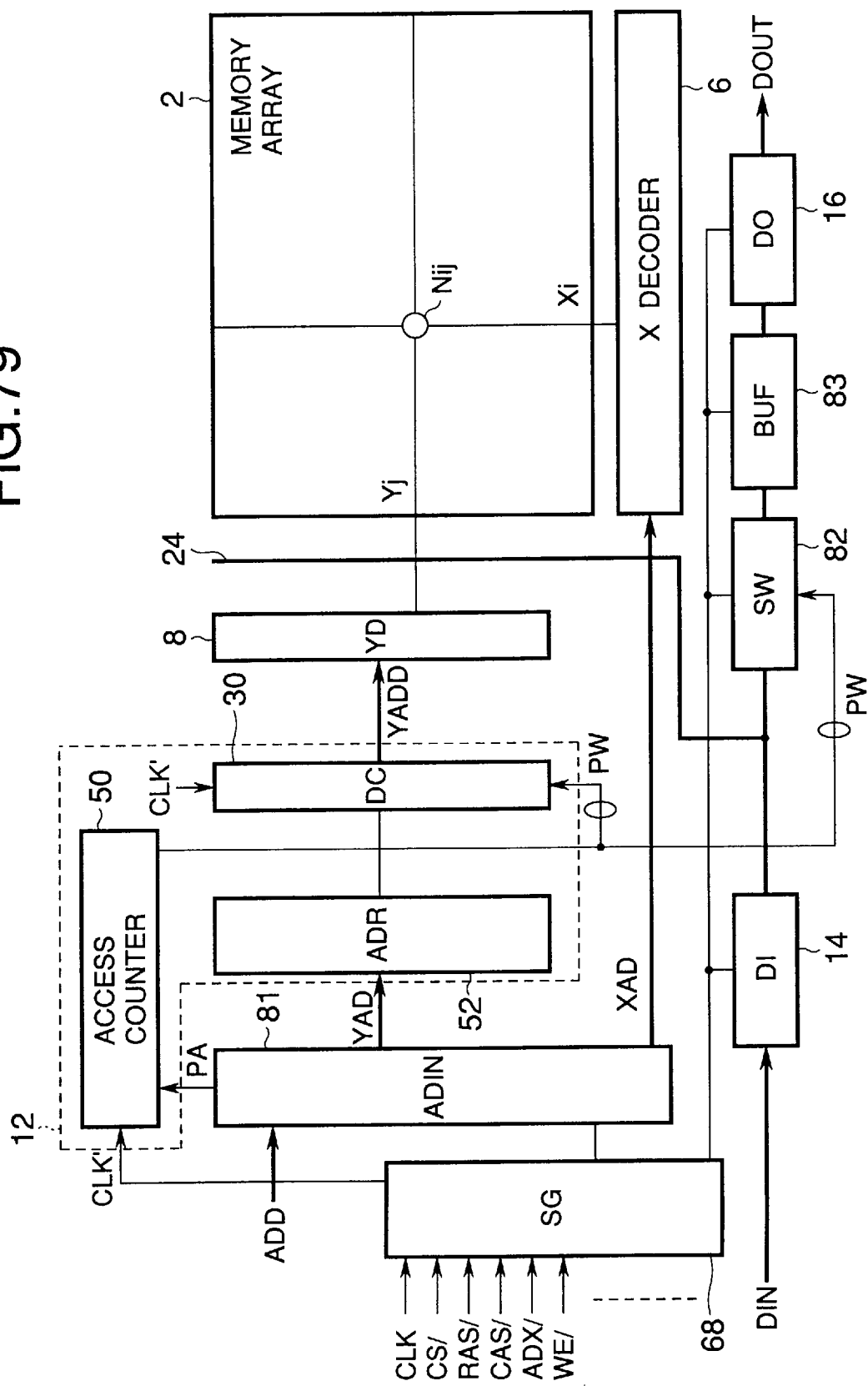
FIG. 79 is a block diagram illustrating a twenty-ninth embodiment of the invention.

Referring to FIG. 79, the twenty-ninth embodiment adds to the configuration of the twenty-seventh embodiment an address register 52 of the type introduced in the fifth embodiment. The address register 52 receives and stores the Y address YAD output from the address input unit 81, so that the Y address YAD can be repeatedly loaded into the down-counter 30. The reloading of the Y address YAD is performed in response to an external control signal ADX/, as explained in the fifth embodiment.

Storing the Y address YAD in the address register 52, instead of the address input unit 81, enables the Y address to be held at a location close in the circuit configuration to the down-counter 30, and allows the address input unit 81 to be initialized in preparation for receiving the next Y address.

Since the down-counter 30 does not have to be reloaded in the middle of a burst, a switch is not strictly necessary between the address register 52 and down-counter 30. The down-counter 30 can be controlled by the PW control signal in an edge-sensitive manner, so that at each rising edge of the PW control signal, the down-counter 30 loads the Y address value held in the address register 52 and starts counting down from that value. The address register 52 can be configured using transparent latches, for example, so that new address values received from the address input unit 81 are immediately made available to the down-counter 30.

The operation of the twenty-ninth embodiment can be understood from the descriptions of the fifth and twenty-seventh embodiments, so a detailed description will be omitted here, but relevant information will given under the thirty-first embodiment. The advantage of the twenty-ninth embodiment is that repeated external input of the same column address is unnecessary.

Thirtieth embodiment

Figure 80:
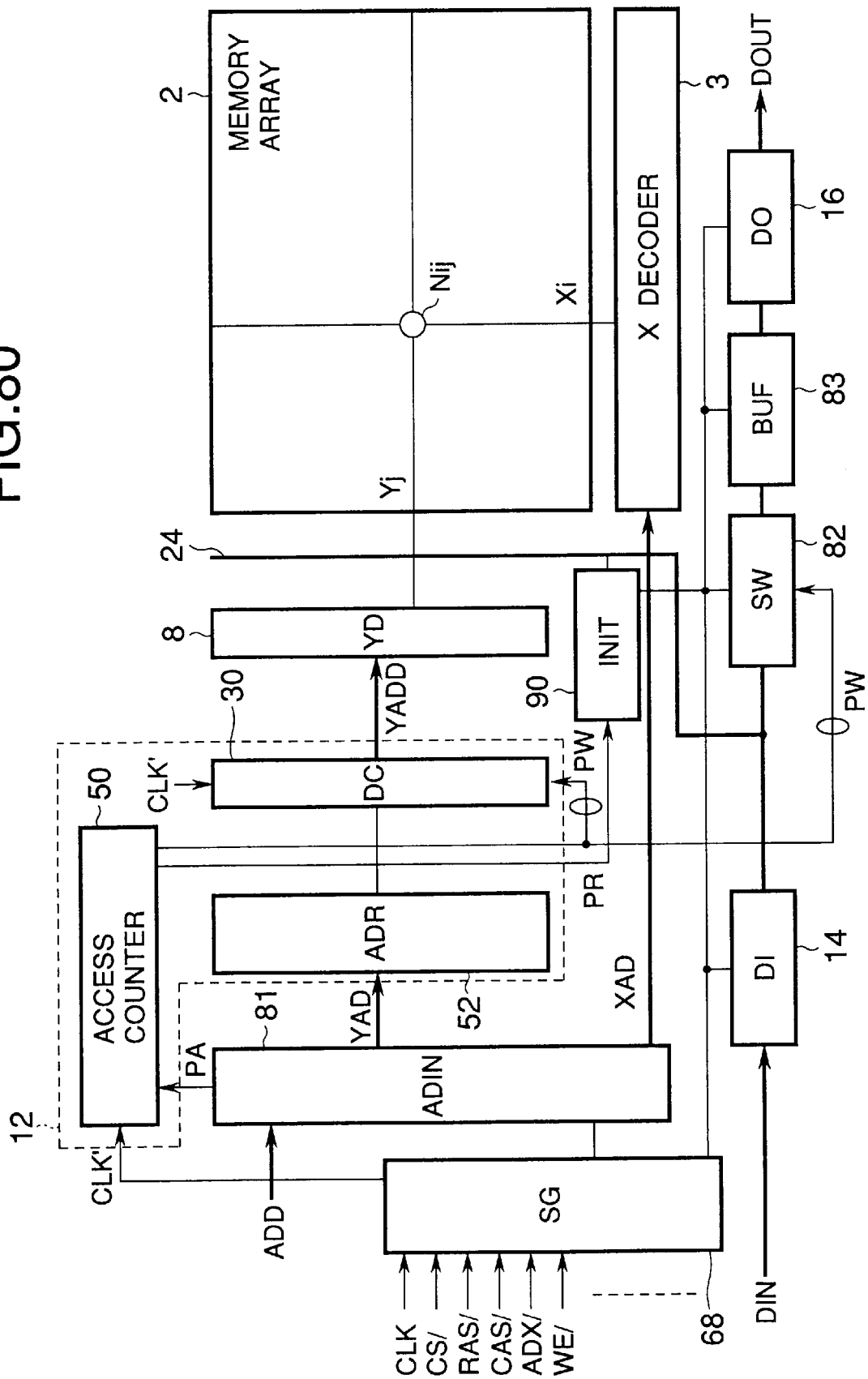
FIG. 80 is a block diagram illustrating a thirtieth embodiment of the invention.

Referring to FIG. 80, the thirtieth embodiment combines the features of the twenty-eighth and twenty-ninth embodiments, having both an address register 52 and a data bus initialization unit 90. A detailed description will omitted here, because the operation of the thirtieth embodiment is substantially as described in the next embodiment.

Thirty-first embodiment

Figure 81:
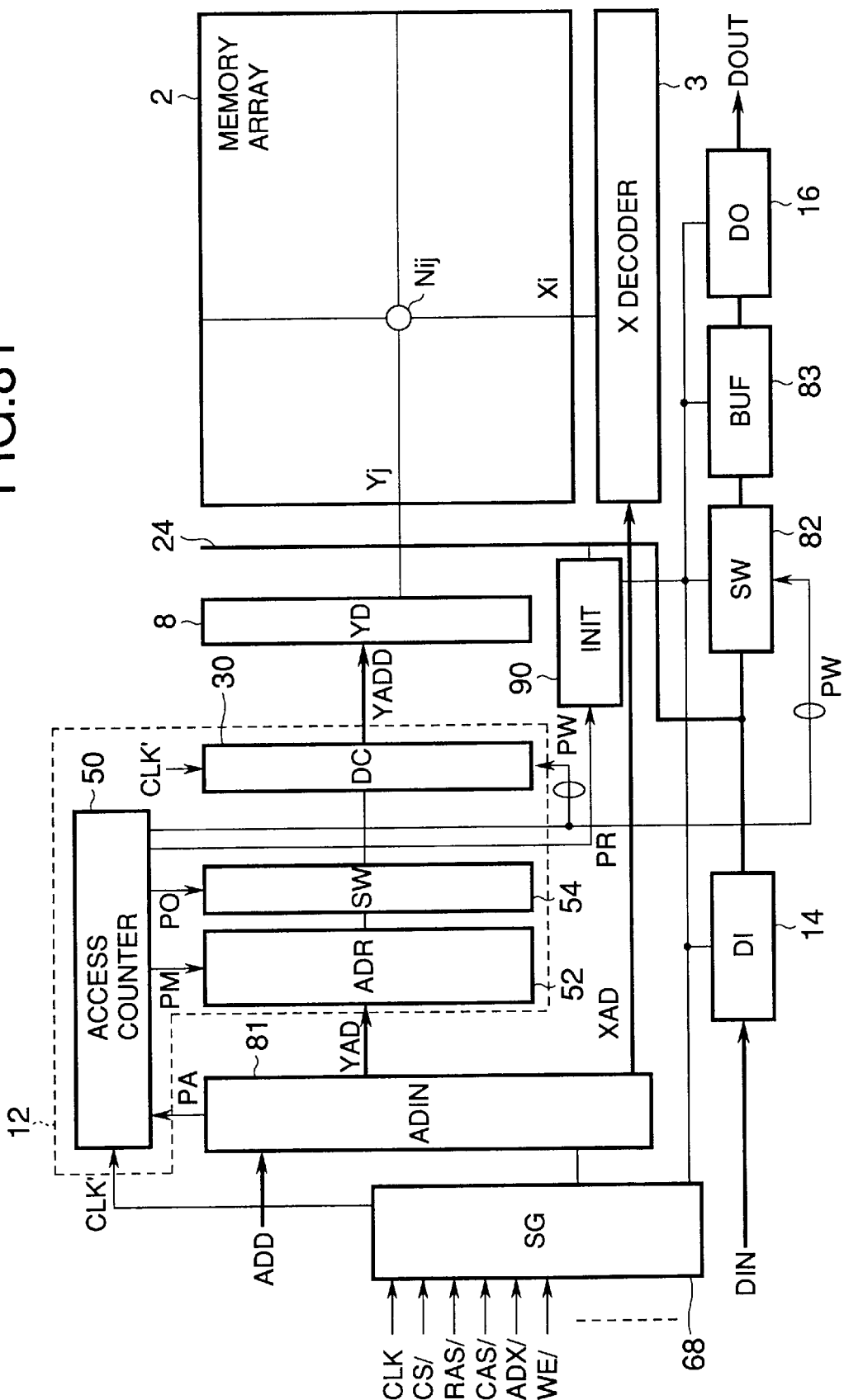
FIG. 81 is a block diagram illustrating a thirty-first embodiment of the invention.

Referring to FIG. 81, the thirty-first embodiment adds to the configuration of the thirtieth embodiment an address register output switch 54 of the type introduced in the fifth embodiment, coupled between the address register 52 and down-counter 30 and controlled by a control signal PO output from the access counter 50. Also added is a control signal PM supplied from the access counter 50 to the address register 52.

Figure 82:
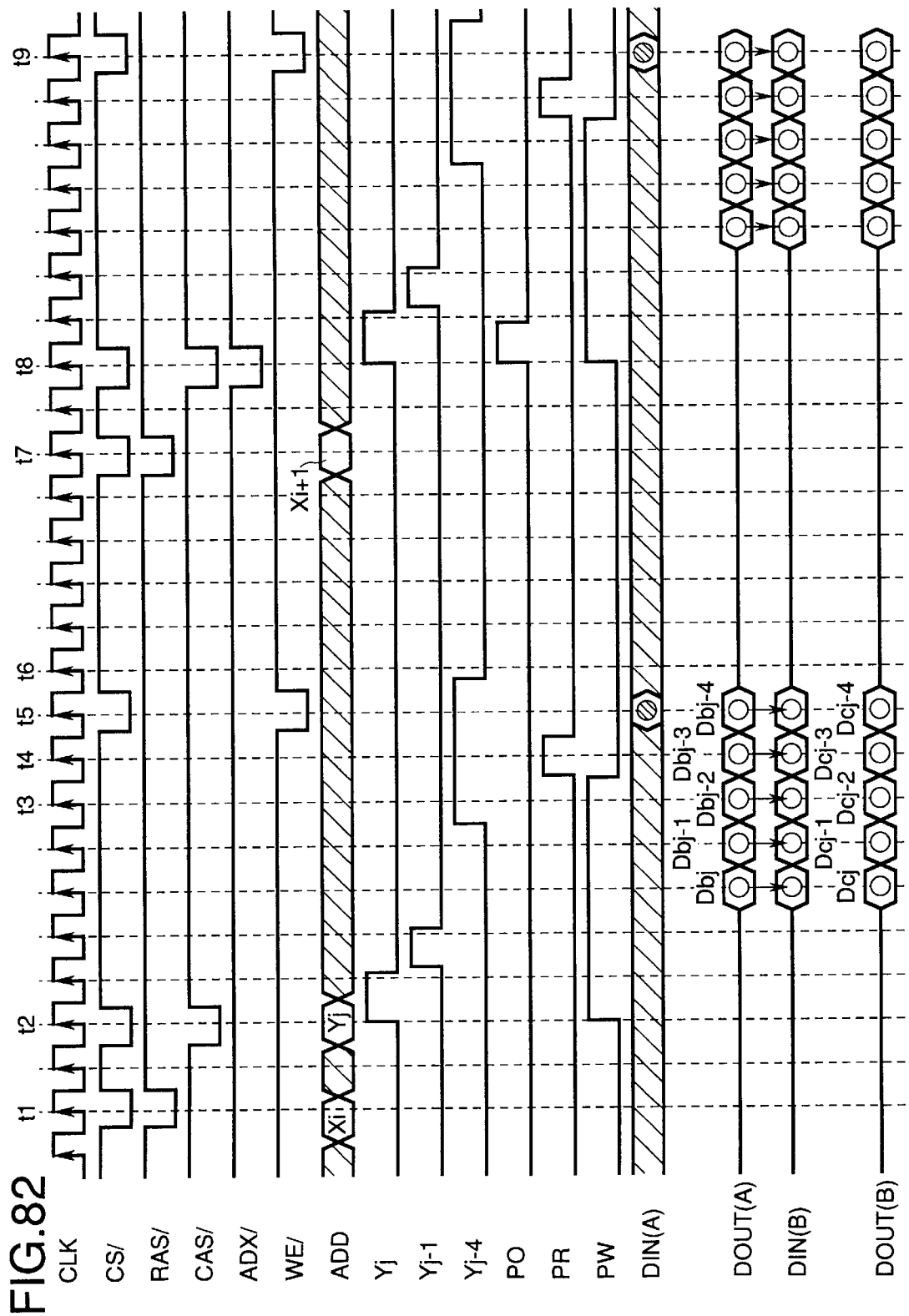
FIG. 82 is a timing diagram illustrating the operation of the thirty-first embodiment.

FIG. 82 illustrates the operation of the thirty-first embodiment. The following description will be confined to the operation of reloading the down-counter 30. Other operations are as described in the twenty-eighth embodiment.

During the first burst shown in FIG. 82, from time t1 to time t6, the PO control signal remains low, preventing the down-counter 30 from being loaded from the address register 52. Instead, at time t2, the input Y address (Yj) received by the address input unit 81 is loaded directly into the down-counter 30 through a signal line not shown in FIG. 81. The Y address Yj is also stored in the address register 52, at an arbitrary convenient time between times t2 and t6, in response to control signal PM (not visible in FIG. 82).

The first burst is executed as explained in the twenty-seventh and twenty-eighth embodiments, the data bus 24 being initialized by the data bus initialization unit 90 when the PR control signal is activated around time t4, in preparation for the writing of new data Daj–4 at time t5.

The second burst begins with input of a new X address (Xi+1) at time t7. At time t8, the CS/, CAS/, and ADX/ signals are low, causing the access counter 50 to drive the PO control signal high at the same time as the PW control signal is driven high. The PO control signal remains high for one clock cycle, during which time the address register output switch 54 is closed, and the same Y address (Yj) as before is loaded into the down-counter 30 from the address register 52. Control signal PM (not visible) is left inactive during the second burst, so the address register 52 retains the same address value (Yj). The second burst accordingly accesses data in the same columns as in the first burst, but in the next row (Xi+1).

The thirty-first embodiment offers the same improvements in operating speed as the twenty-eighth embodiment, due to the initialization of the data bus 24, and the same advantage of not requiring repeated column address input as the twenty-ninth and thirtieth embodiments. Compared with the twenty-ninth and thirtieth embodiments, the thirty-first embodiment allows more freedom in the design of the address register 52, since the address register 52 does not have to pass newly received address data immediately to the down-counter 30, and in the design of the down-counter 30, since the address register output switch 54 prevents the down-counter 30 from receiving unwanted address input from the address register 52 at times when the address input is not needed.

Thirty-second embodiment

Figure 83:
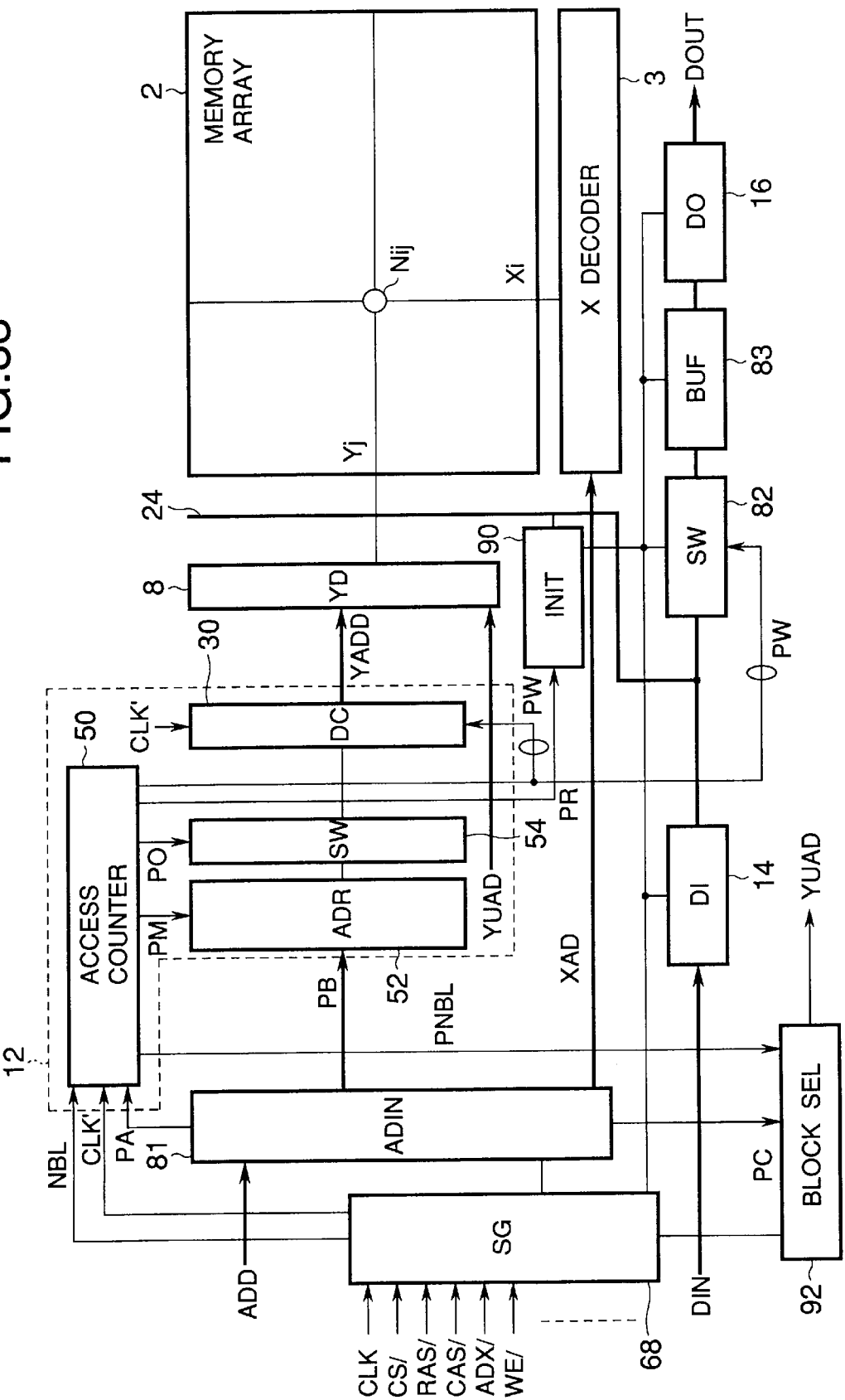
FIG. 83 is a block diagram illustrating a thirty-second embodiment of the invention.

Referring to FIG. 83, the thirty-second embodiment adds to the configuration of the thirty-first embodiment a block selection unit 92, for selecting different blocks of data in the memory array 2.

The address input unit 81 in this embodiment divides the received Y address bits into an upper group PC and a lower group PB. The lower group PB is supplied to the address register 52 and down-counter 30. The upper group PC is supplied to the block selection unit 92. From the supplied address bits, the block selection unit 92 generates an upper Y address YUAD, which is supplied directly to the Y decoder 8, bypassing the down-counter 30. The Y decoder 8 uses YUAD as, for example, the high-order bits of the Y address.

The memory control signal generator 68 in the thirty-second embodiment also supplies the access counter 50 with a control signal NBL designating the number of columns to be accessed in the same burst in each block. The access counter 50 supplies a next-block control signal PNBL to the block selection unit 92, causing the block selection unit 92 to output the upper Y address YUAD for the next block.

Figure 84:
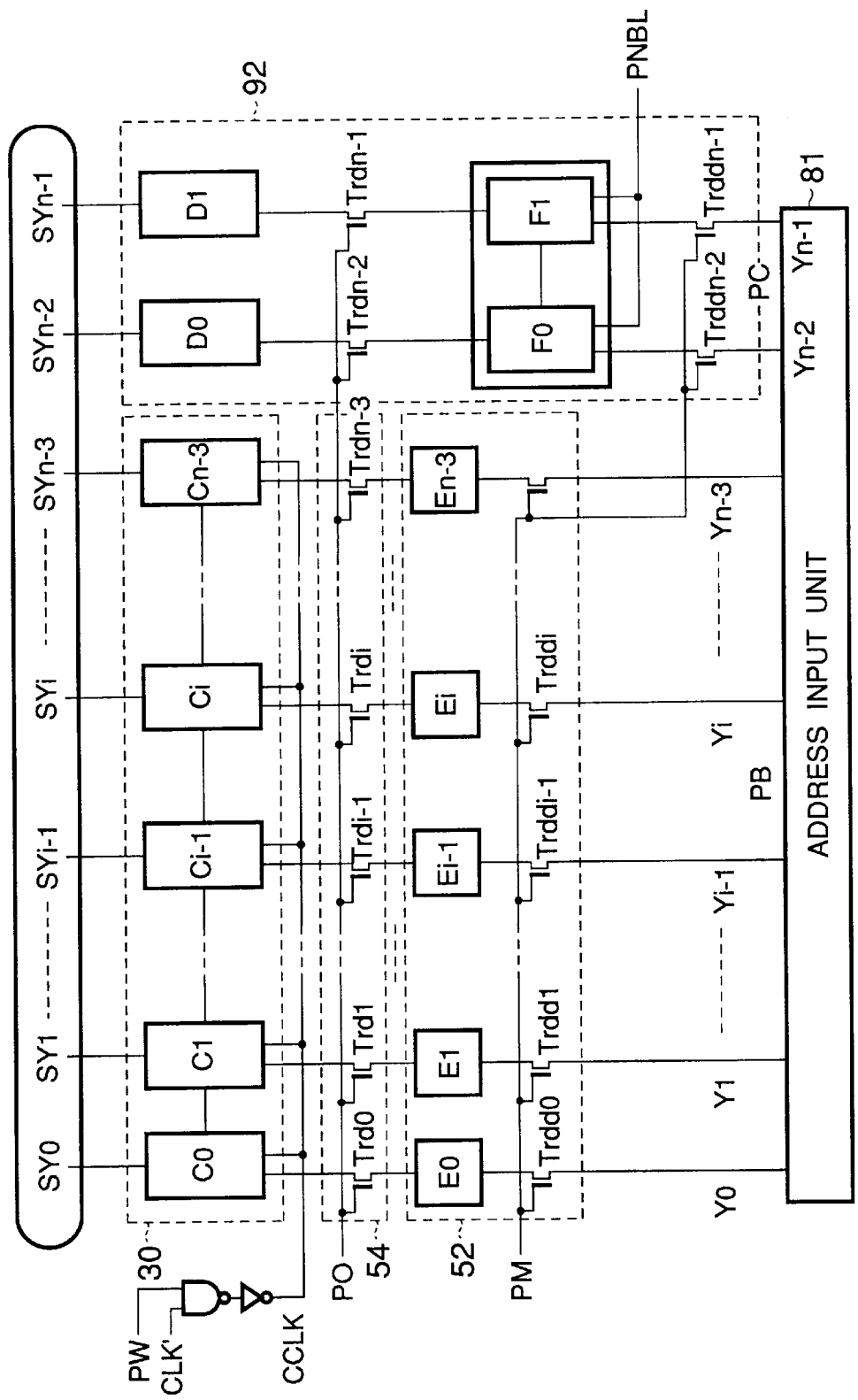
FIG. 84 shows an example of the internal structure of the address register, address register output switch, down-counter, and block selection unit in the thirty-second embodiment.

FIG. 84 shows an example of the internal configuration of the down-counter 30, address register 52, address register output switch 54, and block selection unit 92. The letter 'n' in this drawing denotes the total number of Y address bits, including both upper and lower address bits.

The down-counter 30 comprises a series of one-bit counters C0 to Cn–3 that are mutually interconnected and are driven by a counter clock signal CCLK. The counter clock signal CCLK is obtained by combining the internal clock signal CLK'0 with control signal PW in a NAND gate and inverter, as shown. Each one-bit counter Ci is, for example, a circuit having an output that toggles on a specific transition of the signal output by the adjacent one-bit counter Ci–1 to the left, all output transitions being synchronized with the counter clock CCLK.

The address register 52 comprises latches E0 to En–3 and transistors Trdd0 to Trddn–3. The transistors Trdd0 to Trddn–3, which are controlled by the PM control signal, feed the n–2 lower Y address bits PB, denoted Y0 to Yn–3, from the address input unit 81 to latches E0 to En–3.

The address register output switch 54 comprises transistors Trd0 to Trdn–3, controlled by the PO control signal, that feed the outputs of latches E0 to En–3 in the address register 52 to the corresponding one-bit counters C0 to Cn–3 in the down-counter 30.

The block selection unit 92 comprises a pair of one-bit counters F0 and F1, a pair of one-bit latches D0 and D1, a pair of transistors Trddn–2 and Trddn–1, and another pair of transistors Trdn–2 and Trdn–1. Transistors Trddn–2 and Trddn–1, which are controlled by the PM control signal, feed the two upper address bits Yn–2 and Yn–1 (PC) from the address input unit 81 to one-bit counters F0 and F1. Transistors Trdn–2 and Trdn–1, which are controlled by the PO control signal, feed the outputs of one-bit counters F0 and F1 to latches D0 and D1. The one-bit counters F0 and F1 are driven by the PNBL control signal, and are mutually interconnected to operate as, for example, an up-counter, or a down-counter.

The outputs SY0 to SYn–1 of the down-counter 30 and block selection unit 92 form the complete Y address signal supplied to the Y decoder 8. The combined value of the lower bits SY0 to SYn–3 (YADD) counts down in synchronization with the counter clock CCLK, while the combined value of the upper bits SYn–2 and SYn–1 (YUAD) counts up or down in synchronization with the PNBL control signal.

Figure 85:
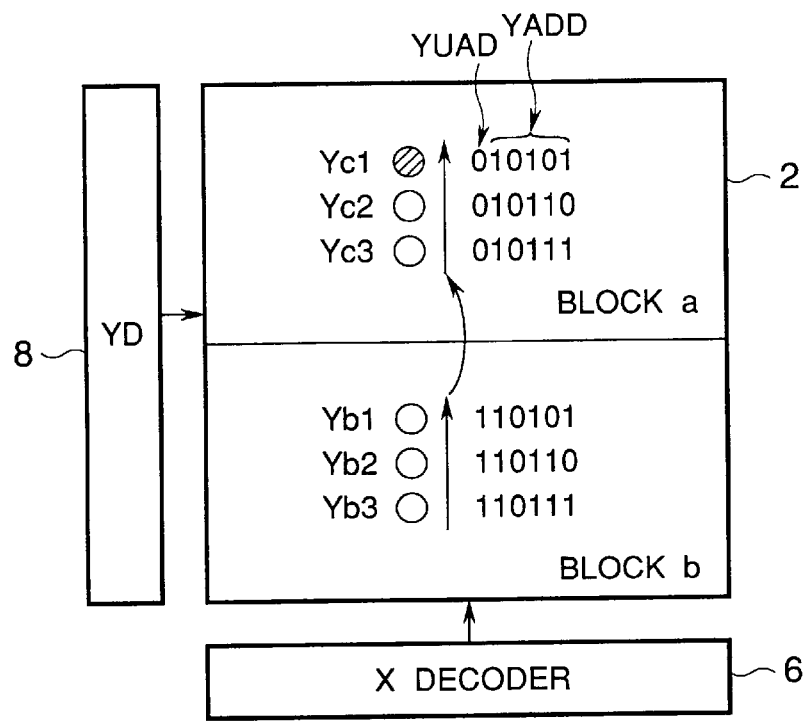
FIG. 85 shows an example of data accessed in a single burst in the thirty-second embodiment.

Referring to FIG. 85, the upper address bits YUAD output by the block selection unit 92 divide the memory array 2 into a plurality of blocks. For simplicity, only one upper address bit and two blocks (block a and block b) are shown in FIG. 85. The value of the upper address bit (YUAD) is zero in block a and one in block b.

The memory in FIG. 85 can be used by storing pixel data for one field in each block, so that the memory array 2 holds pixel data for two fields, or one frame. For example, even fields can be stored in block a, and odd fields in block b.

A single burst comprises data from both fields. FIG. 85 illustrates the case in which data are currently being received for an even field, and are being stored in block a. The burst begins with the reading of data for three pixels from the previous odd field (Yb3, Yb2, and Yb1) from block b, then the reading of data for three pixels from the previous even field (Yc3, Yc2, and Yc1) from block a, followed by the writing of new input data (Ya1, not shown) over the oldest read data (Yc1), as indicated by the hatched dot.

This burst is obtained by controlling the block selection unit 92 and address register output switch 54 with the PNBL and PO control signals so that, after the transfer of data Yb1, the upper address bit changes from one to zero, and the lower address bits of the starting address ('10111') are loaded again from the address register 52 into the down-counter 30. The burst accordingly jumps from column address '110101' (Yb1) in block b to column address '010111' (Yc3) in block a, without interruption.

Figure 86:
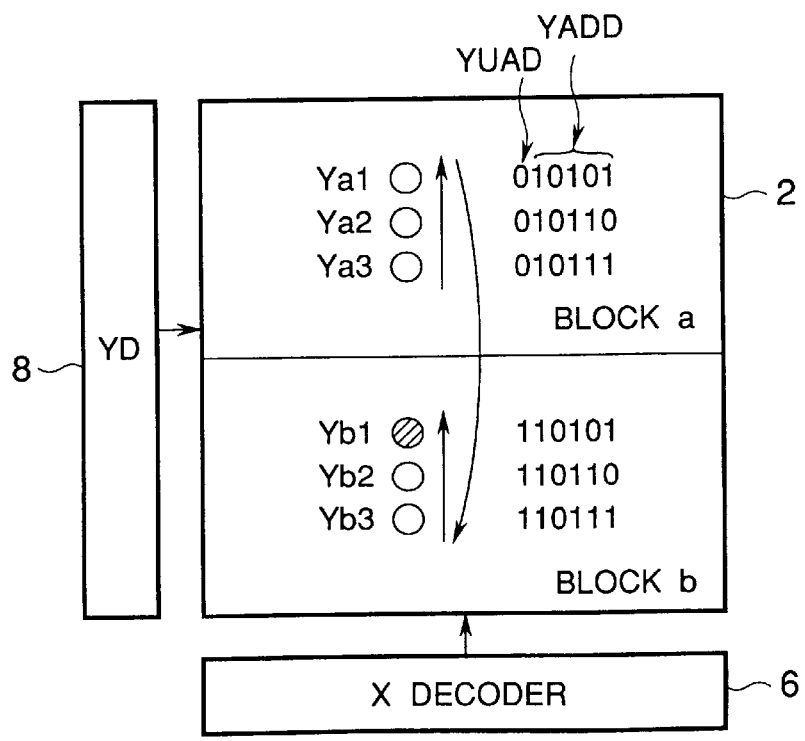
FIG. 86 shows another example of data accessed in a single burst in the thirty-second embodiment.

After all data for the new even field have been stored in block a, during reception of data for the next field, which is an odd field, burst access will take place as shown in FIG. 86. Each burst will now begin in block a and end in block b, with new pixel data being stored in block b.

If progressive scanning is employed, different blocks can store data for different frames, instead of different fields. When different blocks store pixel data for different frames, the data will normally represent pixels in identical positions in the different frames. When different blocks store pixel data for different fields, the data will normally represent pixels in mutually adjacent positions in the different fields, as can be seen in FIG. 64, for example, where data Da1 and Db1 represent pixels in mutually adjacent positions in fields a and b.

The thirty-second embodiment enables a single memory device to output pixel data from multiple fields or frames in a single burst. The number of fields or frames was shown as two in FIGS. 85 and 86, but depending on the number of upper address bits, the memory array 2 in the thirty-second embodiment can be divided into an arbitrary number of blocks, each storing a different field or frame. Differing from the first to twenty-sixth embodiments, the thirty-second embodiment does not require any data to be transferred from one block to another, so operation is simpler than in those earlier embodiments, although more data must be stored.

Further details of the operation of the thirty-second embodiment will be shown below, under the thirty-eighth embodiment.

Thirty-third embodiment

Figure 87:
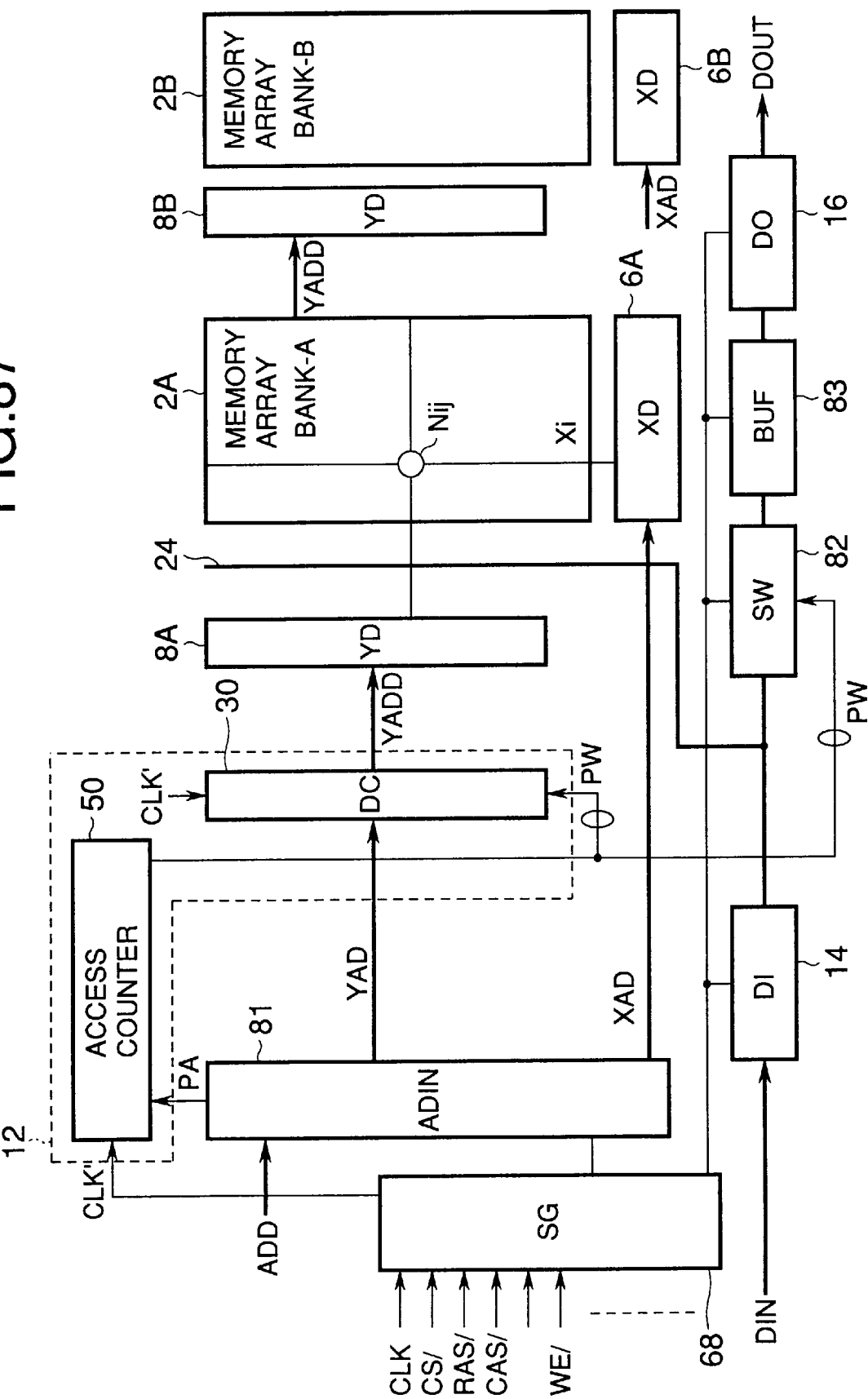
FIG. 87 is a block diagram illustrating a thirty-third embodiment of the invention.

Referring to FIG. 87, the thirty-third embodiment is similar to the twenty-seventh embodiment, but has two memory banks, with separate memory arrays 2A and 2B, separate X decoders 6A and 6B, and separate Y decoders 8A and 8B. Both banks share the same internal data bus 24 and down-counter 30.

One of the two banks can be used to store pixel data with even X addresses, while the other bank is used to store pixel data with odd X addresses in the same field, so that one bank can be precharged during burst access to the other bank.

A detailed description of the operation of the thirty-third embodiment will be deferred to the thirty-eighth embodiment.

Thirty-fourth embodiment

Figure 88:
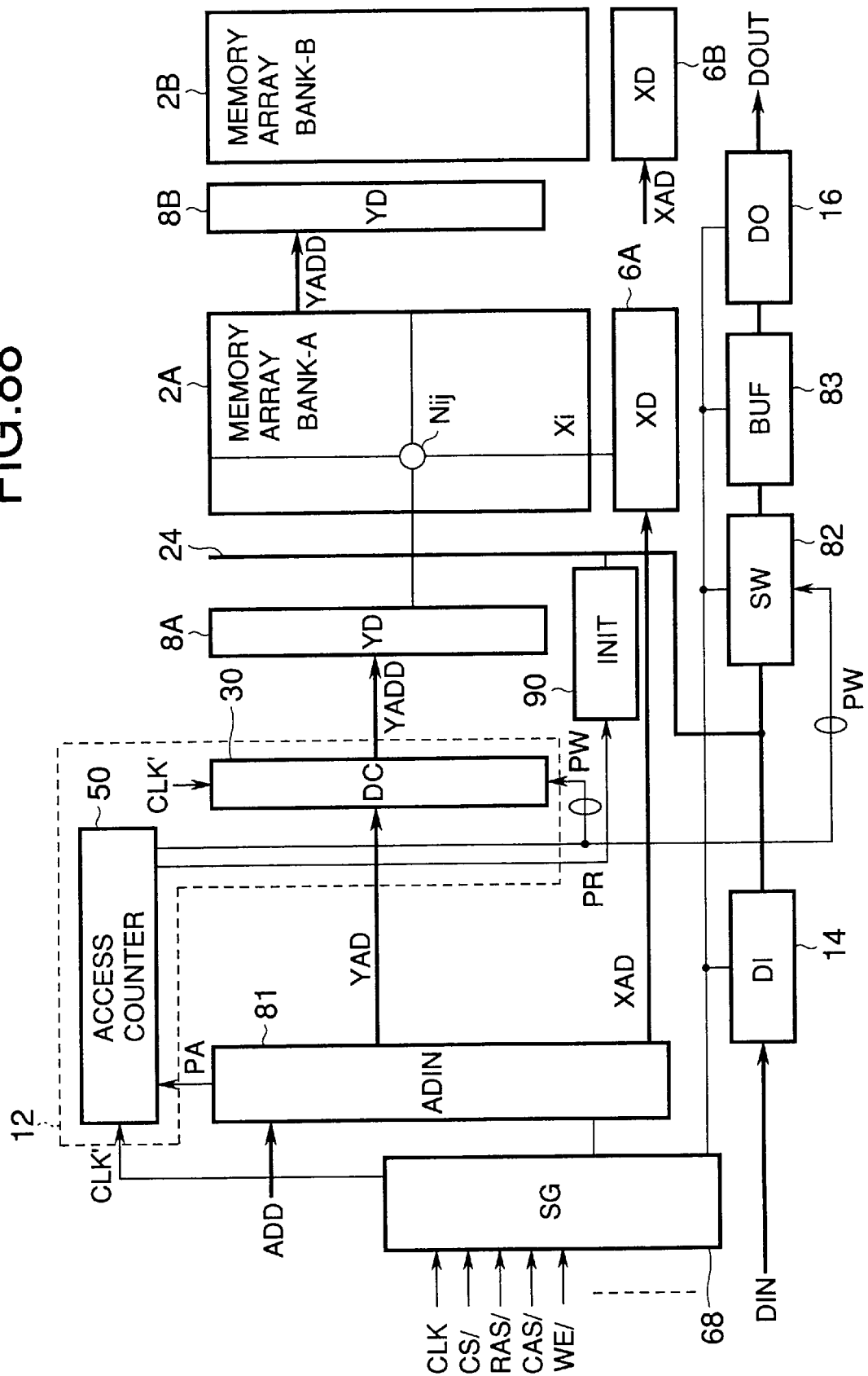
FIG. 88 is a block diagram illustrating a thirty-fourth embodiment of the invention.

Referring to FIG. 88, the thirty-fourth embodiment combines the features of the twenty-eighth and thirty-third embodiments. That is, the thirty-fourth embodiment adds a data bus initialization unit 90 to the two-bank configuration of the thirty-third embodiment. The thirty-fourth embodiment inherits the advantages of the twenty-eighth and thirty-third embodiments.

A detailed description of the operation of the thirty-fourth embodiment will be deferred to the thirty-eighth embodiment.

Thirty-fifth embodiment

Figure 89:
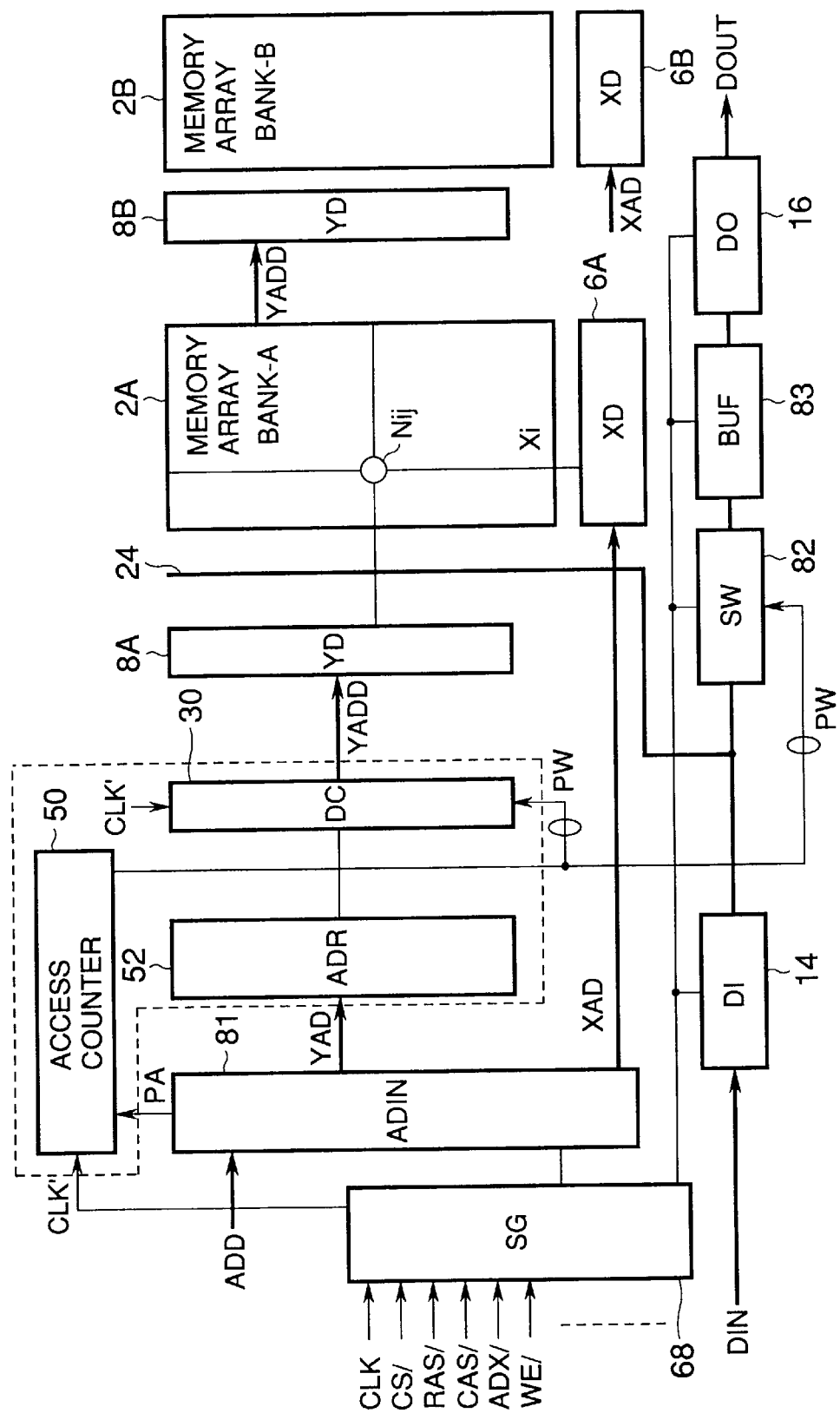
FIG. 89 is a block diagram illustrating a thirty-fifth embodiment of the invention.

Referring to FIG. 89, the thirty-fifth embodiment combines the features of the twenty-ninth and thirty-third embodiments. That is, the thirty-fifth embodiment adds an address register 52 to the configuration of the thirty-third embodiment. The thirty-fifth embodiment inherits the advantages of the twenty-ninth and thirty-third embodiments.

A detailed description of the operation of the thirty-fifth embodiment will be deferred to the thirty-eighth embodiment.

Thirty-sixth embodiment

Figure 90:
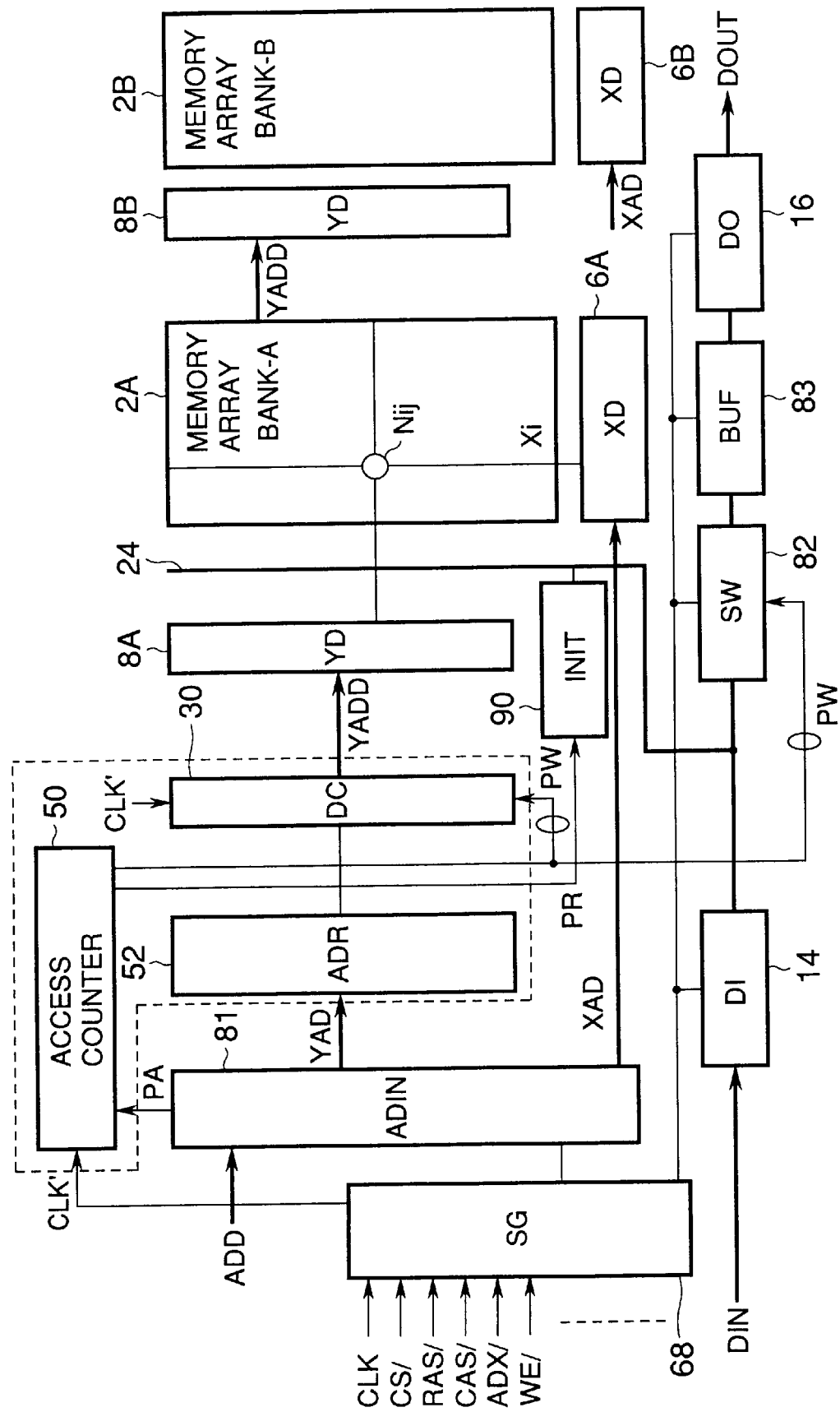
FIG. 90 is a block diagram illustrating a thirty-sixth embodiment of the invention.

Referring to FIG. 90, the thirty-sixth embodiment combines the features of the thirtieth and thirty-third embodiments. That is, the thirty-sixth embodiment adds both an address register 52 and a data bus initialization unit 90 to the configuration of the thirty-third embodiment. The thirty-sixth embodiment inherits the advantages of the thirtieth and thirty-third embodiments.

A detailed description of the operation of the thirty-sixth embodiment will be deferred to the thirty-eighth embodiment.

Thirty-seventh embodiment

Figure 91:
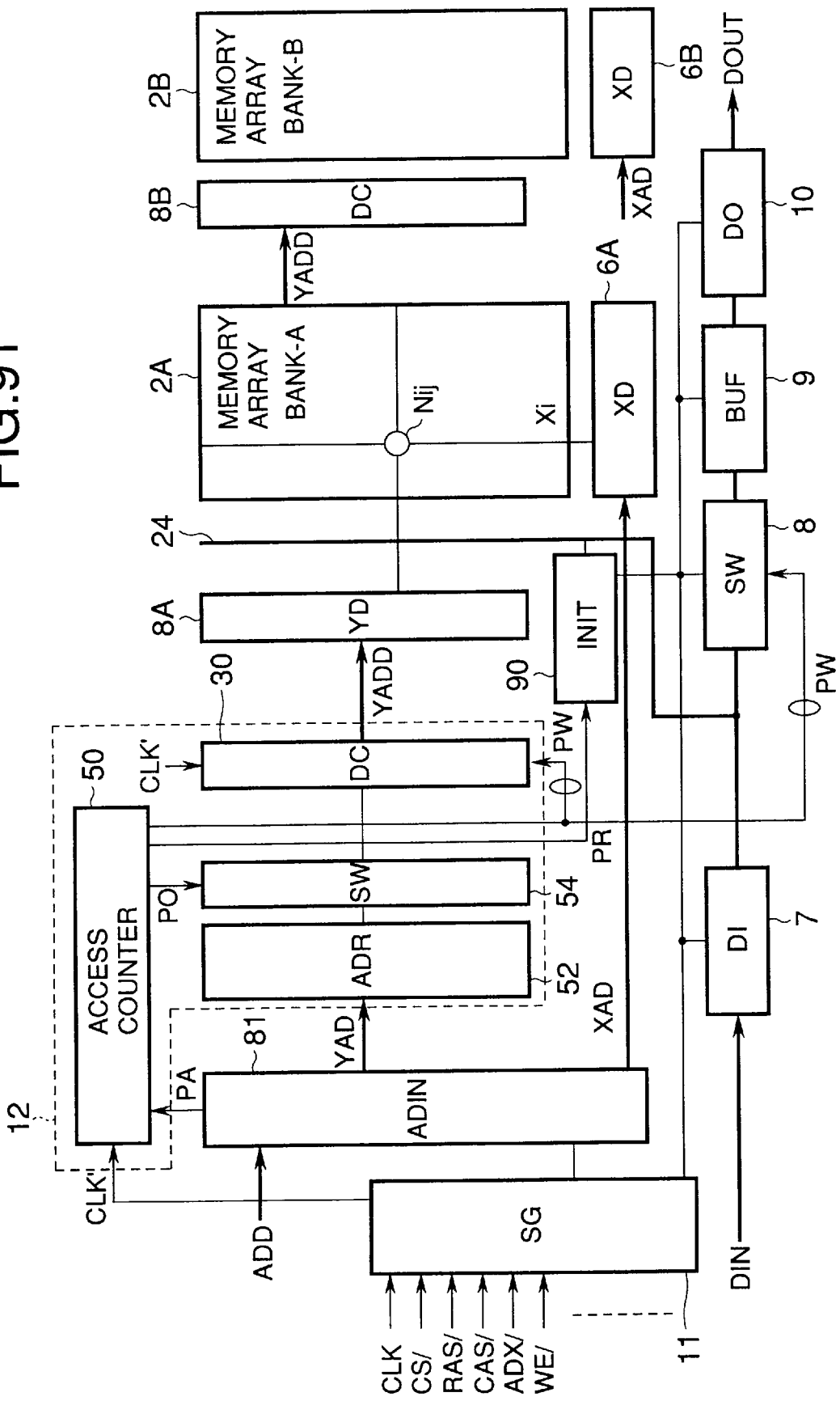
FIG. 91 is a block diagram illustrating a thirty-seventh embodiment of the invention.

Referring to FIG. 91, the thirty-seventh embodiment combines the features of the thirty-first and thirty-third embodiments. That is, the thirty-seventh embodiment adds an address register output switch 54 to the configuration of the thirty-sixth embodiment. The thirty-seventh embodiment inherits the advantages of the thirty-first and thirty-third embodiments.

A detailed description of the operation of the thirty-seventh embodiment will be deferred to the thirty-eighth embodiment.

Thirty-eighth embodiment

Figure 92:
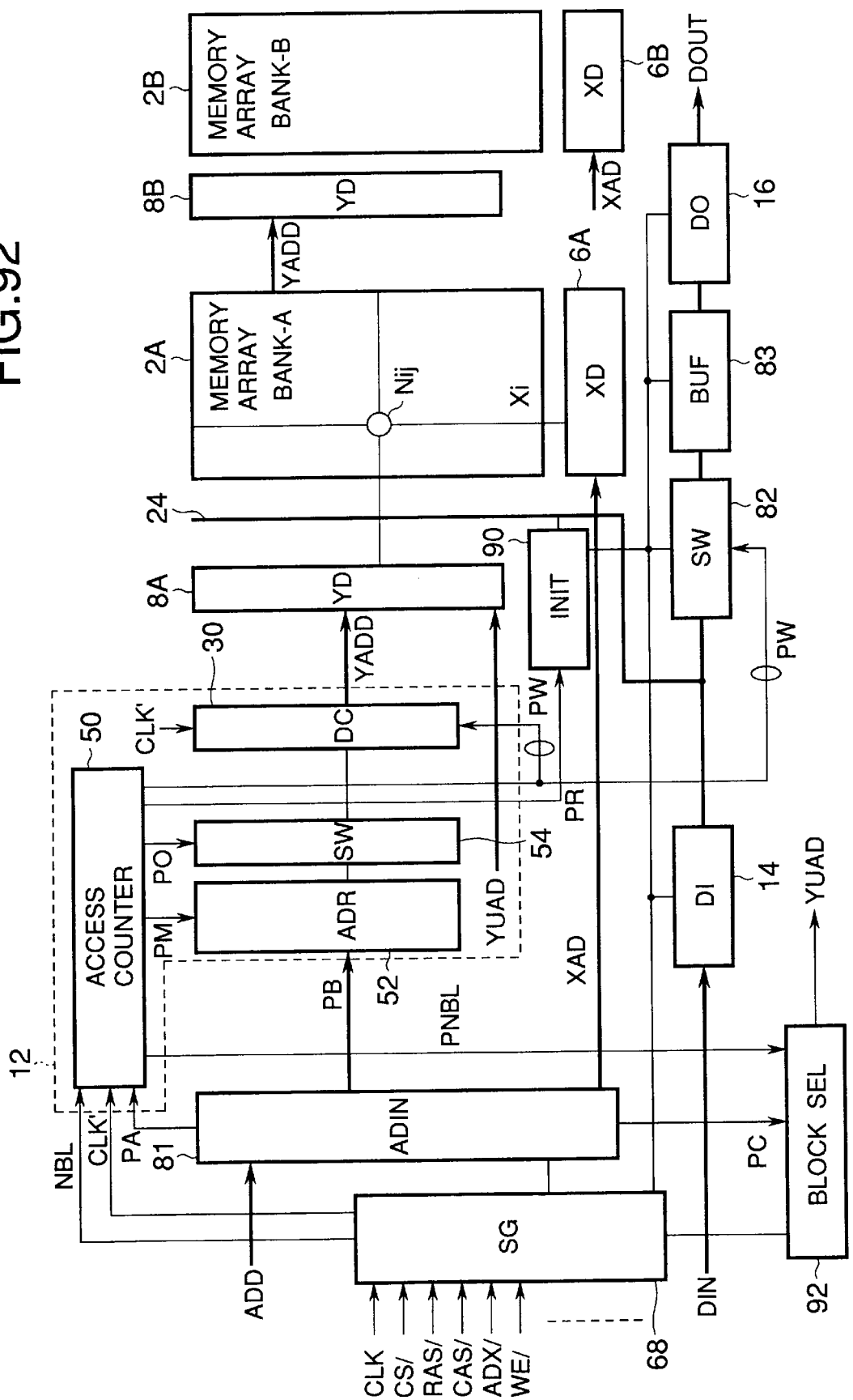
FIG. 92 is a block diagram illustrating a thirty-eighth embodiment of the invention.

Referring to FIG. 92, the thirty-eighth embodiment combines the features of the thirty-second and thirty-third embodiments, having a block selection unit 92 as in the thirty-second embodiment, and two memory banks as in the thirty-third embodiment, each memory bank now being divided into multiple blocks according to the upper address bits YUAD output by the block selection unit 92.

Figure 93:
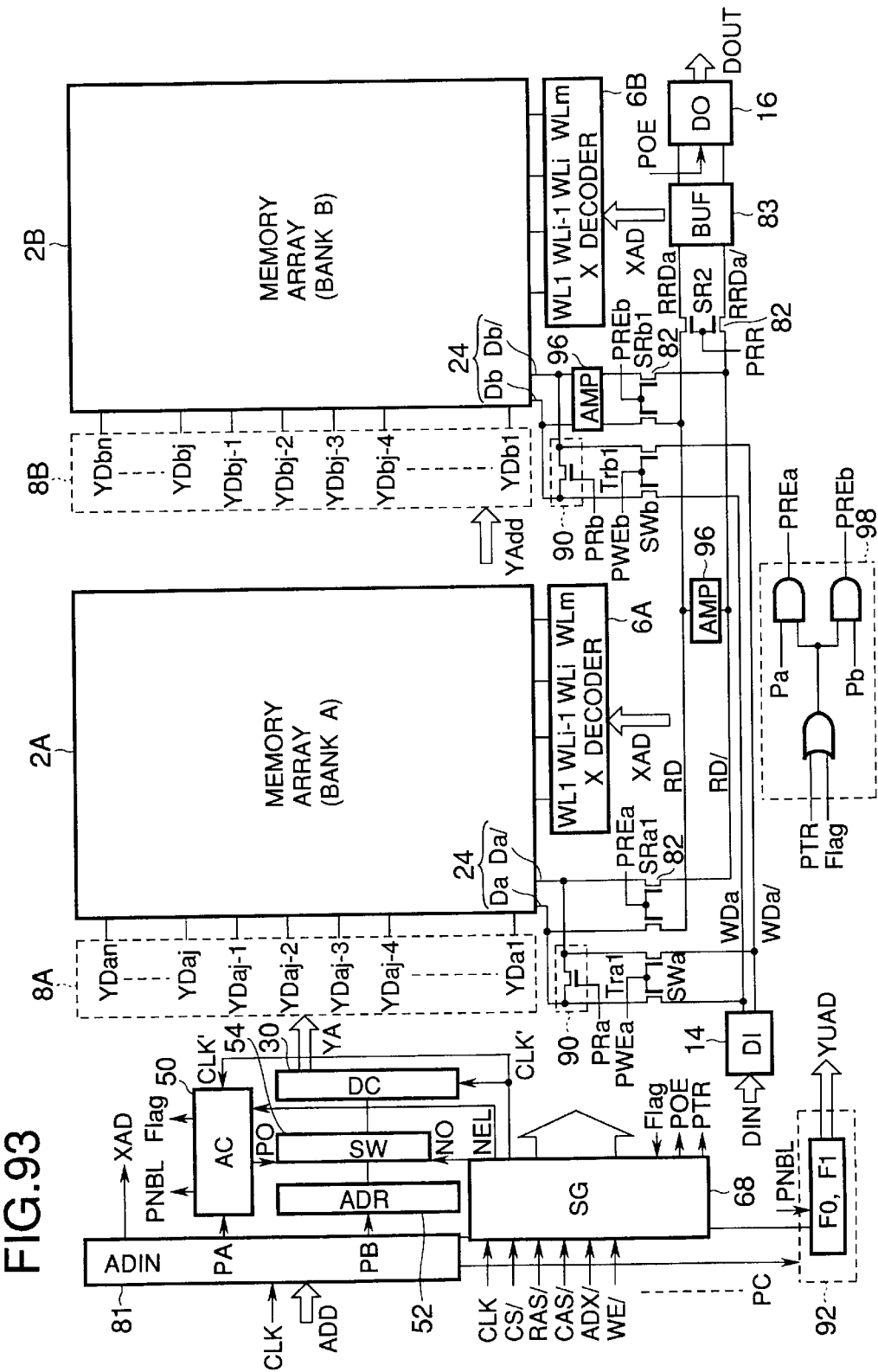
FIG. 93 is a more detailed block diagram illustrating the thirty-eighth embodiment.

FIG. 93 shows the internal structure of the thirty-eighth embodiment in more detail.

The address input unit 81 outputs the X address signal XAD and three other control and address signals: PA, PB, and PC. PA is supplied to the access counter 50 to control the burst length, as explained in the twenty-seventh embodiment. PB comprises the lower bits of the Y address, and is supplied to the address register 52. PC comprises the upper bits of the Y address, and is supplied to the block selection unit 92.

The access counter 50 also receives the NBL control signal from the memory control signal generator 68. As described in the thirty-second embodiment, NBL is a control signal that controls the number of bits read from each block in a burst. The access counter 50 outputs the PO control signal as shown in the thirty-first embodiment, outputs the PNBL signal that controls the block selection unit 92 as explained in the thirty-second embodiment, and outputs a flag signal, which is normally low but goes high to indicate the end of a burst.

The address register 52, address register output switch 54, and down-counter 30 have, for example, the structure shown in FIG. 84, except that the address register output switch 54 receives an NO control signal from the memory control signal generator 68, in addition to the PO control signal from the access counter 50. The address register output switch 54 connects the address register 52 to the down-counter 30 whenever either NO or PO is active.

The memory control signal generator 68 outputs various control signals in addition to those described in previous embodiments. Two of these signals, an output enable signal POE and a read timing signal PTR, are indicated explicitly; other control signals are indicated generally by a large arrow. The memory control signal generator 68 receives the flag signal output by the access counter 50.

The block selection unit 92 has, for example, the structure shown in FIG. 84, comprising one-bit counters F0 and F1 that produce the upper Y address signal YUAD.

The internal data bus 24 has pairs of complementary signal lines Da and Da/ for bank A, and similar pairs of complementary signal lines Db and Db/ for bank B. For simplicity, only one complementary pair of data bus lines is shown in each bank. The data bus 24 also comprises complementary pairs of read data bus lines RD and RD/, and RRDa and RRDa/, that couple data bus lines Da, Da/, Db, and Db/ through transistor switches (described below) to the buffer circuit 83, and complementary pairs of write data bus lines WDa and WDa/ that couple data bus lines Da, Da/, Db, and Db/ through other transistor switches (described below) to the data input unit 14.

The data bus initialization unit 90 comprises transistors Tra1 and Trb1 that equalize the complementary pairs of data bus lines. These transistors are driven by reset control signals PRa and PRb, which are among the control signals output by the memory control signal generator 68.

The data bus lines Da and Da/ leading from bank A are coupled to the write data bus lines WDa and WDa/ through transistors SWa, which are driven by an internal write enable control signal PWEa for bank A. Similarly, the data bus lines Db and Db/ leading from bank B are coupled to the write data bus lines WDa and WDa/ through transistors SWb, which are driven by an internal write enable control signal PWEb for bank B. Control signals PWEa and PWEb are output from the memory control signal generator 68. The write data bus lines WDa and WDa/ are coupled to the data input unit 14.

The data bus switch 82 by which the data bus 24 is coupled to the buffer circuit 83 comprises transistors SRa1, SRb1, and SR2. Transistors SRa1, which couple the data bus lines Da and Da/ in bank A to the read data bus lines RD and RD/, are driven by an internal read enable control signal PREa for bank A. Transistors SRb1, which couple the data bus lines Db and Db/ in bank B to the read data bus lines RD and RD/, are driven by an internal read enable control signal PREb for bank B. Transistors SR2, which couple read data bus lines RD and RD/ to read data bus lines RRDa and RRDa/, are controlled by a read ready control signal PRR, which is output from the memory control signal generator 68. Read data bus lines RRDa and RRDa/ are coupled to the buffer circuit 83. Amplifiers 96 are coupled to the read data bus lines RD and RD/, and to the data bus lines Db and Db/ leading from transistors SRb1 into memory array 2B, to amplify the read data.

The read enable control signals PREa and PREb are generated by, for example, a logic circuit 98 comprising AND and OR gates, which receives the PTR control signal from the memory control signal generator 68 and the flag signal from the access counter 50. The logic circuit 98 also receives control signals Pa and Pb, output by the memory control signal generator 68, that select banks A and B, respectively.

The data output unit 16 is controlled by the internal output enable signal POE from the memory control signal generator 68.

The Y decoders 8A and 8B comprise AND gates as shown in FIG. 10. In FIG. 93, these AND gates are designated YDa1 to YDan in Y decoder 8A, and YDb1 to YDbn in Y decoder 8B.

Figure 94:
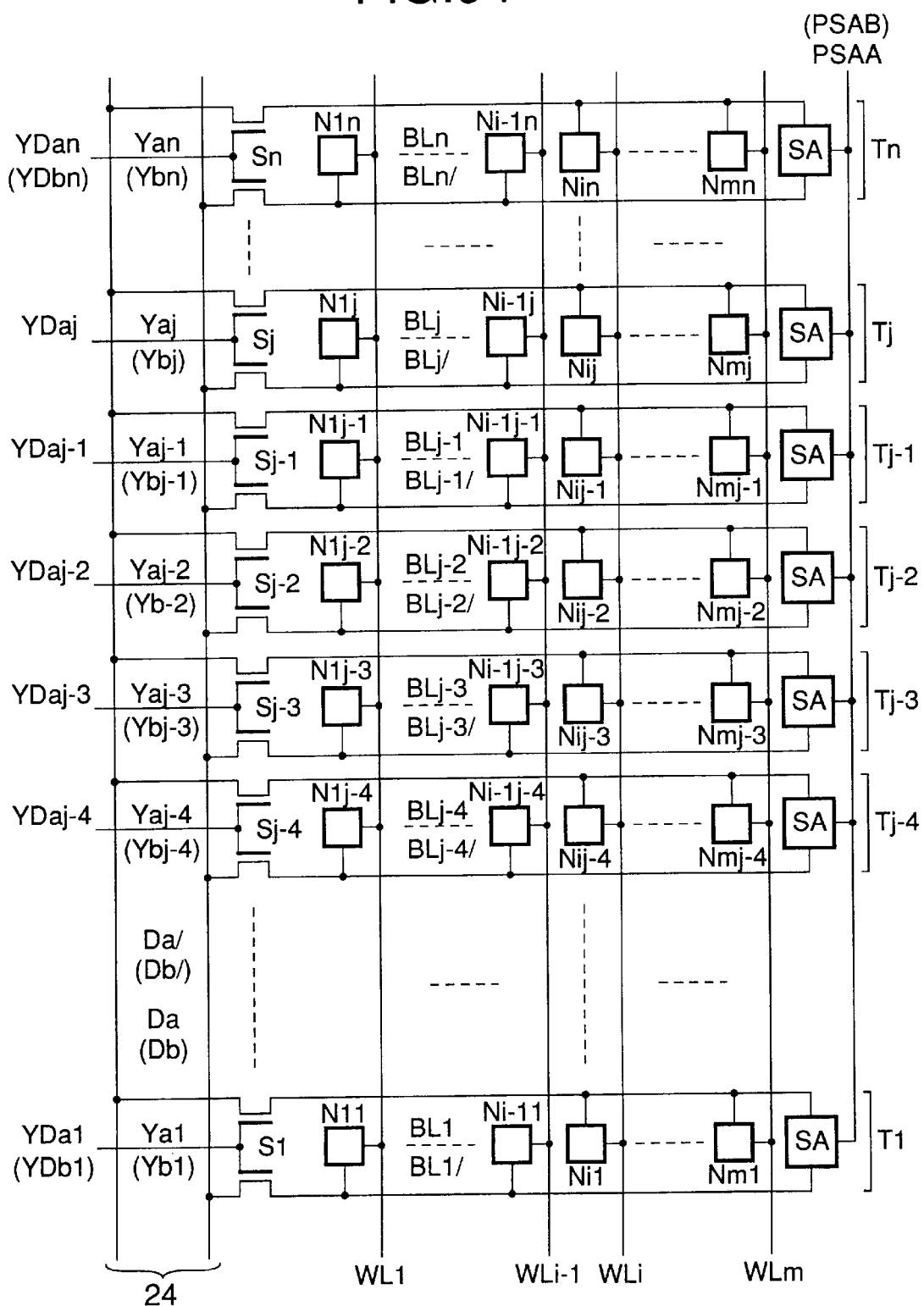
FIG. 94 is schematic diagram of the memory array in the thirty-eighth embodiment.

FIG. 94 shows the internal structure of the memory arrays 2A and 2B. With certain notational differences, this structure is identical to the structure of the main memory array 2 shown in FIG. 10. The following description will be confined to the notational differences.

The notation YDa1 (YDb1) to YDan (YDbn) denotes the AND gates of the Y decoders 8A and 8B, as in FIG. 93, which are equivalent to the AND gates 38 in FIG. 10.

The signals that were denoted Y1 to Ym in FIG. 10 are denoted Ya1 (Yb1) to Yan (Ybn) in FIG. 93, the letters 'a' and 'b' denoting bank A and bank B, respectively.

The transfer transistors 46 that connect the bit lines to the data bus lines Da (Db) and Da/ (Db/) are denoted Si to Sn. The bit lines are denoted BL1 and BL1/ to BLn and BLn/.

PSAA and PSAB are the signals that activate the sense amplifiers (SA) in banks A and B, respectively. T1 to Tn denote columns 1 to n. The letter 'm' denotes the number of rows in each memory bank. The letter 'n' denotes the number of columns in each memory bank.

Next, the operation of the thirty-eighth embodiment will be described for the case of a burst in which data for six pixels are read from one bank, comprising three pixels each from two fields, the data being stored in separate blocks in the bank.

The following description also applies to the thirty-second through thirty-seventh embodiments, insofar as those embodiments share common features with the thirty-eighth embodiment.

Figure 95:
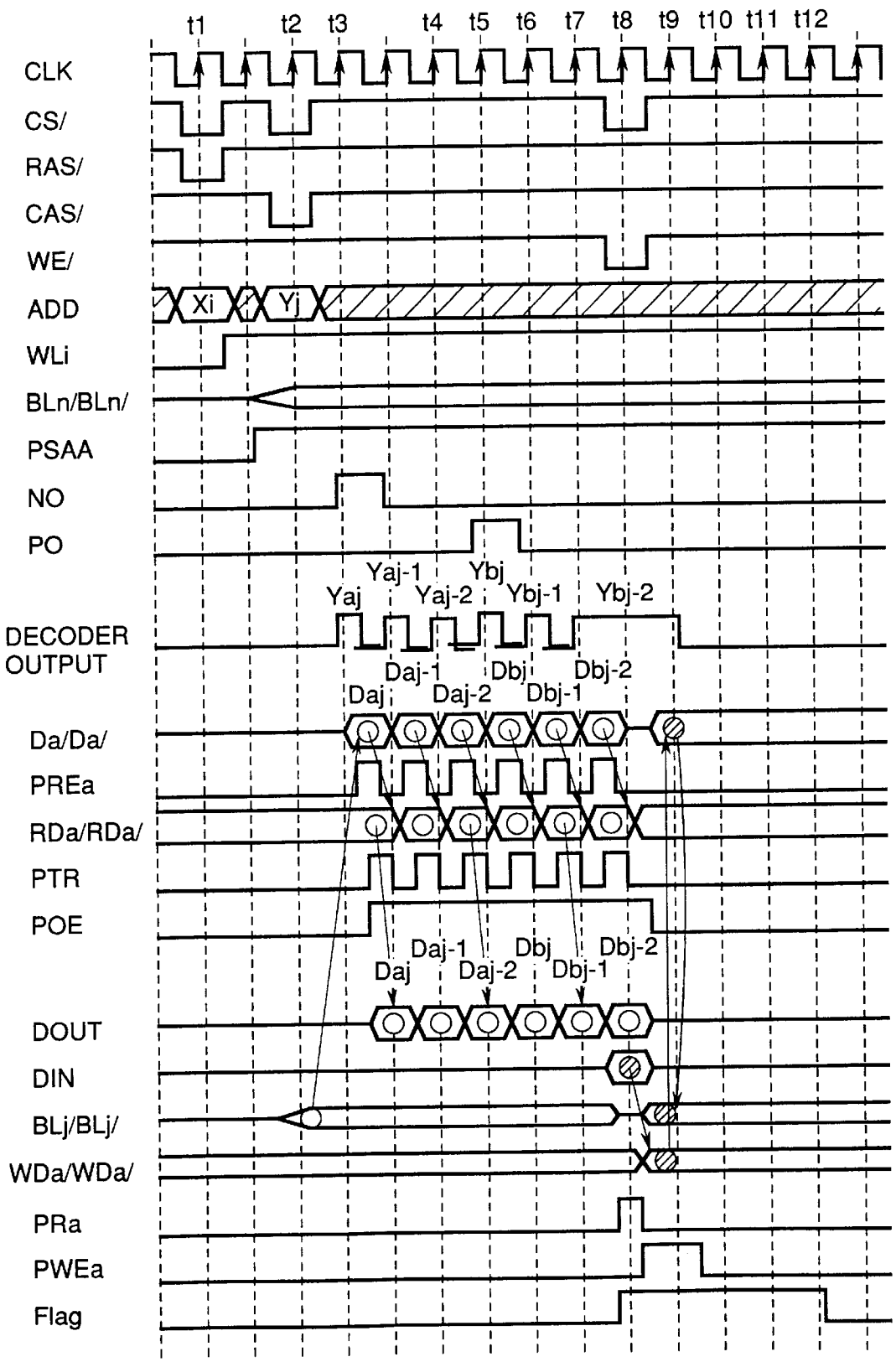
FIG. 95 is a timing diagram illustrating the operation of the thirty-eighth embodiment.

Referring to FIG. 95, at time t1, with CS/ and RAS/ low, an X address (Xi) is received at the address input terminals ADD. The memory control signal generator 68 selects bank A or B according to, for example, the least significant X address bit, and sends the X address to the corresponding X decoder 6A or 6B, which drives the corresponding word line WLi. In the following description, it will be assumed that bank A is selected. Thus control signal Pa is therefore high, and control signal Pb is low.

Following time t1, the memory control signal generator 68 drives the sense amplifier activating signal (PSAA) in the selected bank A, and data begin to appear on the bit lines (BL1 and BL1/ to BLn and BLn/) in bank A. Bank B remains inactive.

At time t2, with CS/ and CAS/ low, a Y address Yj is received at the address input terminals ADD. The address input unit 81 sends the lower address bits (PB) to the address register 52, and sends the upper address bits (PC) to the block selection unit 92. The address input unit 81 also sends the PA control signal to the access counter 50, designating a burst length of six cycles. The NBL control signal sent from the memory control signal generator 68 to the access counter 50 indicates that the burst is to spend three cycles accessing each block in the selected memory bank.

The invention is not restricted to this method of using the PA and NBL control signals. As an alternative method, PA can designate three cycles, and NBL can designate two sets of three cycles each.

At a point between times t2 and t3, the memory control signal generator 68 activates the NO control signal, and the address register output switch 54 responds by connecting the address register 52 to the down-counter 30, loading the lower Y address bits into the down-counter 30. These bits combine with the upper address bits YUAD output by the block selection unit 92 so that the Y decoder 8A receives the entire input Y address Yj, and activates a signal Yaj that connects the bit lines in the designated column Tj in bank A to the data bus 24.

Incidentally, the letters 'a' and 'b' in the decoder output waveforms (Yaj, Yaj−1, . . . , Ybj−2 ) in FIG. 95 do not indicate banks A and B; all access in this burst is to bank A. Instead, 'a' and 'b' in the decoder output waveforms denote blocks a and b in bank A, as in FIG. 86.

At time t3, the data Daj (corresponding to data Da3 in FIG. 86) are transferred from bit lines BLj and BLj/ and begin to appear on the data bus lines Da and Da/ in bank A. During the next clock cycle, the internal read enable control signal PREa is activated for a certain period, during which period data Daj are transferred from data bus lines Da and Da/ through transistors SRa1 to the read data bus lines RDa and RDa/, as shown by the waveforms in FIG. 95. The PRR control signal (not shown) is also active, so data Daj are passed through transistors SR2 and read data bus lines RRDa and RRDa/ to the buffer circuit 83, latched in the buffer circuit 83, and passed to the data output unit 16.

The PREa signal is generated from the PTR read timing signal by the logic circuit 98 shown in FIG. 93. The flag signal output by the access counter 50 is low, and Pa is high, so PREa follows the high and low transitions of PTR, substantially as shown by the waveforms in FIG. 95.

Shortly after time t3, the memory control signal generator 68 activates the output enable control signal POE, and in the next clock cycle, the data output unit 16 sends data Daj to the output terminals DOUT, as shown.

Operations proceed in this way, the down-counter 30 decrementing so that data Daj−1 and Daj−2 are transferred from the memory array 2A to the buffer circuit 83. These transfers take place in the clock cycles preceding and following time t4.

Shortly before time t5, the access counter 50 determines, from the information supplied earlier in the PA and NBL signals, that sufficient data have been read from block a, and activates the PO control signal, causing the starting Y address (lower bits) to be reloaded from the address register 52 into the down-counter 30. At the same time, although not indicated in FIG. 95, the access counter 50 sends a PNBL control signal to the block selection unit 92, causing the block selection unit 92 to alter the upper address bits YUAD to indicate the next block (b). Thus at time t5, the Y decoder 8A generates a signal Ybj selecting a column in block b in memory bank A, and data Dbj (corresponding to Yb3 in FIG. 86) are transferred through the data bus lines Da and Da/, Rda and RDa/, and RRDa and RRDa/ to the buffer circuit 83.

Following times t6 and t7, succeeding data Dbj−1 and Dbj−2 (corresponding to Yb2 and Yb1 in FIG. 86) are transferred from the memory array 2A through data bus lines Da and Da/, Rda and RDa/, and RRDa and RRDa/ to the buffer circuit 83. Data Dbj, Dbj−1, and Dbj−2 are output at times t6, t7, and t8, respectively, by the data output unit 16.

Around time t8, when data Dbj−2 have been transferred to the buffer circuit 83 and are being output by the data output unit 16, the memory control signal generator 68 activates the data bus reset control signal PRa, thereby initializing the data bus lines Da and Da/. The Y decoder 8A continues to output the Ybj−2 column select signal, so the bit lines selected by this signal are also initialized. New input data, indicated by a hatched dot, are also received at time t8 at the data input terminals DIN, and placed on the write data bus lines WDa and WDa/.

The access counter 50 also activates the flag signal at this time, to indicate the end of the burst. Receiving the flag signal, the memory control signal generator 68 halts output of the read timing signal PTR, so that no more PTR pulses are generated after time t8. Accordingly, no more PREa pulses are generated after time t8.

Incidentally, although the logic circuit 98 that generates the read enable signals PREa and PREb is shown as receiving the flag signal in FIG. 93, PREa and PREb can be generated correctly without input of the flag signal to logic circuit 98, so this input can be eliminated if so preferred.

Shortly after time t8, the memory control signal generator 68 activates the internal write enable signal PWEa, connecting the write data bus lines WDa and WDa/ to the data bus lines Da and Da/ serving memory array 2A. At time t9, the new input data are transferred to the data bus lines Da and Da/. Since the Y decoder 8A continues to output the signal Ybj−2, the input data are also transferred to the selected bit lines and written in the memory cells in block b that formerly held data Dbj−2. Although these bit lines are indicated as BLj and BLj/ in FIG. 95, they are not the same bit lines BLj and BLj/ from which the initial data Daj in the burst were read, since data Daj were read from block a.

During this burst, the word lines in bank B can be precharged in preparation for the next burst, in which bank B will be accessed. The data bus lines and bit lines in bank B can also be initialized.

The flag signal is shown as remaining high from time t8 to time t12 in FIG. 95, but of course the flag signal can be brought low earlier, in preparation for the next burst. Other minor timing changes can also be made as necessary. FIG. 95 is intended to show the general sequence of events, rather than to depict accurate timing relationships.

Like the thirty-second embodiment, the thirty-eighth embodiment enables a single memory device to output pixel data from multiple fields or frames in a single burst. In addition, the thirty-eighth embodiment can shorten the intervals between bursts by hiding the precharging of each bank behind burst access to another bank. With two banks, a preferred way to use the thirty-eighth embodiment is to store the data for odd-numbered pixels in each scanning line in one bank, and the data for even-numbered pixels in each scanning line in the other bank, so that access alternates between the two banks.

Variations

The preceding embodiments have described a bank interleaving scheme by which alternate rows are accessed in alternate banks, but column interleaving of access between banks is also possible.

The number of banks is not restricted to two. Larger numbers of banks can be provided.

The down-counter in the Y address generator can be replaced by an up-counter. There is an advantage in using a down-counter, however, in that the scanning lines in a moving picture are generally addressed and scanned in ascending order from the top of the screen to the bottom. This makes a down-counter more convenient for bursts of the type described above, in which data are output in the reverse of the line scanning order.

When the first through twenty-sixth embodiments are used in a non-cascaded manner, with input and output occurring at separate times, the data input unit 14 and data output unit 16 can share the same external data terminals.

The access count registers and address recalculators of the nineteenth to twenty-sixth embodiments can be employed in combinations with various other embodiments.

The PM and PO control signals in the thirty-first embodiment can be generated by the memory control signal generator 68 instead of the access counter 50.

The PA control signal in the twenty-seventh through thirty-eighth embodiments can be generated by the memory control signal generator 68 instead of the address input unit 81.

Although the invention addresses problems encountered in the digital processing of moving pictures, applications of the invented memory devices are not limited to the digital processing of moving pictures.

Those skilled in the art will recognize that further variations are possible within the scope claimed below.

What is claimed is:

1. A memory device receiving row and column address signals, input data, and external control signals in synchronization with a clock signal, having a data input unit for receiving said input data, having a data output unit for output of output data, having a plurality of word lines, having a row decoder for activating a word line selected from among said word lines according to a received row address signal, and comprising:

a main memory array having a plurality of memory cells arranged in intersecting rows and columns, said word lines being coupled to respective rows of memory cells in said main memory array;

an internal data bus;

a column address generator generating a series of column addresses from a single received column address signal, each column address in said series of column addresses having a high-order part and a low-order part;

a main column decoder coupled to said main memory array and said column address generator, for decoding said column addresses and coupling corresponding columns of memory cells in said main memory array to said internal data bus;

a sub memory array having a plurality of memory cells arranged in intersecting rows and columns, said word lines also being coupled to respective rows of memory cells in said sub memory array, said sub memory array having fewer columns that said main memory array;

a sub column decoder coupled to said sub memory array and said column address generator, for decoding the low-order part of said column addresses and coupling corresponding columns of memory cells in said sub memory array to said internal data bus; and a control signal generator coupled to said column address generator and receiving said external control signals, for generating internal control signals that enable said main column decoder and said sub column decoder and control said data input unit and said data output unit, thereby causing data stored in said main memory array to be output through said internal data bus and said data output unit, causing data stored in said main memory array to be transferred through said internal data bus to said sub memory array and stored in said sub memory array, causing data stored in said sub memory array to be output through said internal data bus and said data output unit, and causing input data received by said data input unit to be transferred through said internal data bus to said main memory array and stored in said main memory array.

2. The memory device of claim 1, wherein said control signal generator has a mode of operation in which reception of a row address signal, a column address signal, and input data is accompanied by transfer of data from a first location in said main memory array to a second location in said sub memory array, storage of the input data in said first location, output of data from a first series of locations in said main memory array, and output of data from a second series of locations in said sub memory array.

3. The memory device of claim 2, wherein said second location is among said second series of locations.

4. The memory device of claim 3, wherein said first location is among said first series of locations.

5. The memory device of claim 4, further comprising a plurality of external data terminals, wherein said data input unit and said data output unit are coupled to different external data terminals, enabling data to be input and output simultaneously.

6. The memory device of claim 5, wherein reception of said input data is simultaneous with the output of data stored in said first location in said main memory array.

7. The memory device of claim 1, further comprising a data bus switch that divides said internal data bus into a first part, coupled to said main memory array, and a second part, coupled to said sub memory array.

8. The memory device of claim 7, further comprising a write amplifier coupled to the second part of said internal data bus, for amplifying the data transferred from said main memory array to said sub memory array.

9. The memory device of claim 1, wherein said data output unit divides said internal data bus into a first part, coupled to said main memory array, and a second part, coupled to said sub memory array, and said data output unit amplifies the data transferred from said main memory array to said sub memory array.

10. The memory device of claim 1, further comprising:
a high-order address bus coupled to said column address generator, carrying the high-order part of said column addresses to said main column decoder;
a low-order address bus coupled to said column address generator, carrying the low-order part of said column addresses; and
an address bus switch dividing said low-order address bus into a first part, coupled to said main column decoder, and a second part, coupled to said sub column decoder, said address bus switch being controllable by said control signal generator to disconnect the second part of said low-order address bus from said column address generator.

11. The memory device of claim 10, further comprising an address-holding latch coupled to the second part of said low-order address bus, for latching the low-order part of said column addresses and supplying said low-order part to said sub column decoder when the second part of said low-order address bus is disconnected from said column address generator.

12. The memory device of claim 1, further comprising:
a main address bus coupled to said column address generator, carrying the high-order part and low-order part of said column addresses to said main column decoder; and
a sub address bus coupled to said column address generator, carrying the low-order part of said column addresses to said sub column decoder.

13. The memory device of claim 1, wherein said column address generator comprises:
an address register for storing a column address designated by the column address signal received by said memory device;
a column address counter for generating said series of column addresses, starting from the column address stored in said address register, at a rate determined by said clock signal; and
an access counter for counting the column addresses generated by said column address counter and stopping said column address counter when a certain number of column addresses have been generated.

14. The memory device of claim 13, wherein said control signal generator generates control signals that repeatedly load the column address stored in said address register into said column address counter, enabling said column address counter to generate identical series of column addresses repeatedly following reception of a single column address signal by said memory device.

15. The memory device of claim 14, wherein said control signal generator generates control signals that cause said column address counter to generate said identical series of column addresses repeatedly following reception of different row address signals by said memory device, even though only one column address signal is received.

16. The memory device of claim 1, comprising at least two memory banks, each constituted as described in claim 1, said memory banks sharing said data input unit, said data output unit, and said control signal generator, but having separate main memory arrays, separate sub memory arrays, separate row decoders, separate main column decoders, and separate sub column decoders.

17. The memory device of claim 16, wherein said memory banks have separate column address generators, further comprising:
an access count register coupled to said control signal generator, storing a value, supplied by said control signal generator, indicating how many column addresses are to be generated in said series of column addresses in each bank; and
an access counter coupled to said access count register, for controlling the column address generator in each bank according to the value stored in said access count register.

18. The memory device of claim 16, wherein said control signal generator causes output of data from the main memory array of a first one of said memory banks to take place between output of data from the main memory array of a second one of said memory banks and output of data from the sub memory array of said second one of said memory banks.

19. The memory device of claim 18, wherein said memory banks have separate column address generators, further comprising:
a first access count register coupled to said control signal generator, storing a first value supplied by said control signal generator;
a second access count register coupled to said control signal generator, storing a second value supplied by said control signal generator;
a third access count register coupled to said control signal generator, storing a third value supplied by said control signal generator; and
an access counter coupled to said first access count register, said second access count register, and said third access count register, for controlling the column address generator in said second one of said banks according to said first value, causing a corresponding quantity of data to be output from the main memory array in said second one of said banks, then controlling the column address generator in said first one of said banks according to said second value, causing a corresponding quantity of data to be output from the main memory array in said first one of said banks, then controlling the column address generator in said second one of said banks according to said third value, causing a corresponding quantity of data to be output from the sub memory array in said second one of said banks.

20. The memory device of claim 19, further comprising at least two address recalculators coupled to the column address generators in respective banks, for modifying initial column addresses in the series of column addresses generated by respective column address generators, according to control signals supplied from said control signal generator, thereby modifying the quantity of data output from the main memory arrays and sub memory arrays in respective banks.

21. The memory device of claim 16, wherein said control signal generator causes the input data received by said data input unit to be transferred to the main memory array in one of said memory banks while data are being output from another one of said memory banks.

22. The memory device of claim 16, wherein said memory banks have separate internal data buses, further comprising a bank bus switch coupling said separate internal data buses to said data input unit and said data output unit.

23. The memory device of claim 22, further comprising a transfer register coupled to said bank bus switch and shared by all of said memory banks, the data transferred from the main memory array to the sub memory array in one of said memory banks being first transferred from said main memory array to said transfer register, then transferred from said transfer register to said sub memory array during output of data from another one of said memory banks.

24. The memory device of claim 23, further comprising an input data register coupled between said data input unit and said bank bus switch, for temporarily storing the input data received by said data input unit, pending transfer of said input data to the main memory array of one of said memory banks.

25. The memory device of claim 22, further comprising, in each memory bank among said memory banks, a transfer register coupled to the internal data bus of said memory bank, the data transferred from the main memory array to the sub memory array in said memory bank being first transferred from said main memory array to said transfer register, then transferred from said transfer register to the sub memory array of said memory bank, during output of data from another one of said memory banks.

26. The memory device of claim 25, further comprising an input data register coupled between said data input unit and said bank bus switch, for temporarily storing the input data received by said data input unit, pending transfer of said input data to the main memory array of one of said memory banks.

27. The memory device of claim 16, wherein said memory banks share said internal data bus described in claim 1.

28. The memory device of claim 27, further comprising a transfer register coupled to said internal data bus, the data transferred from the main memory array to the sub memory array in one of said memory banks being first transferred from said main memory array to said transfer register, then transferred from said transfer register to said sub memory array during output of data from another one of said memory banks.

29. The memory device of claim 28, further comprising an input data register coupled to said data bus, for temporarily storing the input data received by said data input unit, pending transfer of said input data to the main memory array of one of said memory banks.

30. The memory device of claim 17, wherein said memory banks have separate internal data buses, further comprising a bank bus switch coupling said separate internal data buses to said data input unit and said data output unit.

31. The memory device of claim 30, further comprising a transfer register coupled to said bank bus switch and shared by all of said memory banks, the data transferred from the main memory array to the sub memory array in one of said memory banks being first transferred from said main memory array to said transfer register, then transferred from said transfer register to said sub memory array during output of data from another one of said memory banks.

32. The memory device of claim 31, further comprising an input data register coupled between said data input unit and said bank bus switch, for temporarily storing the input data received by said data input unit, pending transfer of said input data to the main memory array of one of said memory banks.

33. The memory device of claim 30, further comprising, in each memory bank among said memory banks, a transfer register coupled to the internal data bus of said memory bank, the data transferred from the main memory array to the sub memory array in said memory bank being first transferred from said main memory array to said transfer register, then transferred from said transfer register to the sub memory array of said memory bank, during output of data from another one of said memory banks.

34. The memory device of claim 33, further comprising an input data register coupled between said data input unit and said bank bus switch, for temporarily storing the input data received by said data input unit, pending transfer of said input data to the main memory array of one of said memory banks.

35. The memory device of claim 17, wherein said memory banks share said internal data bus described in claim 1.

36. The memory device of claim 35, further comprising a transfer register coupled to said internal data bus, the data transferred from the main memory array to the sub memory array in one of said memory banks being first transferred from said main memory array to said transfer register, then transferred from said transfer register to said sub memory array during output of data from another one of said memory banks.

37. The memory device of claim 36, further comprising an input data register coupled to said data bus, for temporarily storing the input data received by said data input unit, pending transfer of said input data to the main memory array of one of said memory banks.

38. The memory device of claim 18, wherein said memory banks have separate internal data buses, further comprising:
 a bank bus switch coupling said separate internal data buses to said data input unit and said data output unit; and
 a transfer register coupled to said bank bus switch and shared by all of said memory banks, the data transferred from the main memory array to the sub memory array in one of said memory banks being first transferred from said main memory array to said transfer register, then transferred from said transfer register to said sub memory array during output of data from another one of said memory banks.

39. The memory device of claim 19, wherein said memory banks have separate internal data buses, further comprising:
 a bank bus switch coupling said separate internal data buses to said data input unit and said data output unit; and
 a transfer register coupled to said bank bus switch and shared by all of said memory banks, the data transferred from the main memory array to the sub memory array in one of said memory banks being first transferred from said main memory array to said transfer register, then transferred from said transfer register to said sub memory array during output of data from another one of said memory banks.

40. A memory device receiving row and column address signals, input data, and external control signals in synchronization with a clock signal, having a memory array with a plurality of memory cells arranged in intersecting rows and columns, a plurality of word lines coupled to respective rows of memory cells, and a row decoder for activating a word line selected from among said word lines by a received row address signal, and comprising:

a data input unit with at least one data input terminal for receiving said input data;

a data output unit with at least one data output terminal for output of data;

an internal data bus coupled to said data input unit;

a data bus switch coupling said internal data bus to said data output unit;

a column address generator generating a series of column addresses from a single starting column address;

a column decoder coupled to said column address generator and said memory array, for decoding said series of column addresses and coupling a corresponding series of columns of memory cells in said memory array to said internal data bus, one column at a time; and a control signal generator coupled to said column address generator and receiving said external control signals, for controlling said column address generator, said data bus switch, said data input unit, and said data output unit so that reception of a row address signal, a column address signal, and said input data is accompanied by both output of data from memory cells disposed at intersections of a row designated by said row address signal with said series of columns, and transfer of said input data from said data input unit to a memory cell disposed at an intersection of the row designated by said row address signal with one column in said series of columns.

41. The memory device of claim 40, wherein said column address generator maintains output of a column address occurring last in said series of column addresses while said input data are being transferred from said data input unit, said one column thus corresponding to said column address occurring last.

42. The memory device of claim 41, further comprising a buffer circuit coupled between said data bus switch and said data output unit, for temporarily storing the data transferred from said memory array to said data output unit, enabling said data input unit to receive said input data while the data read from said one column are being output by said output unit.

43. The memory device of claim 41, further comprising a data bus initialization unit, for resetting said internal data bus to an initial state following the transfer of data from said one column.

44. The memory device of claim 40, wherein said column address generator comprises:

a column address counter for generating said series of column addresses at a rate determined by said clock signal; and an access counter for counting the column addresses generated by said column address counter and stopping said column address counter when a certain number of column addresses have been generated.

45. The memory device of claim 44, wherein said column address counter is a down-counter.

46. The memory device of claim 44, wherein said column address generator also comprises an address register for storing a column address designated by the column address signal received by said memory device, said column address generator using the column address stored in said address register as said starting column address.

47. The memory device of claim 46, wherein one of the external control signals received by said control signal generator causes the column address stored in said address register to be reloaded into said address counter without input of another external column address signal.

48. The memory device of claim 46, further comprising an address register output switch through which said address register is coupled to said column address counter.

49. The memory device of claim 40, wherein said memory array is divided into at least two blocks, each column of memory cells being disposed in just one of said blocks, further comprising a block selection unit coupled to said column address generator, for modifying at least one column address bit midway through the series of column addresses generated by said column address generator, thereby causing said series of column addresses to jump from one of said blocks to another one of said blocks.

50. The memory device of claim 40, comprising two memory banks, each constituted as described in claim 40, said two memory banks sharing said data input unit, said data output unit, and said control signal generator, but having separate memory arrays, separate word lines, separate row decoders, and separate column decoders.

51. A method of controlling access to a memory array in a memory device, said memory array having intersecting rows and columns of memory cells, said memory array being divided into a main memory array and a sub memory array, said sub memory array having as many rows as said main memory array but having fewer columns than said main memory array, comprising the steps of:

(a) receiving a row address signal and activating a corresponding row in said main memory array and said sub memory array;

(b) generating, within said memory device, a first series of column addresses designating different columns in said main memory array;

(c) reading data from memory cells disposed at intersections of the row activated in said step (a) with the columns designated in said step (b), and outputting the data thus read;

(d) transferring data, in the row activated in said step (a), from one column in said main memory array to one column in said sub memory array, and storing the transferred data in said sub memory array;

(e) generating, within said memory device, a second series of column addresses designating columns in said sub memory array;

(f) reading data from memory cells disposed at intersections of the row activated in said step (a) with the columns designated in said step (e), and outputting the data thus read;

(g) receiving input data; and (h) storing said input data in a memory cell in said one column in said main memory array, in the row activated in said step (a).

52. The method of claim 51, wherein said one column in said main memory array occurs first among the columns designated in said step (b).

53. The method of claim 51, wherein said memory device has separate data terminals for input and output, and said step (g) is simultaneous with output of the data read from said one column in said main memory array in said step (c).

54. The method of claim 51, wherein said step (d) stores the transferred data in a column designated by one column address in said second series of column addresses.

55. The method of claim 51, wherein said first series of column addresses and said second series of column addresses comprise equal numbers of column addresses.

56. The method of claim 51, wherein said first series of column addresses and said second series of column addresses comprise different numbers of column addresses.

57. The method of claim 51, wherein said first series of column addresses and said second series of column addresses are both generated from external input of a single starting column address.

58. The method of claim 51, further comprising the steps of:
receiving a starting column address;
storing said starting column address in an address register; and
repeatedly carrying out said steps (a) through (h), said first series of column addresses starting from the starting column address stored in said address register, without further external column address input.

59. The method of claim 51, wherein said step (h) further comprises the step of storing said input data temporarily in an input data register, pending storing said input data in said main memory array.

60. The method of claim 51, wherein the data stored in said memory array represent picture elements in a moving picture scanned in successive scanning lines, data for picture elements in different scanning lines being stored in different columns in said main memory array.

61. The method of claim 60, wherein the data read in said step (c) and the data read in said step (f) represent picture elements in two different fields of said moving picture.

62. The method of claim 60, wherein the data read in said step (c) and the data read in said step (f) represent picture elements in two different frames of said moving picture.

63. The method of claim 51, wherein said memory array is divided into at least two banks, each bank having a main memory array and a sub memory array, different banks having different rows of memory cells, wherein said step (a) activates a row in a first bank among said banks and a row in a second bank among said banks, and said steps (c) X through (h) are performed in said first bank, further comprising the steps of:
(i) generating a third series of column addresses designating successive columns of memory cells in the main memory array of said second bank; and
(j) reading data from memory cells disposed at intersections of the row in said second bank activated in said step (a) and the columns designated in said step (i), and outputting the data thus read;
said step (j) being performed between said step (c) and said step (f).

64. The method of claim 63, wherein said steps (d) and (h) are performed during said step (j).

65. The method of claim 64, wherein said step (d) comprises the further steps of:
(k) reading data from said one column in the main memory array in said first bank;
(l) storing the data read in said step (k) temporarily in a transfer register; and
(m) transferring the data stored in said transfer register to the sub memory array in said first bank during said step (j).

66. The method of claim 63, wherein said step (a) activates said row in said first bank before said step (c), and activates said row in said second bank during said step (c).

67. The method of claim 63, wherein the data stored in said memory array represent picture elements in a moving picture scanned in successive scanning lines, data for picture elements in different scanning lines being stored in different columns in the main memory array in each said bank.

68. The method of claim 67, wherein the data read in said step (c), the data read in said step (f), and the data read in said step (j) represent picture elements in three different fields of said moving picture.

69. The method of claim 67, wherein the data read in said step (c), the data read in said step (f), and the data read in said step (j) represent picture elements in three different frames of said moving picture.

70. The method of claim 63, wherein said first series of column addresses, said second series of column addresses, and said third series of column addresses comprise equal numbers of column addresses.

71. The method of claim 63, wherein said first series of column addresses and said second series of column addresses comprise equal numbers of column addresses, and said third series of column addresses comprises a different number of column addresses.

72. The method of claim 71, wherein said step (d) stores the transferred data in a column designated by said second series of column addresses.

73. The method of claim 72, wherein said one column in said main memory array in said first bank occurs among the columns designated by said first series of column addresses.

74. The method of claim 71, wherein said one column in said main memory array in said first bank is not among the columns designated by said first series of column addresses, and said step (d) stores the transferred data in a column not designated by said second series of column addresses.

75. A method of controlling access to a memory array in a memory device, said memory array having intersecting rows and columns of memory cells, said memory device having separate data input terminals and data output terminals, comprising the steps of:
(a) receiving a row address signal and activating a corresponding row in said memory array;
(b) generating, within said memory device, a series of column addresses designating different columns in said memory array;
(c) reading data from memory cells disposed at intersections of the row activated in said step (a) with the columns designated in said step (b), and outputting the data thus read;
(d) receiving input data simultaneous with output of data read from one column in said step (c); and
(e) storing said input data in a memory cell disposed at an intersection of the row activated in step (a) with said one column.

76. The method of claim 75, wherein said one column occurs last among the columns designated in said step (b).

77. The method of claim 76, wherein said memory device has an internal data bus used for both reading and writing data in said memory array, further comprising the step of initializing said internal data bus after reading data from said one column in said step (c) but before said step (e).

78. The method of claim 75, wherein said series of column addresses is generated from external input of a starting column address.

79. The method of claim 75, further comprising the steps of:
receiving a starting column address;
storing said starting column address in an address register; and repeatedly carrying out said steps (a) through (e), the series of column addresses generated in said step (b) starting from the starting column address stored in said address register, without further external column address input.

80. The method of claim 75, wherein the data stored in said memory array represent picture elements in a moving picture scanned in successive scanning lines, data for picture elements in different scanning lines being stored in different columns in said memory array.

81. The method of claim 80, wherein said memory array is divided into blocks of columns, said blocks storing data for different fields of said moving picture, and said series of column addresses designates columns in at least two of said blocks, storing data representing picture elements in mutually adjacent positions in said different fields.

82. The method of claim 80, wherein said memory array is divided into blocks of columns, said blocks storing data for different frames of said moving picture, and said series of column addresses designates columns in at least two of said blocks, storing data representing picture elements in identical positions in said different frames.

* * * * *